US011916154B2

(12) United States Patent
Neya et al.

(10) Patent No.: US 11,916,154 B2
(45) Date of Patent: *Feb. 27, 2024

(54) LIGHT RECEIVING ELEMENT AND RANGING MODULE HAVING A PLURALITY OF PIXELS THAT EACH INCLUDES VOLTAGE APPLICATION UNITS AND CHARGE DETECTION UNITS

(71) Applicant: SONY SEMICONDUCTOR SOLUTIONS CORPORATION, Kanagawa (JP)

(72) Inventors: Koji Neya, Kanagawa (JP); Takuya Maruyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/089,293

(22) Filed: Dec. 27, 2022

(65) Prior Publication Data

US 2023/0137903 A1 May 4, 2023

Related U.S. Application Data

(63) Continuation of application No. 16/633,710, filed as application No. PCT/JP2019/026576 on Jul. 4, 2019, now Pat. No. 11,538,942.

(30) Foreign Application Priority Data

Jul. 18, 2018 (JP) ................................ 2018-135352

(51) Int. Cl.
*H01L 31/02* (2006.01)
*G01S 7/4863* (2020.01)
(Continued)

(52) U.S. Cl.
CPC ...... *H01L 31/02019* (2013.01); *G01S 7/4863* (2013.01); *H01L 31/02164* (2013.01); *H01L 31/103* (2013.01)

(58) Field of Classification Search
CPC ..... H01L 27/146; H01L 31/02; H01L 31/103; G01S 7/486; G01S 7/491; G01S 7/483
(Continued)

(56) References Cited

U.S. PATENT DOCUMENTS 7,427,740 B2 * 9/2008 Park .................. H01L 27/14609 257/230
7,667,178 B2 2/2010 Bae et al.
(Continued)

FOREIGN PATENT DOCUMENTS

EP 2960952 12/2015
EP 3439038 A1 2/2019
(Continued)

OTHER PUBLICATIONS

International Search Report and Written Opinion for International (PCT) Patent Application No. PCT/JP2019/026576, dated Sep. 10, 2019, 6 pages.

(Continued)

*Primary Examiner* — Que Tan Le
(74) *Attorney, Agent, or Firm* — Sheridan Ross PC

(57) ABSTRACT

The present technology relates to a light receiving element and a ranging module that can improve characteristics. A light receiving element includes: light receiving regions each including a first voltage application unit to which a first voltage is applied, a first charge detection unit provided around the first voltage application unit, a second voltage application unit to which a second voltage different from the first voltage is applied, and a second charge detection unit provided around the second voltage application unit; and an (Continued)

isolation portion that is arranged at a boundary between the light receiving regions adjacent to each other, and isolates the light receiving regions from each other. The present technology can be applied to a light receiving element.

24 Claims, 91 Drawing Sheets

(51) Int. Cl.
*H01L 31/0216* (2014.01)
*H01L 31/103* (2006.01)

(58) Field of Classification Search
USPC ........................................ 250/208.1, 214 R
See application file for complete search history.

(56) References Cited

U.S. PATENT DOCUMENTS

| | | | |
|---|---|---|---|
| 11,538,942 | B2 | 12/2022 | Neya et al. |
| 2009/0045321 | A1 | 2/2009 | Bae |
| 2015/0356351 | A1 | 12/2015 | Saylor et al. |
| 2017/0194367 | A1 | 7/2017 | Fotopoulou et al. |
| 2018/0054581 | A1 | 2/2018 | Sano et al. |
| 2019/0006399 | A1 | 1/2019 | Otake et al. |
| 2019/0081094 | A1 | 3/2019 | Kato et al. |

FOREIGN PATENT DOCUMENTS

| | | | |
|---|---|---|---|
| EP | 3550273 | | 10/2019 |
| EP | 3573104 | | 11/2019 |
| JP | 2011-086904 | | 4/2011 |
| JP | 2016-510467 | | 4/2016 |
| JP | 2017107132 | A | 6/2017 |
| JP | 2017-522727 | | 8/2017 |
| JP | 2018201005 | A | 12/2018 |
| JP | 2009-008537 | | 1/2019 |
| TW | 200414528 | A | 8/2004 |
| WO | WO-2014113728 | A | 7/2014 |
| WO | WO-2015197685 | A | 12/2015 |
| WO | WO 2016/167044 | | 10/2016 |
| WO | WO 2017/169479 | | 10/2017 |
| WO | WO 2018/074530 | | 4/2018 |

OTHER PUBLICATIONS

Extended European Search Report for European Patent Application No. 19836783.1, dated Oct. 16, 2020, 9 pages.

Official Action for U.S. Appl. No. 16/633,710, dated Apr. 4, 2022, 7 pages.

Notice of Allowance for U.S. Appl. No. 16/633,710, dated Aug. 11, 2022, 5 pages.

* cited by examiner

BACKSIDE ILLUMINATION TYPE

A

B

LIGHT RECEIVING ELEMENT AND RANGING MODULE HAVING A PLURALITY OF PIXELS THAT EACH INCLUDES VOLTAGE APPLICATION UNITS AND CHARGE DETECTION UNITS

CROSS REFERENCE TO RELATED APPLICATIONS

This application is a continuation of U.S. patent application Ser. No. 16/633,710, filed Jan. 24, 2020, which is a national stage application under 35 U.S.C. 371 and claims the benefit of PCT Application No. PCT/JP2019/026576 having an international filing date of 4 Jul. 2019, which designated the United States, which PCT application claimed the benefit of Japanese Patent Application No. 2018-135352 filed 18 Jul. 2018, the entire disclosures of each of which are incorporated herein by reference.

TECHNICAL FIELD

The present technology relates to a light receiving element and a ranging module, and more particularly to a light receiving element and a ranging module that can improve characteristics.

BACKGROUND ART

Conventionally, a ranging system using an indirect time-of-flight (ToF) technique is known. In such a ranging system, essential is a sensor that can distribute, to different regions at high speed, a signal charge obtained by receiving light produced by active light that is radiated using a light emitting diode (LED) or a laser at a certain phase to strike and be reflected by a target object.

Therefore, for example, a technology has been proposed in which a voltage is directly applied to a sensor substrate to generate a current in the substrate, whereby a wide region in the substrate can be modulated at high speed (see, for example, Patent Document 1). Such a sensor is also called a current assisted photonic demodulator (CAPD) sensor.

CITATION LIST

Patent Document

Patent Document 1: Japanese Patent Application Laid-Open No. 2011-86904

SUMMARY OF THE INVENTION

Problems to be Solved by the Invention

However, it has been difficult to obtain a CAPD sensor having sufficient characteristics with the above-described technology.

For example, the CAPD sensor described above is a front-side illuminated sensor in which wirings and the like are arranged on a surface of the substrate on a side that receives light from the outside.

In order to secure the photoelectric conversion region, it is desirable that a light-receiving surface side of a photodiode (PD), that is, the photoelectric conversion unit have no part that blocks the optical path of entering light, such as wiring. However, in some front-side illuminated CAPD sensors, there are cases where, depending on the structure, a charge retrieving wiring, various control lines, and signal lines need to be arranged on the light-receiving surface side of the PD, which limits the photoelectric conversion region. In other words, a sufficient photoelectric conversion region cannot be secured, and characteristics such as pixel sensitivity are sometimes deteriorated.

Furthermore, in a case where the use of the CAPD sensor in a place with external light is considered, the external light component is treated as a noise component for the indirect ToF technique that uses active light for ranging, and it is thus necessary to secure a sufficient amount of saturation signals (Qs) in order to secure a sufficient signal-to-noise ratio (SN ratio) and obtain distance information. However, since the front-side illuminated CAPD sensor has a limited wiring layout, it has been necessary to devise using an approach other than the wiring capacity, such as providing an additional transistor to secure the capacity.

Moreover, in the front-side illuminated CAPD sensor, a signal retrieving unit called tap is arranged on a side of the substrate on which light enters. Meanwhile, in a case where photoelectric conversion in a Si substrate is considered, although there are differences in the attenuation rate depending on the light wavelength, photoelectric conversion is caused on the light entrance surface side at a higher percentage. Therefore, in the front-side type CAPD sensor, there is a possibility of a rise in probability that photoelectric conversion is performed in an inactive tap region, which is a tap region to which signal charges are not distributed among the tap regions in which the signal retrieving units are provided. The indirect ToF sensor uses a signal distributed to each charge accumulation region according to the phase of the active light to obtain ranging information; accordingly, a component directly photoelectrically converted in the inactive tap region is treated as noise, and as a result, there is a possibility that the ranging accuracy is degraded. That is, there is a possibility that characteristics of the CAPD sensor are deteriorated.

The present technology has been made in view of such a situation and is intended to enable an improvement in characteristics.

Solutions to Problems

A light receiving element of a first aspect of the present technology includes:

- light receiving regions each including
  - a first voltage application unit to which a first voltage is applied,
  - a first charge detection unit provided around the
  - a second voltage application unit to which a second voltage different from the first voltage is applied, and
  - a second charge detection unit provided around the second voltage application unit; and
- an isolation portion that is arranged at a boundary between the light receiving regions adjacent to each other, and isolates the light receiving regions from each other.

In the first aspect of the present technology,

- light receiving regions each including
  - a first voltage application unit to which a first voltage is applied,
  - a first charge detection unit provided around the first voltage application unit,
  - a second voltage application unit to which a second voltage different from the first voltage is applied, and
  - a second charge detection unit provided around the second voltage application unit; and an isolation portion that is arranged at a boundary between the light receiving regions adjacent to each other, and isolates the light receiving regions from each other are provided in the light receiving element.

A ranging module of a second aspect of the present technology includes:

a light receiving element;

a light source that radiates irradiation light whose brightness varies periodically; and a light emission control part that controls an irradiation timing of the irradiation light, in which the light receiving element includes:

light receiving regions each including a first voltage application unit to which a first voltage is applied, a first charge detection unit provided around the first voltage application unit, a second voltage application unit to which a second voltage different from the first voltage is applied, and a second charge detection unit provided around the second voltage application unit, and an isolation portion that is arranged at a boundary between the light receiving regions adjacent to each other, and isolates the light receiving regions from each other.

In the second aspect of the present technology, a light receiving element;

a light source that radiates irradiation light whose brightness varies periodically; and a light emission control part that controls an irradiation timing of the irradiation light are provided in the ranging module, in which the light receiving element includes the light receiving regions each including a first voltage application unit to which a first voltage is applied, a first charge detection unit provided around the first voltage application unit, a second voltage application unit to which a second voltage different from the first voltage is applied, and a second charge detection unit provided around the second voltage application unit, and an isolation portion that is arranged at a boundary between the light receiving regions adjacent to each other, and isolates the light receiving regions from each other.

Effects of the Invention

According to the first and second aspects of the present technology, the characteristics can be improved.

Note that, the effects described herein are not necessarily limited and any effects described in the present disclosure may be applied.

MODE FOR CARRYING OUT THE INVENTION

Hereinafter, embodiments to which the present technology is applied will be described with reference to the drawings.

First Embodiment

Configuration Example of Light Receiving Element

The present technology is intended to enable an improvement in characteristics such as pixel sensitivity by configuring a CAPD sensor as a backside illumination type.

The present technology can be applied to a light receiving element that constitutes a ranging system that performs ranging, for example, by the indirect ToF technique, an imaging apparatus having such a light receiving element, and the like.

For example, the ranging system can be applied to an in-vehicle system that is equipped in a vehicle and measure a distance to a target object located outside the vehicle, or a gesture recognition system that measures a distance to a target object such as a user's hand and recognizes a gesture of the user on the basis of the result of the measurement. In this case, the result of gesture recognition can be used for operation of a car navigation system, for example.

Figure 1:
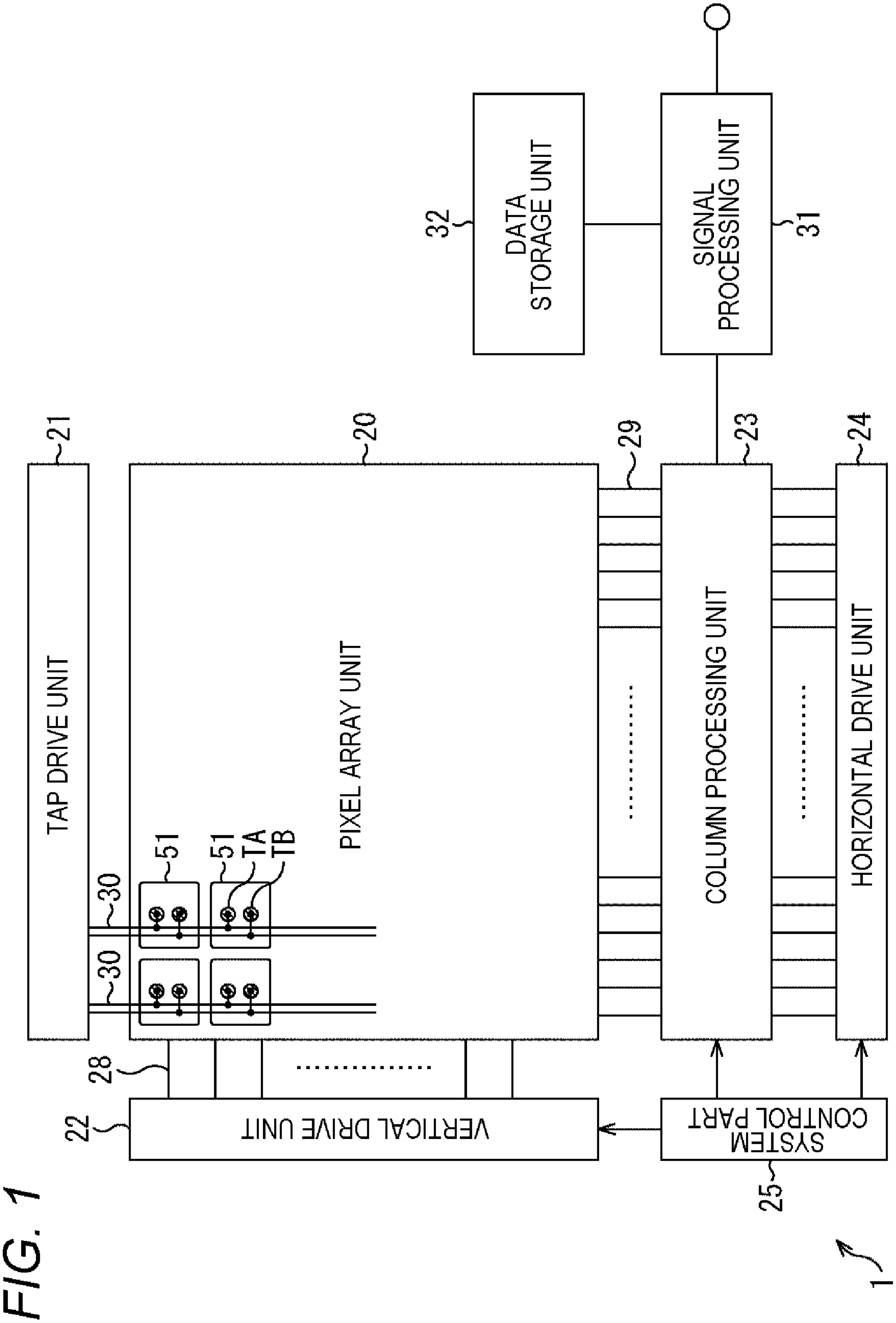
FIG. 1 is a block diagram illustrating a configuration example of a light receiving element.

FIG. 1 is a block diagram illustrating a configuration example of an embodiment of a light receiving element to which the present technology is applied.

A light receiving element 1 illustrated in FIG. 1 is a backside illuminated CAPD sensor, and is provided, for example, in an imaging apparatus having a ranging function.

The light receiving element 1 has a configuration including a pixel array unit 20 formed on a semiconductor substrate (not illustrated) and a peripheral circuit unit integrated on the same semiconductor substrate as the pixel array unit 20. The peripheral circuit unit is constituted by, for example, a tap drive unit 21, a vertical drive unit 22, a column processing unit 23, a horizontal drive unit 24, and a system control part 25.

The light receiving element 1 is further provided with a signal processing unit 31 and a data storage unit 32. Note that the signal processing unit 31 and the data storage unit 32 may be equipped on the same substrate as the light receiving element 1, or may be arranged on a substrate different from the light receiving element 1 in the imaging apparatus.

The pixel array unit 20 has a configuration in which pixels 51 that each generate a charge according to the amount of received light and output a signal according to the generated charge are two-dimensionally arranged in a matrix in row and column directions. That is, the pixel array unit 20 includes a plurality of pixels 51 that each photoelectrically convert light that has entered and output a signal according to a charge obtained as a result. Here, the row direction refers to an array direction of the pixels 51 in the horizontal direction, and the column direction refers to an array direction of the pixels 51 in the vertical direction. The row direction is the lateral direction in the drawing, and the column direction is the longitudinal direction in the drawing.

The pixel 51 receives light that has entered from the outside, particularly infrared light to photoelectrically convert the received light, and outputs a pixel signal according to a charge obtained as a result. The pixel 51 includes a first tap TA that applies a predetermined voltage MIX0 (first voltage) to detect a photoelectrically converted charge, and a second tap TB that applies a predetermined voltage MIX1 (second voltage) to detect a photoelectrically converted charge.

The tap drive unit 21 supplies the predetermined voltage MIX0 to the first tap TA of each pixel 51 of the pixel array unit 20 via a predetermined voltage supply line 30, and supplies the predetermined voltage MIX1 to the second tap TB of each pixel 51 of the pixel array unit 20 via a predetermined voltage supply line 30. Accordingly, two voltage supply lines 30, namely, a voltage supply line 30 that sends the voltage MIX0 and a voltage supply line 30 that sends the voltage MIX1, are wired in one pixel column of the pixel array unit 20.

In the pixel array unit 20, a pixel drive line 28 is wired along the row direction for each pixel row, and two vertical signal lines 29 are wired along the column direction for each pixel column in the pixel array in a matrix. For example, the pixel drive line 28 sends a drive signal for performing driving when a signal is read from the pixel. Note that, in FIG. 1, the pixel drive line 28 is illustrated as one wiring, but is not limited to one. One end of the pixel drive line 28 is connected to an output end of the vertical drive unit 22 corresponding to each row.

The vertical drive unit 22 is constituted by a shift register, an address decoder, and the like, and drives each pixel of the pixel array unit 20 at the same time for all pixels or in units of rows. That is, the vertical drive unit 22 constitutes a drive unit that controls the working of each pixel of the pixel array unit 20, together with the system control part 25 that controls the vertical drive unit 22.

A signal output from each pixel 51 in the pixel row according to drive control by the vertical drive unit 22 is input to the column processing unit 23 through the vertical signal line 29. The column processing unit 23 performs predetermined signal processing on the pixel signal output from each pixel 51 through the vertical signal line 29, and also temporarily holds a pixel signal after the signal processing.

Specifically, the column processing unit 23 performs noise removal processing, analog-to-digital (AD) conversion processing, and the like as signal processing.

The horizontal drive unit 24 is constituted by a shift register, an address decoder, and the like, and sequentially selects unit circuits of the column processing unit 23 corresponding to the pixel columns. By this selective scanning by this horizontal drive unit 24, pixel signals on which signal processing has been performed for each unit circuit in the column processing unit 23 are sequentially output.

The system control part 25 is constituted by a timing generator that generates various timing signals, and the like, and performs drive control of the tap drive unit 21, the vertical drive unit 22, the column processing unit 23, the horizontal drive unit 24, and the like, using the various timing signals generated by the timing generator as a basis.

The signal processing unit 31 has at least an arithmetic processing function, and performs a variety of types of signal processing such as arithmetic processing on the basis of the pixel signal output from the column processing unit 23. At the time of signal processing in the signal processing unit 31, the data storage unit 32 temporarily stores data necessary for the processing.

Configuration Example of Pixel

Next, a configuration example of the pixels provided in the pixel array unit 20 will be described. The pixel provided in the pixel array unit 20 is configured as illustrated in FIG. 2, for example.

Figure 2:
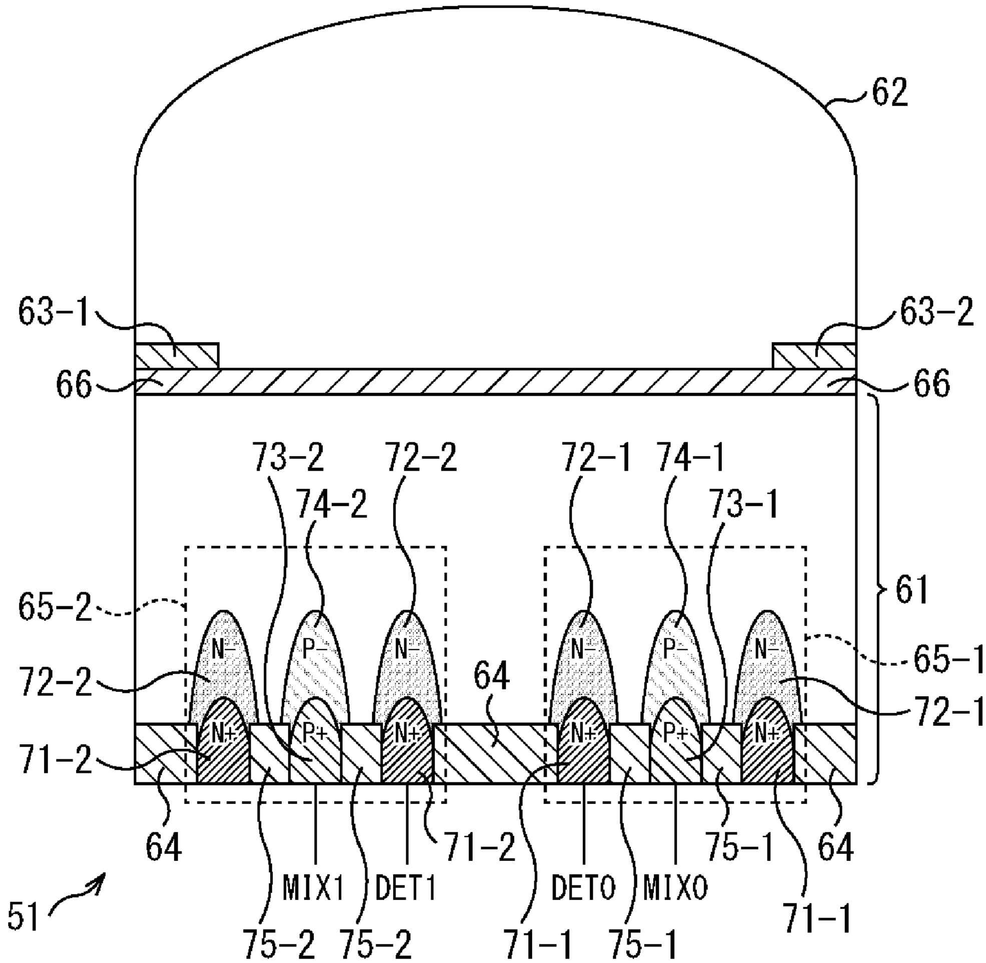
FIG. 2 is a diagram illustrating a configuration example of a pixel.

FIG. 2 illustrates a cross section of one pixel 51 provided in the pixel array unit 20, and the one pixel 51 receives light that has entered from the outside, particularly infrared light, to photoelectrically convert the received light, and outputs a signal according to a charge obtained as a result.

The pixel 51 includes a substrate 61 including a semiconductor layer of P-type, such as a silicon substrate, and an on-chip lens 62 formed on that substrate 61.

For example, the substrate 61 is designed to have a thickness in the longitudinal direction in the drawing, that is, a thickness perpendicular to a surface of the substrate 61 of 20 μm or less. Note that, of course, the thickness of the substrate 61 may be 20 μm or more, and the thickness only needs to be defined according to the targeted characteristics or the like of the light receiving element 1.

Furthermore, the substrate 61 is configured as, for example, a high resistance P-Epi substrate having a substrate concentration of the order of 1E+13 or less, and the resistance (resistivity) of the substrate 61 is designed to be, for example, 500 [Ωcm] or more.

Here, the relationship between the substrate concentration and the resistance of the substrate 61 is, for example, such that the resistance is 2000 [Ωcm] when the substrate concentration is 6.48E+12 [$cm^3$], the resistance is 1000 [Ωcm] when the substrate concentration is 1.30E+13 [$cm^3$], the resistance is 500 [Ωcm] when the substrate concentration is 2.59E+13 [$cm^3$], the resistance is 100 [Ωcm] when the substrate concentration is 1.30E+14 [$cm^3$], and so forth.

In FIG. 2, a surface of the substrate 61 on an upper side is a back surface of the substrate 61, and serves as a light entrance surface through which light from the outside enters the substrate 61. Meanwhile, a surface of the substrate 61 on a lower side is a front surface of the substrate 61, and a multilayer wiring layer (not illustrated) is formed thereon. A fixed charge film 66 including a single-layer film or a laminated film having a positive fixed charge is formed on the light entrance surface of the substrate 61, and the on-chip lens 62 that condenses light that has entered from the outside and causes the condensed light to enter the substrate 61 is formed on an upper surface of the fixed charge film 66. The fixed charge film 66 places the light entrance surface side of the substrate 61 in a hole accumulation state and suppresses the generation of dark current.

Moreover, in the pixel 51, an inter-pixel light-shielding film 63-1 and an inter-pixel light-shielding film 63-2 for preventing crosstalk between pixels that are adjacent are formed on end portions of the pixel 51 on the fixed charge film 66. Hereinafter, the inter-pixel light-shielding films 63-1 and 63-2 are also simply referred to as inter-pixel light-shielding films 63 in a case where it is particularly not necessary to distinguish between the inter-pixel light-shielding films 63-1 and 63-2.

In this example, while light from the outside enters the substrate 61 via the on-chip lens 62, the inter-pixel light-shielding film 63 is formed so as not to allow light that has entered from the outside to enter the region of another pixel provided adjacent to the pixel 51 on the substrate 61. That is, shielding from light that enters the on-chip lens 62 from the outside and travels into the another pixel adjacent to the pixel 51 is ensured by the inter-pixel light-shielding films 63-1 and 63-2, and the light is prevented from entering into the another pixel being adjacent.

Since the light receiving element 1 is a backside illuminated CAPD sensor, the light entrance surface of the substrate 61 is positioned on a so-called back surface, and a wiring layer including wiring and the like is not formed on this back surface. Furthermore, wiring layers formed with a wiring for driving a transistor and the like formed in the pixel 51, a wiring for reading a signal from the pixel 51, and the like are formed on a surface portion of the substrate 61 on an opposite side of the light entrance surface by lamination.

An oxide film 64, a signal retrieving unit 65-1, and a signal retrieving unit 65-2 are formed on an inner side portion of a surface of the substrate 61 opposite to the light entrance surface, that is, a surface on a lower side in the drawing. The signal retrieving unit 65-1 corresponds to the first tap TA described in FIG. 1, and the signal retrieving unit 65-2 corresponds to the second tap TB described in FIG. 1.

In this example, the oxide film 64 is formed in a central portion of the pixel 51 in the vicinity of the surface of the substrate 61 on an opposite side of the light entrance surface, and the signal retrieving units 65-1 and 65-2 are formed at two respective ends of this oxide film 64.

Here, the signal retrieving unit 65-1 includes an N+ semiconductor region 71-1, which is an N-type semiconductor region, and an N− semiconductor region 72-1 having a lower donor impurity concentration than the N+ semiconductor region 71-1, and also includes a P+ semiconductor region 73-1, which is a P-type semiconductor region, and a P− semiconductor region 74-1 having a lower acceptor impurity concentration than the P+ semiconductor region 73-1. Here, donor impurities include, for example, elements belonging to group 5 in the element periodic table, such as phosphorus (P) and arsenic (As) with respect to Si, and acceptor impurities include, for example, elements belonging to group 3 in the element periodic table, such as boron (B) with respect to Si. An element acting as a donor impurity is referred to as a donor element, and an element acting as an acceptor impurity is referred to as an acceptor element.

In FIG. 2, the N+ semiconductor region 71-1 is formed at a position adjacent to the right side of the oxide film 64 in an inner side outer surface portion of a surface of the substrate 61 on an opposite side of the light entrance surface. Furthermore, the N-semiconductor region 72-1 is formed on an upper side of the N+ semiconductor region 71-1 in the drawing so as to cover (surround) this N+ semiconductor region 71-1.

Moreover, the P+ semiconductor region 73-1 is formed on the right side of the N+ semiconductor region 71-1. In addition, the P− semiconductor region 74-1 is formed on an upper side of the P+ semiconductor region 73-1 in the drawing so as to cover (surround) this P+ semiconductor region 73-1.

Additionally, the N+ semiconductor region 71-1 is formed on the right side of the P+ semiconductor region 73-1. Furthermore, the N− semiconductor region 72-1 is formed on an upper side of the N+ semiconductor region 71-1 in the drawing so as to cover (surround) this N+ semiconductor region 71-1.

Similarly, the signal retrieving unit 65-2 includes an N+ semiconductor region 71-2, which is an N-type semiconductor region, and an N− semiconductor region 72-2 having a lower donor impurity concentration than the N+ semiconductor region 71-2, and also includes a P+ semiconductor region 73-2, which is a P-type semiconductor region, and a P− semiconductor region 74-2 having a lower acceptor impurity concentration than the P+ semiconductor region 73-2.

In FIG. 2, the N+ semiconductor region 71-2 is formed at a position adjacent to the left side of the oxide film 64 in an inner side outer surface portion of a surface of the substrate 61 on an opposite side of the light entrance surface. Furthermore, the N-semiconductor region 72-2 is formed on an upper side of the N+ semiconductor region 71-2 in the drawing so as to cover (surround) this N+ semiconductor region 71-2.

Moreover, the P+ semiconductor region 73-2 is formed on the left side of the N+ semiconductor region 71-2. In addition, the P− semiconductor region 74-2 is formed on an upper side of the P+ semiconductor region 73-2 in the drawing so as to cover (surround) this P+ semiconductor region 73-2.

Additionally, the N+ semiconductor region 71-2 is formed on the left side of the P+ semiconductor region 73-2. Furthermore, the N− semiconductor region 72-2 is formed on an upper side of the N+ semiconductor region 71-2 in the drawing so as to cover (surround) this N+ semiconductor region 71-2.

An oxide film 64 similar to the oxide film 64 in the central portion of the pixel 51 is formed at an end portion of the pixel 51 in an inner side outer surface portion of a surface of the substrate 61 on an opposite side of the light entrance surface.

Hereinafter, the signal retrieving units 65-1 and 65-2 are also simply referred to as signal retrieving units 65 in a case where it is not particularly necessary to distinguish between the signal retrieving units 65-1 and 65-2.

Furthermore, hereinafter, the N+ semiconductor regions 71-1 and 71-2 are also simply referred to as N+ semiconductor regions 71 in a case where it is not particularly necessary to distinguish between the N+ semiconductor regions 71-1 and 71-2, and the N-semiconductor regions 72-1 and 72-2 are also simply referred to as N− semiconductor regions 72 in a case where it is not particularly necessary to distinguish between the N− semiconductor regions 72-1 and 72-2.

Moreover, hereinafter, the P+ semiconductor regions 73-1 and 73-2 are also simply referred to as P+ semiconductor regions 73 in a case where it is not particularly necessary to distinguish between the P+ semiconductor regions 73-1 and 73-2, and the P− semiconductor regions 74-1 and 74-2 are also simply referred to as P− semiconductor regions 74 in a case where it is not particularly necessary to distinguish between the P− semiconductor regions 74-1 and 74-2.

In addition, in the substrate 61, an isolation portion 75-1 for isolating the N+ semiconductor region 71-1 and the P+ semiconductor region 73-1 from each other is formed by an oxide film or the like between these regions. Similarly, an isolation portion 75-2 for isolating the N+ semiconductor region 71-2 and the P+ semiconductor region 73-2 from each other is formed by an oxide film or the like between these regions. Hereinafter, the isolation portions 75-1 and 75-2 are also simply referred to as isolation portions 75 in a case where it is not particularly necessary to distinguish between the isolation portions 75-1 and 75-2.

The N+ semiconductor region 71 provided on the substrate 61 functions as a charge detection unit for detecting the amount of light entering the pixels 51 from the outside, that is, the amount of signal carriers generated by photoelectric conversion by the substrate 61. Note that the charge detection unit can also be regarded as including the N− semiconductor region 72 having a lower donor impurity concentration, in addition to the N+ semiconductor region 71. Furthermore, the P+ semiconductor region 73 functions as a voltage application unit for injecting majority carrier current into the substrate 61, that is, for directly applying a voltage to the substrate 61 to generate an electric field in the substrate 61. Note that the voltage application unit can also be regarded as including the P− semiconductor region 74 having a lower acceptor impurity concentration, in addition to the P+ semiconductor region 73.

In the pixel 51, a floating diffusion (FD) portion (hereinafter also referred to particularly as FD portion A), which is a floating diffusion region (not illustrated), is directly connected to the N+ semiconductor region 71-1, and this FD portion A is further connected to the vertical signal line 29 via an amplification transistor (not illustrated) or the like.

Similarly, another FD portion (hereinafter also referred to particularly as FD portion B) different from the FD portion A is directly connected to the N+ semiconductor region 71-2, and this FD portion B is further connected to the vertical signal line 29 via an amplification transistor (not illustrated) or the like. Here, the FD portion A and the FD portion B are connected to mutually different vertical signal lines 29.

For example, in a case where a distance to a target object is to be measured by the indirect ToF technique, infrared light is issued from an imaging apparatus provided with the light receiving element 1 toward the target object. Then, when the issued infrared light is reflected by the target object and returns to the imaging apparatus as reflected light, the substrate 61 of the light receiving element 1 receives the entering reflected light (infrared light) to photoelectrically convert the received reflected light. The tap drive unit 21 drives the first tap TA and the second tap TB of the pixel 51, and distributes a signal according to a charge DET obtained by photoelectric conversion to the FD portion A or the FD portion B.

For example, at a certain timing, the tap drive unit 21 applies voltages to the two P+ semiconductor regions 73 via contacts or the like. Specifically, for example, the tap drive unit 21 applies a voltage of MIX0=1.5 V to the P+ semiconductor region 73-1, which is the first tap TA, and applies a voltage of MIX1=0 V to the P+ semiconductor region 73-2, which is the second tap TB.

Then, an electric field is generated between the two P+ semiconductor regions 73 in the substrate 61, and a current flows from the P+ semiconductor region 73-1 to the P+ semiconductor region 73-2. In this case, a hole in the substrate 61 is caused to move in a direction of the P+ semiconductor region 73-2, and an electron is caused to move in a direction of the P+ semiconductor region 73-1.

Accordingly, once infrared light (reflected light) from the outside enters the substrate 61 via the on-chip lens 62 in such a state, and the entering infrared light is photoelectrically converted in the substrate 61 to be converted into a pair of the electron and the hole, the obtained electron is guided in a direction of the P+ semiconductor region 73-1 by the electric field between the P+ semiconductor regions 73 and moves into the N+ semiconductor region 71-1.

In this case, the electron generated by photoelectric conversion is used as a signal carrier for detecting a signal corresponding to the amount of infrared light that has entered the pixel 51, that is, the amount of received infrared light.

As a consequence, a charge according to the electron that has moved into the N+ semiconductor region 71-1 is accumulated in the N+ semiconductor region 71-1, and this charge is detected by the column processing unit 23 via the FD portion A, the amplification transistor, the vertical signal line 29, and the like.

That is, an accumulated charge DET0 in the N+ semiconductor region 71-1 is transferred to the FD portion A directly connected to this N+ semiconductor region 71-1, and a signal according to the charge DET0 that has transferred to the FD portion A is read by the column processing unit 23 via the amplification transistor and the vertical signal line 29. Then, the read signal is subjected to processing such as AD conversion processing in the column processing unit 23, and a pixel signal obtained as a result is supplied to the signal processing unit 31.

This pixel signal is a signal indicating the amount of charges according to the electrons detected by the N+ semiconductor region 71-1, that is, the amount of charges DET0 accumulated in the FD portion A. In different terms, the pixel signal can be said to be a signal indicating the amount of infrared light received by the pixel 51.

Note that, at this time, similarly to the case of the N+ semiconductor region 71-1, a pixel signal according to electrons detected in the N+ semiconductor region 71-2 may be used as appropriate for ranging.

Furthermore, at the next timing, voltages are applied to the two P+ semiconductor regions 73 by the tap drive unit 21 via contacts or the like such that an electric field in a direction opposite to the electric field that has been produced in the substrate 61 until then is generated. Specifically, for example, a voltage of MIX0=0 V is applied to the P+ semiconductor region 73-1, which is the first tap TA, and a voltage of MIX1=1.5 V is applied to the P+ semiconductor region 73-2, which is the second tap TB.

As a consequence, an electric field is generated between the two P+ semiconductor regions 73 in the substrate 61, and a current flows from the P+ semiconductor region 73-2 to the P+ semiconductor region 73-1.

Once infrared light (reflected light) from the outside enters the substrate 61 via the on-chip lens 62 in such a state, and the entering infrared light is photoelectrically converted in the substrate 61 to be converted into a pair of the electron and the hole, the obtained electron is guided in a direction of the P+ semiconductor region 73-2 by the electric field between the P+ semiconductor regions 73 and moves into the N+ semiconductor region 71-2.

As a consequence, a charge according to the electron that has moved into the N+ semiconductor region 71-2 is accumulated in the N+ semiconductor region 71-2, and this charge is detected by the column processing unit 23 via the FD portion B, the amplification transistor, the vertical signal line 29, and the like.

That is, an accumulated charge DET1 in the N+ semiconductor region 71-2 is transferred to the FD portion B directly connected to this N+ semiconductor region 71-2, and a signal according to the charge DET1 that has transferred to the FD portion B is read by the column processing unit 23 via the amplification transistor and the vertical signal line 29. Then, the read signal is subjected to processing such as AD conversion processing in the column processing unit 23, and a pixel signal obtained as a result is supplied to the signal processing unit 31.

Note that, at this time, similarly to the case of the N+ semiconductor region 71-2, a pixel signal according to electrons detected in the N+ semiconductor region 71-1 may be used as appropriate for ranging.

Once the pixel signals obtained by photoelectric conversion in mutually different periods are obtained in the same pixel 51 in this manner, the signal processing unit 31 calculates distance information indicating a distance to the target object on the basis of these pixel signals, and outputs the calculated distance information to the subsequent stage.

This method of distributing signal carriers to mutually different N+ semiconductor regions 71 and calculating distance information on the basis of signals according to these signal carriers is called the indirect ToF technique.

Figure 3:
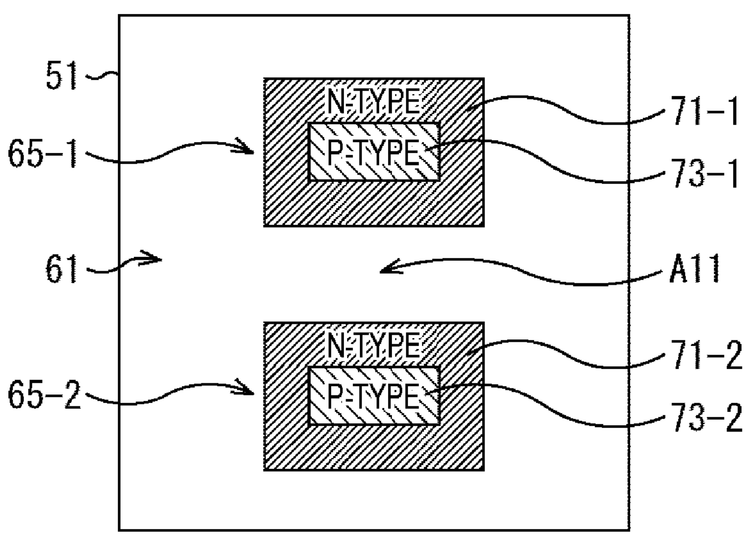
FIG. 3 is a diagram illustrating a configuration example of a signal retrieving unit portion of the pixel.

When the portion of the signal retrieving unit 65 in the pixel 51 is viewed in a downward direction from the top in FIG. 2, that is, in a direction perpendicular to a surface of the substrate 61, the circumference of the P+ semiconductor region 73 is structured so as to be surrounded by the N+ semiconductor region 71 as illustrated in FIG. 3, for example. Note that, in FIG. 3, constituent members corresponding to those in the case of FIG. 2 are denoted with the same reference numerals and the description thereof will be omitted as appropriate.

In the example illustrated in FIG. 3, the oxide film 64 (not illustrated) is formed in the center portion of the pixel 51, and the signal retrieving unit 65 is formed in a portion slightly on an end side from the center of the pixel 51. In particular, two signal retrieving units 65 are formed in the pixel 51 here.

Then, in each signal retrieving unit 65, the P+ semiconductor region 73 is formed in a rectangular shape at the center position of the signal retrieving unit 65, and the circumference of the P+ semiconductor region 73 is surrounded by the N+ semiconductor region 71 having a rectangular shape, in more detail, a rectangular frame shape, with the surrounded P+ semiconductor region 73 as the center. That is, the N+ semiconductor region 71 is formed so as to surround the circumference of the P+ semiconductor region 73.

Furthermore, in the pixel 51, the on-chip lens 62 is formed such that infrared light entering from the outside is condensed on the central portion of the pixel 51, that is, a portion indicated by an arrow A11. In different terms, the infrared light that has entered the on-chip lens 62 from the outside is condensed by the on-chip lens 62 at the position indicated by the arrow A11, that is, a position on an upper side in FIG. 2 of the oxide film 64 in FIG. 2.

Accordingly, the infrared light is condensed at a position between the signal retrieving units 65-1 and 65-2. With this configuration, it is possible to suppress the entry of the infrared light from a pixel adjacent to the pixel 51 and the occurrence of crosstalk, and it is also possible to suppress the entry of the infrared light directly to the signal retrieving unit 65.

For example, when the infrared light directly enters the signal retrieving unit 65, the charge isolation efficiency, that is, contrast between active and inactive taps (C mod) and modulation contrast are deteriorated.

Here, one of the signal retrieving units 65 from which a signal according to the charge DET obtained by photoelectric conversion is read, that is, a signal retrieving unit 65 in which the charge DET obtained by photoelectric conversion is to be detected is also referred to as active tap.

In contrast, one of the signal retrieving units 65 from which basically a signal according to the charge DET obtained by photoelectric conversion is not read, that is, one of the signal retrieving units 65 that is not the active tap is also referred to as inactive tap.

In the above example, one of the signal retrieving units 65 in which a voltage of 1.5 V is applied to the P+ semiconductor region 73 is an active tap, and the other of the signal retrieving units 65 in which a voltage of 0 V is applied to the P+ semiconductor region 73 is an inactive tap.

The C mod is computed by following formula (1), and is an index representing what percentage of charges can be detected by the N+ semiconductor region 71 of the signal retrieving unit 65, which is an active tap, from among charges generated by photoelectric conversion of infrared light that has entered, in other words, whether a signal according to a charge can be retrieved, which indicates the charge isolation efficiency. In formula (1), I0 denotes a signal detected by one of the two charge detection units (P+ semiconductor regions 73), and I1 denotes a signal detected by the other.

$$C\ \mathrm{mod}=\{|I0-I1|/(I0+I1)\}\times 100 \tag{1}$$

Accordingly, for example, when infrared light that has entered from the outside enters the region of the inactive tap and photoelectric conversion is performed in this inactive tap, there is a high possibility that an electron, which is a signal carrier generated by the photoelectric conversion, moves to the N+ semiconductor region 71 in the inactive tap. In consequence, the charges of some of electrons obtained by photoelectric conversion are no longer detected by the N+ semiconductor region 71 in the active tap, and the C mod, that is, the charge isolation efficiency is deteriorated.

In view of this, in the pixel 51, infrared light is condensed near the central portion of the pixel 51 located at an approximately equidistant position from the two signal retrieving units 65, such that the probability that infrared light that has entered from the outside is photoelectrically converted in the region of the inactive tap can be reduced, and the charge isolation efficiency can be improved. Furthermore, in the pixel 51, the modulation contrast can also be improved. In different terms, an electron obtained by photoelectric conversion can be allowed to be more easily led to the N+ semiconductor region 71 in the active tap.

According to the light receiving element 1 as described above, the following effects can be exhibited.

That is, firstly, since the light receiving element 1 is a backside illumination type, the quantum efficiency (QE)×the aperture ratio (fill factor (FF)) can be maximized, and the ranging characteristics of the light receiving element 1 can be improved.

Figure 4:
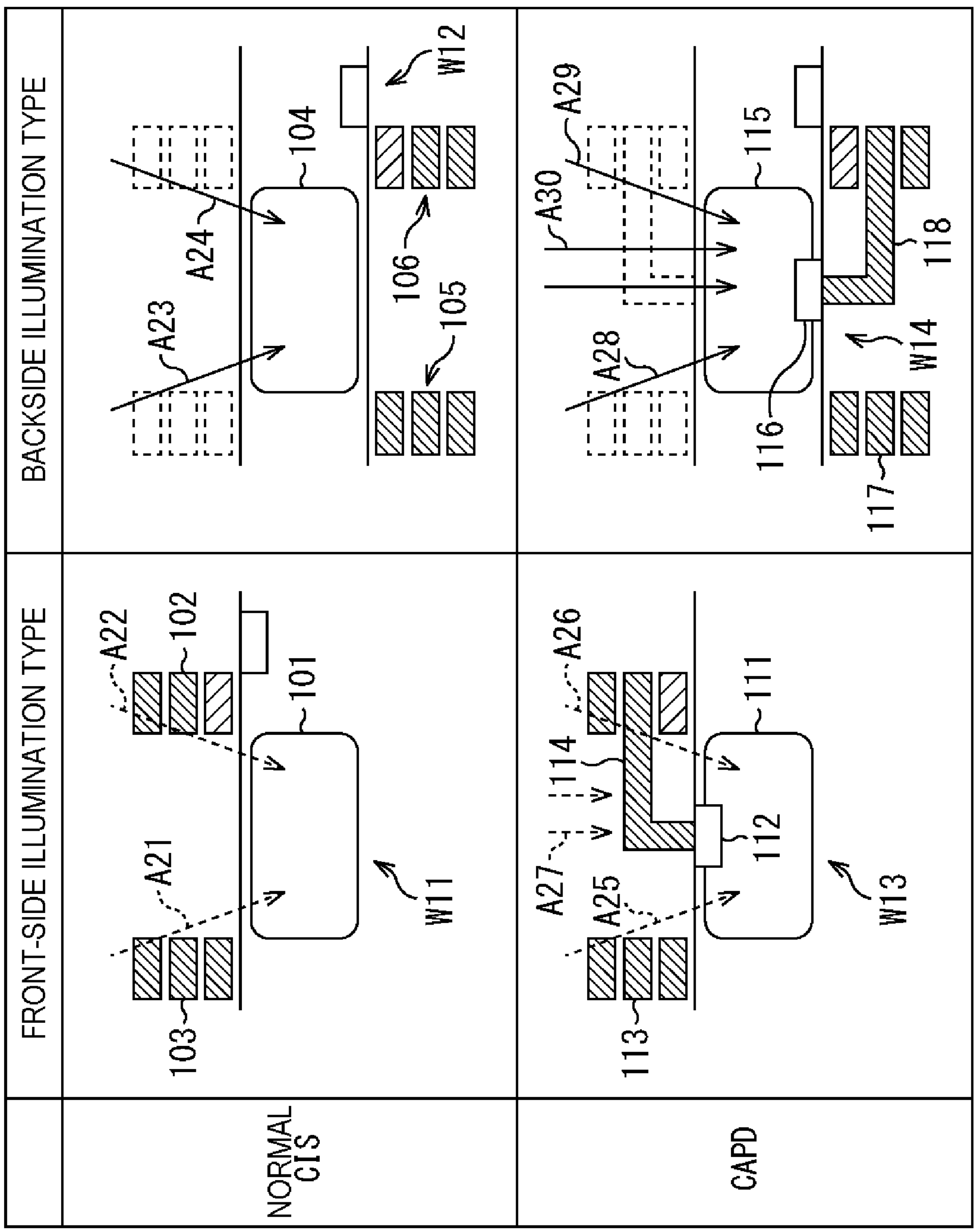
FIG. 4 is a diagram for explaining sensitivity improvement.

For example, as indicated by an arrow W11 in FIG. 4, a normal front-side illuminated image sensor has a structure in which a wiring 102 and a wiring 103 are formed on the light entrance surface side on which light from the outside enters, of a PD 101, which is a photoelectric conversion unit.

For this reason, for example, a phenomenon happens in which part of light entering obliquely at some angles with respect to the PD 101 from the outside as indicated by arrows A21 and A22 is blocked by the wiring 102 and the wiring 103 and does not enter the PD 101.

On the other hand, for example, as indicated by an arrow W12, a backside illuminated image sensor has a structure in which a wiring 105 and a wiring 106 are formed on a surface on an opposite side of the light entrance surface on which light from the outside enters, of a PD 104, which is a photoelectric conversion unit.

Therefore, a sufficient aperture ratio can be ensured as compared with the case of the front-side illumination type. That is, for example, light entering obliquely at some angles with respect to the PD 104 from the outside as indicated by arrows A23 and A24 enters the PD 104 without being blocked by the wiring. With this structure, more light can be received and the sensitivity of the pixel can be improved.

Such an effect of improving the pixel sensitivity obtained by employing the backside illumination type can also be obtained in the light receiving element 1, which is a backside illuminated CAPD sensor.

Furthermore, for example, as indicated by an arrow W13, in a front-side illuminated CAPD sensor, a signal retrieving unit 112 called a tap, in more detail, a P+ semiconductor region and an N+ semiconductor region of the tap are formed on the light entrance surface side on which light from the outside enters, inside a PD 111, which is a photoelectric conversion unit. In addition, the front-side illuminated CAPD sensor has a structure in which a wiring 113 and a wiring 114 such as a contact or a metal connected to the signal retrieving unit 112 are formed on the light entrance surface side.

For this reason, for example, a phenomenon happens in which not only part of light entering obliquely at some angles with respect to the PD 111 from the outside as indicated by arrows A25 and A26 is blocked by the wiring 113 and the like and does not enter the PD 111, but also light entering perpendicularly to the PD 111 as indicated by an arrow A27 is blocked by the wiring 114 and does not enter the PD 111.

On the other hand, for example, as indicated by an arrow W14, a backside illuminated CAPD sensor has a structure in which a signal retrieving unit 116 is formed on a surface portion on an opposite side of the light entrance surface on which light from the outside enters, of a PD 115, which is a photoelectric conversion unit. Furthermore, a wiring 117 and a wiring 118 such as a contact or a metal connected to the signal retrieving unit 116 are formed on a surface of the PD 115 on an opposite side of the light entrance surface.

Here, the PD 115 corresponds to the substrate 61 illustrated in FIG. 2, and the signal retrieving unit 116 corresponds to the signal retrieving unit 65 illustrated in FIG. 2.

In the backside illuminated CAPD sensor having such a structure, a sufficient aperture ratio can be ensured as compared with the case of the front-side illumination type. Accordingly, the quantum efficiency (QE)×the aperture ratio (FF) can be maximized, and the ranging characteristics can be improved.

That is, for example, light entering obliquely at some angles with respect to the PD 115 from the outside as indicated by arrows A28 and A29 enters the PD 115 without being blocked by the wiring. Similarly, light entering perpendicularly to the PD 115 as indicated by an arrow A30 also enters the PD 115 without being blocked by wiring or the like.

In this manner, in the backside illuminated CAPD sensor, not only light entering at some angles but also light entering perpendicularly to the PD 115, which are reflected by wiring or the like connected to the signal retrieving unit (tap) in the front-side illumination type, can be received. With this structure, more light can be received and the sensitivity of the pixel can be improved. In different terms, the quantum efficiency (QE)×the aperture ratio (FF) can be maximized, and as a result, the ranging characteristics can be improved.

In particular, in a case where the tap is arranged in the vicinity of the center of the pixel, rather than an outer edge of the pixel, the front-side illuminated CAPD sensor cannot ensure a sufficient aperture ratio and the sensitivity of the pixel is deteriorated; however, in the light receiving element 1, which is a backside illuminated CAPD sensor, a sufficient aperture ratio can be ensured regardless of the tap arrangement position, and the sensitivity of the pixel can be improved.

Furthermore, in the backside illuminated light receiving element 1, since the signal retrieving unit 65 is formed in the vicinity of a surface of the substrate 61 on an opposite side of the light entrance surface on which infrared light from the outside enters, it is possible to reduce the occurrence of photoelectric conversion of infrared light in the region of the inactive tap. Consequently, the C mod, that is, the charge isolation efficiency can be improved.

Figure 5:
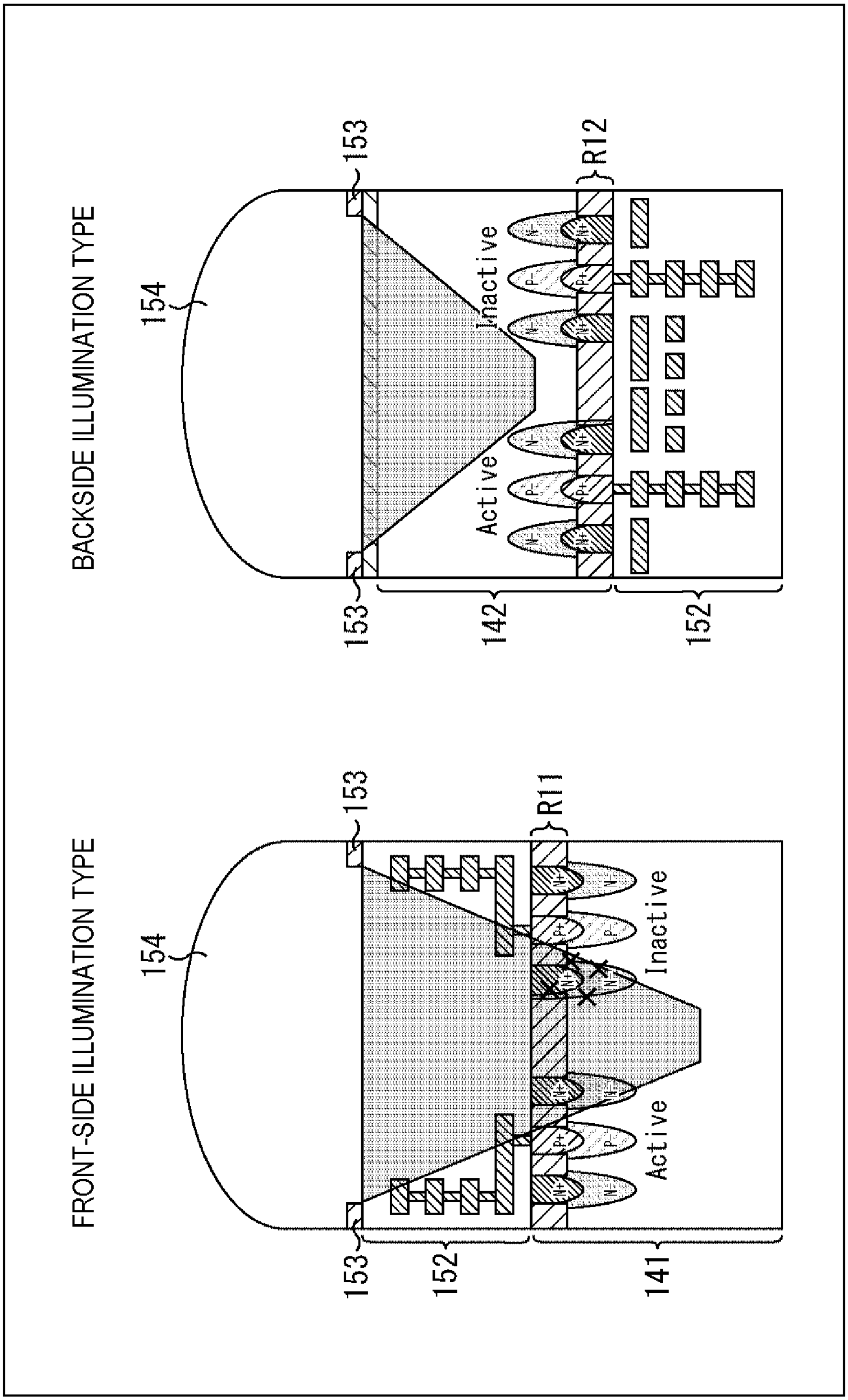
FIG. 5 is a diagram for explaining improvement of charge isolation efficiency.

FIG. 5 illustrates a pixel cross-sectional view of front-side illuminated and backside illuminated CAPD sensors.

In the front-side illuminated CAPD sensor on the left side of FIG. 5, an upper side of a substrate 141 in the drawing represents a light entrance surface, and a wiring layer 152 including a plurality of layers of wiring, and an inter-pixel light-shielding portion 153, and an on-chip lens 154 are laminated on the light entrance surface side of the substrate 141.

In the backside illuminated CAPD sensor on the right side of FIG. 5, a wiring layer 152 including a plurality of layers of wiring is formed on a lower side of a substrate 142 in the drawing on an opposite side of the light entrance surface, and an inter-pixel light-shielding portion 153 and an on-chip lens 154 are laminated on an upper side of the substrate 142, which is the light entrance surface side.

Note that, in FIG. 5, gray trapezoidal shapes indicate regions where the light intensity is higher due to infrared light being condensed by the on-chip lenses 154.

For example, the front-side illuminated CAPD sensor has a region R11 where an inactive tap and an active tap are present, on the light entrance surface side of the substrate 141. For this reason, many components directly enter the inactive tap and, when photoelectric conversion is performed in the region of the inactive tap, a signal carrier obtained by this photoelectric conversion is no longer detected in the N+ semiconductor region of the active tap.

In the front-side illuminated CAPD sensor, since the intensity of infrared light is higher in the region R11 in the vicinity of the light entrance surface of the substrate 141, the probability that infrared light is photoelectrically converted in the region R11 rises. In other words, since a larger amount of infrared light enters the vicinity of the inactive tap, the number of signal carriers that can no longer be detected by the active tap is expanded, and the charge isolation efficiency is deteriorated.

On the other hand, the backside illuminated CAPD sensor has a region R12 where an inactive tap and an active tap are present at a position far from the light entrance surface of the substrate 142, that is, a position in the vicinity of a surface on an opposite side of the light entrance surface side. Here, the substrate 142 corresponds to the substrate 61 illustrated in FIG. 2.

In this example, since the region R12 is located on a surface portion of the substrate 142 on an opposite side of the light entrance surface side, and the region R12 is positioned far from the light entrance surface, the intensity of infrared light that has entered is relatively low in the vicinity of this region R12.

A signal carrier obtained by photoelectric conversion in a region where the intensity of infrared light is higher, such as a region near the center of the substrate 142 or in the vicinity of the light entrance surface, is guided to the active tap by an electric field generated in the substrate 142, and detected in the N+ semiconductor region of the active tap.

Meanwhile, in the vicinity of the region R12 containing the inactive tap, since the intensity of infrared light that has entered is relatively low, the probability that infrared light is photoelectrically converted in the region R12 is lowered. In other words, the number of signal carriers (electrons) generated by photoelectric conversion in the vicinity of the inactive tap and moving to the N+ semiconductor region of the inactive tap is decreased because the amount of infrared light entering the vicinity of the inactive tap is smaller, and the charge isolation efficiency can be improved. As a result, the ranging characteristics can be enhanced.

Moreover, in the backside illuminated light receiving element 1, since the thinning of the substrate 61 can be implemented, the efficiency of retrieving electrons (charges), which are signal carriers, can be improved.

Figure 6:
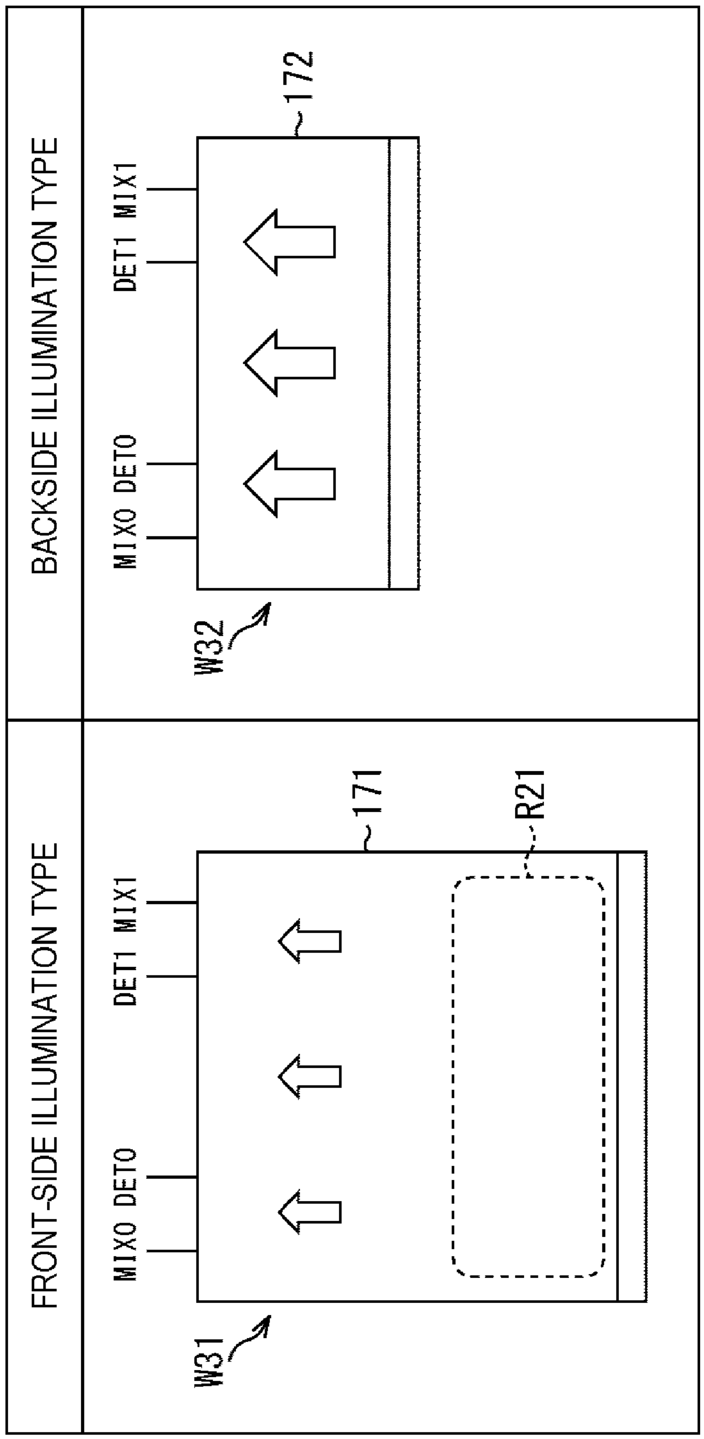
FIG. 6 is a diagram for explaining improvement of electron retrieving efficiency.

For example, the front-side illuminated CAPD sensor cannot sufficiently ensure an aperture ratio and, as indicated by an arrow W31 in FIG. 6, in order to ensure a higher quantum efficiency and suppress the deterioration of the quantum efficiency×the aperture ratio, a substrate 171 needs to be thickened to some extent.

If this is the case, the potential gradient is made gentler in a region in the substrate 171 in the vicinity of a surface on an opposite side of the light entrance surface, for example, the portion of a region R21, and an electric field in a direction substantially perpendicular to the substrate 171 is weakened. In this case, since the moving speed of the signal carrier becomes lower, a time required from when photoelectric conversion is performed until the signal carrier is detected in the N+ semiconductor region of the active tap becomes longer. Note that, in FIG. 6, arrows in the substrate 171 represent an electric field in the substrate 171 in a direction perpendicular to the substrate 171.

Furthermore, when the substrate 171 is thicker, the moving distance of the signal carrier from a position far from the active tap in the substrate 171 to the N+ semiconductor region in the active tap is made longer. Accordingly, at a position far from the active tap, a time required from when photoelectric conversion is performed until the signal carrier is detected in the N+ semiconductor region of the active tap becomes still longer.

Figure 7:
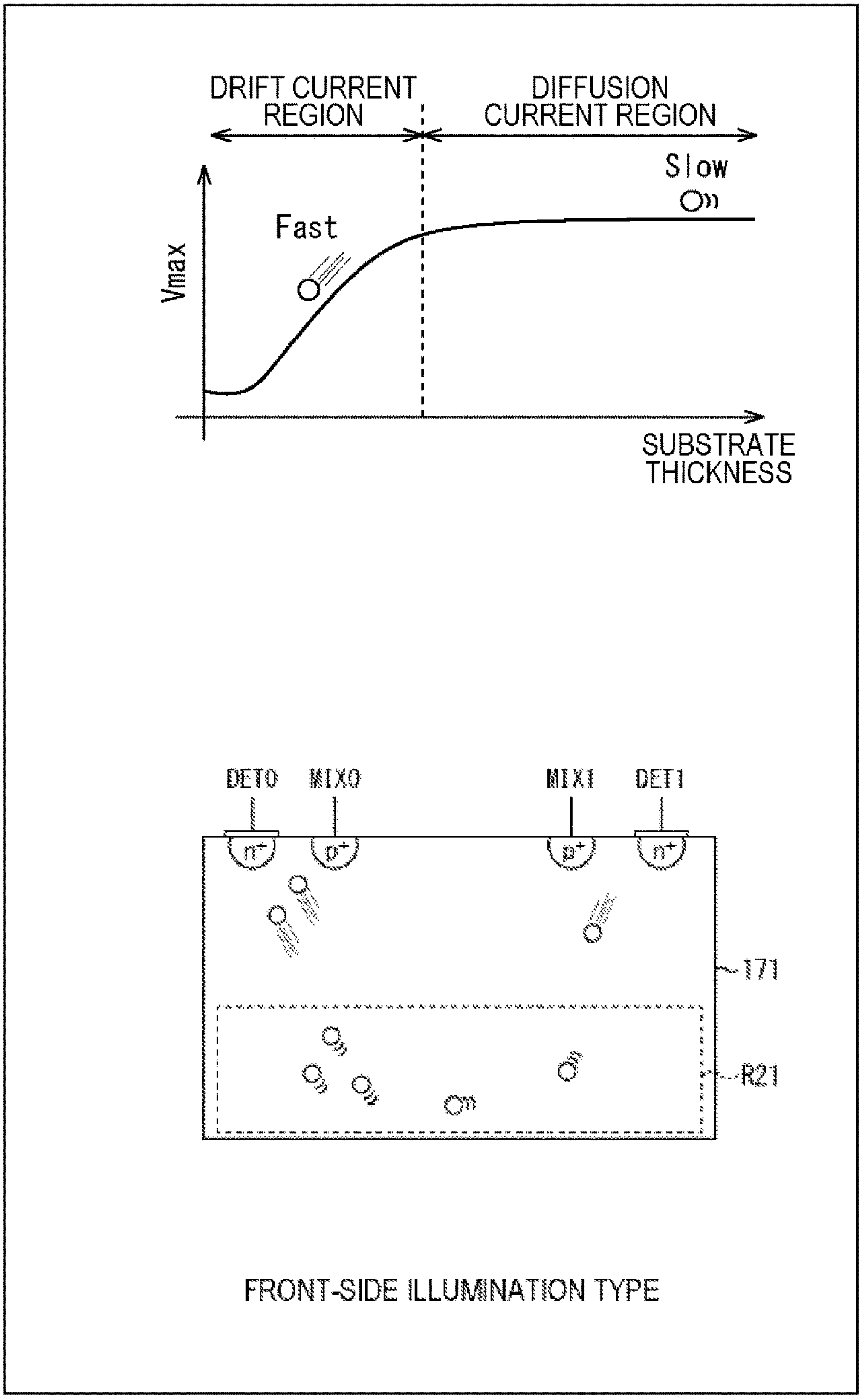
FIG. 7 is a diagram for explaining a moving speed of a signal carrier in a front-side illumination type.

FIG. 7 illustrates a relationship between a position in the substrate 171 in a thickness direction and the moving speed of the signal carrier. The region R21 corresponds to the diffusion current region.

In a case where the substrate 171 is made thicker in this manner, for example, when the drive frequency is higher, that is, when the tap (signal retrieving unit) is switched between active and inactive at higher speed, electrons generated at positions far from the active tap such as the region R21 cannot be completely drawn into the N+ semiconductor region of the active tap. That is, if the time during which the tap is kept active is shorter, a phenomenon in which electrons (charges) generated in the region R21 or the like can no longer be detected in the N+ semiconductor region of the active tap happens, and the electron retrieving efficiency is deteriorated.

On the other hand, since the backside illuminated CAPD sensor can ensure a sufficient aperture ratio, for example, as indicated by an arrow W32 in FIG. 6, it is possible to ensure a sufficient quantum efficiency×aperture ratio even if a substrate 172 is thinned. Here, the substrate 172 corresponds to the substrate 61 in FIG. 2, and arrows in the substrate 172 represent an electric field in a direction perpendicular to the substrate 172.

Figure 8:
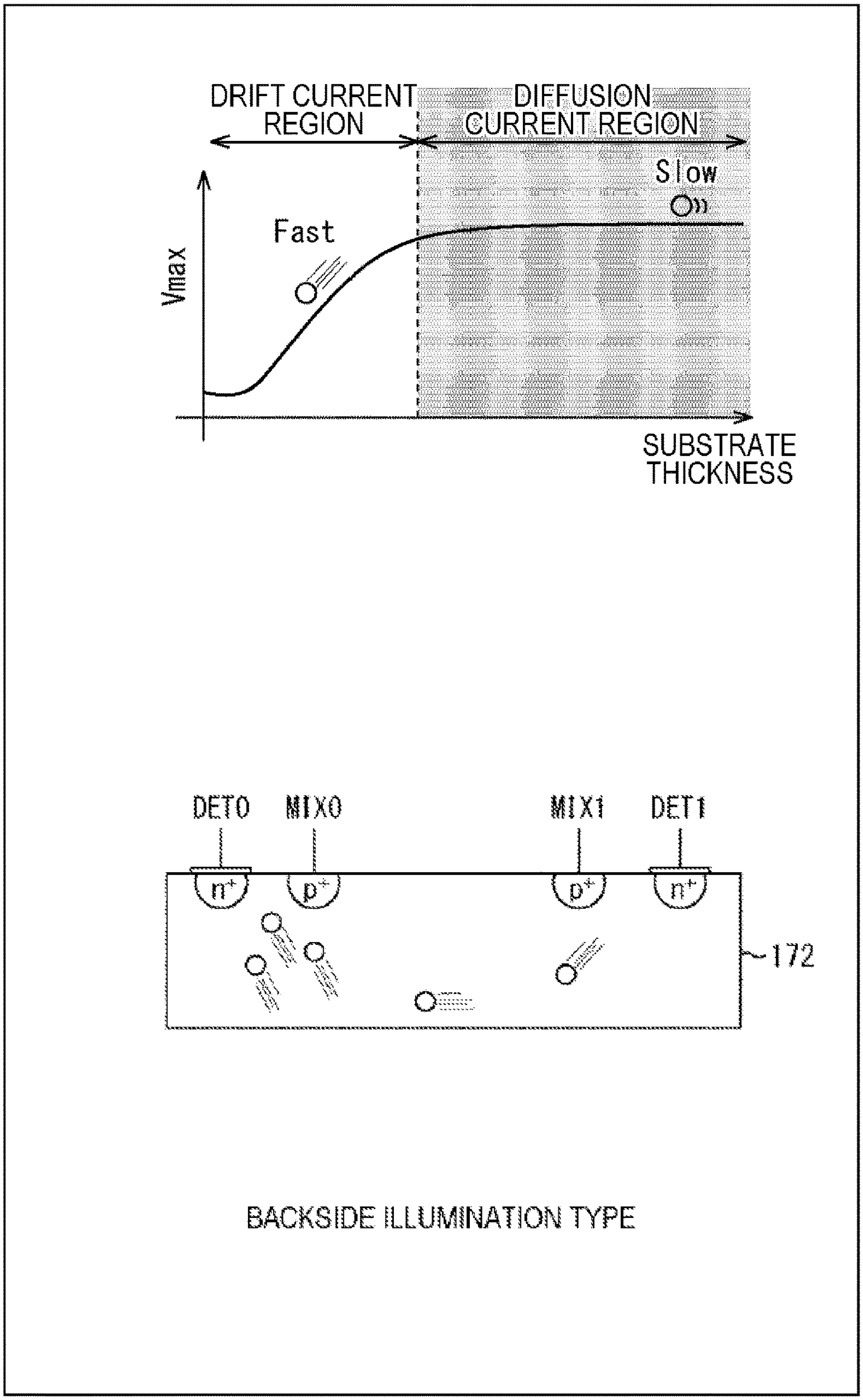
FIG. 8 is a diagram for explaining a moving speed of a signal carrier in a backside illumination type.

FIG. 8 illustrates a relationship between a position in the substrate 172 in a thickness direction and the moving speed of the signal carrier.

As described above, when the thickness of the substrate 172 in a direction perpendicular to the substrate 172 is thinned, an electric field in the direction perpendicular to the substrate 172 is substantially strengthened, and electrons (charges) only in a drift current region where the moving speed of the signal carrier is higher are exclusively used, while electrons in the diffusion current region where the moving speed of the signal carrier is lower are not used. By exclusively using electrons (charges) only in the drift current region, a time required from when photoelectric conversion is performed until the signal carrier is detected in the N+ semiconductor region of the active tap is shortened. Furthermore, when the thickness of the substrate 172 is thinned, the moving distance of the signal carrier to the N+ semiconductor region in the active tap is also shortened.

For these reasons, the backside illuminated CAPD sensor can sufficiently draw the signal carriers (electrons) generated in each region in the substrate 172 into the N+ semiconductor region of the active tap even when the drive frequency is higher, and the electron retrieving efficiency can be improved.

In addition, by thinning the substrate 172, sufficient electron retrieving efficiency can be ensured even at a higher drive frequency, and the high-speed driving tolerance can be improved.

In particular, in the backside illuminated CAPD sensor, a voltage can be applied directly to the substrate 172, that is, the substrate 61, such that the response speed of switching between active and inactive taps is made higher, and driving at a higher drive frequency can be performed. Additionally, since a voltage can be directly applied to the substrate 61, a region in the substrate 61 that can be modulated is widened.

Moreover, in the backside illuminated light receiving element 1 (CAPD sensor), since a sufficient aperture ratio can be obtained, the pixel can be miniaturized correspondingly, and the miniaturization tolerance of the pixel can be improved.

Besides, by configuring the light receiving element 1 as a backside illumination type, the back-end-of-line (BEOL) capacity design can be freed, whereby the degree of freedom in designing the saturation signal amount (Qs) can be improved.

First Modification of First Embodiment

Configuration Example of Pixel

Note that, in the above, the portion of the signal retrieving unit 65 in the substrate 61 has been described taking as an example a case where the N+ semiconductor region 71 and the P+ semiconductor region 73 are regions having rectangular shapes as illustrated in FIG. 3. However, the shapes of the N+ semiconductor region 71 and the P+ semiconductor region 73 when viewed from a direction perpendicular to the substrate 61 may be any shape.

Figure 9:
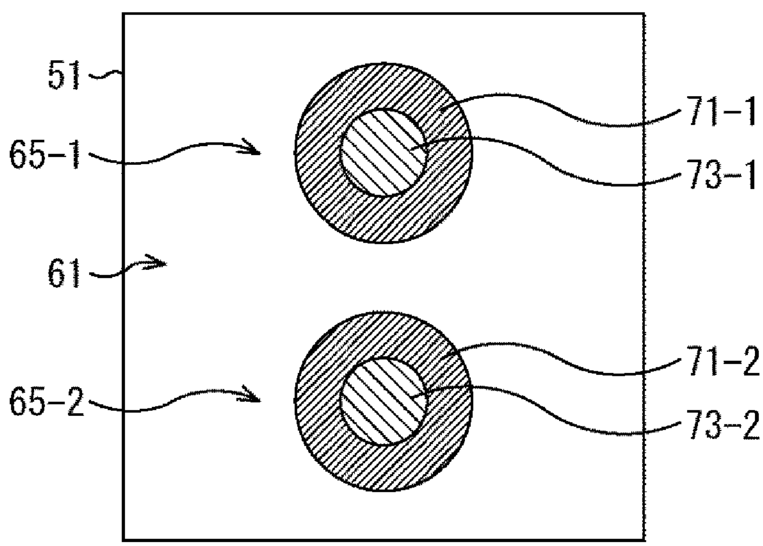
FIG. 9 is a diagram illustrating another configuration example of the signal retrieving unit portion of the pixel.

Specifically, for example, as illustrated in FIG. 9, the N+ semiconductor region 71 and the P+ semiconductor region 73 may have circular shapes. Note that, in FIG. 9, constituent members corresponding to those in the case of FIG. 3 are denoted with the same reference numerals and the description thereof will be omitted as appropriate.

FIG. 9 illustrates the N+ semiconductor region 71 and the P+ semiconductor region 73 when the portion of the signal retrieving unit 65 in the pixel 51 is viewed from a direction perpendicular to the substrate 61.

In this example, the oxide film 64 (not illustrated) is formed in the center portion of the pixel 51, and the signal retrieving unit 65 is formed in a portion slightly on an end side from the center of the pixel 51. In particular, two signal retrieving units 65 are formed in the pixel 51 here.

Then, in each signal retrieving unit 65, the P+ semiconductor region 73 having a circular shape is formed at the center position of the signal retrieving unit 65, and the circumference of the P+ semiconductor region 73 is surrounded by the N+ semiconductor region 71 having a circular shape, in more detail, an annular shape, with the surrounded P+ semiconductor region 73 as the center.

Figure 10:
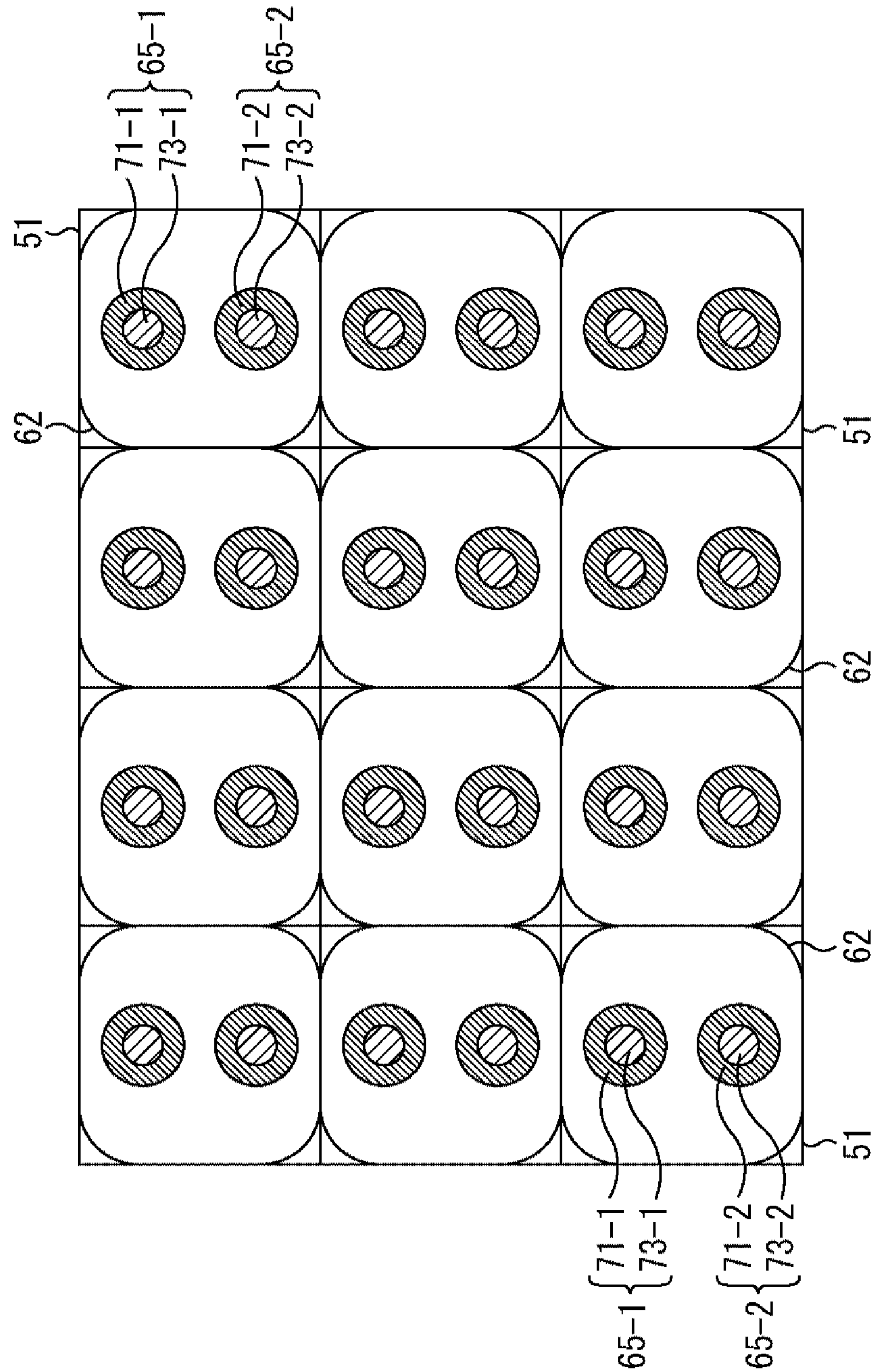
FIG. 10 is a diagram for explaining a relationship between pixels and on-chip lenses.

FIG. 10 is a plan view in which the on-chip lens 62 is superimposed on a part of the pixel array unit 20 in which the pixels 51 each including the signal retrieving units 65 illustrated in FIG. 9 are two-dimensionally arranged in a matrix.

As illustrated in FIG. 10, the on-chip lens 62 is formed in units of pixels. In different terms, a unit region where one on-chip lens 62 is formed corresponds to one pixel.

Note that, in FIG. 2, the isolation portion 75 formed by an oxide film or the like is arranged between the N+ semiconductor region 71 and the P+ semiconductor region 73; however, the isolation portion 75 may or may not be prepared.

Second Modification of First Embodiment

Configuration Example of Pixel

Figure 11:
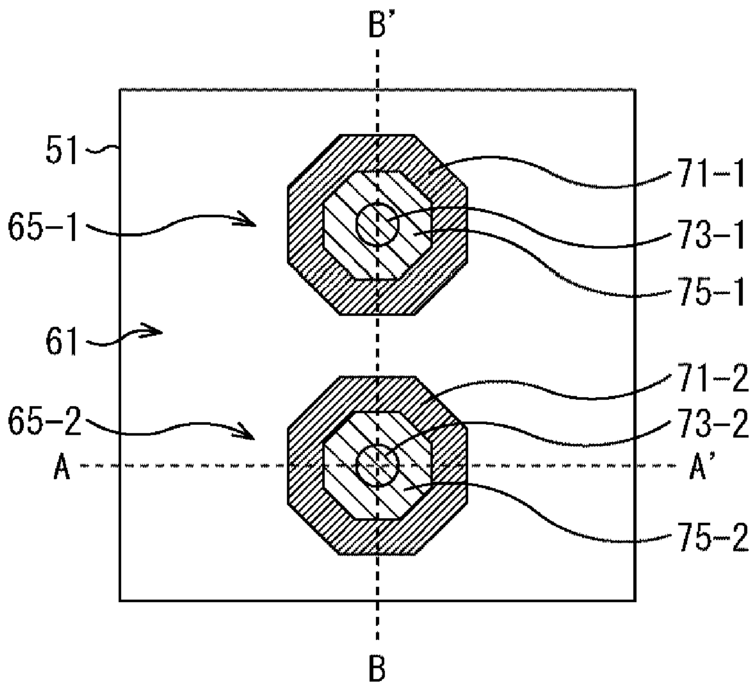
FIG. 11 is a diagram illustrating another configuration example of the signal retrieving unit portion of the pixel.

FIG. 11 is a plan view illustrating a modification of the planar shape of the signal retrieving unit 65 in the pixel 51.

In addition to the rectangular shape illustrated in FIG. 3 and the circular shape illustrated in FIG. 9, the planar shape of the signal retrieving unit 65 may be formed in an octagonal shape as illustrated in FIG. 11, for example.

Furthermore, FIG. 11 illustrates a plan view in a case where the isolation portion 75 formed by an oxide film or the like is formed between the N+ semiconductor region 71 and the P+ semiconductor region 73.

An A-A' line illustrated in FIG. 11 indicates a cross-sectional line of FIG. 37 described later, and a B-B' line indicates a cross-sectional line of FIG. 36 described later.

Second Embodiment

Configuration Example of Pixel

Moreover, in the above, the configuration in which the circumference of the P+ semiconductor region 73 is surrounded by the N+ semiconductor region 71 in the signal retrieving unit 65 has been described as an example; however, the circumference of the N+ semiconductor region may be surrounded by the P+ semiconductor region.

Figure 12:
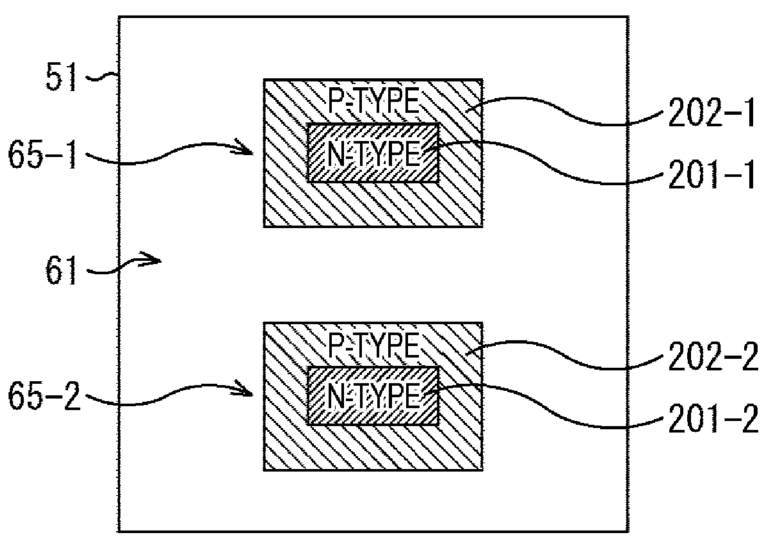
FIG. 12 is a diagram illustrating another configuration example of the signal retrieving unit portion of the pixel.

In such a case, a pixel 51 is configured as illustrated in FIG. 12, for example. Note that, in FIG. 12, constituent members corresponding to those in the case of FIG. 3 are denoted with the same reference numerals and the description thereof will be omitted as appropriate.

FIG. 12 illustrates the arrangement of the N+ semiconductor regions and the P+ semiconductor regions when the portion of a signal retrieving unit 65 in the pixel 51 is viewed from a direction perpendicular to a substrate 61.

In this example, an oxide film 64 (not illustrated) is formed in the center portion of the pixel 51, and the signal retrieving unit 65-1 is formed in a portion slightly on an upper side in the drawing from the center of the pixel 51, while the signal retrieving unit 65-2 is formed in a portion slightly on a lower side in the drawing from the center of the pixel 51. Particularly in this example, the formation positions of the signal retrieving units 65 in the pixel 51 are positioned the same as those in the case of FIG. 3.

In the signal retrieving unit 65-1, an N+ semiconductor region 201-1 having a rectangular shape, which corresponds to the N+ semiconductor region 71-1 illustrated in FIG. 3, is formed at the center of the signal retrieving unit 65-1. Then, the circumference of this N+ semiconductor region 201-1 is surrounded by a P+ semiconductor region 202-1 having a rectangular shape, in more detail, a rectangular frame shape, which corresponds to the P+ semiconductor region 73-1 illustrated in FIG. 3. That is, the P+ semiconductor region 202-1 is formed so as to surround the circumference of the N+ semiconductor region 201-1.

Similarly, in the signal retrieving unit 65-2, an N+ semiconductor region 201-2 having a rectangular shape, which corresponds to the N+ semiconductor region 71-2 illustrated in FIG. 3, is formed at the center of the signal retrieving unit 65-2. Then, the circumference of this N+ semiconductor region 201-2 is surrounded by a P+ semiconductor region 202-2 having a rectangular shape, in more detail, a rectangular frame shape, which corresponds to the P+ semiconductor region 73-2 illustrated in FIG. 3.

Note that, hereinafter, the N+ semiconductor regions 201-1 and 201-2 are also simply referred to as N+ semiconductor regions 201 in a case where it is not particularly necessary to distinguish between the N+ semiconductor regions 201-1 and 201-2. Furthermore, hereinafter, the P+ semiconductor regions 202-1 and 202-2 are also simply referred to as P+ semiconductor regions 202 in a case where it is not particularly necessary to distinguish between the P+ semiconductor regions 202-1 and 202-2.

Also in a case where the signal retrieving unit 65 has the configuration illustrated in FIG. 12, similarly to the case of the configuration illustrated in FIG. 3, the N+ semiconductor region 201 functions as a charge detection unit for detecting the amount of signal carriers, and the P+ semiconductor region 202 functions as a voltage application unit for directly applying a voltage to the substrate 61 to generate an electric field.

First Modification of Second Embodiment

Configuration Example of Pixel

Furthermore, similarly to the example illustrated in FIG. 9, also in a case where an arrangement in which the circumference of the N+ semiconductor region 201 is surrounded by the P+ semiconductor region 202 is employed, the shapes of these N+ semiconductor region 201 and P+ semiconductor region 202 may be any shape.

Figure 13:
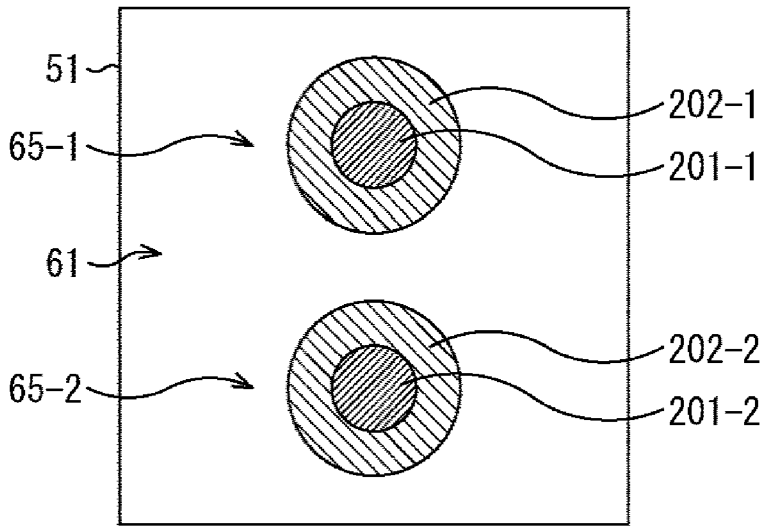
FIG. 13 is a diagram illustrating another configuration example of the signal retrieving unit portion of the pixel.

That is, for example, as illustrated in FIG. 13, the N+ semiconductor region 201 and the P+ semiconductor region 202 may have circular shapes. Note that, in FIG. 13, constituent members corresponding to those in the case of FIG. 12 are denoted with the same reference numerals and the description thereof will be omitted as appropriate.

FIG. 13 illustrates the N+ semiconductor region 201 and the P+ semiconductor region 202 when the portion of the signal retrieving unit 65 in the pixel 51 is viewed from a direction perpendicular to the substrate 61.

In this example, the oxide film 64 (not illustrated) is formed in the center portion of the pixel 51, and the signal retrieving unit 65 is formed in a portion slightly on an end side from the center of the pixel 51. In particular, two signal retrieving units 65 are formed in the pixel 51 here.

Then, in each signal retrieving unit 65, the N+ semiconductor region 201 having a circular shape is formed at the center position of the signal retrieving unit 65, and the circumference of the N+ semiconductor region 201 is surrounded by the P+ semiconductor region 202 having a circular shape, in more detail, an annular shape, with the surrounded N+ semiconductor region 201 as the center.

Third Embodiment

Configuration Example of Pixel

Moreover, the N+ semiconductor region and the P+ semiconductor region formed in the signal retrieving unit 65 may be formed in a line shape (oblong rectangular shape).

Figure 14:
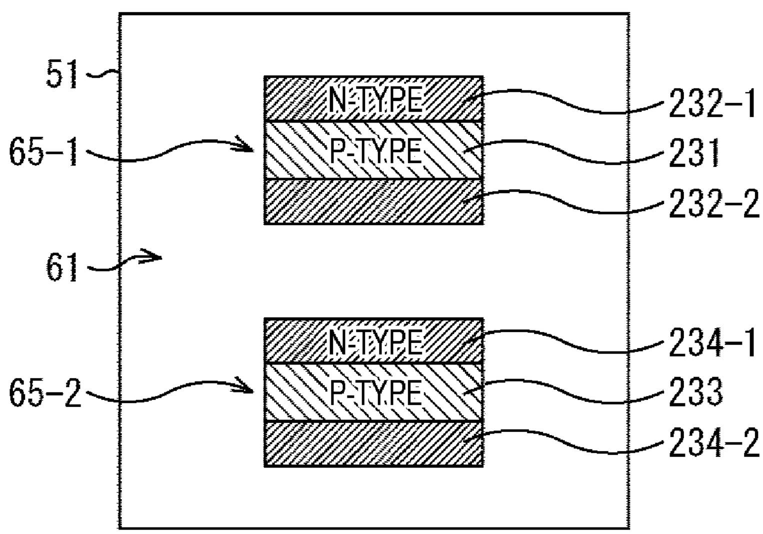
FIG. 14 is a diagram illustrating another configuration example of the signal retrieving unit portion of the pixel.

In such a case, a pixel 51 is configured as illustrated in FIG. 14, for example. Note that, in FIG. 14, constituent members corresponding to those in the case of FIG. 3 are denoted with the same reference numerals and the description thereof will be omitted as appropriate.

FIG. 14 illustrates the arrangement of the N+ semiconductor regions and the P+ semiconductor regions when the portion of a signal retrieving unit 65 in the pixel 51 is viewed from a direction perpendicular to a substrate 61.

In this example, an oxide film 64 (not illustrated) is formed in the center portion of the pixel 51, and the signal retrieving unit 65-1 is formed in a portion slightly on an upper side in the drawing from the center of the pixel 51, while the signal retrieving unit 65-2 is formed in a portion slightly on a lower side in the drawing from the center of the pixel 51. Particularly in this example, the formation positions of the signal retrieving units 65 in the pixel 51 are positioned the same as those in the case of FIG. 3.

In the signal retrieving unit 65-1, a P+ semiconductor region 231 having a line shape, which corresponds to the P+ semiconductor region 73-1 illustrated in FIG. 3, is formed at the center of the signal retrieving unit 65-1. Then, around this P+ semiconductor region 231, an N+ semiconductor region 232-1 and an N+ semiconductor region 232-2 each having a line shape, which correspond to the N+ semiconductor region 71-1 illustrated in FIG. 3, are formed so as to sandwich the P+ semiconductor region 231. That is, the P+ semiconductor region 231 is formed at a position flanked by the N+ semiconductor regions 232-1 and 232-2.

Note that, hereinafter, the N+ semiconductor regions 232-1 and 232-2 are also simply referred to as N+ semiconductor regions 232 in a case where it is not particularly necessary to distinguish between the N+ semiconductor regions 232-1 and 232-2.

In the example illustrated in FIG. 3, a structure in which the P+ semiconductor region 73 is surrounded by the N+ semiconductor region 71 is employed; however, in the example illustrated in FIG. 14, a structure in which the P+ semiconductor region 231 is flanked by the two N+ semiconductor regions 232 provided adjacent to the P+ semiconductor region 231 is employed.

Similarly, in the signal retrieving unit 65-2, a P+ semiconductor region 233 having a line shape, which corresponds to the P+ semiconductor region 73-2 illustrated in FIG. 3, is formed at the center of the signal retrieving unit 65-2. Then, around this P+ semiconductor region 233, an N+ semiconductor region 234-1 and an N+ semiconductor region 234-2 each having a line shape, which correspond to the N+ semiconductor region 71-2 illustrated in FIG. 3, are formed so as to sandwich the P+ semiconductor region 233.

Note that, hereinafter, the N+ semiconductor regions 234-1 and 234-2 are also simply referred to as N+ semiconductor regions 234 in a case where it is not particularly necessary to distinguish between the N+ semiconductor regions 234-1 and 234-2.

In the signal retrieving unit 65 in FIG. 14, the P+ semiconductor regions 231 and 233 function as voltage application units corresponding to the P+ semiconductor region 73 illustrated in FIG. 3, and the N+ semiconductor regions 232 and 234 function as charge detection units corresponding to the N+ semiconductor region 71 illustrated in FIG. 3. In this case, for example, both regions of the N+ semiconductor regions 232-1 and 232-2 are connected to the FD portion A.

Furthermore, the lengths in the lateral direction in the drawing of the respective regions, namely, the P+ semiconductor region 231, the N+ semiconductor regions 232, the P+ semiconductor region 233, and the N+ semiconductor regions 234 each having a line shape may be any length, and these respective regions do not have to have the same length.

Fourth Embodiment

Configuration Example of Pixel

Moreover, in the example illustrated in FIG. 14, a structure in which the P+ semiconductor region 231 and the P+ semiconductor region 233 are sandwiched between the N+ semiconductor regions 232 and the N+ semiconductor regions 234 has been described as an example; however, conversely, a shape in which the N+ semiconductor region is sandwiched between the P+ semiconductor regions may be employed.

Figure 15:
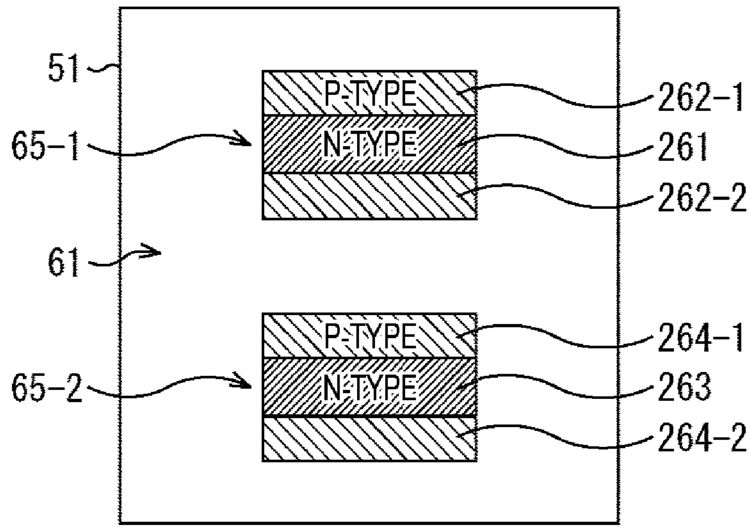
FIG. 15 is a diagram illustrating another configuration example of the signal retrieving unit portion of the pixel.

In such a case, a pixel 51 is configured as illustrated in FIG. 15, for example. Note that, in FIG. 15, constituent members corresponding to those in the case of FIG. 3 are denoted with the same reference numerals and the description thereof will be omitted as appropriate.

FIG. 15 illustrates the arrangement of the N+ semiconductor regions and the P+ semiconductor regions when the portion of a signal retrieving unit 65 in the pixel 51 is viewed from a direction perpendicular to a substrate 61.

In this example, an oxide film 64 (not illustrated) is formed in the center portion of the pixel 51, and the signal retrieving unit 65 is formed in a portion slightly on an end side from the center of the pixel 51. Particularly in this example, the formation positions of two respective signal retrieving units 65 in the pixel 51 are positioned the same as those in the case of FIG. 3.

In the signal retrieving unit 65-1, an N+ semiconductor region 261 having a line shape, which corresponds to the N+ semiconductor region 71-1 illustrated in FIG. 3, is formed at the center of the signal retrieving unit 65-1. Then, around this N+ semiconductor region 261, a P+ semiconductor region 262-1 and a P+ semiconductor region 262-2 each having a line shape, which correspond to the P+ semiconductor region 73-1 illustrated in FIG. 3, are formed so as to sandwich the N+ semiconductor region 261. That is, the N+ semiconductor region 261 is formed at a position flanked by the P+ semiconductor regions 262-1 and 262-2.

Note that, hereinafter, the P+ semiconductor regions 262-1 and 262-2 are also simply referred to as P+ semiconductor regions 262 in a case where it is not particularly necessary to distinguish between the P+ semiconductor regions 262-1 and 262-2.

Similarly, in the signal retrieving unit 65-2, an N+ semiconductor region 263 having a line shape, which corresponds to the N+ semiconductor region 71-2 illustrated in FIG. 3, is formed at the center of the signal retrieving unit 65-2. Then, around this N+ semiconductor region 263, a P+ semiconductor region 264-1 and a P+ semiconductor region 264-2 each having a line shape, which correspond to the P+ semiconductor region 73-2 illustrated in FIG. 3, are formed so as to sandwich the N+ semiconductor region 263.

Note that, hereinafter, the P+ semiconductor regions 264-1 and 264-2 are also simply referred to as P+ semiconductor regions 264 in a case where it is not particularly necessary to distinguish between the P+ semiconductor regions 264-1 and 264-2.

In the signal retrieving unit 65 in FIG. 15, the P+ semiconductor regions 262 and 264 function as voltage application units corresponding to the P+ semiconductor region 73 illustrated in FIG. 3, and the N+ semiconductor regions 261 and 263 function as charge detection units corresponding to the N+ semiconductor region 71 illustrated in FIG. 3. Note that, the lengths in the lateral direction in the drawing of the respective regions, namely, the N+ semiconductor region 261, the P+ semiconductor regions 262, the N+ semiconductor region 263, and the P+ semiconductor regions 264 each having a line shape may be any length, and these respective regions do not have to have the same length.

Fifth Embodiment

Configuration Example of Pixel

Moreover, in the above, an example in which two signal retrieving units 65 are provided in every single pixel constituting the pixel array unit 20 has been described; however, the number of signal retrieving units provided in the pixel may be one, or three or more.

Figure 16:
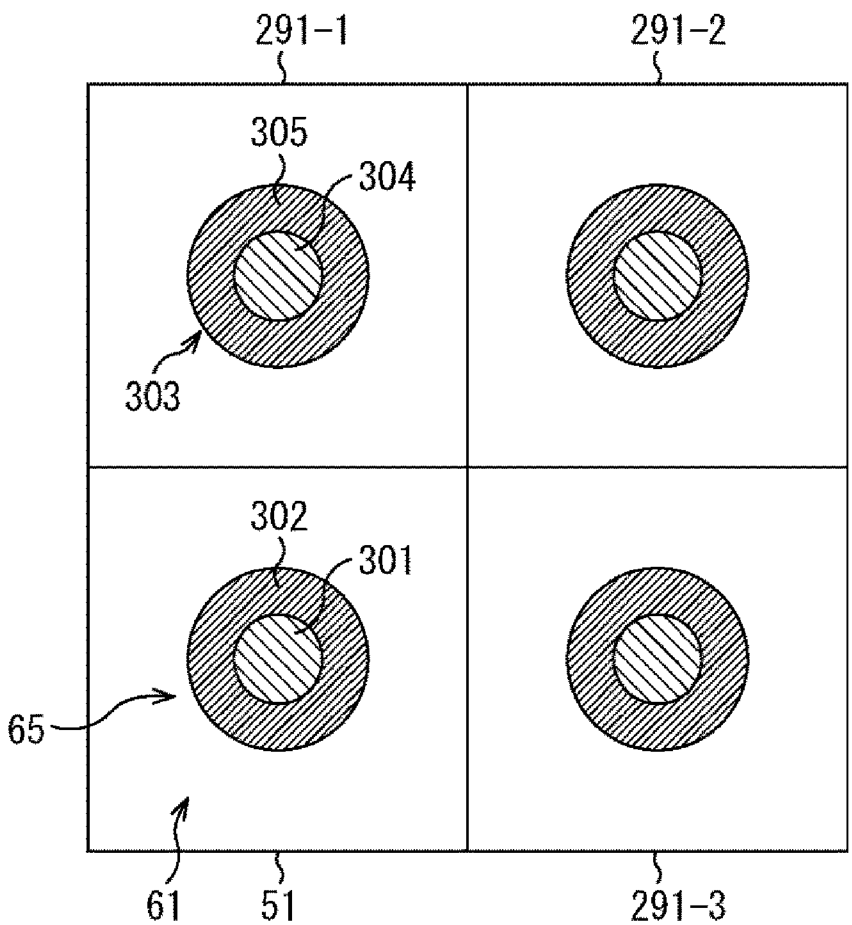
FIG. 16 is a diagram illustrating another configuration example of the pixels.

For example, in a case where one signal retrieving unit is formed in a pixel 51, the configuration of the pixel is configured as illustrated in FIG. 16, for example. Note that, in FIG. 16, constituent members corresponding to those in the case of FIG. 3 are denoted with the same reference numerals and the description thereof will be omitted as appropriate.

FIG. 16 illustrates the arrangement of the N+ semiconductor regions and the P+ semiconductor regions when signal retrieving unit portions in some pixels provided in a pixel array unit 20 are viewed from a direction perpendicular to a substrate.

In this example, the pixel 51, and a pixel 291-1 to a pixel 291-3, which are represented as pixels 51 adjacent to the above pixel 51 by distinguishing reference numerals, provided in the pixel array unit 20 are illustrated, and one signal retrieving unit is formed in each of these pixels.

That is, in the pixel 51, one signal retrieving unit 65 is formed in the center portion of the pixel 51. Then, in the signal retrieving unit 65, a P+ semiconductor region 301 having a circular shape is formed at the center position of the signal retrieving unit 65, and the circumference of the P+ semiconductor region 301 is surrounded by an N+ semiconductor region 302 having a circular shape, in more detail, an annular shape, with the surrounded P+ semiconductor region 301 as the center.

Here, the P+ semiconductor region 301 corresponds to the P+ semiconductor region 73 illustrated in FIG. 3 and functions as a voltage application unit. Furthermore, the N+ semiconductor region 302 corresponds to the N+ semiconductor region 71 illustrated in FIG. 3 and functions as a charge detection unit. Note that the P+ semiconductor region 301 and the N+ semiconductor region 302 may have any shape.

In addition, the pixels 291-1 to 291-3 located around the pixel 51 have a similar structure as the structure of the pixel 51.

That is, for example, one signal retrieving unit 303 is formed in the center portion of the pixel 291-1. Then, in the signal retrieving unit 303, a P+ semiconductor region 304 having a circular shape is formed at the center position of the signal retrieving unit 303, and the circumference of the P+ semiconductor region 304 is surrounded by an N+ semiconductor region 305 having a circular shape, in more detail, an annular shape, with the surrounded P+ semiconductor region 304 as the center.

These P+ semiconductor region 304 and N+ semiconductor region 305 correspond to the P+ semiconductor region 301 and the N+ semiconductor region 302, respectively.

Note that, hereinafter, the pixels 291-1 to 291-3 are also simply referred to as pixels 291 in a case where it is not particularly necessary to distinguish between the pixels 291-1 to 291-3.

In a case where one signal retrieving unit (tap) is formed in each pixel in this manner, when a distance to a target object is to be measured by the indirect ToF technique, several pixels adjacent to each other are used, and distance information is calculated on the basis of the pixel signals obtained for these several pixels.

For example, when attention is paid to the pixel 51, in a state in which the signal retrieving unit 65 of the pixel 51 is assigned as an active tap, each pixel is driven such that, for example, the signal retrieving units 303 of several pixels 291 adjacent to the pixel 51 including the pixel 291-1 turn into inactive taps.

As an example, the signal retrieving units of pixels adjacent to the pixel 51 laterally and longitudinally in the drawing, such as the pixels 291-1 and 291-3, are driven so as to turn into inactive taps.

Thereafter, when the applied voltage is switched such that the signal retrieving unit 65 of the pixel 51 turns into an inactive tap, this time, the signal retrieving units 303 of several pixels 291 adjacent to the pixel 51 including the pixel 291-1 are caused to turn into active taps.

Then, on the basis of a pixel signal read from the signal retrieving unit 65 with the signal retrieving unit 65 assigned as an active tap, and a pixel signal read from the signal retrieving unit 303 with the signal retrieving unit 303 assigned as an active tap, distance information is calculated.

As described above, even in a case where the number of signal retrieving units (taps) provided in the pixel is one, it is possible to perform ranging by the indirect ToF technique using pixels adjacent to each other.

Sixth Embodiment

Configuration Example of Pixel

Furthermore, as mentioned earlier, three or more signal retrieving units (taps) may be provided in each pixel.

Figure 17:
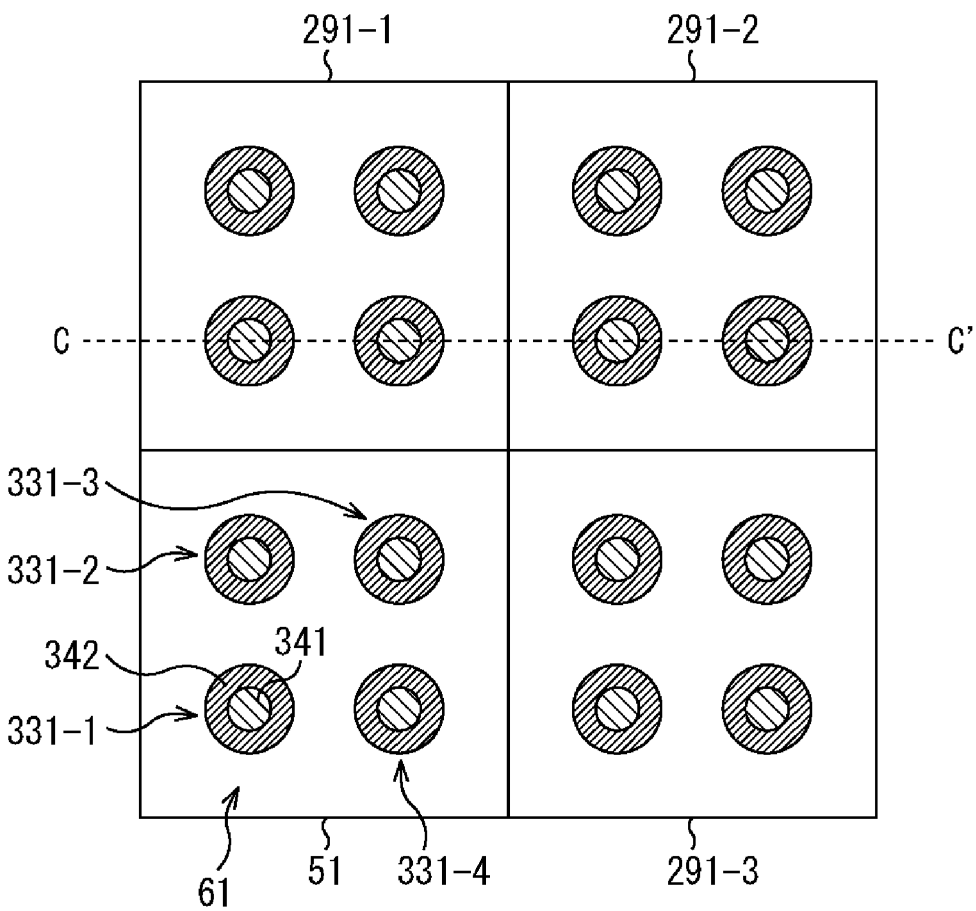
FIG. 17 is a diagram illustrating another configuration example of the pixels.

For example, in a case where four signal retrieving units (taps) are provided in a pixel, each pixel of a pixel array unit 20 is configured as illustrated in FIG. 17. Note that, in FIG. 17, constituent members corresponding to those in the case of FIG. 16 are denoted with the same reference numerals and the description thereof will be omitted as appropriate.

FIG. 17 illustrates the arrangement of the N+ semiconductor regions and the P+ semiconductor regions when signal retrieving unit portions in some pixels provided in the pixel array unit 20 are viewed from a direction perpendicular to a substrate.

A cross-sectional view taken along a C-C' line illustrated in FIG. 17 is as in FIG. 36 described later.

In this example, the pixel 51 and pixels 291 provided in the pixel array unit 20 are illustrated, and four signal retrieving units are formed in each of these pixels.

That is, in the pixel 51, a signal retrieving unit 331-1, a signal retrieving unit 331-2, a signal retrieving unit 331-3, and a signal retrieving unit 331-4 are formed at positions between the center of the pixel 51 and end portions of the pixel 51, that is, a position on a lower left side, a position on an upper left side, a position on an upper right side, and a position on a lower right side of the center of the pixel 51 in the drawing.

These signal retrieving units 331-1 to 331-4 correspond to the signal retrieving unit 65 illustrated in FIG. 16.

For example, in the signal retrieving unit 331-1, a P+ semiconductor region 341 having a circular shape is formed at the center position of the signal retrieving unit 331-1, and the circumference of the P+ semiconductor region 341 is surrounded by an N+ semiconductor region 342 having a circular shape, in more detail, an annular shape, with the surrounded P+ semiconductor region 341 as the center.

Here, the P+ semiconductor region 341 corresponds to the P+ semiconductor region 301 illustrated in FIG. 16 and functions as a voltage application unit. Furthermore, the N+ semiconductor region 342 corresponds to the N+ semiconductor region 302 illustrated in FIG. 16 and functions as a charge detection unit. Note that the P+ semiconductor region 341 and the N+ semiconductor region 342 may have any shape.

In addition, the signal retrieving units 331-2 to 331-4 also have a configuration similar to the configuration of the signal retrieving unit 331-1, and each includes a P+ semiconductor region functioning as a voltage application unit, and an N+ semiconductor region functioning as a charge detection unit. Moreover, the pixels 291 formed around the pixel 51 have a similar structure as the structure of the pixel 51.

Note that, hereinafter, the signal retrieving units 331-1 to 331-4 are also simply referred to as signal retrieving units 331 in a case where it is not particularly necessary to distinguish between the signal retrieving units 331-1 to 331-4.

In a case where four signal retrieving units are provided in each pixel as described above, distance information is calculated using the four signal retrieving units in the pixel, for example, at the time of ranging by the indirect ToF technique.

When attention is paid to the pixel 51 as an example, for example, in a state in which the signal retrieving units 331-1 and 331-3 are assigned as active taps, the pixel 51 is driven such that the signal retrieving units 331-2 and 331-4 turn into inactive taps.

Thereafter, the voltage applied to each signal retrieving unit 331 is switched. That is, the pixel 51 is driven such that the signal retrieving units 331-1 and 331-3 turn into inactive taps, and the signal retrieving units 331-2 and 331-4 turn into active taps.

Then, distance information is calculated on the basis of pixel signals read from the signal retrieving units 331-1 and 331-3 with these signal retrieving units 331-1 and 331-3 assigned as active taps, and pixel signals read from the signal retrieving units 331-2 and 331-4 with these signal retrieving units 331-2 and 331-4 assigned as active taps.

Seventh Embodiment

Configuration Example of Pixel

Moreover, the signal retrieving unit (tap) may be shared between pixels of the pixel array unit 20 adjacent to each other.

Figure 18:
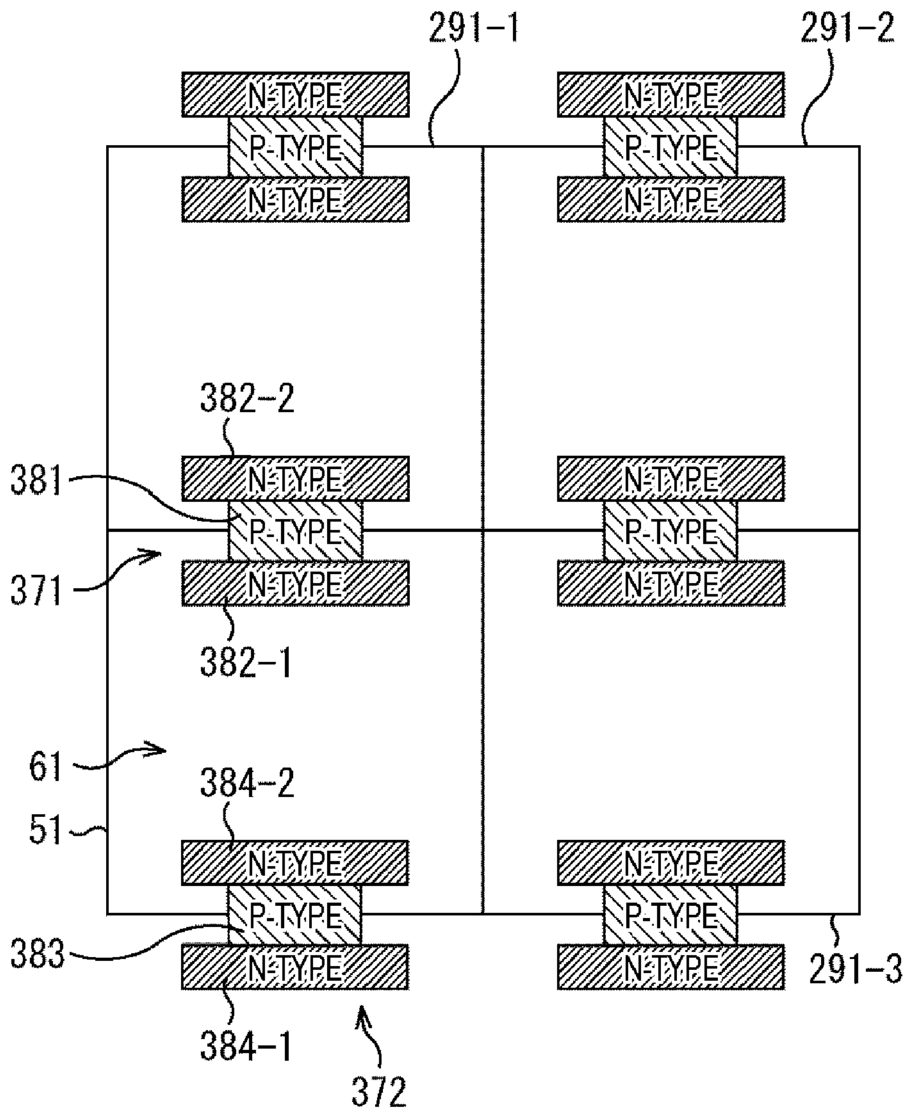
FIG. 18 is a diagram illustrating another configuration example of the pixels.

In such a case, each pixel of a pixel array unit 20 is configured as illustrated in FIG. 18, for example. Note that, in FIG. 18, constituent members corresponding to those in the case of FIG. 16 are denoted with the same reference numerals and the description thereof will be omitted as appropriate.

FIG. 18 illustrates the arrangement of the N+ semiconductor regions and the P+ semiconductor regions when signal retrieving unit portions in some pixels provided in the pixel array unit 20 are viewed from a direction perpendicular to a substrate.

In this example, a pixel 51 and pixels 291 provided in the pixel array unit 20 are illustrated, and two signal retrieving units are formed in each of these pixels.

For example, in the pixel 51, a signal retrieving unit 371 is formed at an end portion on an upper side of the pixel 51 in the drawing, and a signal retrieving unit 372 is formed at an end portion on a lower side of the pixel 51 in the drawing.

The signal retrieving unit 371 is shared by the pixel 51 and the pixel 291-1. In other words, the signal retrieving unit 371 is used as a tap for the pixel 51 and is also used as a tap for the pixel 291-1. Furthermore, the signal retrieving unit 372 is shared by the pixel 51 and a pixel (not illustrated) being adjacent on a lower side of this pixel 51 in the drawing.

In the signal retrieving unit 371, a P+ semiconductor region 381 having a line shape, which corresponds to the P+ semiconductor region 231 illustrated in FIG. 14, is formed at the position of the center of the signal retrieving unit 371. Then, at positions above and below this P+ semiconductor region 381 in the drawing, an N+ semiconductor region 382-1 and an N+ semiconductor region 382-2 each having a line shape, which correspond to the N+ semiconductor region 232 illustrated in FIG. 14, are formed so as to sandwich the P+ semiconductor region 381.

In particular, in this example, the P+ semiconductor region 381 is formed at a boundary portion between the pixel 51 and the pixel 291-1. Furthermore, the N+ semiconductor region 382-1 is formed in a region in the pixel 51, whereas the N+ semiconductor region 382-2 is formed in a region in the pixel 291-1.

Here, the P+ semiconductor region 381 functions as a voltage application unit, and the N+ semiconductor regions 382-1 and 382-2 function as charge detection units. Note that, hereinafter, the N+ semiconductor regions 382-1 and 382-2 are also simply referred to as N+ semiconductor regions 382 in a case where it is not particularly necessary to distinguish between the N+ semiconductor regions 382-1 and 382-2.

In addition, the P+ semiconductor region 381 and the N+ semiconductor region 382 may have any shape. Moreover, the N+ semiconductor regions 382-1 and 382-2 may be connected to the same FD portion, or may be connected to mutually different FD portions.

In the signal retrieving unit 372, a P+ semiconductor region 383, an N+ semiconductor region 384-1, and an N+ semiconductor region 384-2 each having a line shape are formed.

These P+ semiconductor region 383, and N+ semiconductor regions 384-1 and 384-2 correspond to the P+ semiconductor region 381, and the N+ semiconductor regions 382-1 and 382-2, respectively, and have arrangements, shapes, and functions similar to those of the corresponding regions. Note that, hereinafter, the N+ semiconductor regions 384-1 and 384-2 are also simply referred to as N+ semiconductor regions 384 in a case where it is not particularly necessary to distinguish between the N+ semiconductor regions 384-1 and 384-2.

As described above, even in a case where the signal retrieving unit (tap) is shared between adjacent pixels, ranging by the indirect ToF technique can be performed by similar working as the example illustrated in FIG. 3.

As illustrated in FIG. 18, in a case where the signal retrieving unit is shared between pixels, a distance between the P+ semiconductor regions forming a pair for generating an electric field, that is, a current, such as a distance between the P+ semiconductor regions 381 and 383, is made longer. In different terms, a distance between the P+ semiconductor regions can be maximized in length by sharing the signal retrieving unit between pixels.

This makes it difficult for current to flow between the P+ semiconductor regions, such that the power consumption of the pixel can be reduced, and furthermore it is advantageous for miniaturization of the pixel.

Note that, although an example in which one signal retrieving unit is shared by two pixels adjacent to each other has been described here, one signal retrieving unit may be shared by three or more pixels adjacent to each other. Furthermore, in a case where the signal retrieving unit is shared by two or more pixels adjacent to each other, only the charge detection unit for detecting the signal carrier may be shared, or only the voltage application unit for generating an electric field may be shared out of the signal retrieving unit.

Eighth Embodiment

Configuration Example of Pixel

Moreover, the on-chip lens and the inter-pixel light-shielding portion provided in each pixel such as the pixel 51 of the pixel array unit 20 may not be particularly provided.

Figure 19:
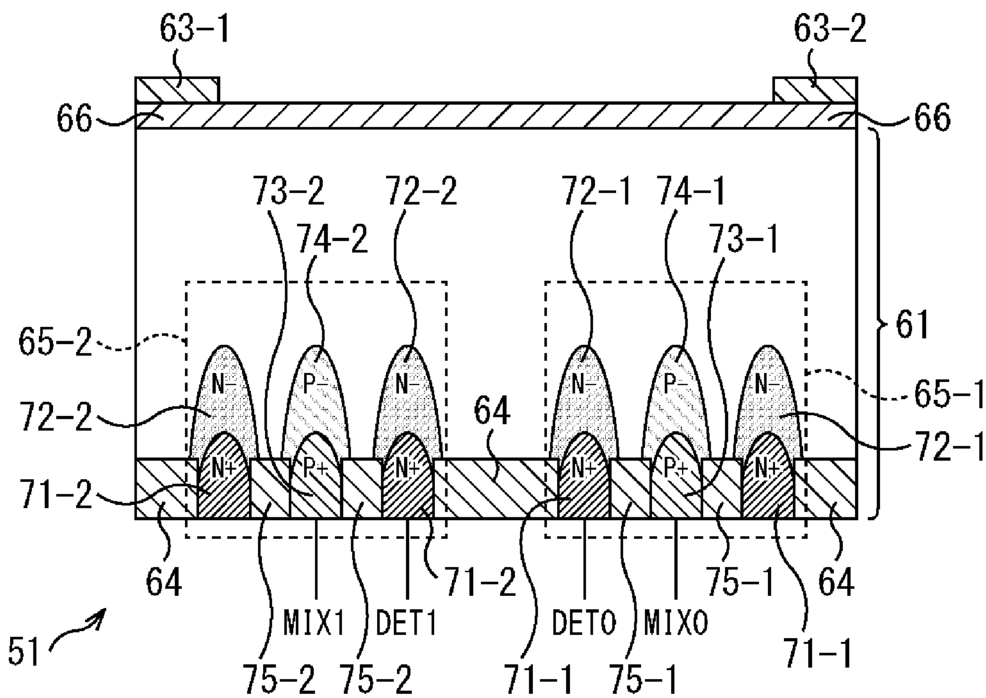
FIG. 19 is a diagram illustrating another configuration example of the pixel.

Specifically, for example, a pixel 51 can be configured as illustrated in FIG. 19. Note that, in FIG. 19, constituent members corresponding to those in the case of FIG. 2 are denoted with the same reference numerals and the description thereof will be omitted as appropriate.

The configuration of the pixel 51 illustrated in FIG. 19 differs from the configuration of the pixel 51 illustrated in FIG. 2 in that the on-chip lens 62 is not provided, but is configured the same as the configuration of the pixel 51 in FIG. 2 in other points.

In the pixel 51 illustrated in FIG. 19, since the on-chip lens 62 is not provided on the light entrance surface side of a substrate 61, the attenuation of infrared light entering the substrate 61 from the outside can be further decreased. As a consequence, the amount of infrared light that can be received by the substrate 61 is increased, and the sensitivity of the pixels 51 can be improved.

First Modification of Eighth Embodiment

Configuration Example of Pixel

Figure 20:
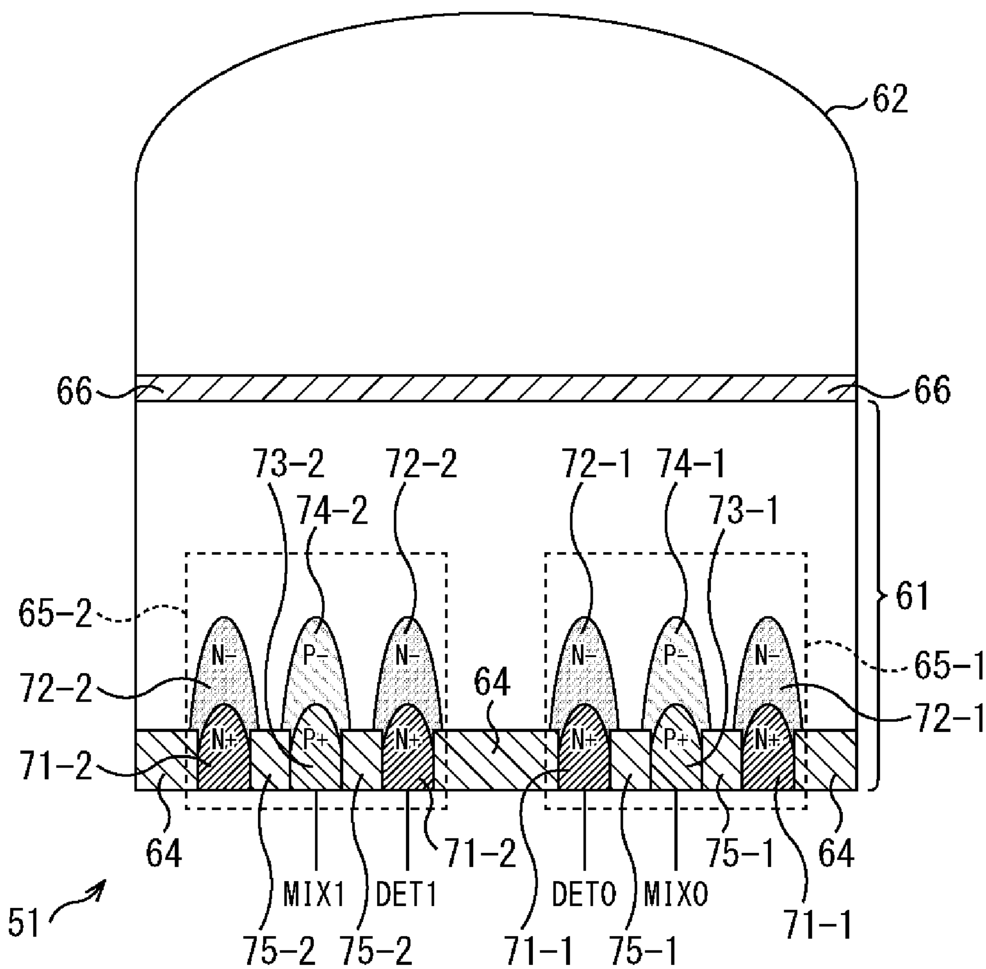
FIG. 20 is a diagram illustrating another configuration example of the pixel.

Furthermore, the configuration of the pixel 51 may be configured as illustrated in FIG. 20, for example. Note that, in FIG. 20, constituent members corresponding to those in the case of FIG. 2 are denoted with the same reference numerals and the description thereof will be omitted as appropriate.

The configuration of the pixel 51 illustrated in FIG. 20 differs from the configuration of the pixel 51 illustrated in FIG. 2 in that the inter-pixel light-shielding films 63-1 and 63-2 are not provided, but is configured the same as the configuration of the pixel 51 in FIG. 2 in other points.

In the example illustrated in FIG. 20, since the inter-pixel light-shielding films 63 are not provided on the light entrance surface side of the substrate 61, the effect of suppressing crosstalk is deteriorated; however, since infrared light that has been shielded by the inter-pixel light-shielding films 63 is also allowed to enter the substrate 61, the sensitivity of the pixel 51 can be improved.

Note that, of course, the pixel 51 may be provided with neither the on-chip lens 62 nor the inter-pixel light-shielding films 63.

Second Modification of Eighth Embodiment

Configuration Example of Pixel

Figure 21:
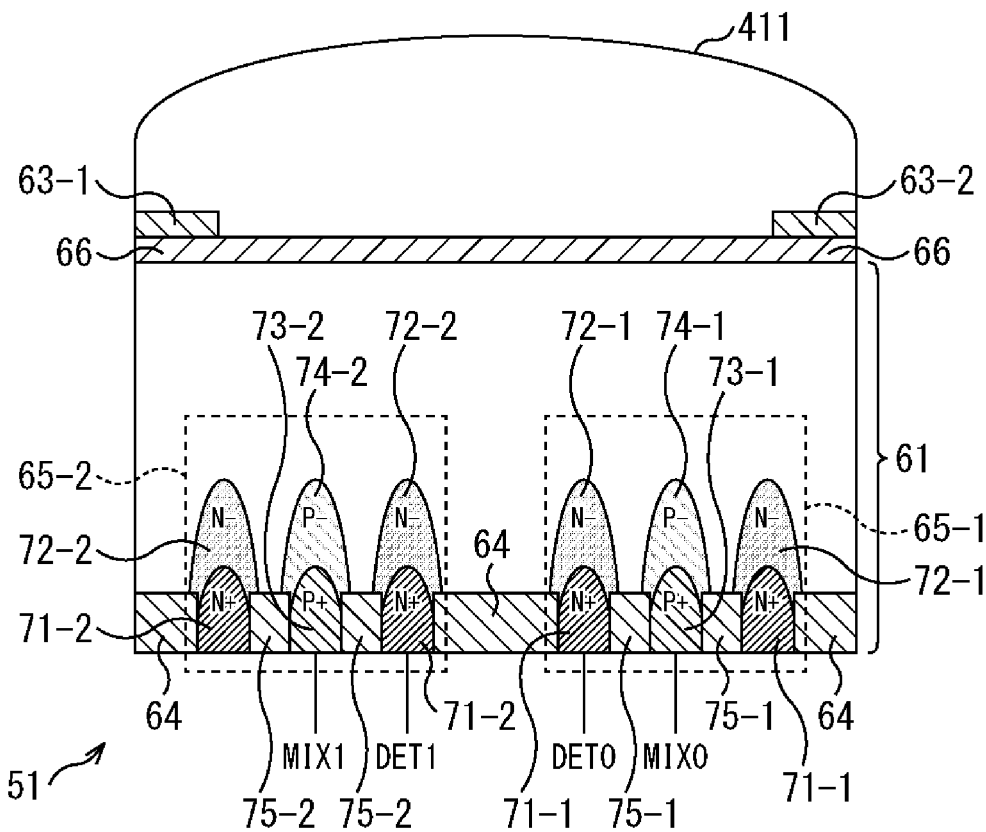
FIG. 21 is a diagram illustrating another configuration example of the pixel.

Besides, for example, as illustrated in FIG. 21, the thickness of the on-chip lens in an optical axis direction may be optimized. Note that, in FIG. 21, constituent members corresponding to those in the case of FIG. 2 are denoted with the same reference numerals and the description thereof will be omitted as appropriate.

The configuration of the pixel 51 illustrated in FIG. 21 differs from the configuration of the pixel 51 illustrated in FIG. 2 in that an on-chip lens 411 is provided instead of the on-chip lens 62, but is configured the same as the configuration of the pixel 51 in FIG. 2 in other points.

In the pixel 51 illustrated in FIG. 21, the on-chip lens 411 is formed on the light entrance surface side of the substrate 61, that is, on an upper side in the drawing. This on-chip lens 411 has a thin thickness in the optical axis direction, that is, in the longitudinal direction in the drawing, compared with the on-chip lens 62 illustrated in FIG. 2.

In general, a thicker on-chip lens provided on a front surface of the substrate 61 is more advantageous for condensing light entering the on-chip lens. However, by thinning the on-chip lens 411, the transmittance rises correspondingly and the sensitivity of the pixel 51 can be improved; accordingly, the thickness of the on-chip lens 411 can be defined appropriately according to the thickness of the substrate 61, or a position where infrared light is to be condensed, or the like.

Ninth Embodiment

Configuration Example of Pixel

Moreover, an isolation region for improving the isolation characteristics between adjacent pixels and suppressing crosstalk may be provided between the pixels formed in the pixel array unit 20.

Figure 22:
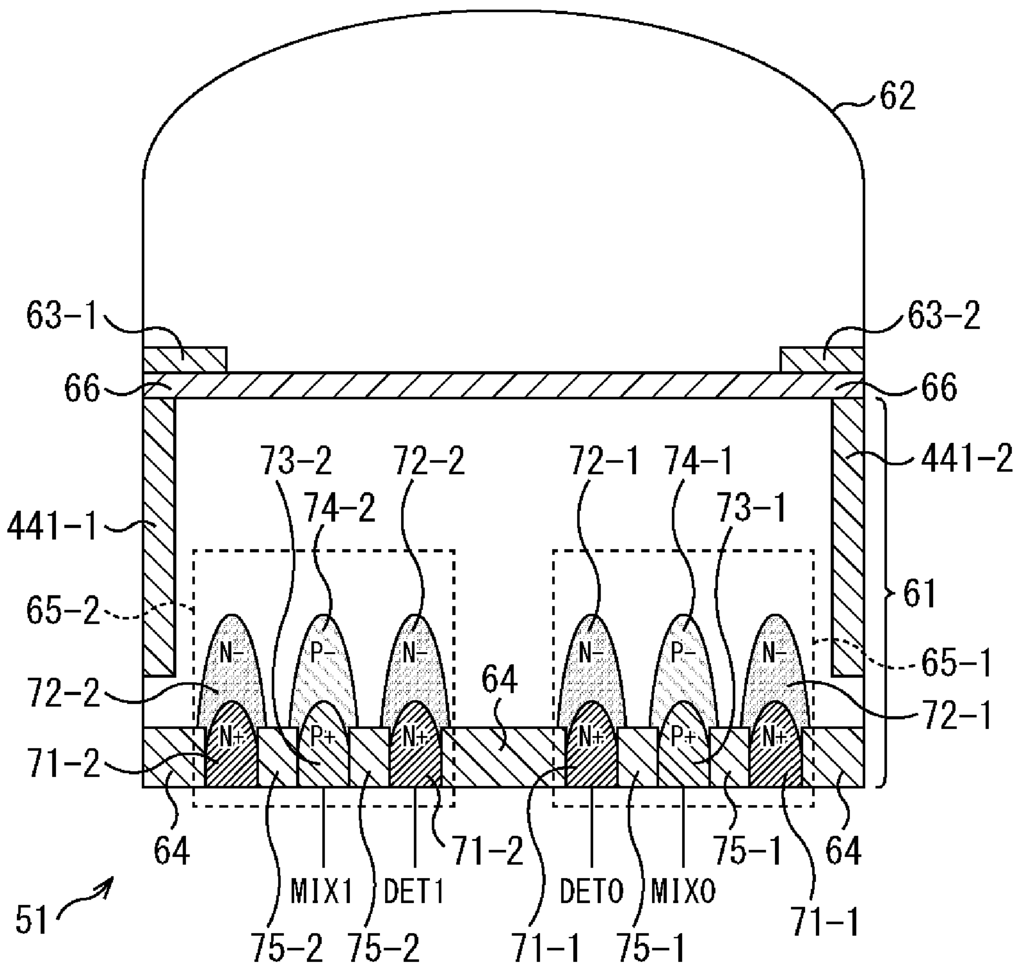
FIG. 22 is a diagram illustrating another configuration example of the pixel.

In such a case, a pixel 51 is configured as illustrated in FIG. 22, for example. Note that, in FIG. 22, constituent members corresponding to those in the case of FIG. 2 are denoted with the same reference numerals and the description thereof will be omitted as appropriate.

The configuration of the pixel 51 illustrated in FIG. 22 differs from the configuration of the pixel 51 illustrated in FIG. 2 in that an isolation region 441-1 and an isolation region 441-2 are provided in a substrate 61, but is configured the same as the configuration of the pixel 51 in FIG. 2 in other points.

In the pixel 51 illustrated in FIG. 22, the isolation regions 441-1 and 441-2 that isolate adjacent pixels from each other are formed by light-shielding films or the like at boundary portions between the pixel 51 and other pixels adjacent to this pixel 51 in the substrate 61, that is, at left and right end portions of the pixel 51 in the drawing. Note that, hereinafter, the isolation regions 441-1 and 441-2 are also simply referred to as isolation regions 441 in a case where it is not particularly necessary to distinguish between the isolation regions 441-1 and 441-2.

For example, when the isolation regions 441 are formed, long grooves (trenches) are formed in the substrate 61 with a predetermined depth in the downward direction in the drawing (a direction perpendicular to a surface of the substrate 61) from the light entrance surface side of the substrate 61, that is, a surface on an upper side in the drawing, and light-shielding films are formed in these groove portions by embedding, such that the isolation regions 441 are obtained. This isolation region 441 functions as a pixel isolation region that ensures shielding from infrared light that enters the substrate 61 through the light entrance surface and travels toward another pixel adjacent to the pixel 51.

By forming the embedded type isolation region 441 in this manner, it is possible to improve isolation characteristics for infrared light between pixels, and to suppress the occurrence of crosstalk.

First Modification of Ninth Embodiment

Configuration Example of Pixel

Figure 23:
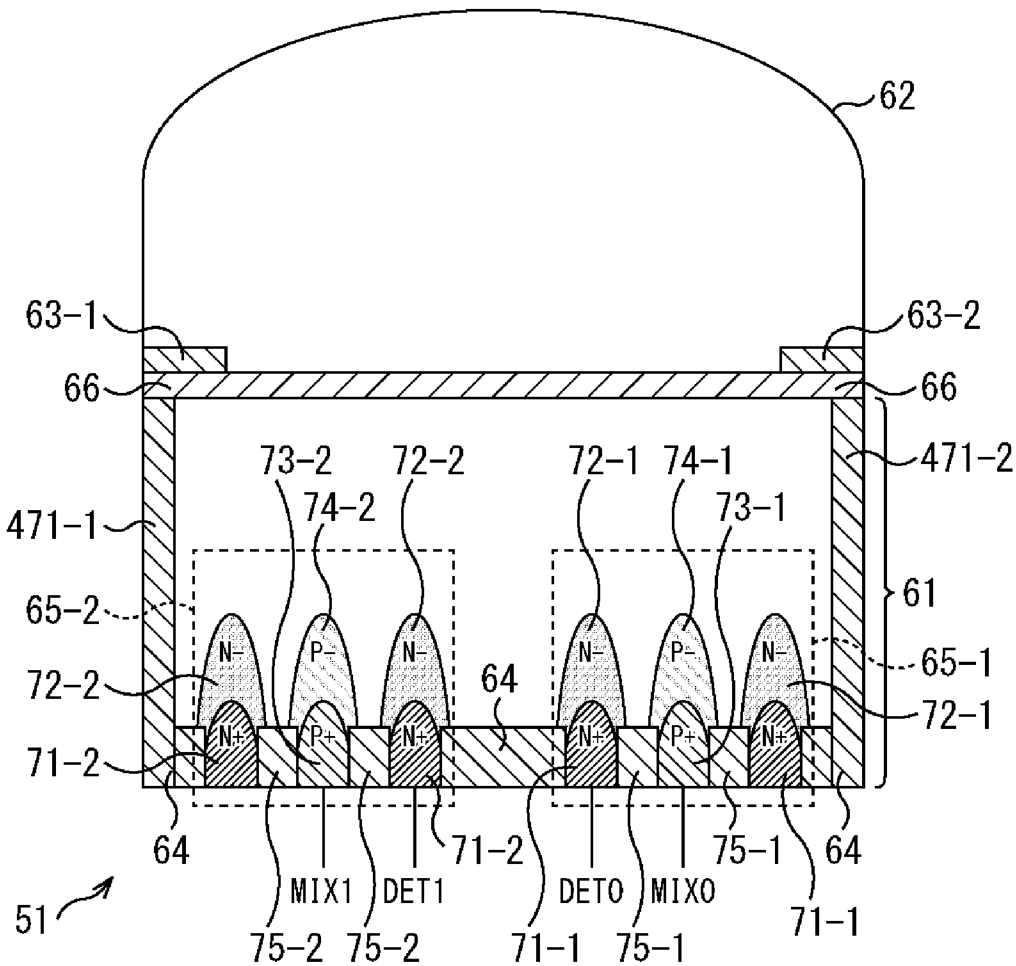
FIG. 23 is a diagram illustrating another configuration example of the pixel.

Moreover, in a case where an embedded type isolation region is formed in the pixel 51, for example, as illustrated in FIG. 23, an isolation region 471-1 and an isolation region 471-2 passing through the entire substrate 61 may be provided. Note that, in FIG. 23, constituent members corresponding to those in the case of FIG. 2 are denoted with the same reference numerals and the description thereof will be omitted as appropriate.

The configuration of the pixel 51 illustrated in FIG. 23 differs from the configuration of the pixel 51 illustrated in FIG. 2 in that the isolation regions 471-1 and 471-2 are provided in the substrate 61, but is configured the same as the configuration of the pixel 51 in FIG. 2 in other points. That is, the pixel 51 illustrated in FIG. 23 has a configuration in which the isolation regions 471-1 and 471-2 are provided instead of the isolation regions 441 of the pixel 51 illustrated in FIG. 22.

In the pixel 51 illustrated in FIG. 23, the isolation regions 471-1 and 471-2 that pass through the entire substrate 61 are formed by light-shielding films or the like at boundary portions between the pixel 51 and other pixels adjacent to this pixel 51 in the substrate 61, that is, at left and right end portions of the pixel 51 in the drawing. Note that, hereinafter, the isolation regions 471-1 and 471-2 are also simply referred to as isolation regions 471 in a case where it is not particularly necessary to distinguish between the isolation regions 471-1 and 471-2.

For example, when the isolation regions 471 are formed, long grooves (trenches) are formed in an upward direction in the drawing from a surface on an opposite side of the light entrance surface side of the substrate 61, that is, a surface on a lower side in the drawing. At this time, these grooves are formed so as to pass through the substrate 61 until reaching the light entrance surface of the substrate 61. Then, light-shielding films are formed by embedding in the groove portions formed as described above, such that the isolation regions 471 are obtained.

Such an embedded type isolation region 471 can also improve isolation characteristics for infrared light between pixels, and suppress the occurrence of crosstalk.

Tenth Embodiment

Configuration Example of Pixel

Moreover, the thickness of a substrate on which the signal retrieving unit 65 is formed can be defined according to various characteristics and the like of the pixel.

Figure 24:
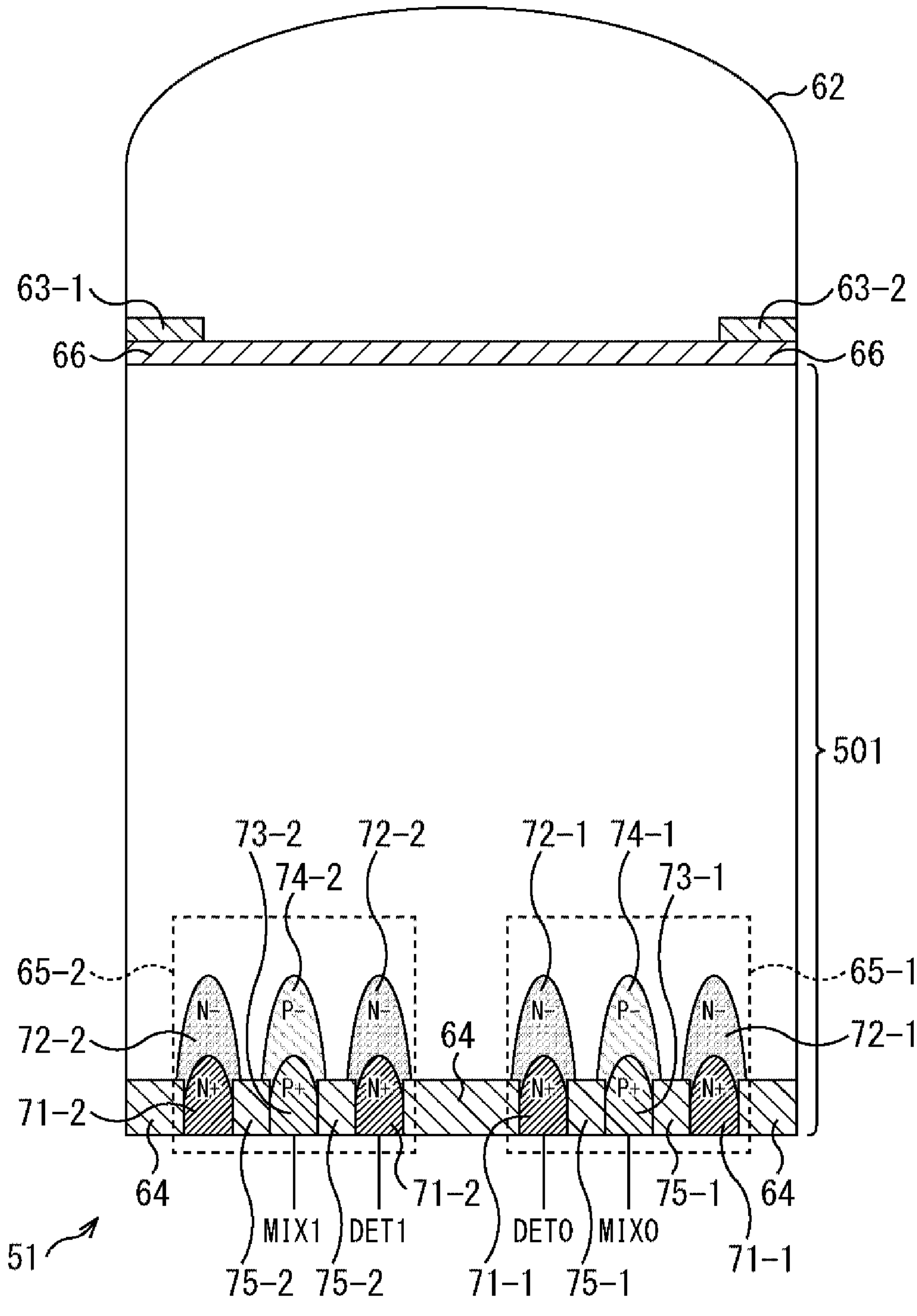
FIG. 24 is a diagram illustrating another configuration example of the pixel.

Accordingly, for example, as illustrated in FIG. 24, a substrate 501 constituting a pixel 51 can be made thicker than the substrate 61 illustrated in FIG. 2. Note that, in FIG. 24, constituent members corresponding to those in the case of FIG. 2 are denoted with the same reference numerals and the description thereof will be omitted as appropriate.

The configuration of the pixel 51 illustrated in FIG. 24 differs from the configuration of the pixel 51 illustrated in FIG. 2 in that the substrate 501 is provided instead of the substrate 61, but is configured the same as the configuration of the pixel 51 in FIG. 2 in other points.

That is, in the pixel 51 illustrated in FIG. 24, an on-chip lens 62, a fixed charge film 66, and inter-pixel light-shielding films 63 are formed on the light entrance surface side of the substrate 501. Furthermore, an oxide film 64, signal retrieving units 65, and isolation portions 75 are formed in the vicinity of an outer surface of a surface of the substrate 501 on an opposite side of the light entrance surface side.

The substrate 501 includes, for example, a P-type semiconductor substrate having a thickness of 20 μm or more. The substrate 501 and the substrate 61 differ from each other only in the substrate thickness, and positions where the oxide film 64, the signal retrieving units 65, and the isolation portions 75 are formed are positioned the same between the substrate 501 and the substrate 61.

Note that film thicknesses of various layers (films) formed as appropriate on the light entrance surface side and the like of the substrate 501 and the substrate 61 are preferably optimized according to the characteristics and the like of the pixel 51.

Eleventh Embodiment

Configuration Example of Pixel

Figure 25:
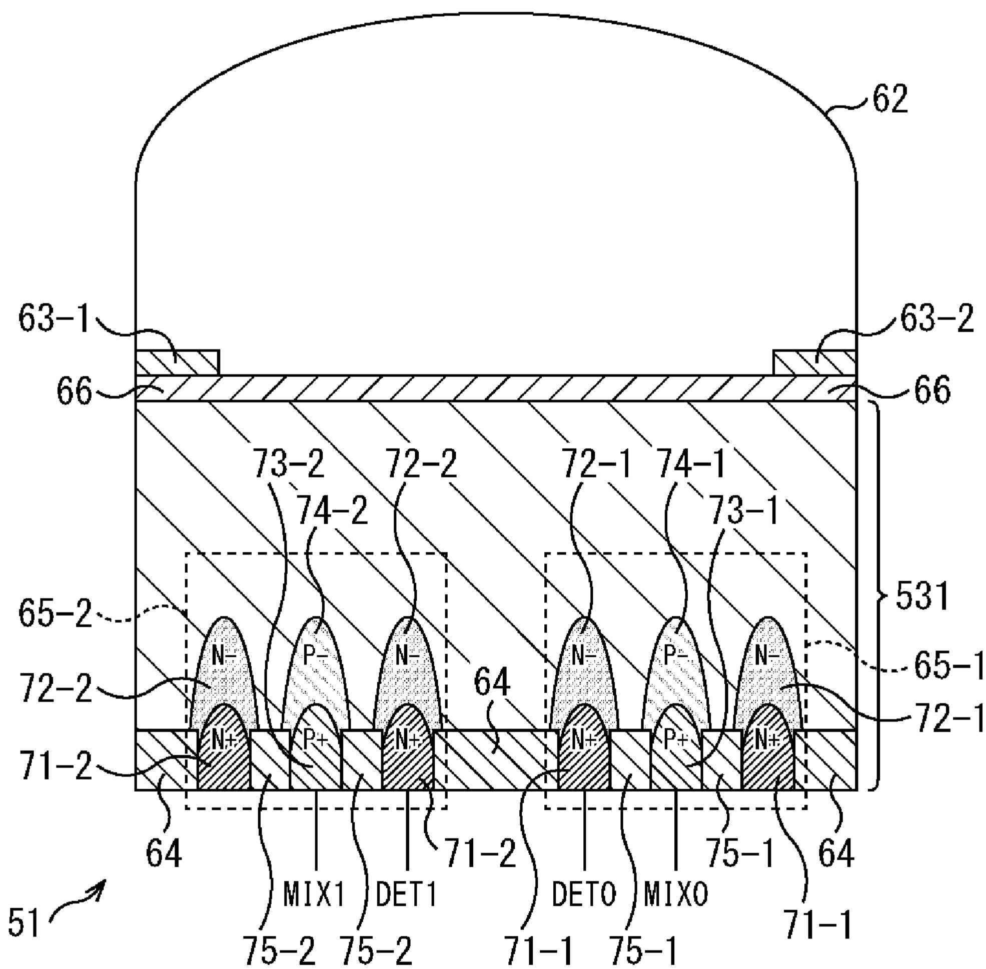
FIG. 25 is a diagram illustrating another configuration example of the pixel.

Moreover, an example in which a substrate constituting the pixel 51 includes a P-type semiconductor substrate has been described above; however, for example, the substrate may include an N-type semiconductor substrate as illustrated in FIG. 25. Note that, in FIG. 25, constituent members corresponding to those in the case of FIG. 2 are denoted with the same reference numerals and the description thereof will be omitted as appropriate.

The configuration of a pixel 51 illustrated in FIG. 25 differs from the configuration of the pixel 51 illustrated in FIG. 2 in that a substrate 531 is provided instead of the substrate 61, but is configured the same as the configuration of the pixel 51 in FIG. 2 in other points.

In the pixel 51 illustrated in FIG. 25, an on-chip lens 62, a fixed charge film 66, and inter-pixel light-shielding films 63 are formed on the light entrance surface side of the substrate 531 including an N-type semiconductor layer, such as a silicon substrate.

Furthermore, an oxide film 64, signal retrieving units 65, and isolation portions 75 are formed in the vicinity of an outer surface of a surface of the substrate 531 on an opposite side of the light entrance surface side. Positions where these oxide film 64, signal retrieving units 65, and isolation portions 75 are formed are positioned the same between the substrate 531 and the substrate 61, and also the configuration of the signal retrieving units 65 is the same between the substrate 531 and the substrate 61.

For example, the substrate 531 is designed to have a thickness in the longitudinal direction in the drawing, that is, a thickness in a direction perpendicular to a surface of the substrate 531 of 20 μm or less.

Furthermore, the substrate 531 is configured as, for example, a high resistance N-Epi substrate having a substrate concentration of the order of 1E+13 or less, and the resistance (resistivity) of the substrate 531 is designed to be, for example, 500 [Ωcm] or more. Consequently, the power consumption in the pixel 51 can be reduced.

Here, the relationship between the substrate concentration and the resistance of the substrate 531 is, for example, such that the resistance is 2000 [Ωcm] when the substrate concentration is 2.15E+12 [$cm^3$], the resistance is 1000 [Ωcm] when the substrate concentration is 4.30E+12 [$cm^3$], the resistance is 500 [Ωcm] when the substrate concentration is 8.61E+12 [$cm^3$], the resistance is 100 [Ωcm] when the substrate concentration is 4.32E+13 [$cm^3$], and so forth.

Even when the substrate 531 of the pixel 51 is configured as an N-type semiconductor substrate in this manner, a similar effect can be obtained by working similar to the working in the example illustrated in FIG. 2.

Twelfth Embodiment

Configuration Example of Pixel

Moreover, similarly to the example described with reference to FIG. 24, the thickness of the N-type semiconductor substrate can be defined according to various characteristics and the like of the pixel.

Figure 26:
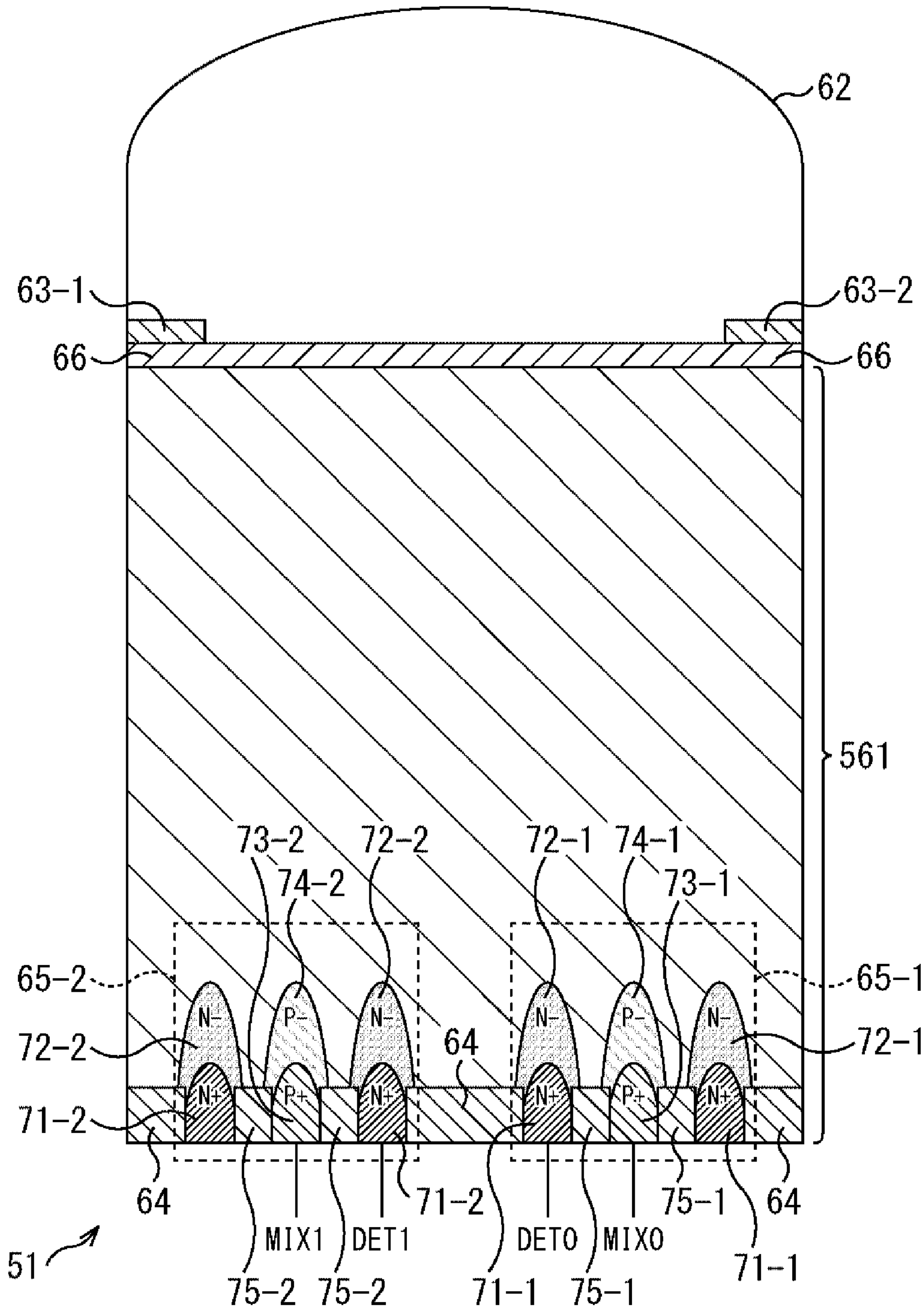
FIG. 26 is a diagram illustrating another configuration example of the pixel.

Accordingly, for example, as illustrated in FIG. 26, a substrate 561 constituting a pixel 51 can be made thicker than the substrate 531 illustrated in FIG. 25. Note that, in FIG. 26, constituent members corresponding to those in the case of FIG. 25 are denoted with the same reference numerals and the description thereof will be omitted as appropriate.

The configuration of the pixel 51 illustrated in FIG. 26 differs from the configuration of the pixel 51 illustrated in FIG. 25 in that the substrate 561 is provided instead of the substrate 531, but is configured the same as the configuration of the pixel 51 in FIG. 25 in other points.

That is, in the pixel 51 illustrated in FIG. 26, an on-chip lens 62, a fixed charge film 66, and inter-pixel light-shielding films 63 are formed on the light entrance surface side of the substrate 561. Furthermore, an oxide film 64, signal retrieving units 65, and isolation portions 75 are formed in the vicinity of an outer surface of a surface of the substrate 561 on an opposite side of the light entrance surface side.

The substrate 561 includes, for example, an N-type semiconductor substrate having a thickness of 20 μm or more. The substrate 561 and the substrate 531 differ from each other only in the substrate thickness, and positions where the oxide film 64, the signal retrieving units 65, and the isolation portions 75 are formed are positioned the same between the substrate 561 and the substrate 531.

Thirteenth Embodiment

Configuration Example of Pixel

Furthermore, for example, by imparting a bias to the light entrance surface side of the substrate 61, an electric field in the substrate 61 in a direction perpendicular to a surface of the substrate 61 (hereinafter also referred to as a Z direction) may be intensified.

Figure 27:
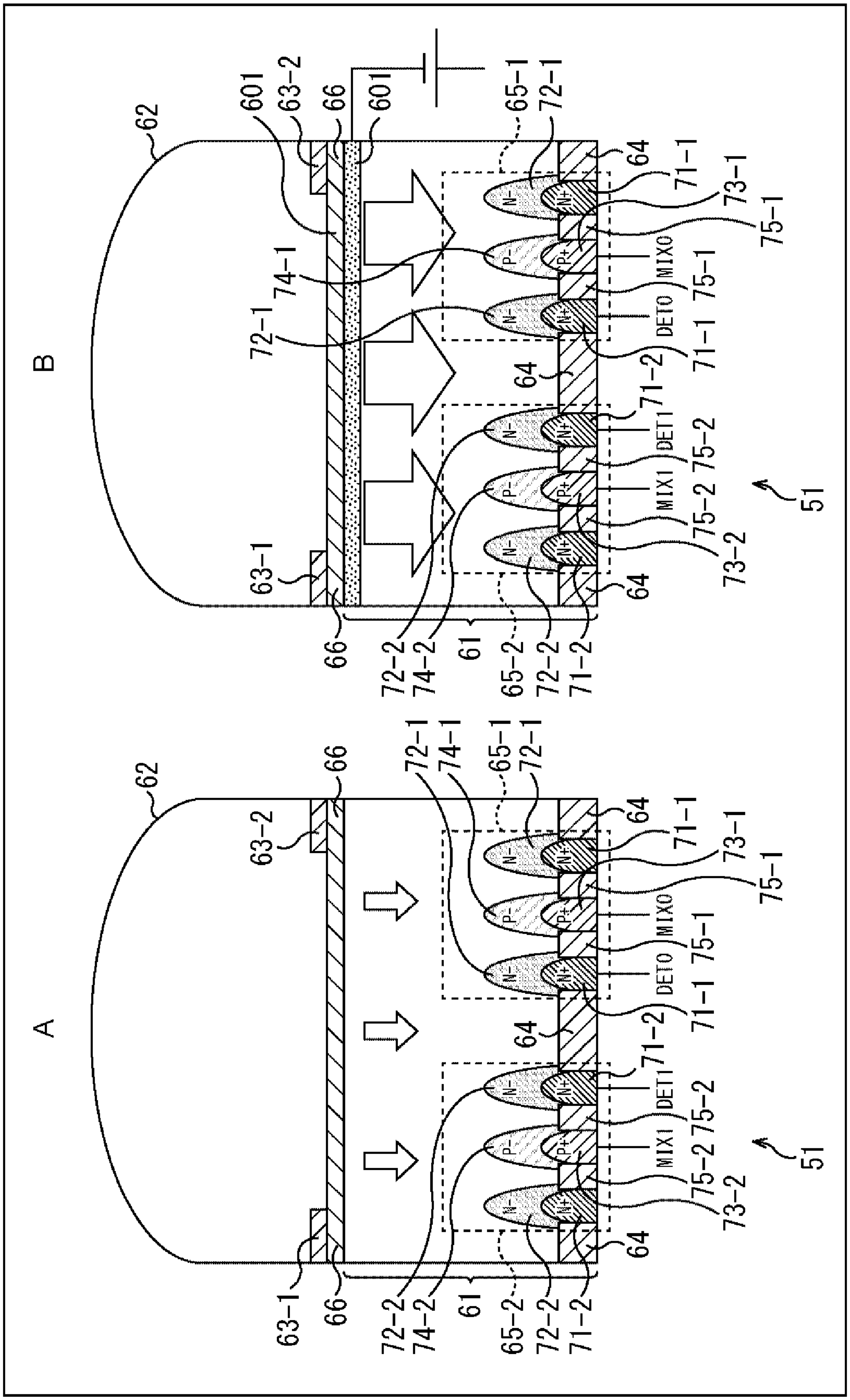
FIG. 27 is a diagram illustrating another configuration example of the pixel.

In such a case, a pixel 51 is configured as illustrated in FIG. 27, for example. Note that, in FIG. 27, constituent members corresponding to those in the case of FIG. 2 are denoted with the same reference numerals and the description thereof will be omitted as appropriate.

A of FIG. 27 illustrates the pixel 51 illustrated in FIG. 2, and arrows in the substrate 61 of the pixel 51 represent the strength of the electric field in the Z direction in the substrate 61.

On the other hand, B of FIG. 27 illustrates the configuration of the pixel 51 in a case where a bias (voltage) is applied to the light entrance surface of a substrate 61. The configuration of the pixel 51 in B of FIG. 27 is basically the same as the configuration of the pixel 51 illustrated in FIG. 2, but a P+ semiconductor region 601 is newly added and formed at a light entrance surface side interface of the substrate 61.

By applying a voltage (negative bias) of 0 V or less from the inside or outside of a pixel array unit 20 to the P+ semiconductor region 601 formed at the light entrance surface side interface of the substrate 61, the electric field in the Z direction is intensified. Arrows in the substrate 61 of the pixel 51 in B of FIG. 27 represents the strength of the electric field in the Z direction in the substrate 61. The thickness of the arrows drawn in the substrate 61 in B of FIG. 27 is thicker than the arrows in the pixel 51 in A of FIG. 27, and means that the electric field in the Z direction is stronger. By applying a negative bias to the P+ semiconductor region 601 formed on the light entrance surface side of the substrate 61 in this manner, the electric field in the Z direction can be intensified, and the electron retrieving efficiency in a signal retrieving unit 65 can be improved.

Note that the configuration for applying a voltage to the light entrance surface side of the substrate 61 is not limited to the configuration provided with the P+ semiconductor region 601, and may be any other configuration. For example, a transparent electrode film may be formed by lamination between the light entrance surface of the substrate 61 and an on-chip lens 62 such that a negative bias is imparted by applying a voltage to this transparent electrode film.

Fourteenth Embodiment

Configuration Example of Pixel

Moreover, in order to improve the sensitivity of the pixel 51 with respect to infrared rays, a reflecting member having a large area may be provided on a surface of the substrate 61 on an opposite side of the light entrance surface.

Figure 28:
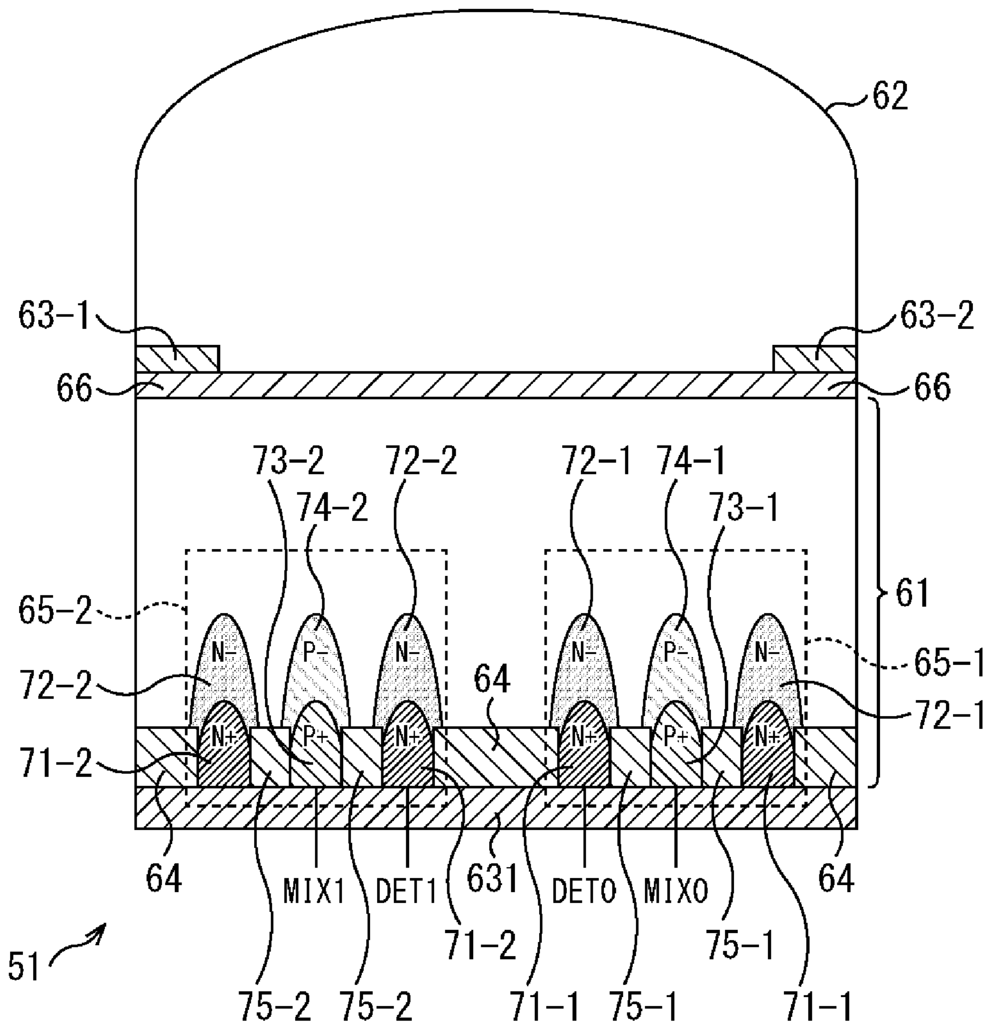
FIG. 28 is a diagram illustrating another configuration example of the pixel.

In such a case, a pixel 51 is configured as illustrated in FIG. 28, for example. Note that, in FIG. 28, constituent members corresponding to those in the case of FIG. 2 are denoted with the same reference numerals and the description thereof will be omitted as appropriate.

The configuration of the pixel 51 illustrated in FIG. 28 differs from the configuration of the pixel 51 in FIG. 2 in that a reflecting member 631 is provided on a surface of a substrate 61 on an opposite side of the light entrance surface, but is configured the same as the configuration of the pixel 51 in FIG. 2 in other points.

In the example illustrated in FIG. 28, the reflecting member 631 that reflects infrared light is provided so as to cover the entire surface of the substrate 61 on an opposite side of the light entrance surface.

This reflecting member 631 may be any member as long as the member has a high infrared light reflectance. For example, a metal (metallic substance) such as copper or aluminum provided in a multilayer wiring layer laminated on a surface of the substrate 61 on an opposite side of the light entrance surface may be used as the reflecting member 631, or a reflective structure such as a polysilicon or oxide film may be formed on a surface of the substrate 61 on an opposite side of the light entrance surface and employed as the reflecting member 631.

By providing the reflecting member 631 in the pixel 51 in this manner, infrared light that has entered the substrate 61 through the light entrance surface via the on-chip lens 62 and has been transmitted through the substrate 61 without being photoelectrically converted in the substrate 61 can be reflected by the reflecting member 631 and caused to enter again the substrate 61. Consequently, the amount of infrared light photoelectrically converted in the substrate 61 can be further expanded, and the quantum efficiency (QE), that is, the sensitivity of the pixel 51 with respect to infrared light can be improved.

Fifteenth Embodiment

Configuration Example of Pixel

Moreover, a light-shielding member having a large area may be provided on a surface of the substrate 61 on an opposite side of the light entrance surface in order to suppress erroneous sensing of light in a pixel in the vicinity.

In such a case, a pixel 51 can be configured, for example, by replacing the reflecting member 631 illustrated in FIG. 28 with the light-shielding member. That is, in the pixel 51 illustrated in FIG. 28, the reflecting member 631 that covers the entire surface of the substrate 61 on an opposite side of the light entrance surface is employed as a light-shielding member 631' that shields from infrared light. The reflecting member 631 of the pixel 51 in FIG. 28 is substituted for the light-shielding member 631'.

This light-shielding member 631' may be any member as long as the member has a high light-shielding rate for infrared light. For example, a metal (metallic substance) such as copper or aluminum provided in a multilayer wiring layer laminated on a surface of the substrate 61 on an opposite side of the light entrance surface may be used as the light-shielding member 631', or a light-shielding structure such as a polysilicon or oxide film may be formed on a surface of the substrate 61 on an opposite side of the light entrance surface and employed as the light-shielding member 631'.

By providing the light-shielding member 631' in the pixel 51 in this manner, it can be suppressed that infrared light that has entered the substrate 61 through the light entrance surface via the on-chip lens 62 and has been transmitted through the substrate 61 without being photoelectrically converted in the substrate 61 is scattered in the wiring layer and enters a pixel in the vicinity. Consequently, light can be avoided from being erroneously sensed at a pixel in the vicinity.

Note that the light-shielding member 631' can also serve as the reflecting member 631 by being formed by a material containing metal, for example.

Sixteenth Embodiment

Configuration Example of Pixel

Moreover, instead of the oxide film 64 on the substrate 61 of the pixel 51, a P-well region including a P-type semiconductor region may be provided.

Figure 29:
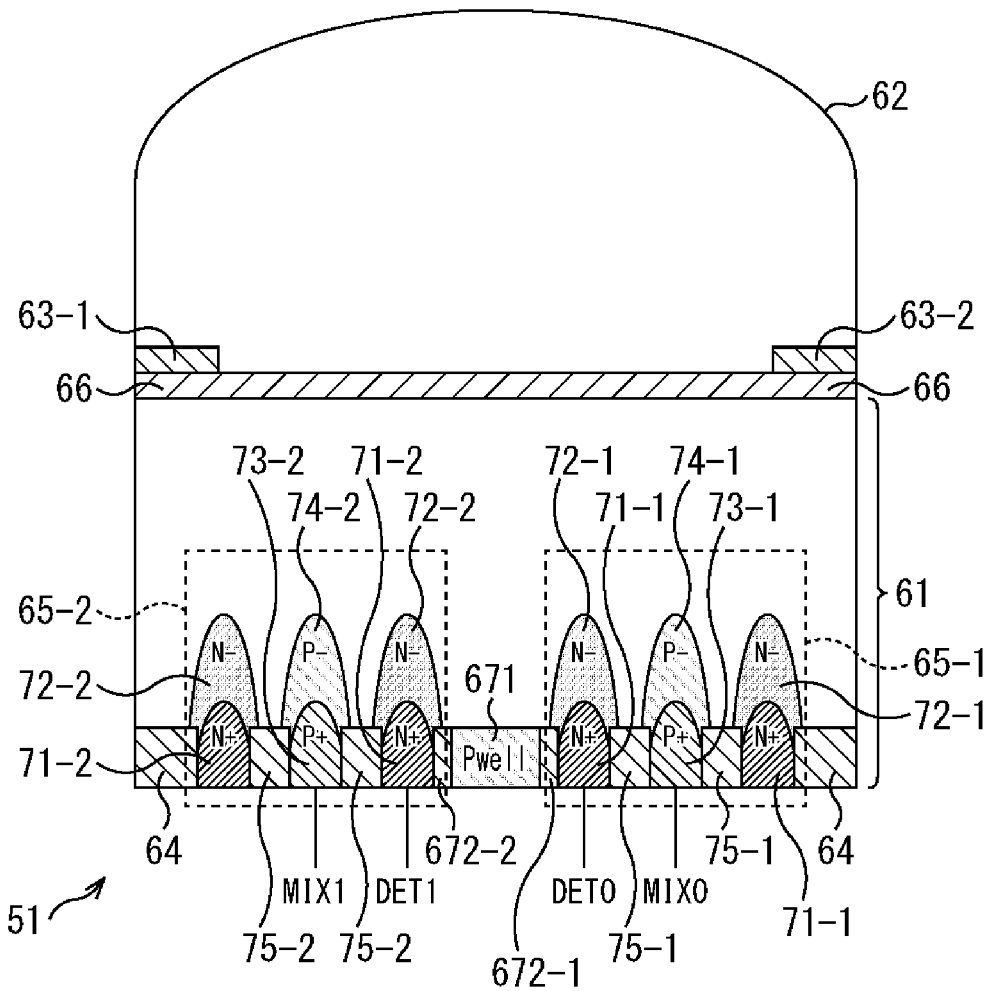
FIG. 29 is a diagram illustrating another configuration example of the pixel.

In such a case, a pixel 51 is configured as illustrated in FIG. 29, for example. Note that, in FIG. 29, constituent members corresponding to those in the case of FIG. 2 are denoted with the same reference numerals and the description thereof will be omitted as appropriate.

The configuration of the pixel 51 illustrated in FIG. 29 differs from the configuration of the pixel 51 illustrated in FIG. 2 in that a P-well region 671, an isolation portion 672-1, and an isolation portion 672-2 are provided instead of the oxide film 64, but is configured the same as the configuration of the pixel 51 in FIG. 2 in other points.

In the example illustrated in FIG. 29, the P-well region 671 including a P-type semiconductor region is formed in the center portion on an inner side of a surface of the substrate 61 on an opposite side of the light entrance surface, that is, a surface on a lower side in the drawing. Furthermore, the isolation portion 672-1 for isolating the P-well region 671 and an N+ semiconductor region 71-1 from each other is formed by an oxide film or the like between these regions. Similarly, the isolation portion 672-2 for isolating the P-well region 671 and an N+ semiconductor region 71-2 from each other is also formed by an oxide film or the like between these regions. In the pixel 51 illustrated in FIG. 29, P− semiconductor regions 74 have a wider region than N-semiconductor regions 72 in the upward direction in the drawing.

Seventeenth Embodiment

Configuration Example of Pixel

Furthermore, in addition to the oxide film 64 on the substrate 61 of the pixel 51, a P-well region including a P-type semiconductor region may be further provided.

Figure 30:
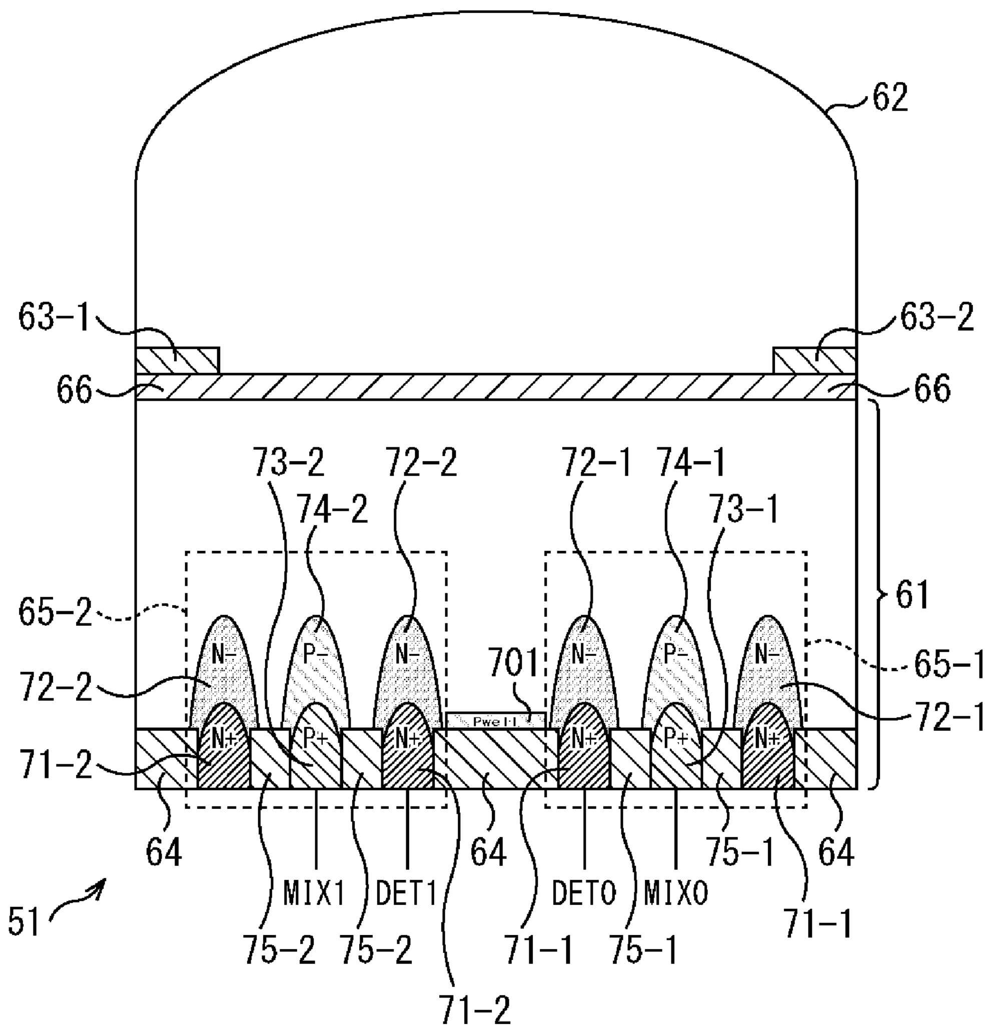
FIG. 30 is a diagram illustrating another configuration example of the pixel.

In such a case, a pixel 51 is configured as illustrated in FIG. 30, for example. Note that, in FIG. 30, constituent members corresponding to those in the case of FIG. 2 are denoted with the same reference numerals and the description thereof will be omitted as appropriate.

The configuration of the pixel 51 illustrated in FIG. 30 differs from the configuration of the pixel 51 illustrated in FIG. 2 in that a P-well region 701 is newly provided, but is configured the same as the configuration of the pixel 51 in FIG. 2 in other points. That is, in the example illustrated in FIG. 30, the P− well region 701 including a P-type semiconductor region is formed on an upper side of the oxide film 64 in a substrate 61.

As described above, according to the present technology, characteristics such as pixel sensitivity can be improved by configuring the CAPD sensor as a backside illumination type.

Equivalent Circuit Configuration Example of Pixel

Figure 31:
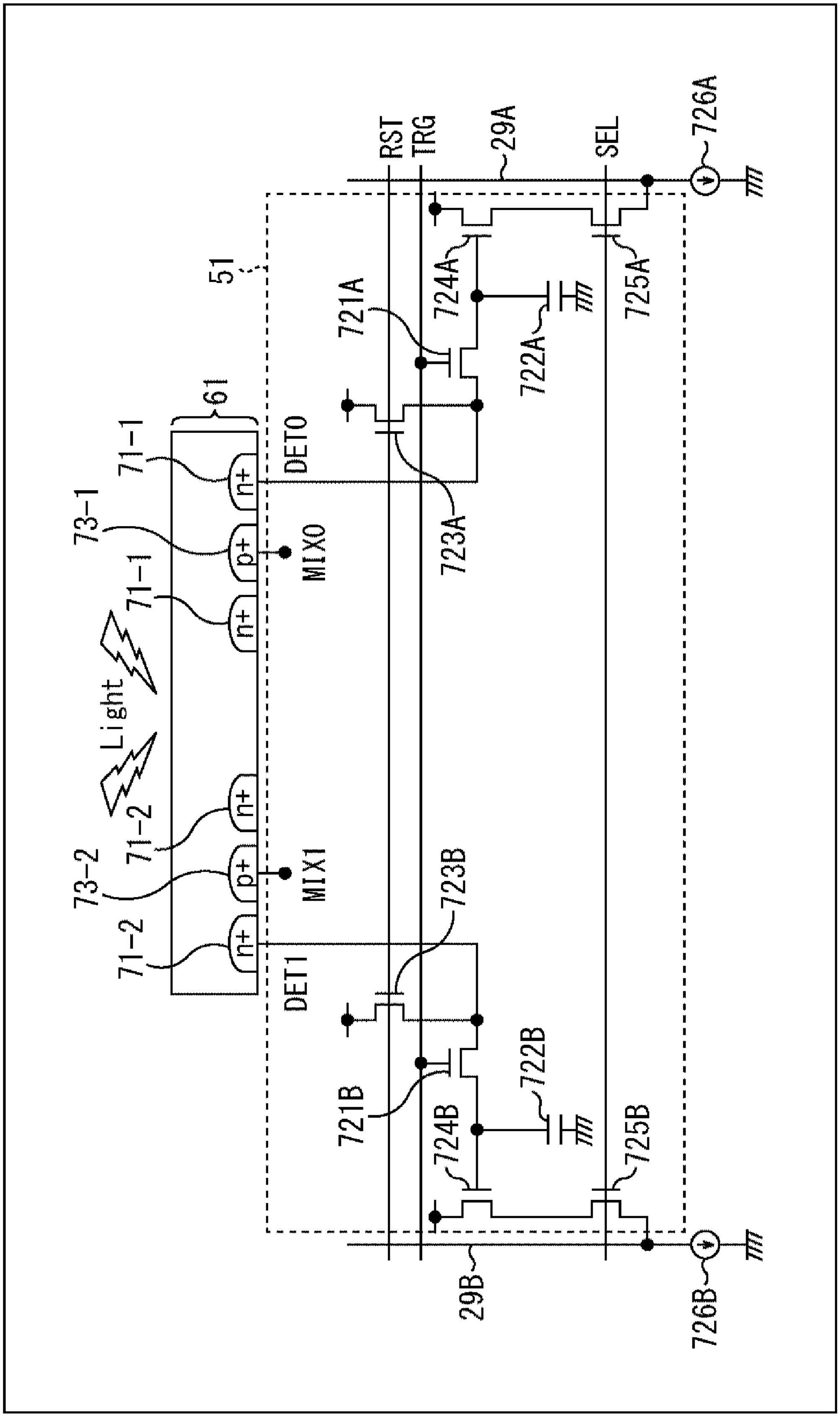
FIG. 31 is a diagram illustrating an equivalent circuit of the pixel.

FIG. 31 illustrates an equivalent circuit of the pixel 51.

The pixel 51 includes a transfer transistor 721A, an FD 722A, a reset transistor 723A, an amplification transistor 724A, and a select transistor 725A for the signal retrieving unit 65-1 including the N+ semiconductor region 71-1, the P+ semiconductor region 73-1, and the like.

Furthermore, the pixel 51 includes a transfer transistor 721B, an FD 722B, a reset transistor 723B, an amplification transistor 724B, and a select transistor 725B for the signal retrieving unit 65-2 including the N+ semiconductor region 71-2, the P+ semiconductor region 73-2, and the like.

A tap drive unit 21 applies a predetermined voltage MIX0 (first voltage) to the P+ semiconductor region 73-1, and applies a predetermined voltage MIX1 (second voltage) to the P+ semiconductor region 73-2. In the example described above, one of the voltages MIX0 and MIX1 is 1.5 V and the other is 0 V. The P+ semiconductor regions 73-1 and 73-2 are voltage application units to which the first voltage or the second voltage is applied.

The N+ semiconductor regions 71-1 and 71-2 are charge detection units that detect and accumulate a charge generated by photoelectrically converting light that has entered the substrate 61.

When a drive signal TRG supplied to a gate electrode is placed in an active state, the transfer transistor 721A is placed in a conductive state in response to the drive signal TRG being in the active state, to transfer a charge accumulated in the N+ semiconductor region 71-1 to the FD 722A. When a drive signal TRG supplied to a gate electrode is placed in an active state, the transfer transistor 721B is placed in a conductive state in response to the drive signal TRG being in the active state, to transfer a charge accumulated in the N+ semiconductor region 71-2 to the FD 722B.

The FD 722A temporarily holds the charge DET0 supplied from the N+ semiconductor region 71-1. The FD 722B temporarily holds the charge DET1 supplied from the N+ semiconductor region 71-2. The FD 722A corresponds to the FD portion A described with reference to FIG. 2, and the FD 722B corresponds to the FD portion B.

When a drive signal RST supplied to a gate electrode is placed in an active state, the reset transistor 723A is placed in a conductive state in response to the drive signal RST being in the active state, to reset the potential of the FD 722A to a predetermined level (power supply voltage VDD). When a drive signal RST supplied to a gate electrode is placed in an active state, the reset transistor 723B is placed in a conductive state in response to the drive signal RST being in the active state, to reset the potential of the FD 722B to a predetermined level (power supply voltage VDD). Note that, when the reset transistors 723A and 723B are placed in an active state, the transfer transistors 721A and 721B are also placed in an active state at the same time.

When a source electrode is connected to a vertical signal line 29A via the select transistor 725A, the amplification transistor 724A constitutes a source follower circuit together with a load MOS of a constant current source circuit unit 726A connected to one end of the vertical signal line 29A. When a source electrode is connected to a vertical signal line 29B via the select transistor 725B, the amplification transistor 724B constitutes a source follower circuit together with a load MOS of a constant current source circuit unit 726B connected to one end of the vertical signal line 29B.

The select transistor 725A is connected between the source electrode of the amplification transistor 724A and the vertical signal line 29A. When a select signal SEL supplied to a gate electrode is placed in an active state, the select transistor 725A is placed in a conductive state in response to the select signal SEL being in the active state, and outputs a pixel signal output from the amplification transistor 724A to the vertical signal line 29A.

The select transistor 725B is connected between the source electrode of the amplification transistor 724B and the vertical signal line 29B. When a select signal SEL supplied to a gate electrode is placed in an active state, the select transistor 725B is placed in a conductive state in response to the select signal SEL being in the active state, and outputs a pixel signal output from the amplification transistor 724B to the vertical signal line 29B.

The transfer transistors 721A and 721B, the reset transistors 723A and 723B, the amplification transistors 724A and 724B, and the select transistors 725A and 725B of the pixel 51 are controlled by the vertical drive unit 22, for example.

Another Equivalent Circuit Configuration Example of Pixel

Figure 32:
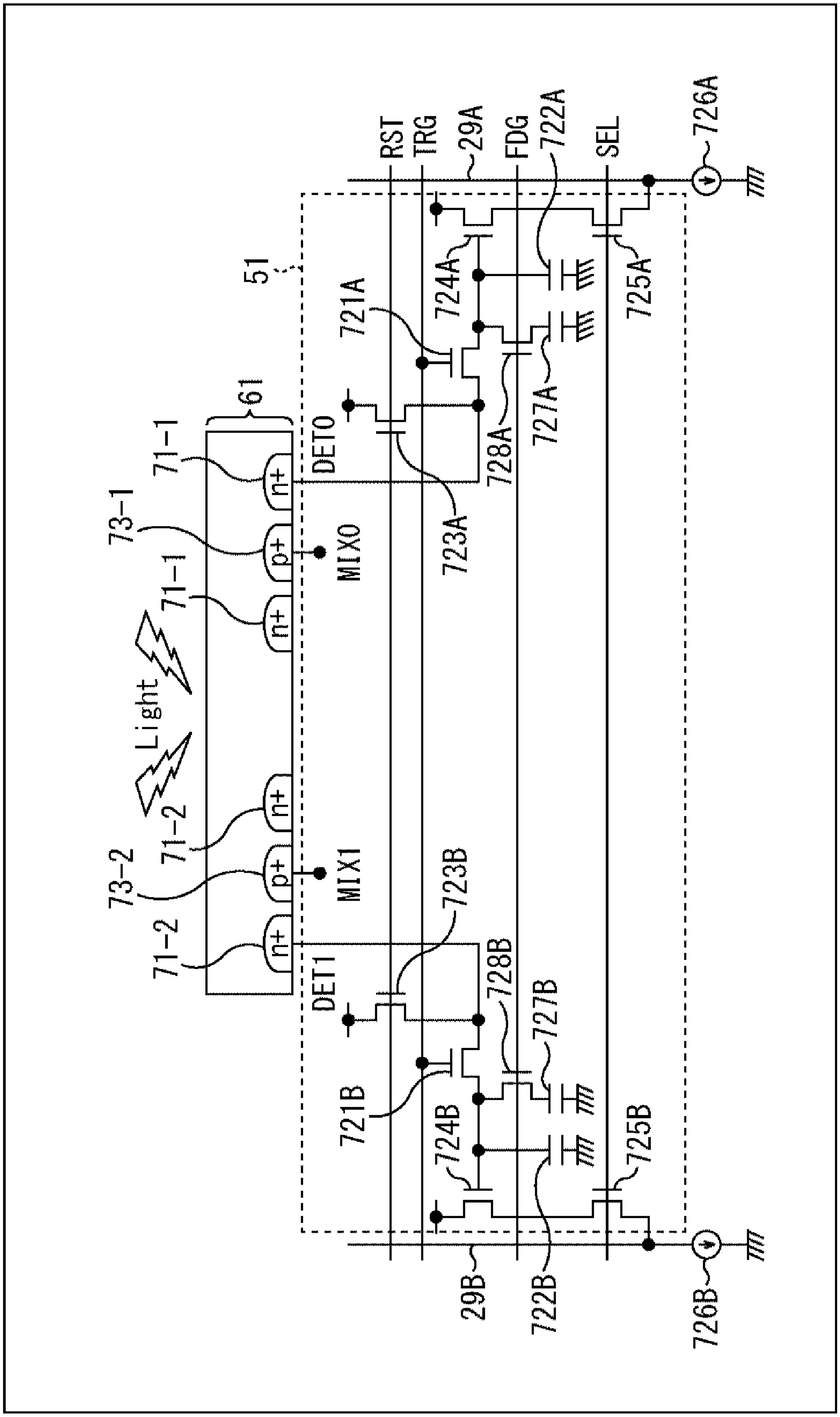
FIG. 32 is a diagram illustrating another equivalent circuit of the pixel.

FIG. 32 illustrates another equivalent circuit of the pixel 51.

In FIG. 32, constituent members corresponding to those in FIG. 31 are denoted with the same reference numerals and the description thereof will be omitted as appropriate.

In the equivalent circuit in FIG. 32, an additional capacitance 727 and a switching transistor 728 that controls the connection of the additional capacitance 727 are added to each of the signal retrieving units 65-1 and 65-2 in the equivalent circuit in FIG. 31.

Specifically, the additional capacitance 727A is connected between the transfer transistors 721A and the FD 722A via the switching transistor 728A, and the additional capacitance 727B is connected between the transfer transistors 721B and the FD 722B via the switching transistor 728B.

When a drive signal FDG supplied to a gate electrode is placed in an active state, the switching transistor 728A is placed in a conductive state in response to the drive signal FDG being in the active state, to connect the additional capacitance 727A to the FD 722A. When a drive signal FDG supplied to a gate electrode is placed in an active state, the switching transistor 728B is placed in a conductive state in response to the drive signal FDG being in the active state, to connect the additional capacitance 727B to the FD 722B.

For example, at the time of high illuminance with a larger amount of entering light, the vertical drive unit 22 places the switching transistors 728A and 728B in an active state to connect the FD 722A and the additional capacitance 727A, and also connect the FD 722B and the additional capacitance 727B. As a consequence, more charges can be accumulated at high illuminance.

Meanwhile, at the time of low illuminance with a smaller amount of entering light, the vertical drive unit 22 places the switching transistors 728A and 728B in an inactive state to disconnect the additional capacitances 727A and 727B from the FDs 722A and 722B, respectively.

Although the additional capacitance 727 may be omitted as in the equivalent circuit in FIG. 31, a high dynamic range can be ensured by providing the additional capacitance 727 and using the additional capacitance 727 properly according to the amount of entering light.

Arrangement Examples of Voltage Supply Lines

Next, the arrangement of the voltage supply lines for applying the predetermined voltage MIX0 or MIX1 to the P+ semiconductor regions 73-1 and 73-2, which are voltage application units of the signal retrieving unit 65 of each pixel 51, will be described with reference to FIGS. 33 to 35. Voltage supply lines 741 illustrated in FIGS. 33 and 34 correspond to the voltage supply lines 30 illustrated in FIG. 1.

Figure 33:
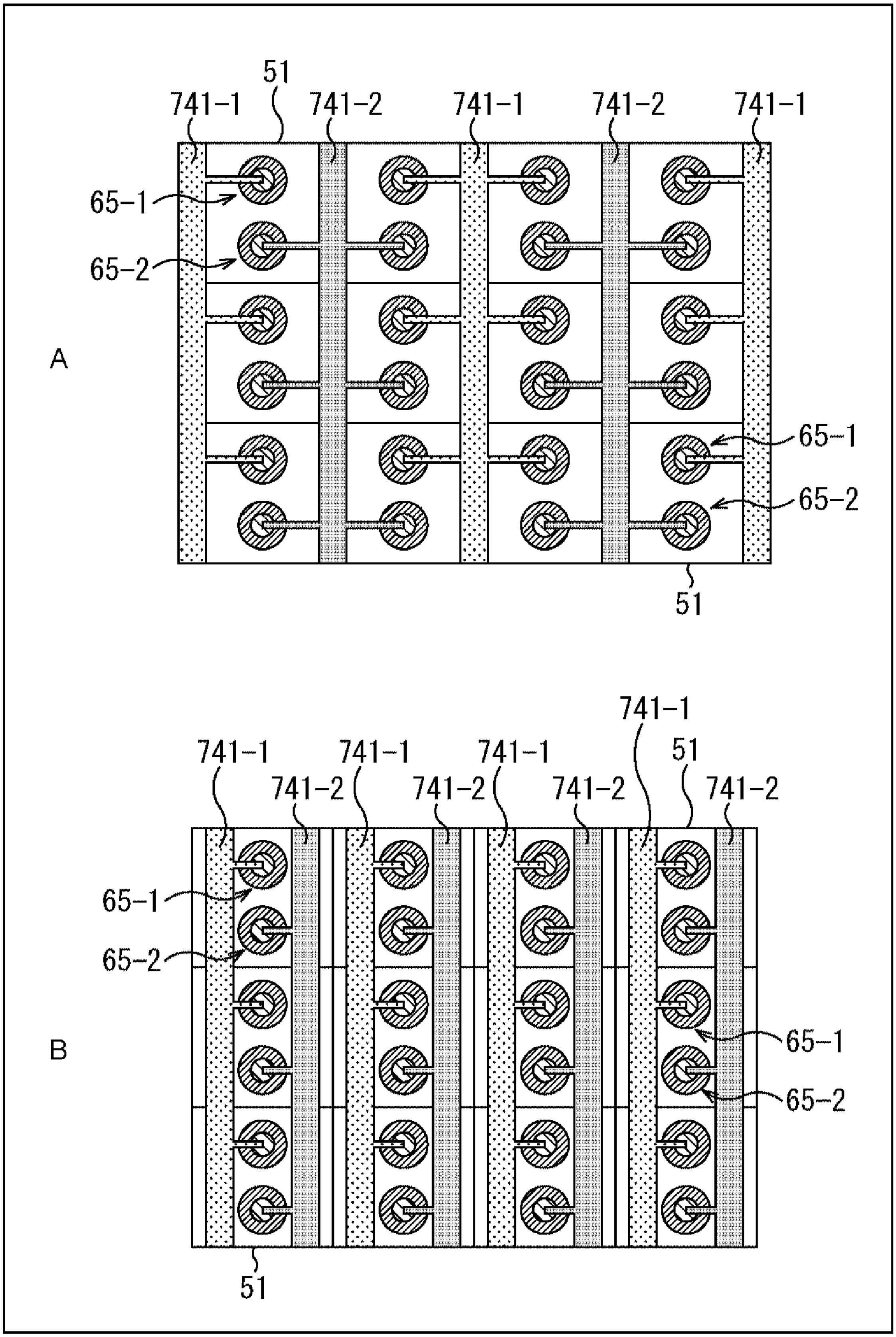
FIG. 33 is a diagram illustrating an arrangement example of voltage supply lines adopting a periodic arrangement.
Figure 34:
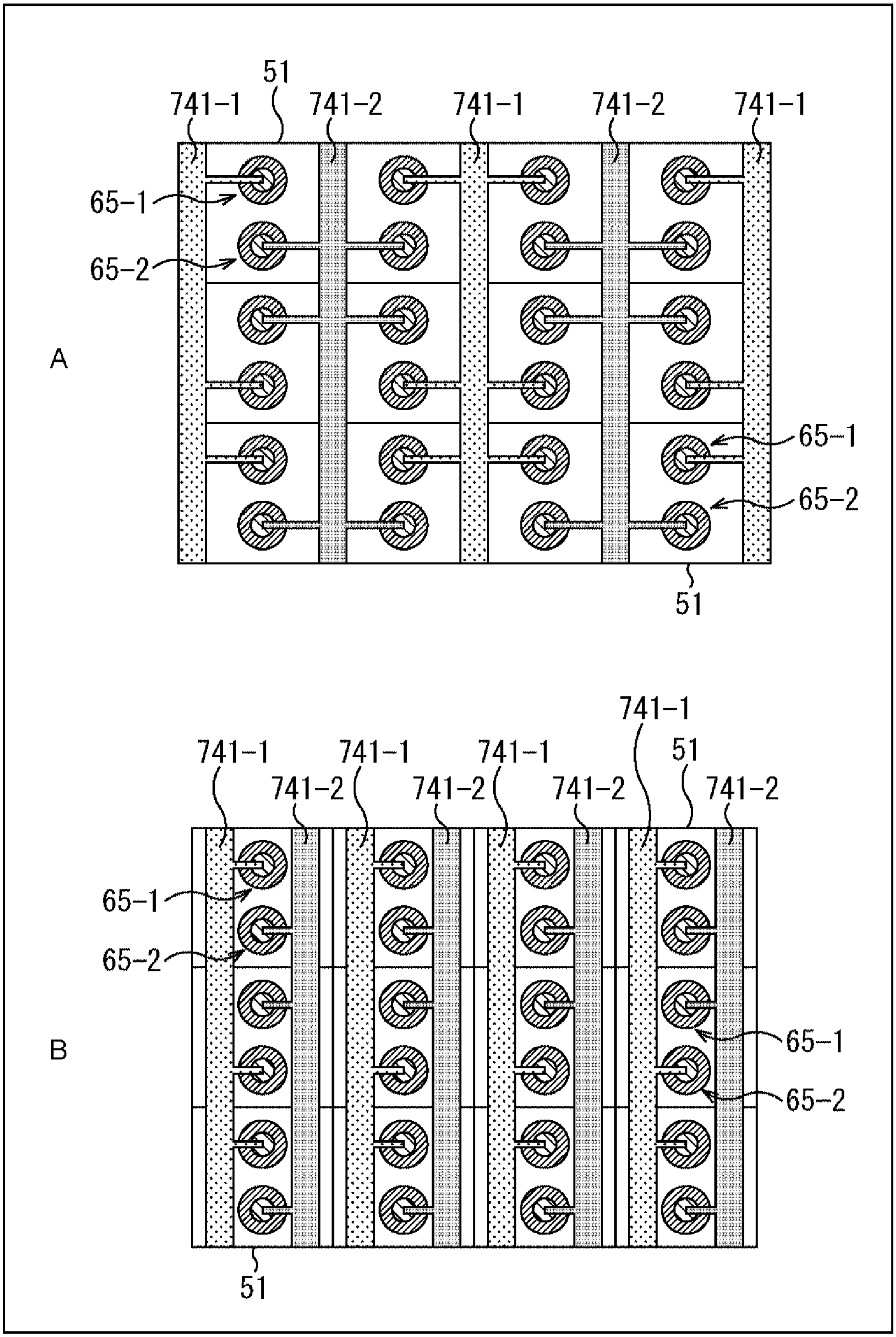
FIG. 34 is a diagram illustrating an arrangement example of voltage supply lines adopting a mirror arrangement.

Note that, in FIGS. 33 and 34, the configuration having a circular shape, which is illustrated in FIG. 9, is adopted and described as the configuration of the signal retrieving unit 65 of each pixel 51; however, it goes without saying that other configurations may be adopted.

A of FIG. 33 is a plan view illustrating a first arrangement example of voltage supply lines.

In the first arrangement example, for a plurality of pixels 51 two-dimensionally arranged in a matrix, the voltage supply line 741-1 or 741-2 is wired along the vertical direction between (at a boundary between) two pixels adjacent in the horizontal direction.

The voltage supply line 741-1 is connected to the P+ semiconductor region 73-1 of the signal retrieving unit 65-1, which is one of the two signal retrieving units 65 located in the pixel 51. The voltage supply line 741-2 is connected to the P+ semiconductor region 73-2 of the signal retrieving unit 65-2, which is the other of the two signal retrieving units 65 located in the pixel 51.

In this first arrangement example, since the two voltage supply lines 741-1 and 741-2 are arranged for two columns of pixels, the number of voltage supply lines 741 arrayed in the pixel array unit 20 approximately equals to the number of columns of pixels 51.

B of FIG. 33 is a plan view illustrating a second arrangement example of voltage supply lines.

In the second arrangement example, two voltage supply lines 741-1 and 741-2 are wired along the vertical direction for one pixel column of a plurality of pixels 51 two-dimensionally arranged in a matrix.

The voltage supply line 741-1 is connected to the P+ semiconductor region 73-1 of the signal retrieving unit 65-1, which is one of the two signal retrieving units 65 located in the pixel 51. The voltage supply line 741-2 is connected to the P+ semiconductor region 73-2 of the signal retrieving unit 65-2, which is the other of the two signal retrieving units 65 located in the pixel 51.

In this second arrangement example, since the two voltage supply lines 741-1 and 741-2 are wired for one pixel column, four voltage supply lines 741 are arranged for two pixel columns. The number of voltage supply lines 741 arrayed in the pixel array unit 20 is about twice the number of columns of the pixels 51.

Both of the arrangement examples in A and B of FIG. 33 have a periodic arrangement in which a configuration with the voltage supply line 741-1 connected to the P+ semiconductor region 73-1 of the signal retrieving unit 65-1, and the voltage supply line 741-2 connected to the P+ semiconductor region 73-2 of the signal retrieving unit 65-2 is periodically repeated for pixels put side-by-side in the vertical direction.

In the first arrangement example in A of FIG. 33, the number of voltage supply lines 741-1 and 741-2 wired in the pixel array unit 20 can be decreased.

In the second arrangement example in B of FIG. 33, the number of wirings is large as compared with the first arrangement example, but the number of signal retrieving units 65 connected to one voltage supply line 741 is halved; accordingly, the load on the wiring can be reduced, which is effective for higher-speed driving or when the total number of pixels in the pixel array unit 20 is larger.

A of FIG. 34 is a plan view illustrating a third arrangement example of voltage supply lines.

The third arrangement example is an example in which two voltage supply lines 741-1 and 741-2 are arranged for two columns of pixels, similarly to the first arrangement example in A of FIG. 33.

The third arrangement example differs from the first arrangement example in A of FIG. 33 in that the connection destinations of the signal retrieving units 65-1 and 65-2 are different between two pixels put side-by-side in the vertical direction.

Specifically, for example, in a certain pixel 51, the voltage supply line 741-1 is connected to the P+ semiconductor region 73-1 of the signal retrieving unit 65-1, and the voltage supply line 741-2 is connected to the P+ semiconductor region 73-2 of the signal retrieving unit 65-2, whereas in a pixel 51 below or above the certain pixel 51, the voltage supply line 741-1 is connected to the P+ semiconductor region 73-2 of the signal retrieving unit 65-2, and the voltage supply line 741-2 is connected to the P+ semiconductor region 73-1 of the signal retrieving unit 65-1.

B of FIG. 34 is a plan view illustrating a fourth arrangement example of voltage supply lines.

The fourth arrangement example is an example in which two voltage supply lines 741-1 and 741-2 are arranged for two columns of pixels, similarly to the second arrangement example in B of FIG. 33.

The fourth arrangement example differs from the second arrangement example in B of FIG. 33 in that the connection destinations of the signal retrieving units 65-1 and 65-2 are different between two pixels put side-by-side in the vertical direction.

Specifically, for example, in a certain pixel 51, the voltage supply line 741-1 is connected to the P+ semiconductor region 73-1 of the signal retrieving unit 65-1, and the voltage supply line 741-2 is connected to the P+ semiconductor region 73-2 of the signal retrieving unit 65-2, whereas in a pixel 51 below or above the certain pixel 51, the voltage supply line 741-1 is connected to the P+ semiconductor region 73-2 of the signal retrieving unit 65-2, and the voltage supply line 741-2 is connected to the P+ semiconductor region 73-1 of the signal retrieving unit 65-1.

In the third arrangement example in A of FIG. 34, the number of voltage supply lines 741-1 and 741-2 wired in the pixel array unit 20 can be decreased.

In the fourth arrangement example in B of FIG. 34, the number of wirings is large as compared with the third arrangement example, but the number of signal retrieving units 65 connected to one voltage supply line 741 is halved;

accordingly, the load on the wiring can be reduced, which is effective for higher-speed driving or when the total number of pixels in the pixel array unit 20 is larger.

Both of the arrangement examples in A and B of FIG. 34 have a mirror arrangement in which the connection destinations of two pixels adjacent above and below (in the vertical direction) are mirror-inverted.

Figure 35:
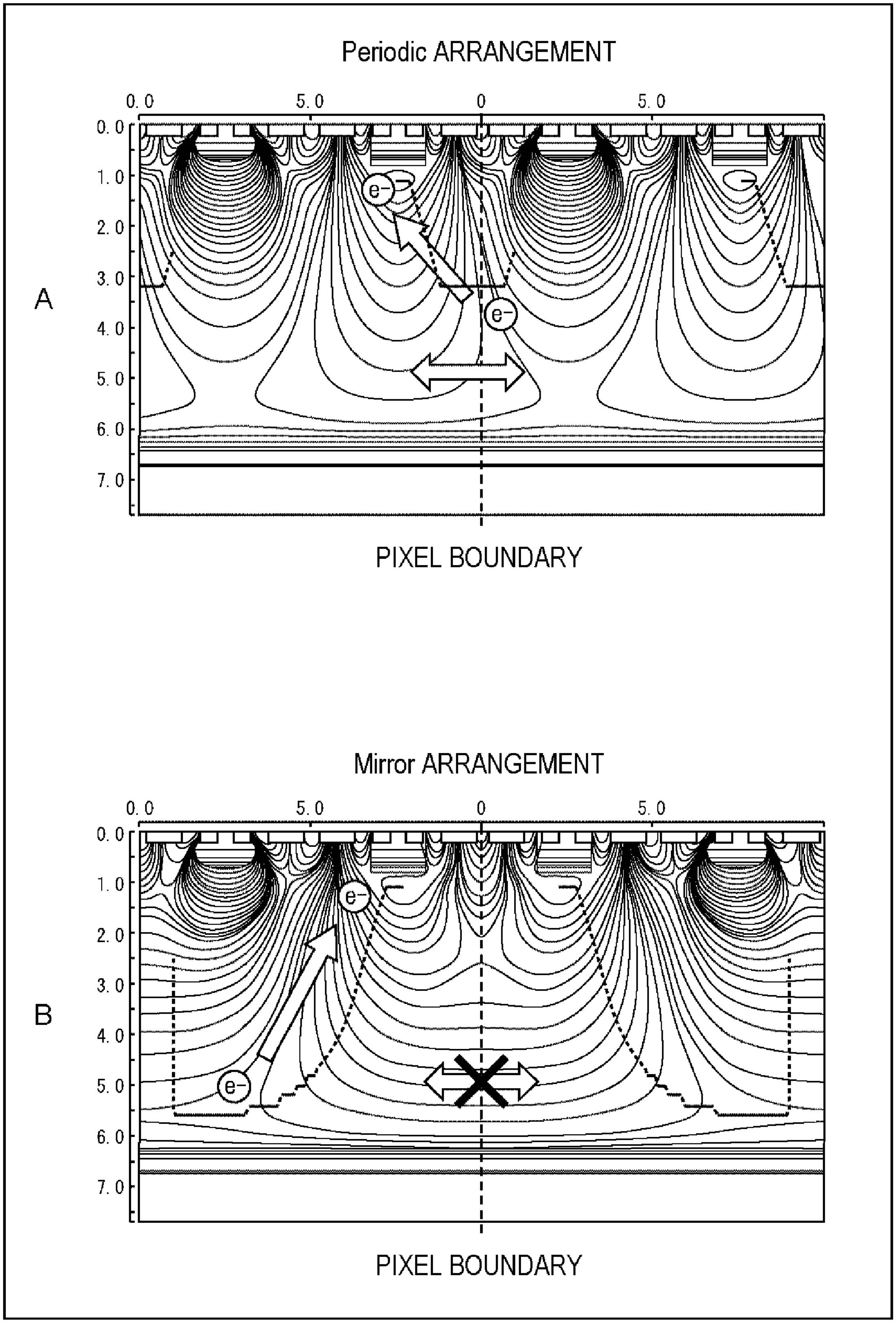
FIG. 35 is a diagram for explaining the characteristics of the periodic arrangement and the mirror arrangement.

In the periodic arrangement, as illustrated in A of FIG. 35, voltages applied to two signal retrieving units 65 adjacent across the pixel boundary are different voltages, such that charge exchange occurs between the adjacent pixels. Therefore, the charge transfer efficiency is superior to that of the mirror arrangement, but the crosstalk characteristics between adjacent pixels are inferior to that of the mirror arrangement.

Meanwhile, in the mirror arrangement, as illustrated in B of FIG. 35, voltages applied to two signal retrieving units 65 adjacent across the pixel boundary are the same voltage, such that charge exchange between the adjacent pixels is suppressed. Therefore, although the charge transfer efficiency is inferior to that of the periodic arrangement, the crosstalk characteristics between adjacent pixels are superior to that of the periodic arrangement.

Cross-Sectional Configuration of Plurality of Pixels According to Fourteenth Embodiment In the cross-sectional configurations of the pixel illustrated in FIG. 2 and other drawings, the illustration of a multilayer wiring layer formed on a front surface side of the substrate 61 opposite to the light entrance surface is omitted.

Therefore, in the following, cross-sectional views of a plurality of pixels that are adjacent will be indicated for some of the above-described embodiments in a form without omitting the multilayer wiring layer.

Figure 36:
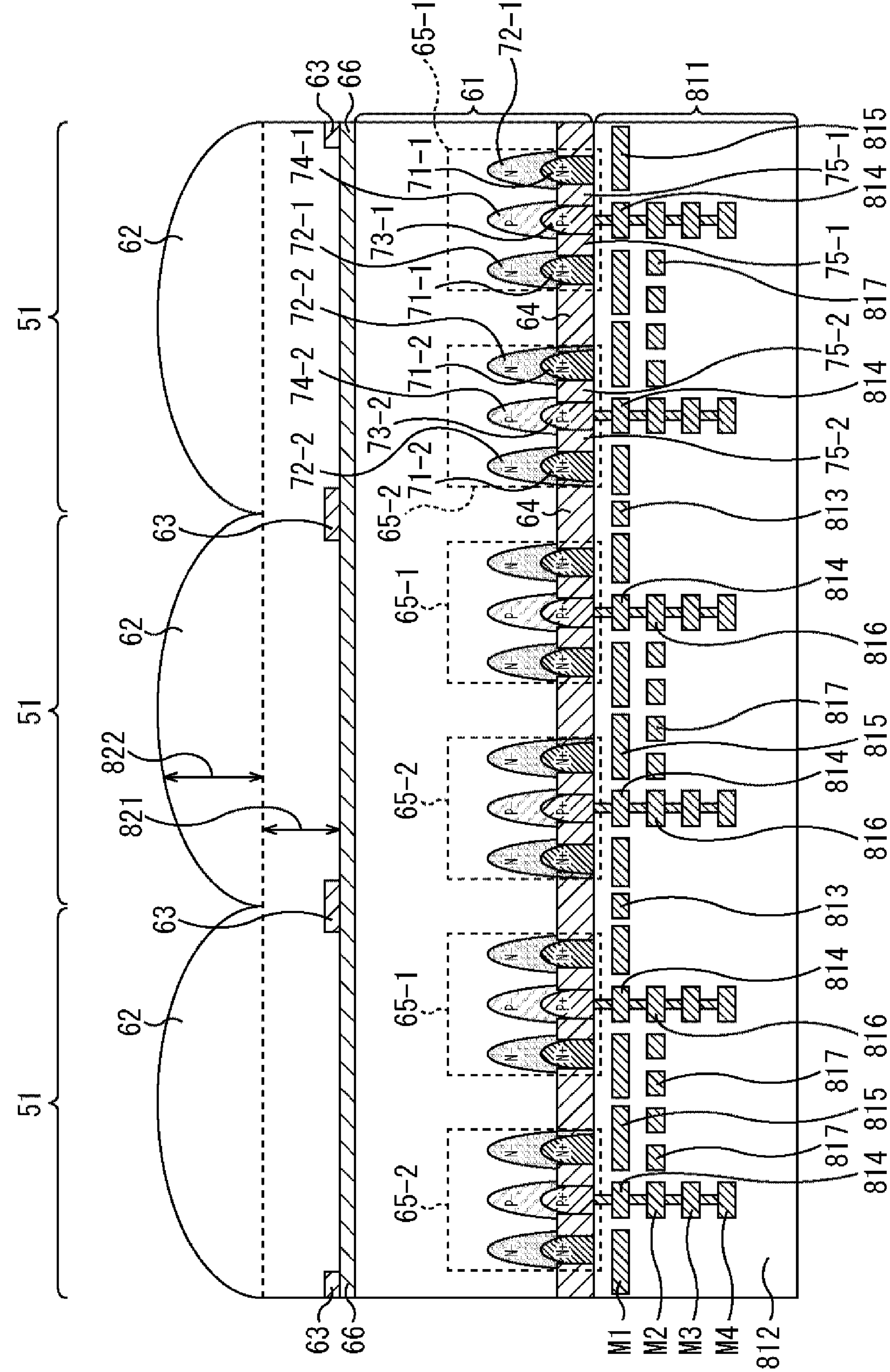
FIG. 36 is a cross-sectional view of a plurality of pixels in a fourteenth embodiment.
Figure 37:
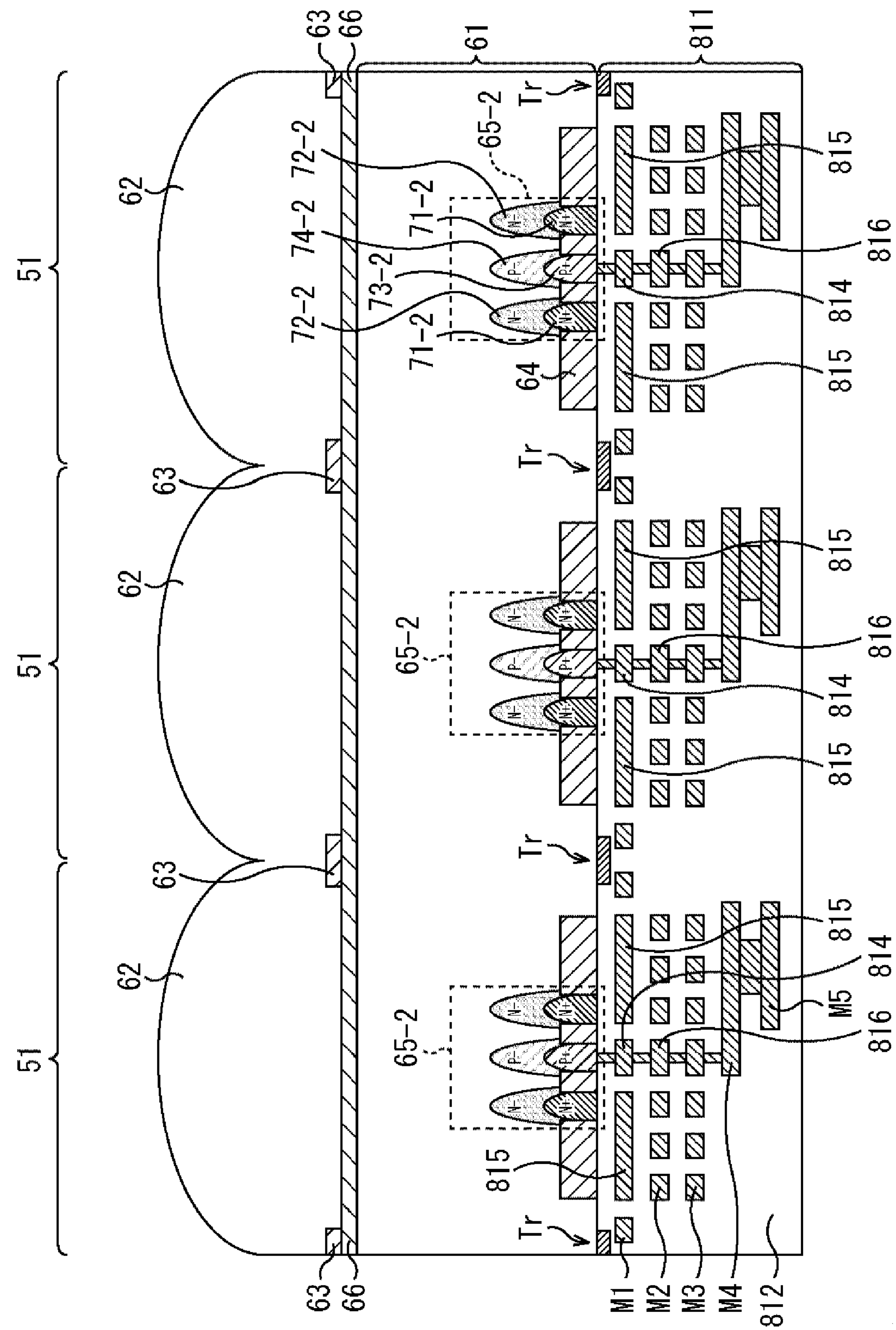
FIG. 37 is a cross-sectional view of a plurality of pixels in the fourteenth embodiment.

Firstly, cross-sectional views of a plurality of pixels according to the fourteenth embodiment illustrated in FIG. 28 will be illustrated in FIGS. 36 and 37.

The fourteenth embodiment illustrated in FIG. 28 has a pixel configuration including the reflecting member 631 having a large area on an opposite side of the light entrance surface of the substrate 61.

FIG. 36 corresponds to a cross-sectional view taken along the B-B' line in FIG. 11, and FIG. 37 corresponds to a cross-sectional view taken along the A-A' line in FIG. 11. Furthermore, a cross-sectional view taken along the C-C' line in FIG. 17 can also be illustrated as in FIG. 36.

As illustrated in FIG. 36, in each pixel 51, the oxide film 64 is formed in the central portion, and the signal retrieving units 65-1 and 65-2 are formed on two respective sides of this oxide film 64.

In the signal retrieving unit 65-1, the N+ semiconductor region 71-1 and the N− semiconductor region 72-1 are formed so as to surround the circumferences of the P+ semiconductor region 73-1 and the P− semiconductor region 74-1, with these P+ semiconductor region 73-1 and P− semiconductor region 74-1 as the center. The P+ semiconductor region 73-1 and the N+ semiconductor region 71-1 are in contact with a multilayer wiring layer 811. The P− semiconductor region 74-1 is arranged above the P+ semiconductor region 73-1 (on the side of the on-chip lens 62) so as to cover the P+ semiconductor region 73-1, and the N− semiconductor region 72-1 is arranged above the N+ semiconductor region 71-1 (on the side of the on-chip lens 62) so as to cover the N+ semiconductor region 71-1. In different terms, the P+ semiconductor region 73-1 and the N+ semiconductor region 71-1 are arranged on the side of the multilayer wiring layer 811 in the substrate 61, and the N− semiconductor region 72-1 and the P− semiconductor region 74-1 are arranged on the side of the on-chip lens 62 in the substrate 61. Furthermore, the isolation portion 75-1 for isolating the N+ semiconductor region 71-1 and the P+ semiconductor region 73-1 from each other is formed by an oxide film or the like between these regions.

In the signal retrieving unit 65-2, the N+ semiconductor region 71-2 and the N− semiconductor region 72-2 are formed so as to surround the circumferences of the P+ semiconductor region 73-2 and the P− semiconductor region 74-2, with these P+ semiconductor region 73-2 and P− semiconductor region 74-2 as the center. The P+ semiconductor region 73-2 and the N+ semiconductor region 71-2 are in contact with the multilayer wiring layer 811. The P− semiconductor region 74-2 is arranged above the P+ semiconductor region 73-2 (on the side of the on-chip lens 62) so as to cover the P+ semiconductor region 73-2, and the N− semiconductor region 72-2 is arranged above the N+ semiconductor region 71-2 (on the side of the on-chip lens 62) so as to cover the N+ semiconductor region 71-2. In different terms, the P+ semiconductor region 73-2 and the N+ semiconductor region 71-2 are arranged on the side of the multilayer wiring layer 811 in the substrate 61, and the N− semiconductor region 72-2 and the P− semiconductor region 74-2 are arranged on the side of the on-chip lens 62 in the substrate 61. Furthermore, the isolation portion 75-2 for isolating the N+ semiconductor region 71-2 and the P+ semiconductor region 73-2 from each other is also formed by an oxide film or the like between these regions.

The oxide film 64 is also formed between the N+ semiconductor region 71-1 of the signal retrieving unit 65-1 of a predetermined pixel 51 and the N+ semiconductor region 71-2 of the signal retrieving unit 65-2 of a pixel 51 neighboring to the predetermined pixel 51, which is a boundary region between neighboring pixels 51.

The fixed charge film 66 is formed on an interface of the substrate 61 on the light entrance surface side (the upper surface in FIGS. 36 and 37).

As illustrated in FIG. 36, when the on-chip lens 62 formed for each pixel on the light entrance surface side of the substrate 61 is divided into a raised portion 821 in which the thickness is uniformly raised over the entire region in the pixel in a height direction, and a curved surface portion 822 having different thicknesses depending on positions in the pixel, the thickness of the raised portion 821 is formed thinner than the thickness of the curved surface portion 822. A thicker thickness of the raised portion 821 more easily allows the reflection of oblique entering light by the inter-pixel light-shielding film 63, and thus oblique entering light can also be taken into the substrate 61 by forming the thickness of the raised portion 821 thinner. Furthermore, as the thickness of the curved surface portion 822 is made thicker, entering light can be condensed at the pixel center.

The multilayer wiring layer 811 is formed on an opposite side of the light entrance surface side of the substrate 61 on which the on-chip lens 62 is formed for each pixel. In different terms, the substrate 61, which is a semiconductor layer, is arranged between the on-chip lens 62 and the multilayer wiring layer 811. The multilayer wiring layer 811 is constituted by five layers of metal films M1 to M5 and an interlayer insulating film 812 between the metal films M1 to M5. Note that, in FIG. 36, among the five layers of metal films M1 to M5 of the multilayer wiring layer 811, the outermost metal film M5 is not illustrated because the metal film M5 is located at an invisible place; however, in FIG. 37, which is a cross-sectional view in a different direction from the cross-sectional view of FIG. 36, the metal film M5 is illustrated.

As illustrated in FIG. 37, a pixel transistor Tr is formed in the pixel boundary region at an interface portion between the multilayer wiring layer 811 and the substrate 61. The pixel transistor Tr is any one of the transfer transistor 721, the reset transistor 723, the amplification transistor 724, and the select transistor 725 illustrated in FIGS. 31 and 32.

Among the five layers of metal films M1 to M5 of the multilayer wiring layer 811, the metal film M1 closest to the substrate 61 includes a power supply line 813 for supplying a power supply voltage, a voltage application wiring 814 for applying a predetermined voltage to the P+ semiconductor region 73-1 or 73-2, and a reflecting member 815, which is a member that reflects entering light. In the metal film M1 in FIG. 36, wirings other than the power supply lines 813 and the voltage application wirings 814 are the reflecting members 815, but some reference numerals are omitted to prevent the drawing from being complicated. The reflecting member 815 is a dummy wiring provided for the purpose of reflecting entering light, and corresponds to the reflecting member 631 illustrated in FIG. 28. The reflecting member 815 is arranged below the N+ semiconductor regions 71-1 and 71-2, which are charge detection units, so as to overlap with the N+ semiconductor regions 71-1 and 71-2 when viewed in plan. Note that, in a case where the light-shielding member 631' of the fifteenth embodiment is provided instead of the reflecting member 631 of the fourteenth embodiment illustrated in FIG. 28, the portion of the reflecting member 815 in FIG. 36 is employed as the light-shielding member 631'.

Furthermore, in the metal film M1, a charge retrieving wiring (not illustrated in FIG. 36) that connects the N+ semiconductor region 71 and the transfer transistor 721 is also formed in order to transfer a charge accumulated in the N+ semiconductor region 71 to the FD 722.

Note that, in this example, the reflecting member 815 (reflecting member 631) and the charge retrieving wiring are arranged in the same layer, namely, the metal film M1, but are not necessarily limited to being arranged in the same layer.

In the metal film M2, which is the second layer from the side of the substrate 61, for example, a voltage application wiring 816 connected to the voltage application wiring 814 on the metal film M1, a control line 817 that sends the drive signal TRG, the drive signal RST, the select signal SEL, the drive signal FDG, and the like, a ground line, and the like are formed. Furthermore, the FD 722B and the additional capacitance 727A are formed in the metal film M2.

In the metal film M3, which is the third layer from the side of the substrate 61, for example, the vertical signal line 29, a VSS wiring for shielding, and the like are formed.

In the metal films M4 and M5, which are the fourth and fifth layers from the side of the substrate 61, for example, the voltage supply lines 741-1 and 741-2 (FIGS. 33 and 34) for applying the predetermined voltage MIX0 or MIX1 to the P+ semiconductor regions 73-1 and 73-2, which are voltage application units of the signal retrieving units 65, are formed.

Note that the planar arrangement of the five layers of metal films M1 to M5 of the multilayer wiring layer 811 will be described later with reference to FIGS. 42 and 43.

Figure 38:
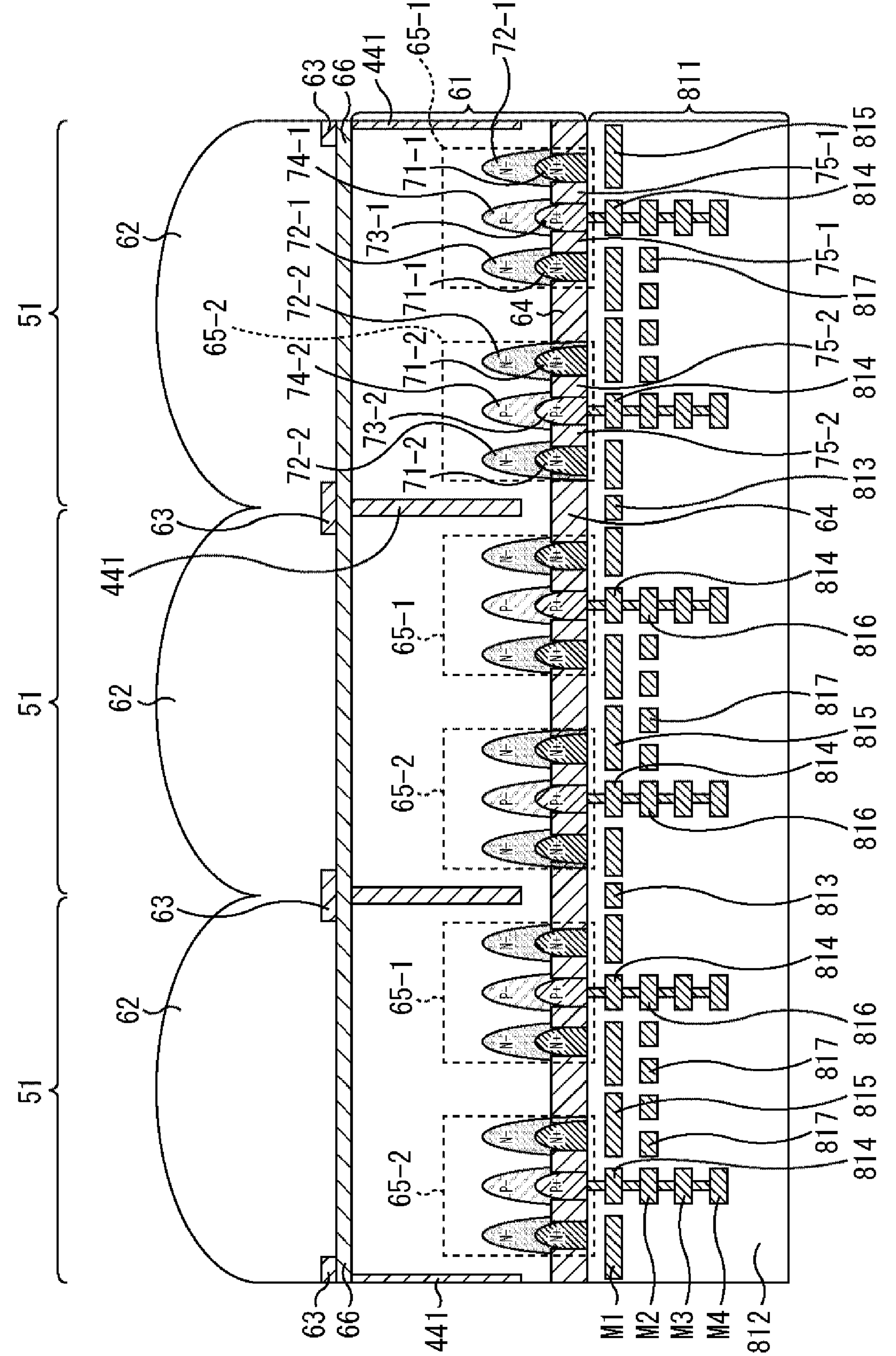
FIG. 38 is a cross-sectional view of a plurality of pixels in a ninth embodiment.

Cross-Sectional Configuration of Plurality of Pixels According to Ninth Embodiment FIG. 38 is a cross-sectional view illustrating the pixel structure of the ninth embodiment illustrated in FIG. 22 for a plurality of pixels in a form without omitting the multilayer wiring layer.

The ninth embodiment illustrated in FIG. 22 has a configuration of a pixel including the isolation region 441 obtained by forming a long groove (trench) from a back surface (light entrance surface) side of the substrate 61 to a predetermined depth at the pixel boundary portion in the substrate 61, and embedding a light-shielding film into the groove.

Other configurations including the signal retrieving units 65-1 and 65-2, the five layers of metal films M1 to M5 of the multilayer wiring layer 811, and the like are similar to the configurations illustrated in FIG. 36.

Figure 39:
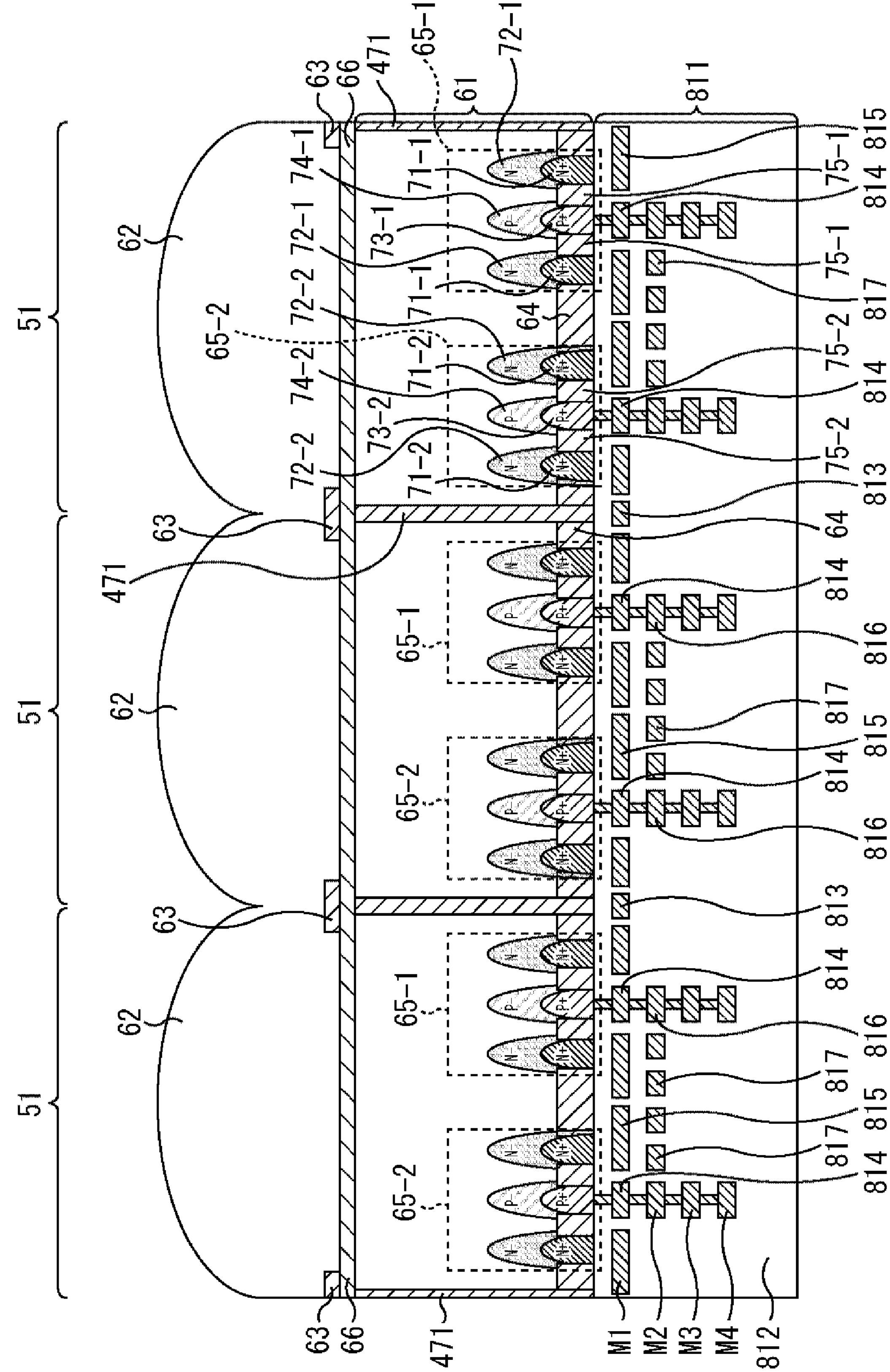
FIG. 39 is a cross-sectional view of a plurality of pixels in a first modification of the ninth embodiment.

Cross-Sectional Configuration of Plurality of Pixels According to First Modification of Ninth Embodiment FIG. 39 is a cross-sectional view illustrating the pixel structure of the first modification of the ninth embodiment illustrated in FIG. 23 for a plurality of pixels in a form without omitting the multilayer wiring layer.

The first modification of the ninth embodiment illustrated in FIG. 23 has a configuration of a pixel including the isolation region 471 that passes through the entire substrate 61 at the pixel boundary portion in the substrate 61.

Other configurations including the signal retrieving units 65-1 and 65-2, the five layers of metal films M1 to M5 of the multilayer wiring layer 811, and the like are similar to the configurations illustrated in FIG. 36.

Figure 40:
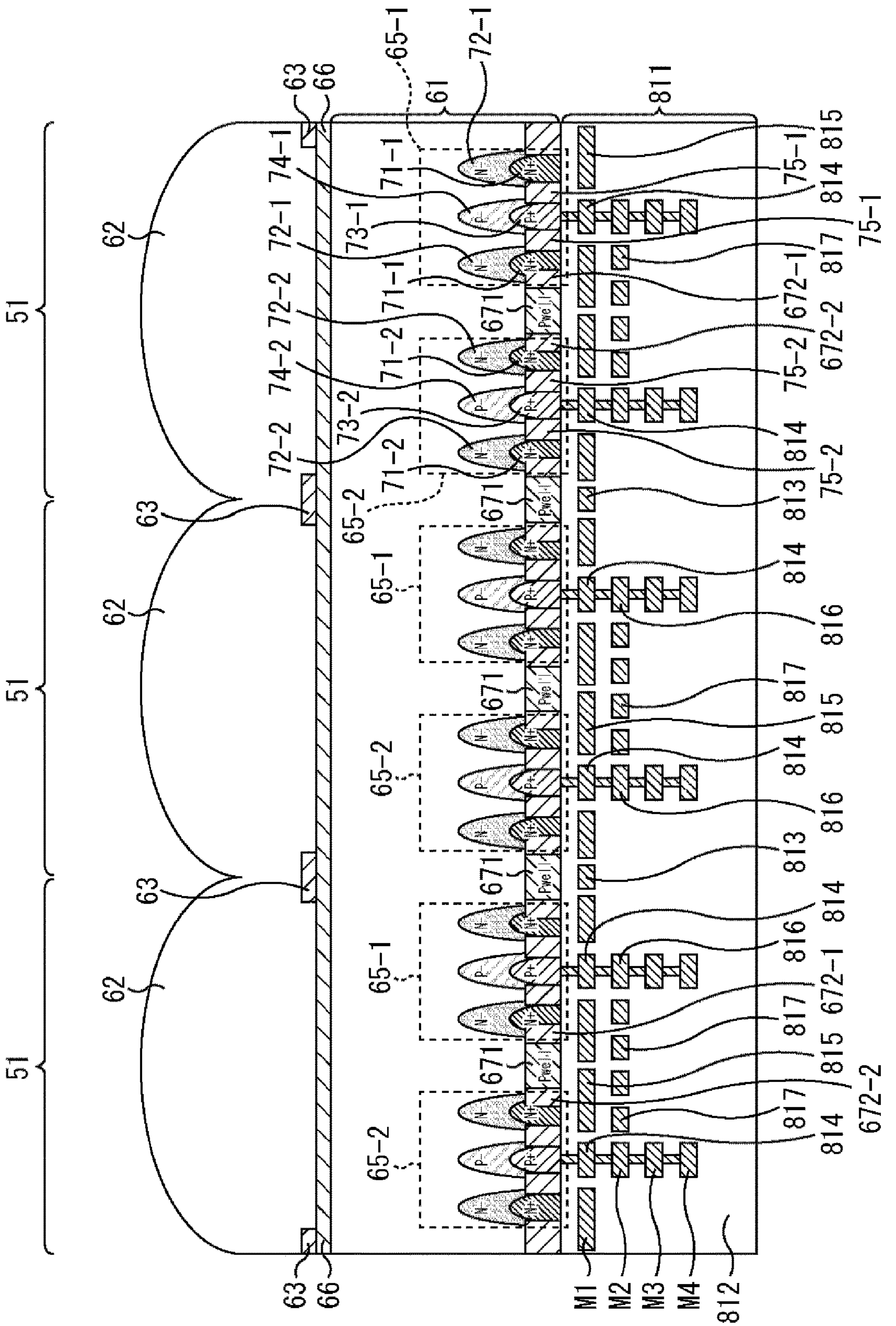
FIG. 40 is a cross-sectional view of a plurality of pixels in a fifteenth embodiment.

Cross-Sectional Configuration of Plurality of Pixels According to Sixteenth Embodiment FIG. 40 is a cross-sectional view illustrating the pixel structure of the sixteenth embodiment illustrated in FIG. 29 for a plurality of pixels in a form without omitting the multilayer wiring layer.

The sixteenth embodiment illustrated in FIG. 29 has a configuration including the P-well region 671 in the center portion on a surface of the substrate 61 opposite to the light entrance surface, that is, on an inner side of a surface on a lower side in the drawing. Furthermore, the isolation portion 672-1 is formed by an oxide film or the like between the P-well region 671 and the N+ semiconductor region 71-1. Similarly, the isolation portion 672-2 is also formed by an oxide film or the like between the P-well region 671 and the N+ semiconductor region 71-2. The P-well region 671 is also formed at the pixel boundary portion of a surface of the substrate 61 on a lower side.

Other configurations including the signal retrieving units 65-1 and 65-2, the five layers of metal films M1 to M5 of the multilayer wiring layer 811, and the like are similar to the configurations illustrated in FIG. 36.

Figure 41:
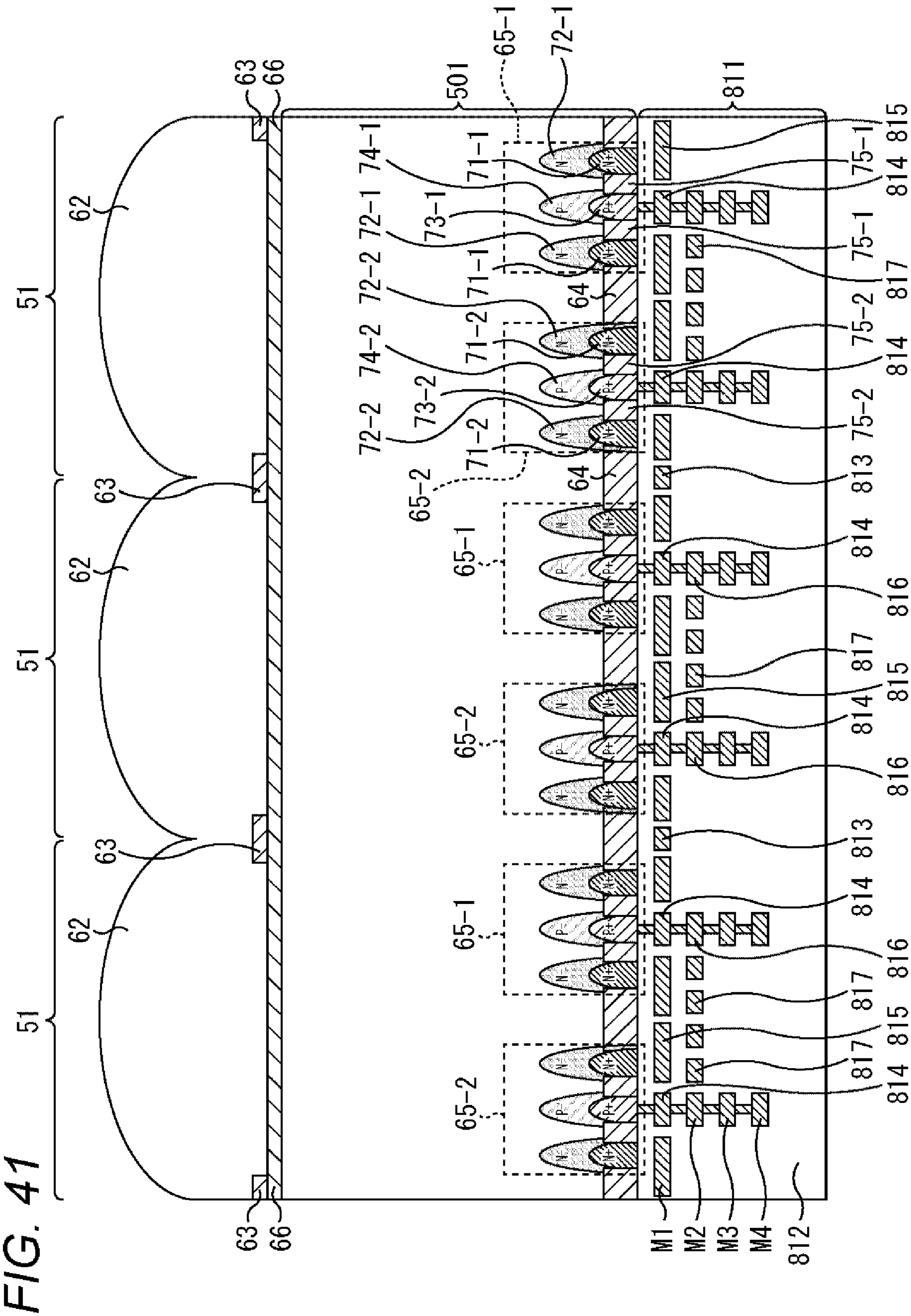
FIG. 41 is a cross-sectional view of a plurality of pixels in a tenth embodiment.

Cross-Sectional Configuration of Plurality of Pixels According to Tenth Embodiment FIG. 41 is a cross-sectional view illustrating the pixel structure of the tenth embodiment illustrated in FIG. 24 for a plurality of pixels in a form without omitting the multilayer wiring layer.

The tenth embodiment illustrated in FIG. 24 has a configuration of a pixel in which the substrate 501 having a thicker substrate thickness is provided instead of the substrate 61.

Other configurations including the signal retrieving units 65-1 and 65-2, the five layers of metal films M1 to M5 of the multilayer wiring layer 811, and the like are similar to the configurations illustrated in FIG. 36.

Planar Arrangement Example of Five Layers of Metal Films M1 to M5

Next, a planar arrangement example of the five layers of metal films M1 to M5 of the multilayer wiring layer 811 illustrated in FIGS. 36 to 41 will be described with reference to FIGS. 42 and 43.

Figure 42:
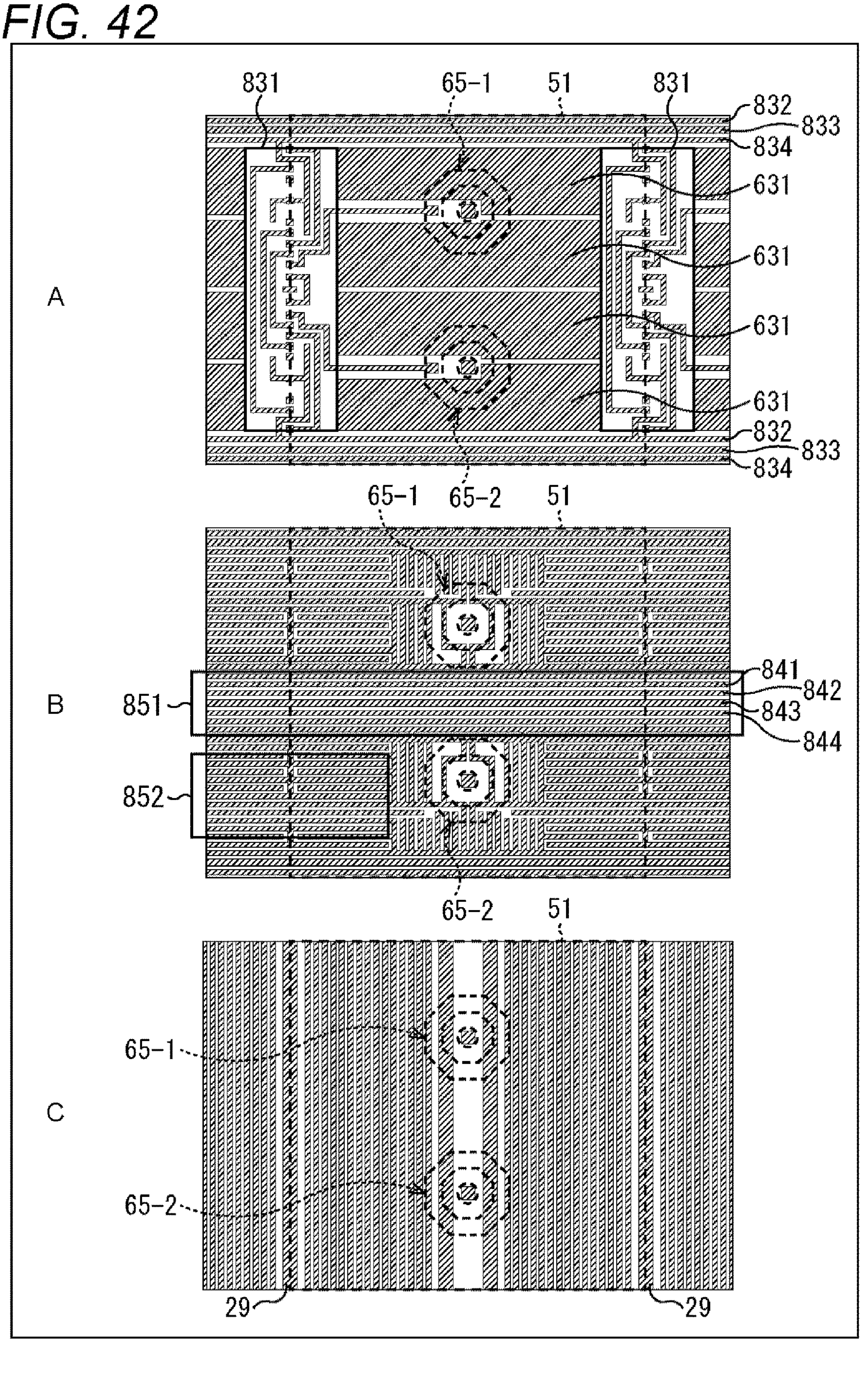
FIG. 42 is a diagram for explaining five-layer metal films of a multilayer wiring layer.

A of FIG. 42 illustrates a planar arrangement example of the metal film M1, which is the first layer among the five layers of metal films M1 to M5 of the multilayer wiring layer 811.

B of FIG. 42 illustrates a planar arrangement example of the metal film M2, which is the second layer among the five layers of metal films M1 to M5 of the multilayer wiring layer 811.

C of FIG. 42 illustrates a planar arrangement example of the metal film M3, which is the third layer among the five layers of metal films M1 to M5 of the multilayer wiring layer 811.

Figure 43:
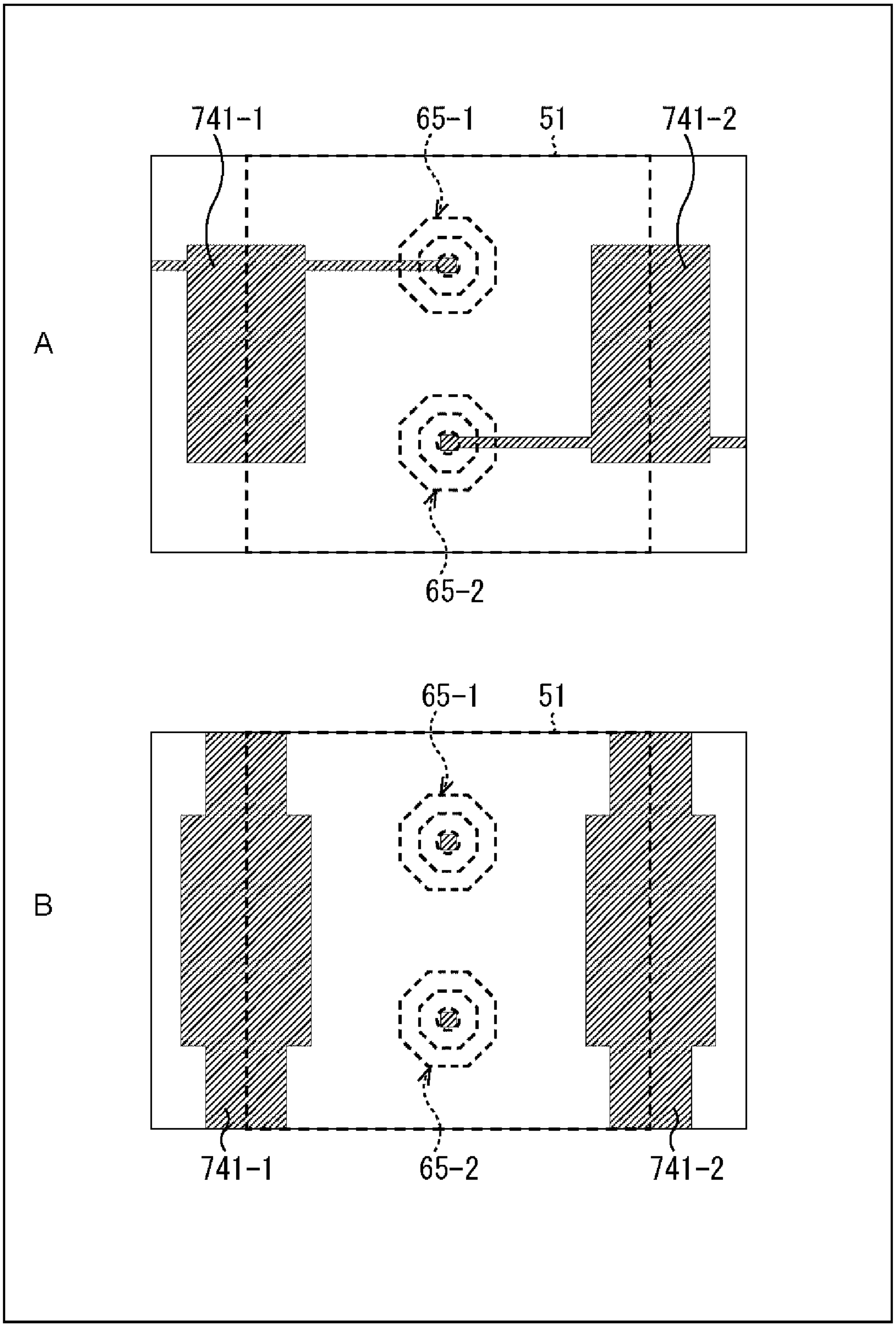
FIG. 43 is a diagram for explaining five-layer metal films of a multilayer wiring layer.

A of FIG. 43 illustrates a planar arrangement example of the metal film M4, which is the fourth layer among the five layers of metal films M1 to M5 of the multilayer wiring layer 811.

B of FIG. 43 illustrates a planar arrangement example of the metal film M5, which is the fifth layer among the five layers of metal films M1 to M5 of the multilayer wiring layer 811.

Note that, in A to C of FIG. 42 and A and B of FIG. 43, the region of the pixel 51 and the regions of the signal retrieving units 65-1 and 65-2 having octagonal shapes illustrated in FIG. 11 are indicated by broken lines.

In A to C of FIG. 42 and A and B of FIG. 43, the longitudinal direction in the drawing is the vertical direction of the pixel array unit 20, and the lateral direction in the drawing is the horizontal direction of the pixel array unit 20.

As illustrated in A of FIG. 42, the reflecting member 631 that reflects infrared light is formed on the metal film M1, which is the first layer of the multilayer wiring layer 811. In the region of the pixel 51, two pieces of the reflecting members 631 are formed for each of the signal retrieving units 65-1 and 65-2, and two pieces of the reflecting members 631 for the signal retrieving unit 65-1 and two pieces of the reflecting members 631 for the signal retrieving unit 65-1 are formed symmetrically with respect to the vertical direction.

Furthermore, a pixel transistor wiring region 831 is arranged between the reflecting members 631 of neighboring pixels 51 in the horizontal direction. In the pixel transistor wiring region 831, a wiring that connects between the pixel transistors Tr, namely, the transfer transistor 721, the reset transistor 723, the amplification transistor 724, or the select transistor 725, is formed. This wiring for the pixel transistors Tr is also formed symmetrically in the vertical direction with an intermediate line (not illustrated) between the two signal retrieving units 65-1 and 65-2 as a reference.

In addition, wirings such as a ground line 832, a power supply line 833, and a ground line 834 are formed between the reflecting members 631 of neighboring pixels 51 in the vertical direction. These wirings are also formed symmetrically in the vertical direction with an intermediate line between the two signal retrieving units 65-1 and 65-2 as a reference.

As described above, the metal film M1 at the first layer is arranged symmetrically between the region on the side of the signal retrieving unit 65-1 and the region on the side of the signal retrieving unit 65-2 in the pixel, such that the wiring load is adjusted equally between the signal retrieving units 65-1 and 65-2. Consequently, drive variations between the signal retrieving units 65-1 and 65-2 are reduced.

In the metal film M1 at the first layer, the reflecting members 631 having a large area is formed on a lower side of the signal retrieving units 65-1 and 65-2 formed on the substrate 61, and owing to this configuration, infrared light that has entered the substrate 61 via the on-chip lens 62 and has been transmitted through the substrate 61 without being photoelectrically converted in the substrate 61 can be reflected by the reflecting members 631 and caused to enter again the substrate 61. Consequently, the amount of infrared light photoelectrically converted in the substrate 61 can be further expanded, and the quantum efficiency (QE), that is, the sensitivity of the pixel 51 with respect to infrared light can be improved.

Meanwhile, in the metal film M1 at the first layer, in a case where the light-shielding member 631' is arranged in the same region as the reflecting member 631 instead of the reflecting member 631, it can be suppressed that infrared light that has entered the substrate 61 through the light entrance surface via the on-chip lens 62 and has been transmitted through the substrate 61 without being photoelectrically converted in the substrate 61 is scattered in the wiring layer and enters a pixel in the vicinity. Consequently, light can be avoided from being erroneously sensed at a pixel in the vicinity.

In the metal film M2, which is the second layer of the multilayer wiring layer 811, a control line region 851 formed with control lines 841 to 844 and the like that send predetermined signals in the horizontal direction is arranged at a position between the signal retrieving units 65-1 and 65-2, as illustrated in B of FIG. 42. The control lines 841 to 844 are lines that send, for example, the drive signal TRG, the drive signal RST, the select signal SEL, or the drive signal FDG.

By arranging the control line region 851 between two signal retrieving units 65, the influence on the respective signal retrieving units 65-1 and 65-2 becomes equal, and drive variations between the signal retrieving units 65-1 and 65-2 can be reduced.

Furthermore, in a predetermined region different from the control line region 851 of the metal film M2, which is the second layer, a capacitance region 852 formed with the FD 722B and the additional capacitance 727A is arranged. In the capacitance region 852, the FD 722B or the additional capacitance 727A is configured by patterning and forming the metal film M2 in a comb-teeth shape.

By arranging the FD 722B or the additional capacitance 727A on the metal film M2, which is the second layer, the pattern of the FD 722B or the additional capacitance 727A can be freely arranged according to the desired wiring capacitance in the design, and the degree of design freedom can be improved.

As illustrated in C of FIG. 42, in the metal film M3, which is the third layer of the multilayer wiring layer 811, at least the vertical signal line 29 that sends the pixel signal output from each pixel 51 to the column processing unit 23 is formed. Three or more vertical signal lines 29 can be arranged for one pixel column in order to improve the reading speed of the pixel signal. Furthermore, in addition to the vertical signal line 29, a shield wiring may be arranged to reduce the coupling capacitance.

In the metal film M4 and the metal film M5, which are the fourth layer and the fifth layer of the multilayer wiring layer 811, the voltage supply lines 741-1 and 741-2 for applying the predetermined voltage MIX0 or MIX1 to the P+ semiconductor regions 73-1 and 73-2 of the signal retrieving unit 65 of each pixel 51 are formed.

The metal films M4 and M5 illustrated in A and B of FIG. 43 indicate an example of a case where the voltage supply lines 741 of the first arrangement example illustrated in A of FIG. 33 is adopted.

The voltage supply line 741-1 on the metal film M4 is connected to the voltage application wiring 814 (for example, FIG. 36) on the metal film M1 via the metal films M3 and M2, and the voltage application wiring 814 is connected to the P+ semiconductor region 73-1 of the signal retrieving unit 65-1 of the pixel 51. Similarly, the voltage supply line 741-2 on the metal film M4 is connected to the voltage application wiring 814 (for example, FIG. 36) on the metal film M1 via the metal films M3 and M2, and the voltage application wiring 814 is connected to the P+ semiconductor region 73-2 of the signal retrieving unit 65-2 of the pixel 51.

The voltage supply lines 741-1 and 741-2 on the metal film M5 are connected to the tap drive unit 21 in the periphery of the pixel array unit 20. The voltage supply line 741-1 on the metal film M4 and the voltage supply line 741-1 on the metal film M5 are connected by a via or the like (not illustrated) at a predetermined position where both of the metal films are present in a planar region. The predetermined voltage MIX0 or MIX1 from the tap drive unit 21 is sent on the voltage supply lines 741-1 and 741-2 on the metal film M5 to be supplied to the voltage supply lines 741-1 and 741-2 on the metal film M4 and, thereafter is supplied to the voltage application wiring 814 on the metal film M1 via the metal films M3 and M2 from the voltage supply lines 741-1 and 741-2.

By configuring the light receiving element 1 as a backside illuminated CAPD sensor, the wiring width and layout of the drive wiring can be freely designed, for example, as illustrated in A and B of FIG. 43, the voltage supply lines 741-1 and 741-2 for applying the predetermined voltage MIX0 or MIX1 to the signal retrieving unit 65 of each pixel 51 can be wired in the vertical direction. Furthermore, wiring suitable for high-speed driving and wiring taking load reduction into account are also allowed.

Planar Arrangement Example of Pixel Transistor

Figure 44:
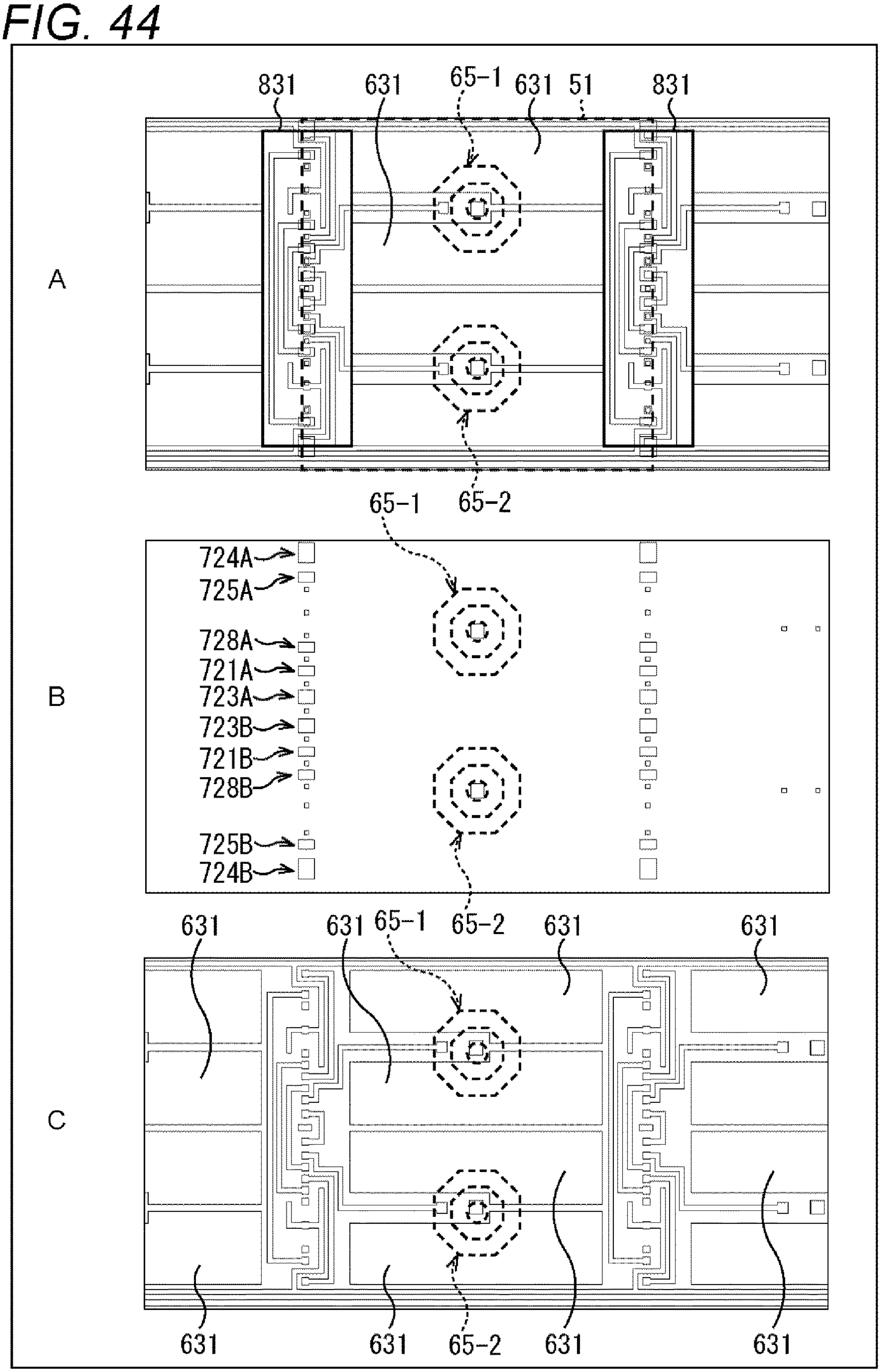
FIG. 44 is a diagram for explaining a polysilicon layer.

FIG. 44 is a plan view in which the metal film M1 at the first layer illustrated in A of FIG. 42 is overlaid on a polysilicon layer that forms the gate electrode and the like of the pixel transistor Tr formed on top of the metal film M1.

A of FIG. 44 is a plan view in which the metal film M1 in C of FIG. 44 and the polysilicon layer in B of FIG. 44 are overlaid, B of FIG. 44 is a plan view of only the polysilicon layer, and C of FIG. 44 is a plan view of only the metal film M1. The plan view of the metal film M1 in C of FIG. 44 is the same as the plan view illustrated in A of FIG. 42, but the hatching is omitted.

As described with reference to A of FIG. 42, the pixel transistor wiring region 831 is formed between the reflecting members 631 of respective pixels.

In the pixel transistor wiring region 831, the pixel transistors Tr corresponding to the respective signal retrieving units 65-1 and 65-2 are arranged, for example, as illustrated in B of FIG. 44.

In B of FIG. 44, gate electrodes of the reset transistors 723A and 723B, the transfer transistors 721A and 721B, the switching transistors 728A and 728B, the select transistors 725A and 725B, and the amplification transistors 724A and 724B are formed from a side closer to an intermediate line (not illustrated) between the two signal retrieving units 65-1 and 65-2 with the intermediate line as a reference.

A wiring that connects the pixel transistors Tr on the metal film M1 illustrated in C of FIG. 44 is also formed symmetrically in the vertical direction with the intermediate line (not illustrated) between the two signal retrieving units 65-1 and 65-2 as a reference.

By arranging the plurality of pixel transistors Tr in the pixel transistor wiring region 831 symmetrically between the region on the side of the signal retrieving unit 65-1 and the region on the side of the signal retrieving unit 65-2 in this manner, drive variations between the signal retrieving units 65-1 and 65-2 can be reduced.

<Modification of Reflecting Member 631>

Next, a modification of the reflecting member 631 formed on the metal film M1 will be described with reference to FIGS. 45 and 46.

In the above-described example, as illustrated in A of FIG. 42, the reflecting member 631 having a large area is arranged in a region in the periphery of the signal retrieving unit 65 in the pixel 51.

Figure 45:
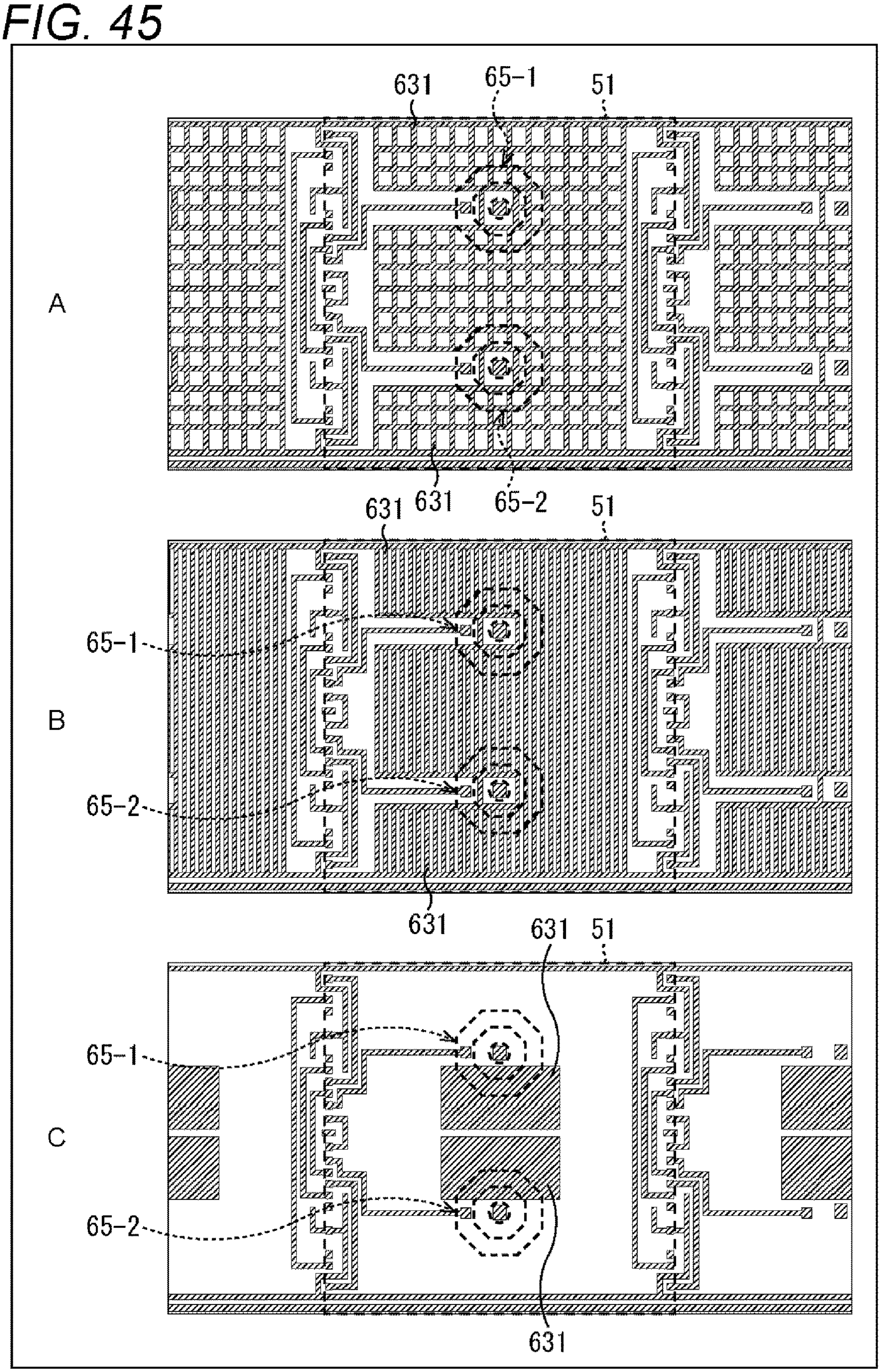
FIG. 45 is a diagram illustrating a modification of a reflecting member formed on a metal film.

On the other hand, the reflecting members 631 can be arranged, for example, in a lattice-shaped pattern as illustrated in A of FIG. 45. By forming the reflecting member 631 in a lattice-shaped pattern in this manner, the pattern anisotropy can be eliminated, and the XY anisotropy of the reflecting ability can be reduced. In different terms, by forming the reflecting member 631 in a lattice-shaped pattern, the reflection of entering light to a partial region that is localized can be reduced and can be easily reflected isotropically, whereby the ranging accuracy is improved.

Alternatively, the reflecting member 631 may be arranged, for example, in a stripe-shaped pattern as illustrated in B of FIG. 45. By forming the reflecting member 631 in a stripe-shaped pattern in this manner, the pattern of the reflecting member 631 can also be used as a wiring capacity, such that a configuration with a dynamic range extended to maximum can be implemented.

Note that B of FIG. 45 is an example of a stripe shape in the vertical direction, but a stripe shape in the horizontal direction may be employed.

Alternatively, the reflecting member 631 may be arranged, for example, only in the pixel central region, more specifically, only between two signal retrieving units 65, as illustrated in C of FIG. 45. When the reflecting member 631 is formed in the pixel central region and not formed at pixel ends in this manner, while the effect of improving the sensitivity is obtained by the reflecting member 631 in the pixel central region, a component reflected to an adjacent pixel in a case where oblique light has entered can be suppressed, and a configuration emphasizing the suppression of crosstalk can be implemented.

Figure 46:
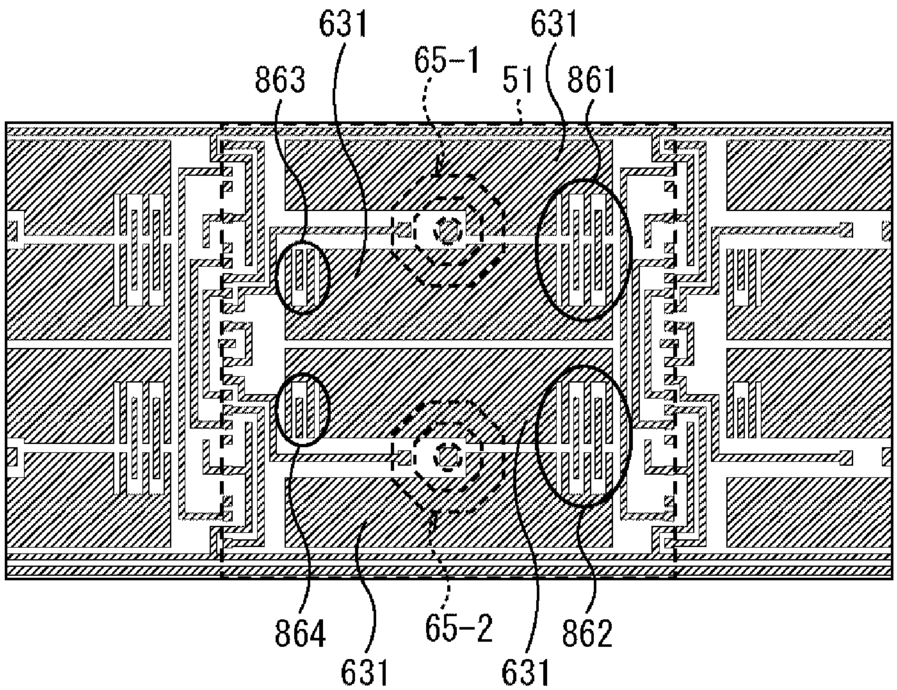
FIG. 46 is a diagram illustrating a modification of the reflecting member formed on a metal film.
Figure 46:
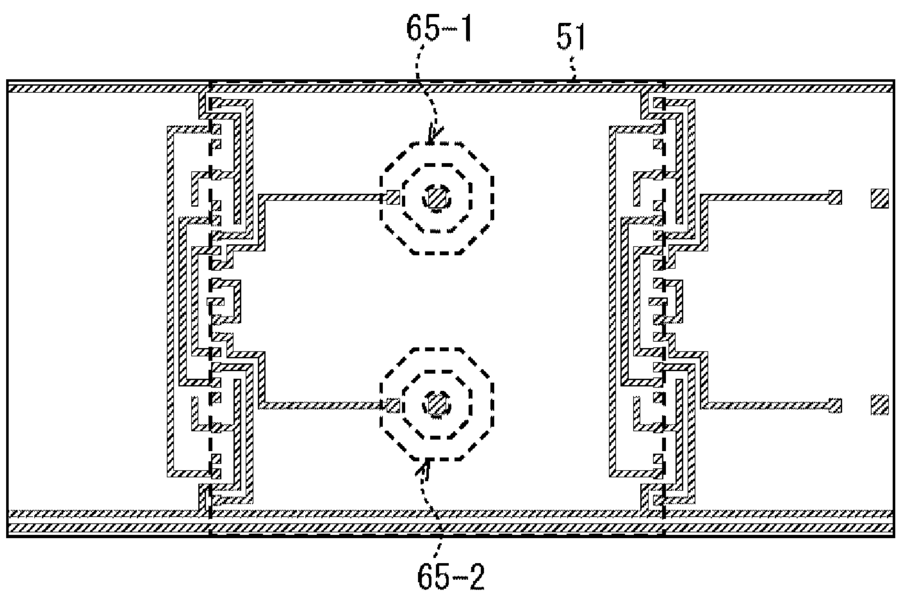

Furthermore, for example, as illustrated in A of FIG. 46, a part of the reflecting member 631 may be arranged in a comb-teeth shape such that a part of the metal film M1 is allocated to the wiring capacity of the FD 722 or the additional capacitance 727. In A of FIG. 46, the comb-teeth shapes in regions 861 to 864 surrounded by the solid circles constitute at least a part of the FD 722 or the additional capacitance 727. The FD 722 or the additional capacitance 727 may be distributed to the metal films M1 and M2 as appropriate when arranged. The pattern of the metal film M1 can be arranged in a balanced manner for the reflecting member 631 and the capacity of the FD 722 or the additional capacitance 727.

B of FIG. 46 illustrates the pattern of the metal film M1 in a case where the reflecting member 631 is not arranged. In order to further expand the amount of infrared light photoelectrically converted in the substrate 61 and improve the sensitivity of the pixel 51, it is preferable to arrange the reflecting member 631; however, a configuration in which the reflecting member 631 is not arranged can also be adopted.

The arrangement examples of the reflecting member 631 illustrated in FIGS. 45 and 46 can be similarly applied to the light-shielding member 631'.

Substrate Configuration Example of Light Receiving Element

Figure 47:
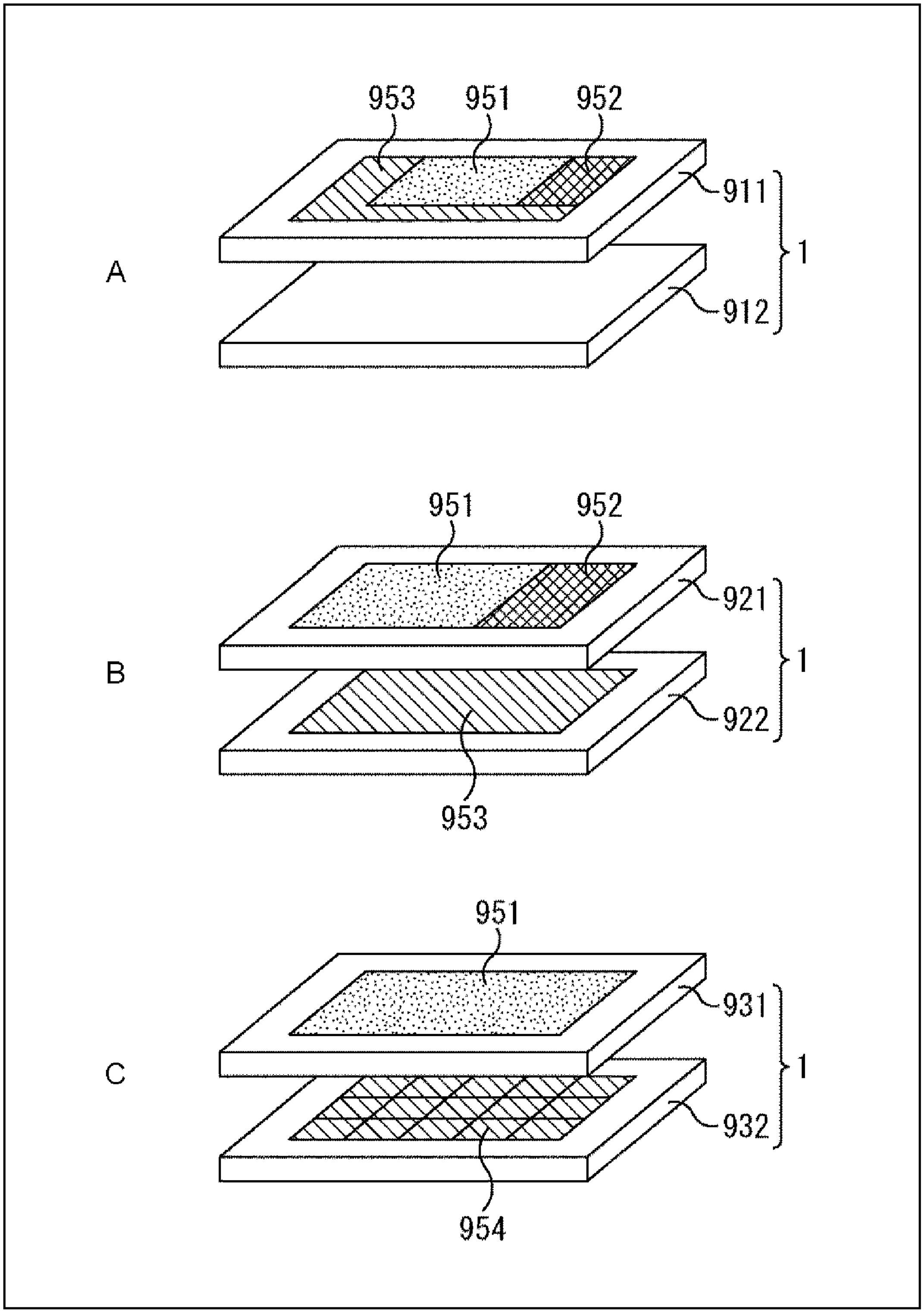
FIG. 47 is a diagram for explaining a substrate configuration of the light receiving element.

The light receiving element 1 in FIG. 1 can adopt any of substrate configurations A to C in FIG. 47.

A of FIG. 47 illustrates an example in which the light receiving element 1 is constituted by a single semiconductor substrate 911 and a supporting substrate 912 below the semiconductor substrate 911.

In this case, on the semiconductor substrate 911 on the upper side, a pixel array region 951 corresponding to the pixel array unit 20 described above, a control circuit 952 that controls each pixel in the pixel array region 951, and a logic circuit 953 including a signal processing circuit for pixel signals are formed.

The control circuit 952 includes the tap drive unit 21, the vertical drive unit 22, the horizontal drive unit 24, and the like described above. The logic circuit 953 includes the column processing unit 23 that performs AD conversion processing for the pixel signal, and the signal processing unit 31 that performs distance calculation processing that calculates a distance from the ratio of pixel signals acquired by two or more respective signal retrieving units 65 in the pixel, calibration processing, and the like.

Alternatively, as illustrated in B of FIG. 47, the light receiving element 1 can also have a configuration in which a first semiconductor substrate 921 formed with the pixel array region 951 and the control circuit 952, and a second semiconductor substrate 922 formed with the logic circuit 953 are laminated. Note that the first semiconductor substrate 921 and the second semiconductor substrate 922 are electrically connected by, for example, a through via or a Cu—Cu metal bond.

Alternatively, as illustrated in C of FIG. 47, the light receiving element 1 can also have a configuration in which a first semiconductor substrate 931 formed with only the pixel array region 951, and a second semiconductor substrate 932 formed with an area control circuit 954 in which a control circuit that controls each pixel, and a signal processing circuit that processes pixel signals are provided in units of single pixels or in units of areas each made up of a plurality of pixels are laminated. The first semiconductor substrate 931 and the second semiconductor substrate 932 are electrically connected by, for example, a through via or a Cu—Cu metal bond.

According to the configuration in which the control circuit and the signal processing circuit are provided in units of single pixels or in units of areas, as in the light receiving element 1 in C of FIG. 47, optimal drive timing and gain can be set for each unit of split control, and optimized distance information can be acquired regardless of distance and reflectance. Furthermore, since the distance information can also be calculated by driving only a part of the pixel array region 951, rather than the whole region, power consumption can be suppressed according to the working mode.

Eighteenth Embodiment

Configuration Example of Pixel

Next, in addition to the first to seventeenth embodiments described above, still other embodiments will be described.

In the thirteenth embodiment, an example in which one of two signal retrieving units 65 provided in the pixel 51 is assigned as an active tap, while the other is assigned as an inactive tap, and additionally a negative bias is applied to the light entrance surface of the substrate 61 has been described with reference to FIG. 27.

In this case, the electric field is intensified by the application of a negative bias and the electron retrieving efficiency can be improved; however, if the P+ semiconductor region 73 of the signal retrieving unit 65 that is not assigned as an active tap in the pixel 51 is placed in a floating state instead of applying a voltage to the above P+ semiconductor region 73, the power consumption can be cut down.

Figure 48:
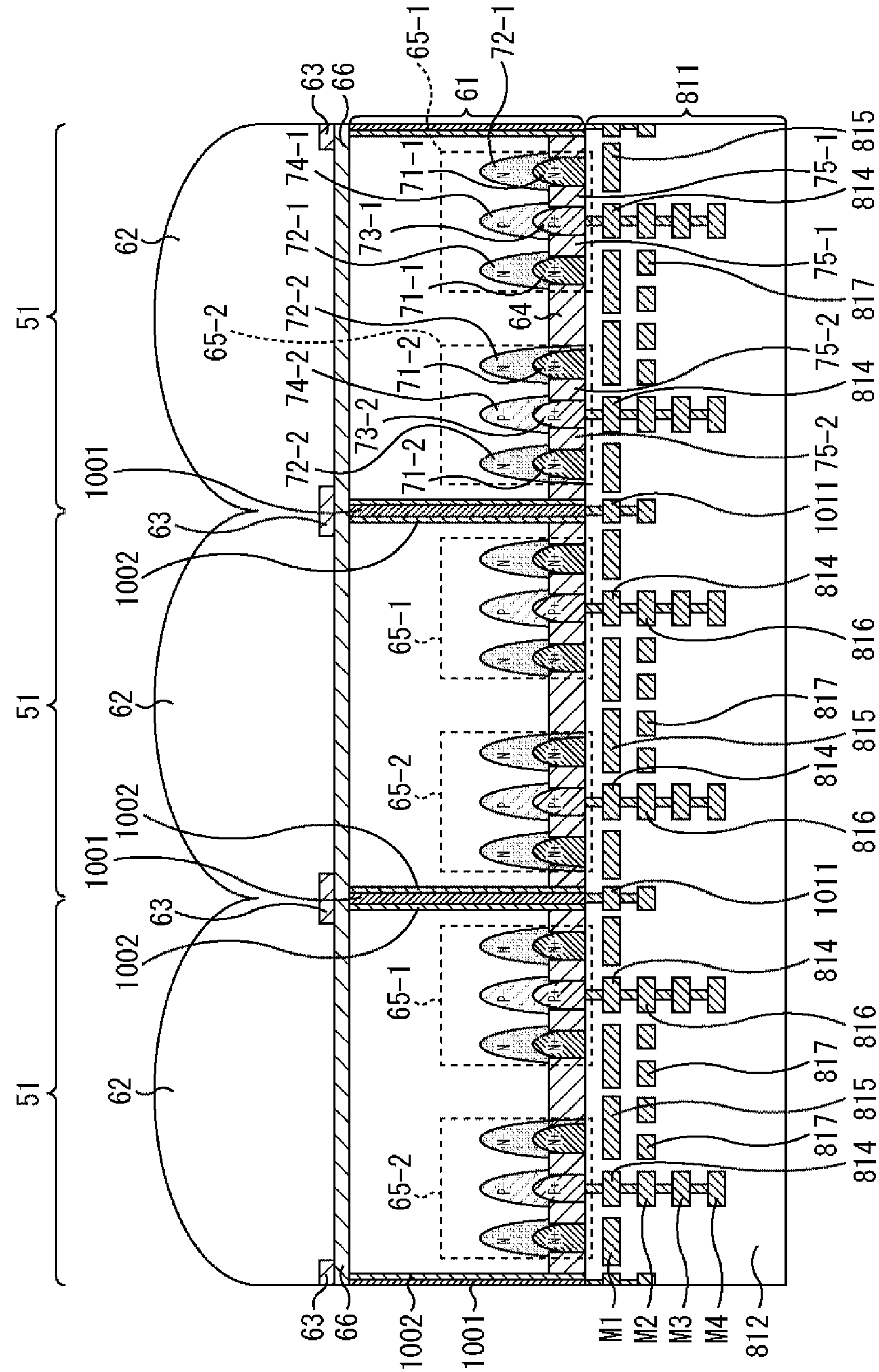
FIG. 48 is a cross-sectional view of a plurality of pixels.

In such a case, the cross-sectional configuration of a pixel 51 is as illustrated in FIG. 48, for example.

FIG. 48 illustrates a cross-sectional view of a plurality of pixels corresponding to the B-B' line in FIG. 11, similarly to FIG. 36 and other drawings described above.

Note that, in FIG. 48, constituent members corresponding to those in the case of FIG. 36 are denoted with the same reference numerals and the description of these constituent members will be omitted as appropriate.

When the configuration of the pixel 51 illustrated in FIG. 48 is compared with the configuration of the pixel 51 illustrated in FIG. 36, in the pixel 51 illustrated in FIG. 48, a through electrode 1001 that passes through the substrate 61, which is a semiconductor layer of P-type, and isolates the pixels 51 that are adjacent, from each other, and an insulating film 1002 that covers the outer periphery (side wall) of the through electrode 1001 are newly formed on the boundary (pixel boundary) between the pixels 51 that are adjacent.

The through electrode 1001 is formed by, for example, a metal material such as tungsten (W), aluminum (Al), or copper (Cu), or polysilicon. The insulating film 1002 is formed by, for example, an oxide film ($SiO_2$).

The through electrode 1001 is formed at a boundary portion of the pixel 51, and functions as a pixel isolation portion that isolates the semiconductor layers (substrates 61) from each other between the pixels 51 adjacent to each other. Note that it can also be understood that the pixel isolation portion is constituted by the through electrode 1001 including the insulating film 1002 at the outer peripheral portion and the insulating film 1002.

The through electrode 1001 is electrically connected to a voltage application wiring 1011 on the metal film M1, which is a metal film of the multilayer wiring layer 811 closest to the substrate 61, and a predetermined bias (voltage) is applied to the through electrode 1001 via the voltage application wiring 1011.

Here, the bias applied to the through electrode 1001 is a voltage different from the voltage applied to the P+ semiconductor region 73 of the signal retrieving unit 65 assigned as an active tap. More specifically, the bias applied to the through electrode 1001 is, for example, a voltage of 0 V or less, that is, a negative bias. Thus, it can be said that the through electrode 1001 to which a negative bias is applied functions as a voltage application unit.

The through electrode 1001 and the insulating film 1002 can be formed by forming a trench from the front surface side or the back surface side of the substrate 61 until arriving at a substrate surface on an opposite side by dry etching or the like, and after forming the insulating film 1002, embedding polysilicon or a metal material, which will constitute the through electrode 1001.

By providing the through electrode 1001 that passes through the substrate 61 in this manner, the electric field in a direction parallel to a surface of the substrate 61 can be intensified.

Furthermore, in the pixel 51 illustrated in FIG. 48, during an accumulation period of a charge generated by the photoelectric conversion in the substrate 61, two signal retrieving units 65 are alternately assigned as an active tap. Then, while one of the signal retrieving units 65 in the pixel 51 is assigned as an active tap, the P+ semiconductor region 73 of the other of the signal retrieving units 65 is placed in a floating state.

By working in this manner, a current dependent on a negative bias using the through electrode 1001 flows in the substrate 61, but a current caused by a potential difference between the one of the signal retrieving units 65, which is assigned as an active tap, and the other of the signal retrieving units 65 stops flowing.

As a consequence, when compared with a case where a voltage such as 0 V is applied to the P+ semiconductor region 73 of the other of the signal retrieving units 65 while the one of the signal retrieving units 65 is assigned as an active tap, the amount of current generated in the substrate 61 (the total amount of Hall current) can be reduced. As a result, the power consumption in the substrate 61 can be cut down.

Additionally, in a case where the signal retrieving unit 65 that is not an active tap is placed in a floating state, the charge (electron) transfer efficiency can be improved as compared with a case where a voltage such as 0 V is applied to the signal retrieving unit 65 that is not an active tap, and the distance can be detected with high accuracy. In different terms, characteristics of the CAPD sensor can be improved. This is because, when the signal retrieving unit 65 that is not an active tap is placed in a floating state, an electric field is not produced between the two signal retrieving units 65, and accordingly the path of a charge (electron) traveling toward the N+ semiconductor region 71 of the signal retrieving unit 65 that is assigned as an active tap is shortened.

Equivalent Circuit Configuration Example of Pixel

Figure 49:
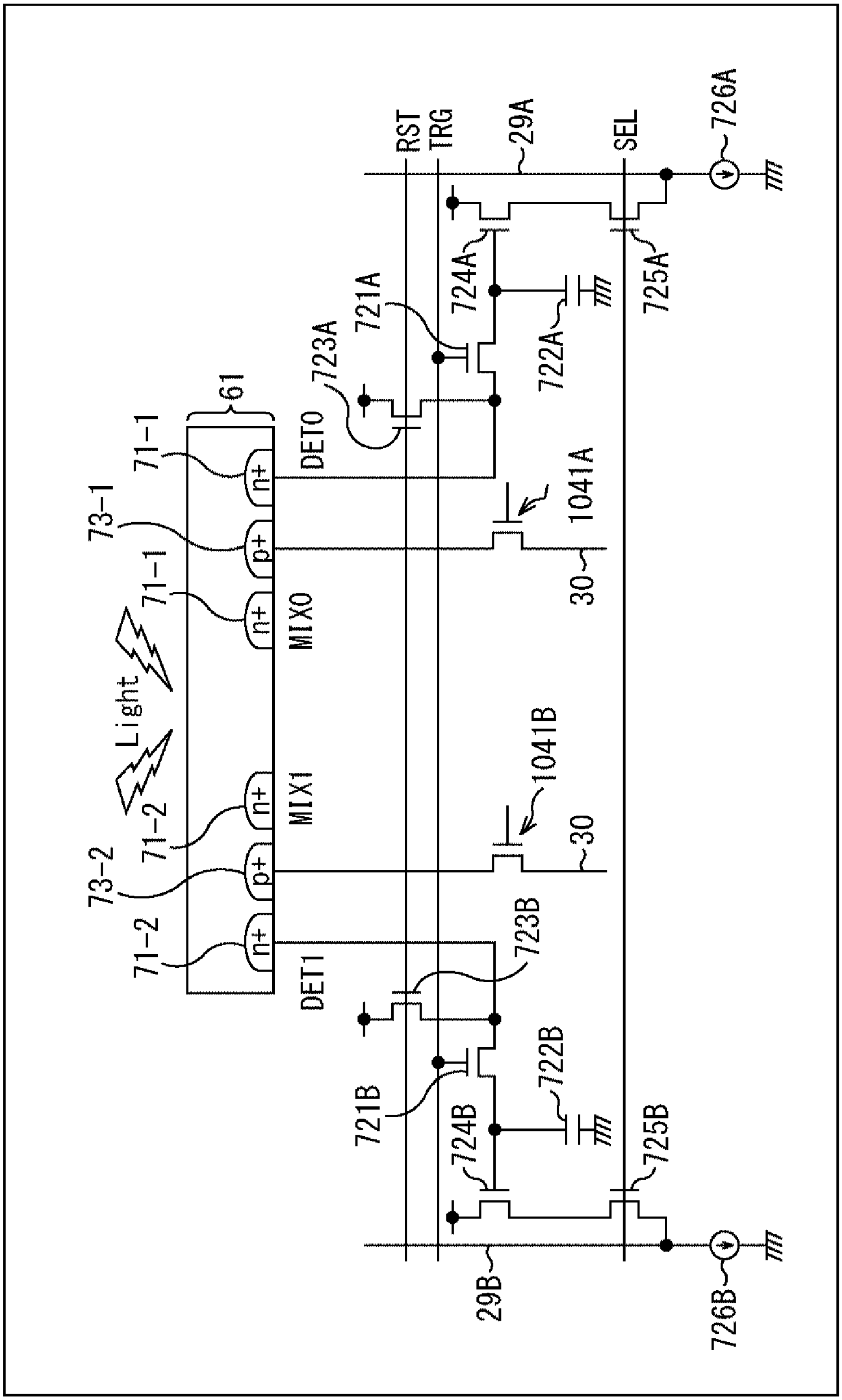
FIG. 49 is a diagram illustrating an equivalent circuit of a pixel.

As described above, in a case where the signal retrieving unit 65 that is not an active tap is placed in a floating state, an equivalent circuit of the pixel 51 is as illustrated in FIG. 49, for example. Note that, in FIG. 49, constituent members corresponding to those in the case of FIG. 1 or 31 are denoted with the same reference numerals and the description thereof will be omitted as appropriate.

The equivalent circuit configuration of the pixel 51 illustrated in FIG. 49 is configured such that a transistor 1041A and a transistor 1041B are newly provided in the equivalent circuit configuration of the pixel 51 illustrated in FIG. 31.

In the example illustrated in FIG. 49, the transistor 1041A is provided between the P+ semiconductor region 73-1 and the voltage supply line 30, and the transistor 1041B is provided between the P+ semiconductor region 73-2 and the voltage supply line 30.

In more detail, for example, the voltage application wiring 814 and the voltage application wiring 816 illustrated in FIG. 48 are provided between the P+ semiconductor region 73-1 and the transistor 1041A. Similarly, for example, the voltage application wiring 814 and the voltage application wiring 816 are also provided between the P+ semiconductor region 73-2 and the transistor 1041B.

Note that, hereinafter, the transistors 1041A and 1041B are also simply referred to as transistors 1041 in a case where it is not particularly necessary to distinguish between the transistors 1041A and 1041B.

The transistors 1041A and 1041B are controlled by a tap drive unit 21 and function as switches.

That is, the tap drive unit 21 places a drive signal (voltage) supplied to a gate electrode of the transistor 1041 in an active state to place the transistor 1041 in an ON state (conductive state), thereby being able to apply a desired voltage such as 1.5 V or 0 V to the P+ semiconductor region 73.

On the other hand, the tap drive unit 21 places a drive signal (voltage) supplied to a gate electrode of the transistor 1041 in an inactive state to place the transistor 1041 in an OFF state (non-conductive state), thereby electrically disconnecting the P+ semiconductor region 73 from the voltage supply line 30. As a consequence, the P+ semiconductor region 73 is placed in a floating state.

Note that turning on and off of the transistor 1041 may be driven by the vertical drive unit 22 instead of the tap drive unit 21.

Drive Example of Pixel

Next, a drive example of the pixel 51 illustrated in FIG. 48 will be described.

Figure 50:
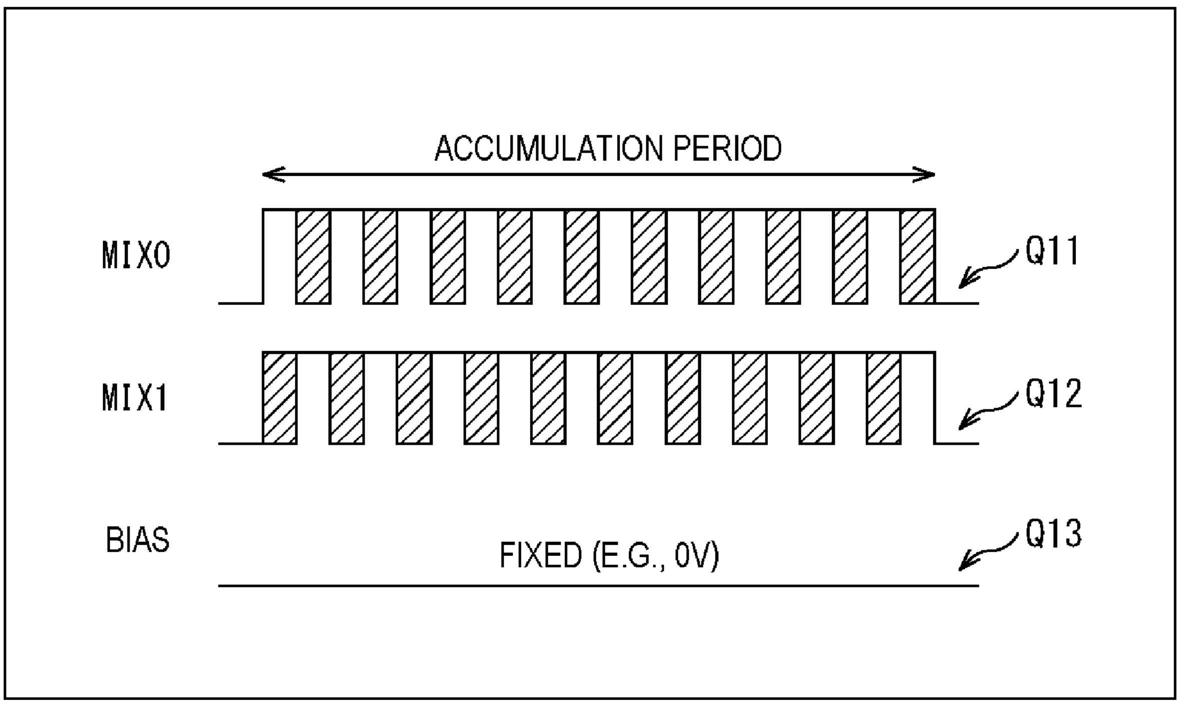
FIG. 50 is a diagram for explaining driving of a signal retrieving unit.

For example, as illustrated in FIG. 50, the tap drive unit 21 controls the driving of the signal retrieving unit 65 in the accumulation period of a charge generated by the photoelectric conversion in the substrate 61.

In FIG. 50, a portion indicated by an arrow Q11 illustrates the voltage MIX0 applied to the P+ semiconductor region 73-1 of the signal retrieving unit 65-1, and a portion indicated by an arrow Q12 illustrates the voltage MIX1 applied to the P+ semiconductor region 73-2 of the signal retrieving unit 65-2. In particular, shaded portions of the voltages MIX0 and MIX1 indicated by the arrows Q11 and Q12 indicate that the floating state is enabled.

Furthermore, a portion indicated by an arrow Q13 indicates a voltage applied to the through electrode 1001, which is a voltage application unit, that is, a bias applied to the light entrance surface (back surface).

In this example, as indicated by the arrow Q13, the through electrode 1001, which is a voltage application unit, is placed in a state in which a constant fixed voltage of 0 V or less, that is, a constant negative bias is continuously applied to the through electrode 1001.

On the other hand, in the P+ semiconductor region 73-1, for example, a state in which a positive voltage such as 1.5 V is applied to the P+ semiconductor region 73-1 as the voltage MIX0 and the floating state are alternately repeated.

Specifically, at the timing when the signal retrieving unit 65-1 is assigned as an active tap, the tap drive unit 21 places the transistor 1041A in an ON state and applies a positive voltage such as 1.5 V to the P+ semiconductor region 73-1. Furthermore, at the timing when the signal retrieving unit 65-1 is not assigned as an active tap, the tap drive unit 21 places the transistor 1041A in an OFF state and places the P+ semiconductor region 73-1 in a floating state.

Similarly, in the P+ semiconductor region 73-2, for example, a state in which a positive voltage such as 1.5 V is applied to the P+ semiconductor region 73-2 as the voltage MIX1 and the floating state are alternately repeated.

In particular, the tap drive unit 21 places the P+ semiconductor region 73-2 in a floating state when a positive voltage is applied to the P+ semiconductor region 73-1, and places the P+ semiconductor region 73-1 in a floating state when a positive voltage is applied to the P+ semiconductor region 73-2. It can be said that such a tap drive unit 21 functions as a voltage control part that controls the application of a voltage to the P+ semiconductor region 73.

Besides, the tap drive unit 21 may be enabled to switch between a floating mode and a normal mode as appropriate.

Here, the floating mode is a mode in which the P+ semiconductor region 73 of the signal retrieving unit 65 that is not an active tap is placed in a floating state, as described with reference to FIG. 50.

That is, in the floating mode, a voltage such as 1.5 V is applied to the P+ semiconductor region 73 of the signal retrieving unit 65 that is assigned as an active tap, the P+ semiconductor region 73 of the signal retrieving unit 65 that is not assigned as an active tap is placed in a floating state, and a negative bias is applied to the through electrode 1001.

Furthermore, the normal mode is a mode in which the P+ semiconductor region 73 of the signal retrieving unit 65 that is not an active tap is not placed in a floating state.

That is, in the normal mode, a voltage such as 1.5 V is applied to the P+ semiconductor region 73 of the signal retrieving unit 65 that is assigned as an active tap, and a voltage such as 0 V is applied to the P+ semiconductor region 73 of the signal retrieving unit 65 that is not assigned as an active tap, that is, the signal retrieving unit 65 as an inactive tap. In other words, the voltages MIX1 and MIX0 are treated as different voltages from each other at each timing.

Moreover, in the normal mode, a negative bias may be applied to the through electrode 1001, or a negative bias may not be applied to the through electrode 1001 such that the floating state is enabled. For example, the negative bias applied to the through electrode 1001 can be made the same as the voltage applied to the P+ semiconductor region 73 of the inactive tap.

The tap drive unit 21 performs mode switching as appropriate such that the driving in any one mode out of the above-described floating mode and normal mode is performed.

First Modification of Eighteenth Embodiment

Configuration Example of Pixel

Moreover, in a case where a negative bias is applied to the substrate 61 and the P+ semiconductor region 73 of the signal retrieving unit 65 that is not assigned as an active tap is placed in a floating state, an electric field in a depth direction (Z direction) perpendicular to a surface of the substrate 61 can also be intensified.

Figure 51:
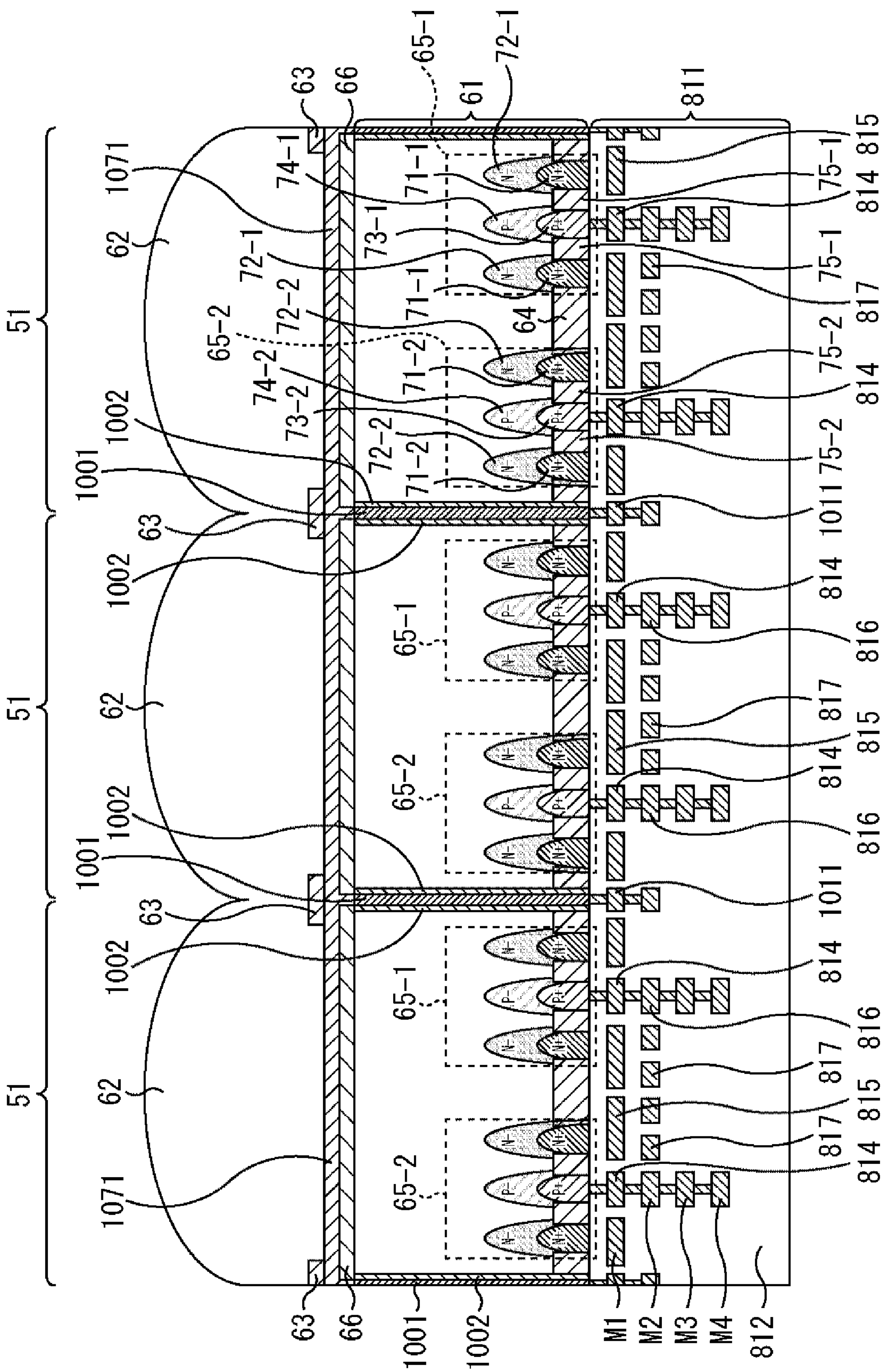
FIG. 51 is a cross-sectional view of a plurality of pixels.

In such a case, the cross-sectional configuration of the pixel 51 is as illustrated in FIG. 51, for example.

FIG. 51 illustrates a cross-sectional view of a plurality of pixels corresponding to the B-B' line in FIG. 11, similarly to FIG. 36 and other drawings described above. Note that, in FIG. 51, constituent members corresponding to those in the case of FIG. 48 are denoted with the same reference numerals and the description of these constituent members will be omitted as appropriate.

When the configuration of the pixel 51 illustrated in FIG. 51 is compared with the configuration of the pixel 51 illustrated in FIG. 48, in the pixel 51 illustrated in FIG. 51, a transparent conductive film 1071, which is a transparent electrode, is newly formed on an upper surface of the fixed charge film 66 formed on the light entrance surface of the substrate 61. That is, the transparent conductive film 1071 is formed on a surface of the substrate 61 on the side of the on-chip lens 62.

The transparent conductive film 1071 is connected to the through electrode 1001 at the boundary of the pixel 51. As the transparent conductive film 1071, a material such as indium-tin-oxide (ITO), ZnO, SnO, $Cd_2SnO_4$, or $TiO_2$:Nb can be adopted.

Since the through electrode 1001 is connected to the voltage application wiring 1011, when a negative bias is applied to the voltage application wiring 1011, the applied negative bias is applied to the fixed charge film 66 via the through electrode 1001 and the transparent conductive film 1071. Accordingly, in this example, the through electrode 1001 and the transparent conductive film 1071 function as voltage application units.

Also in the example illustrated in FIG. 51, similarly to the example illustrated in FIG. 48, the tap drive unit 21 drives the signal retrieving unit 65 as described with reference to FIG. 50. Furthermore, also in the example illustrated in FIG. 51, the tap drive unit 21 can switch between the normal mode and the floating mode.

In the pixel 51 illustrated in FIG. 51, since the transparent conductive film 1071 is formed on an upper surface of the fixed charge film 66, an electric field in the depth direction traveling from the light entrance surface of the substrate 61 toward the signal retrieving unit 65 (tap) can be intensified. Consequently, the electron retrieving efficiency can be further improved as compared with the example illustrated in FIG. 48.

Note that, in the pixel 51, in a case where the fixed charge film 66 is not formed on the light entrance surface of the substrate 61, a configuration in which an insulating film including an oxide film or the like is formed on the light entrance surface of the substrate 61, and a negative bias is applied to the insulating film via the through electrode 1001 and the transparent conductive film 1071 can be employed. The insulating film is not limited to a single layer film, and may be a laminated film.

Moreover, in FIG. 51, an example in which the transparent conductive film 1071 and the through electrode 1001 are electrically connected has been described; however, these transparent conductive film 1071 and through electrode 1001 may not be electrically connected. Furthermore, in such a case, a negative bias may be applied only to the transparent conductive film 1071. Additionally, only the transparent conductive film 1071 may be provided, and the through electrode 1001 may not be provided.

Nineteenth Embodiment

Configuration Example of Pixel

In addition, in a case where driving in the floating mode is performed, an inter-pixel light-shielding portion for applying a bias may be provided independently on each side surface of the pixel 51 such that a higher effect is obtained by the electric field intensification from a side wall of the pixel 51, that is, the electric field intensification in a direction parallel to a surface of the substrate 61.

Figure 52:
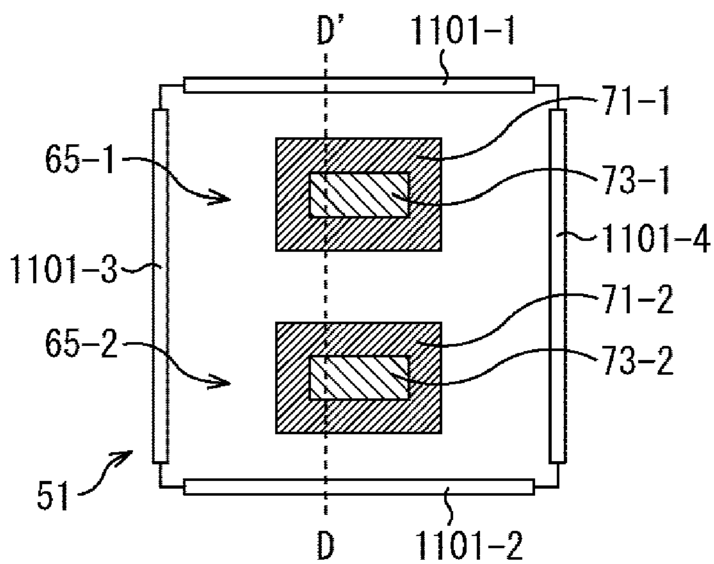
FIG. 52 is a diagram of a pixel viewed from a direction perpendicular to a surface of a substrate.

In such a case, for example, a configuration in which an inter-pixel light-shielding portion is formed between pixels 51 as illustrated in FIG. 52 is employed. Note that, in FIG.

52, constituent members corresponding to those in the case of FIG. 3 are denoted with the same reference numerals and the description thereof will be omitted as appropriate.

FIG. 52 is a diagram of the pixel 51 viewed from a direction perpendicular to a surface of a substrate 61.

In this example, an inter-pixel light-shielding portion 1101-1 to an inter-pixel light-shielding portion 1101-4 are provided at boundary positions between the pixel 51 and other pixels 51.

Specifically, the inter-pixel light-shielding portion 1101-1 is provided at a boundary of the pixel 51 on an upper side in the drawing, and the inter-pixel light-shielding portion 1101-2 is provided at a boundary of the pixel 51 on a lower side in the drawing.

That is, the inter-pixel light-shielding portion 1101-1 is formed at a pixel boundary on the side of the signal retrieving unit 65-1 in a direction in which two signal retrieving units 65 in the pixel 51 are put side-by-side. On the other hand, the inter-pixel light-shielding portion 1101-2 is formed at a pixel boundary on the side of the signal retrieving unit 65-2 in a direction in which two signal retrieving units 65 in the pixel 51 are put side-by-side.

Furthermore, the inter-pixel light-shielding portion 1101-3 is provided at a boundary of the pixel 51 on a left side in the drawing, and the inter-pixel light-shielding portion 1101-4 is provided at a boundary of the pixel 51 on a right side in the drawing. That is, these inter-pixel light-shielding portions 1101-3 and 1101-4 are formed at pixel boundaries in a direction perpendicular to a direction in which two signal retrieving units 65 in the pixel 51 are put side-by-side.

Note that, hereinafter, the inter-pixel light-shielding portions 1101-1 to 1101-4 are also simply referred to as inter-pixel light-shielding portions 1101 in a case where it is not particularly necessary to distinguish between the inter-pixel light-shielding portions 1101-1 to 1101-4.

These four inter-pixel light-shielding portions 1101 serve as deep trench isolation (DTI) having a trench structure that isolates pixels 51 that are adjacent, from each other, and the inter-pixel light-shielding portions 1101 are formed by, for example, a metal material such as tungsten (W), aluminum (Al), or copper (Cu), or polysilicon.

In addition, here, the four inter-pixel light-shielding portions 1101-1 to 1101-4 are electrically isolated. Note that, for example, the inter-pixel light-shielding portion 1101-3 or 1101-4 of the pixel 51 and the inter-pixel light-shielding portion 1101-3 or 1101-4 of another pixel 51 adjacent to the pixel 51 in the up-down direction in the drawing may be electrically connected.

For example, in the example illustrated in FIG. 52, the inter-pixel light-shielding portions 1101-1 to 1101-4 function as pixel isolation portions that isolate pixels 51 adjacent to each other, and also function as voltage application units to which a voltage such as a negative bias is applied.

Specifically, for example, a constant voltage of 0 V or less, that is, a constant (fixed) negative bias is always applied to the inter-pixel light-shielding portions 1101-3 and 1101-4.

Furthermore, in a case where the signal retrieving unit 65-1 is assigned as an active tap, a voltage higher than voltages for around the inter-pixel light-shielding portion 1101-1 provided on the side of this signal retrieving unit 65-1, for example, a voltage such as 1.5 V is applied to this inter-pixel light-shielding portion 1101-1. Note that the voltage applied to the inter-pixel light-shielding portion 1101-1 can be the same as the voltage MIX0.

By employing such a configuration, the electric field in the vicinity of the signal retrieving unit 65-1 assigned as an active tap can be further intensified, whereby the electron retrieving efficiency can be improved.

On the other hand, in a state in which the signal retrieving unit 65-1 is not assigned as an active tap, that is, in a case where the P+ semiconductor region 73-1 of the signal retrieving unit 65-1 is placed in a floating state, the inter-pixel light-shielding portion 1101-1 is also placed in a floating state.

In order to make the state of voltage application to the inter-pixel light-shielding portion 1101-1 the same as the state of voltage application to the P+ semiconductor region 73-1 in this manner, for example, it is only required to connect not only the P+ semiconductor region 73-1 but also the inter-pixel light-shielding portion 1101-1 to a transistor 1041A illustrated in FIG. 49.

Meanwhile, for the inter-pixel light-shielding portion 1101-2 provided on the side of the signal retrieving unit 65-2, it is only required to make the voltage application state the same as the state of voltage application to the P+ semiconductor region 73-2 of the signal retrieving unit 65-2. In other words, the state of voltage application to the inter-pixel light-shielding portion 1101-2 is only required to be made reverse to the state of voltage application to the inter-pixel light-shielding portion 1101-1.

Specifically, when a voltage such as 1.5 V is applied to the inter-pixel light-shielding portion 1101-1, the inter-pixel light-shielding portion 1101-2 is placed in a floating state, and conversely, when the inter-pixel light-shielding portion 1101-1 is placed in a floating state, a voltage such as 1.5 V is applied to the inter-pixel light-shielding portion 1101-2.

In order to perform such control of the state of voltage application to the inter-pixel light-shielding portion 1101-2, for example, it is only required to connect not only the P+ semiconductor region 73-2 but also the inter-pixel light-shielding portion 1101-2 to a transistor 1041B illustrated in FIG. 49.

Figure 53:
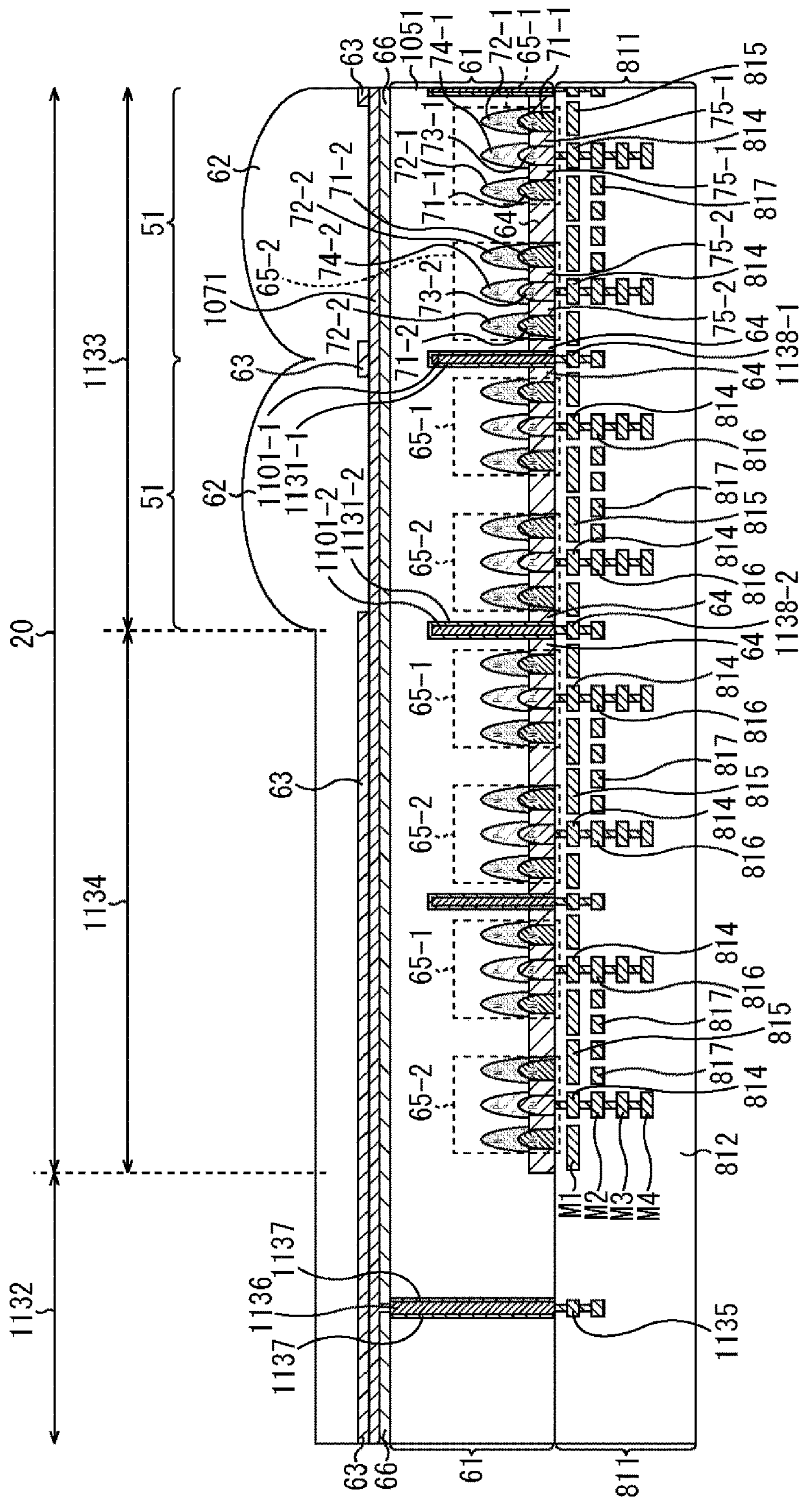
FIG. 53 is a cross-sectional view of a plurality of pixels.

Furthermore, a cross-sectional view of a plurality of pixels corresponding to a D-D' line in the pixel 51 illustrated in FIG. 52 is as illustrated in FIG. 53, for example. Note that, in FIG. 53, constituent members corresponding to those in the case of FIG. 1, 51, or 52 are denoted with the same reference numerals and the description thereof will be omitted as appropriate.

The configuration of the pixel 51 illustrated in FIG. 53 differs from the configuration of the pixel 51 illustrated in FIG. 51 mainly in that the inter-pixel light-shielding portion 1101, an insulating film 1131-1, and an insulating film 1131-2 are provided instead of the through electrode 1001 and the insulating film 1002 in the configuration of the pixel 51 illustrated in FIG. 51.

Note that, hereinafter, the insulating films 1131-1 and 1131-2 are also simply referred to as insulating films 1131 in a case where it is not particularly necessary to distinguish between the insulating films 1131-1 and 1131-2.

In the example in FIG. 53, a region on an outer side of a pixel array unit 20 on the semiconductor substrate constituting the light receiving element 1 has a peripheral circuit unit 1132. Furthermore, the pixel array unit 20 is constituted by an effective pixel region 1133 in which a plurality of pixels 51 is arranged, and an optical black (OPB) pixel region 1134 around the effective pixel region 1133.

In such a pixel array unit 20 illustrated in FIG. 53, since the through electrode 1001 is not formed, a negative bias cannot be applied to the fixed charge film 66 via the through electrode 1001. Therefore, in the example illustrated in FIG. 53, a negative bias is supplied to a transparent conductive film 1071 from a voltage application wiring 1135 formed in the peripheral circuit unit 1132 on an outer side of the pixel array unit 20 via a through electrode 1136, and the negative bias is applied to the fixed charge film 66 from the transparent conductive film 1071.

That is, in the example illustrated in FIG. 53, the voltage application wiring 1135 is formed in a multilayer wiring layer 811 of the peripheral circuit unit 1132 on an outer side of the pixel array unit 20, and a negative bias is supplied to the voltage application wiring 1135. Furthermore, the peripheral circuit unit 1132 of the substrate 61 is formed with the through electrode 1136 whose outer periphery is covered with an insulating film 1137, and the through electrode 1136 is connected to the transparent conductive film 1071 on the light entrance surface of the substrate 61.

According to such a pixel 51, a negative bias supplied from the voltage application wiring 1135 of the multilayer wiring layer 811 is applied to the fixed charge film 66 via the through electrode 1136 and the transparent conductive film 1071. Consequently, the electric field in the depth direction traveling from the light entrance surface of the substrate 61 toward the signal retrieving unit 65 (tap) can be intensified.

Note that, although an example in which a negative bias is applied to the transparent conductive film 1071 will be described here, a negative bias may not be applied to the transparent conductive film 1071 in particular.

Furthermore, in the substrate 61, the inter-pixel light-shielding portion 1101 that isolates the pixels 51 that are adjacent, from each other to shield from a surface on the side of the multilayer wiring layer 811 of the substrate 61, which is a semiconductor layer of P− type, to a predetermined depth, and the insulating film 1131 that covers the outer periphery (side wall) of the inter-pixel light-shielding portion 1101 are formed at a boundary between the pixels 51 that are adjacent.

In particular, here, the inter-pixel light-shielding portion 1101-1 is covered with the insulating film 1131-1, and the inter-pixel light-shielding portion 1101-2 is covered with the insulating film 1131-2.

The insulating film 1131 is formed by, for example, an oxide film ($SiO_2$). The inter-pixel light-shielding portion 1101 also functions as a pixel isolation portion that isolates the semiconductor layers (substrates 61) of the neighboring pixels 51 from each other. Note that it can also be understood that the pixel isolation portion is constituted by the inter-pixel light-shielding portion 1101 including the insulating film 1131 at the outer peripheral portion and the insulating film 1131.

The inter-pixel light-shielding portions 1101-1 and 1101-2 are connected to a voltage application wiring 1138-1 and a voltage application wiring 1138-2 on the metal film M1, which is a metal film of the multilayer wiring layer 811 closest to the substrate 61.

In more detail, the inter-pixel light-shielding portion 1101-1 is connected to the transistor 1041A via the voltage application wiring 1138-1 and the like, and the inter-pixel light-shielding portion 1101-2 is connected to the transistor 1041B via the voltage application wiring 1138-2 and the like. Note that, hereinafter, the voltage application wirings 1138-1 and 1138-2 are also simply referred to as voltage application wirings 1138 in a case where it is not particularly necessary to distinguish between the voltage application wirings 1138-1 and 1138-2.

The inter-pixel light-shielding portion 1101 and the insulating film 1131 can be formed by forming a trench from the front surface side (the side of the multilayer wiring layer 811) of the substrate 61 to a predetermined depth by dry etching or the like, and after forming the insulating film 1131, embedding polysilicon or a metal material, which will constitute the inter-pixel light-shielding portion 1101.

Note that, although only the inter-pixel light-shielding portions 1101-1 and 1101-2 are illustrated here, the inter-pixel light-shielding portions 1101-3 and 1101-4 also have a structure similar to the structure of these inter-pixel light-shielding portions 1101-1 and 1101-2. That is, the outer surfaces of the inter-pixel light-shielding portions 1101-3 and 1101-4 are also covered with the insulating films 1131.

Furthermore, while the inter-pixel light-shielding portion 1101 and the insulating film 1131 are formed from the front surface side to a predetermined depth here, the inter-pixel light-shielding portion 1101 and the insulating film 1131 may be provided from the front surface side to the back surface side (light entrance surface side) so as to pass through the substrate 61. In such a case, for example, the inter-pixel light-shielding portions 1101-3 and 1101-4 may be electrically connected to the transparent conductive film 1071.

Moreover, the inter-pixel light-shielding portion 1101 and the insulating film 1131 may be formed from the back surface side (light entrance surface side) of the substrate 61 to a predetermined depth.

Drive Example of Pixel

Next, a drive example of the pixel 51 illustrated in FIG. 52 will be described.

Figure 54:
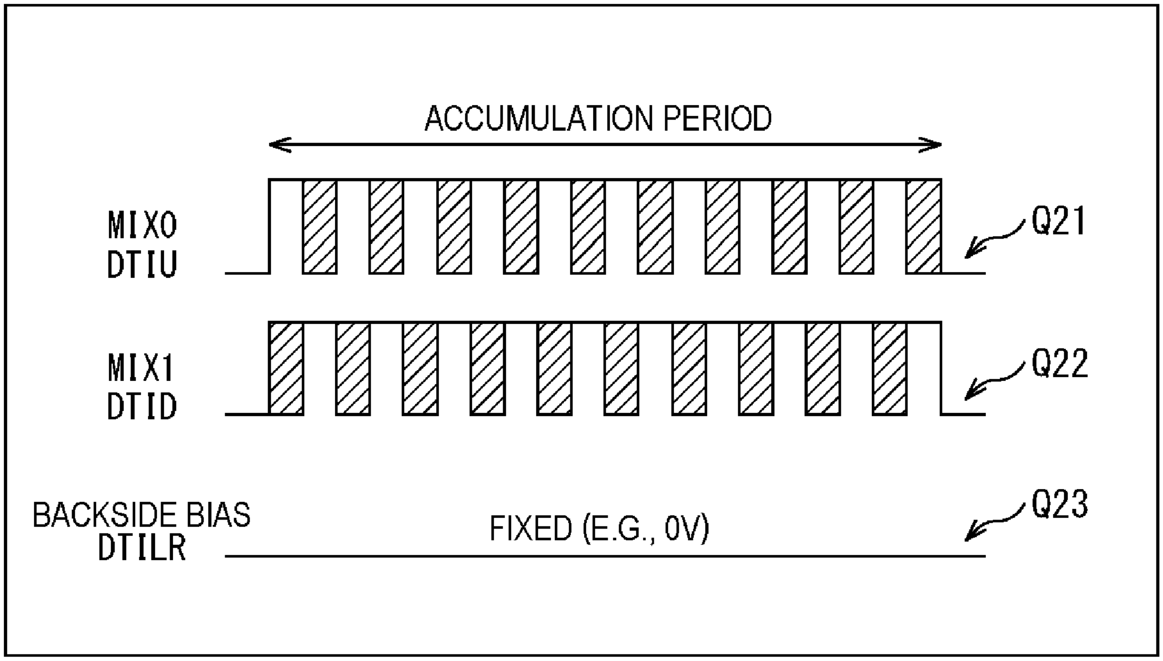
FIG. 54 is a diagram for explaining driving of the signal retrieving unit.

For example, as illustrated in FIG. 54, a tap drive unit 21 controls the driving of the signal retrieving unit 65 in the accumulation period of a charge generated by the photoelectric conversion in the substrate 61.

In FIG. 54, a portion indicated by an arrow Q21 illustrates the voltage MIX0 applied to the P+ semiconductor region 73-1 of the signal retrieving unit 65-1 and a voltage applied to the inter-pixel light-shielding portion 1101-1. In particular, the characters “DTIU” indicate the inter-pixel light-shielding portion 1101-1.

Furthermore, a portion indicated by an arrow Q22 illustrates the voltage MIX1 applied to the P+ semiconductor region 73-2 of the signal retrieving unit 65-2 and a voltage applied to the inter-pixel light-shielding portion 1101-2. In particular, the characters “DTID” indicate the inter-pixel light-shielding portion 1101-2.

In addition, shaded portions in the portions indicated by the arrows Q21 and Q22 indicate that the floating state is enabled.

A portion indicated by an arrow Q23 illustrates a voltage (bias) applied to the transparent conductive film 1071, and the inter-pixel light-shielding portions 1101-3 and 1101-4. In particular, the characters “DTILR” indicate the inter-pixel light-shielding portions 1101-3 and 1101-4.

In this example, as indicated by the arrow Q23, the transparent conductive film 1071, and the inter-pixel light-shielding portions 1101-3 and 1101-4 are placed in a state in which a constant fixed voltage of 0 V or less, that is, a constant negative bias is continuously applied to the transparent conductive film 1071, and the inter-pixel light-shielding portions 1101-3 and 1101-4.

Note that different voltages may be applied to the transparent conductive film 1071, and the inter-pixel light-shielding portions 1101-3 and 1101-4.

On the other hand, in the P+ semiconductor region 73-1 and the inter-pixel light-shielding portion 1101-1, a state in which a positive voltage such as 1.5 V is applied and the floating state are alternately repeated.

Specifically, at the timing when the signal retrieving unit 65-1 is assigned as an active tap, the tap drive unit 21 places the transistor 1041A in an ON state and applies a positive voltage such as 1.5 V to the P+ semiconductor region 73-1 and the inter-pixel light-shielding portion 1101-1.

Furthermore, at the timing when the signal retrieving unit 65-1 is not assigned as an active tap, the tap drive unit 21 places the transistor 1041A in an OFF state and places the P+ semiconductor region 73-1 and the inter-pixel light-shielding portion 1101-1 in a floating state.

Similarly, in the P+ semiconductor region 73-2 and the inter-pixel light-shielding portion 1101-2, a state in which a positive voltage such as 1.5 V is applied and the floating state are alternately repeated.

In particular, when the positive voltage is applied to the P+ semiconductor region 73-1 and the inter-pixel light-shielding portion 1101-1, the tap drive unit 21 places the P+ semiconductor region 73-2 and the inter-pixel light-shielding portion 1101-2 in a floating state. Conversely, when the positive voltage is applied to the P+ semiconductor region 73-2 and the inter-pixel light-shielding portion 1101-2, the tap drive unit 21 places the P+ semiconductor region 73-1 and the inter-pixel light-shielding portion 1101-1 in a floating state.

Note that, in a case where such driving is performed, in a pixel 51 adjacent to the pixel 51 illustrated in FIG. 52 on an upper side in FIG. 52, the inter-pixel light-shielding portion 1101-1 is provided adjacent to the signal retrieving unit 65-2. Accordingly, in such a pixel 51, it is only required to make timings at which the positive voltage is applied and timings at which the floating state is enabled the same between the signal retrieving unit 65-2 and the inter-pixel light-shielding portion 1101-1 provided adjacent to each other. In this case, timings when the positive voltage is applied and timings when the floating state is enabled are made the same between the signal retrieving unit 65-1 and the inter-pixel light-shielding portion 1101-2 provided adjacent to each other. Besides, the inter-pixel light-shielding portions 1101-1 and 1101-2 may be provided adjacent to each other at a boundary between two pixels 51.

In addition, also in the pixel 51 illustrated in FIG. 52, the tap drive unit 21 may be enabled to switch between the floating mode and the normal mode as appropriate.

As described above, by performing the driving described with reference to FIG. 54, the amount of current consumption can be cut down and also the charge (electron) transfer efficiency can be improved similarly to the case of the eighteenth embodiment, such that the distance can be detected with high accuracy. In different terms, characteristics of the CAPD sensor can be improved.

Twentieth Embodiment

Configuration Example of Pixel

Moreover, in the eighteenth and the nineteenth embodiments, an example in which the through electrode 1001 and the transparent conductive film 1071 function as voltage application units when the driving in the floating mode is performed has been described. However, in particular, these through electrode 1001 and transparent conductive film 1071 may not be provided.

Figure 55:
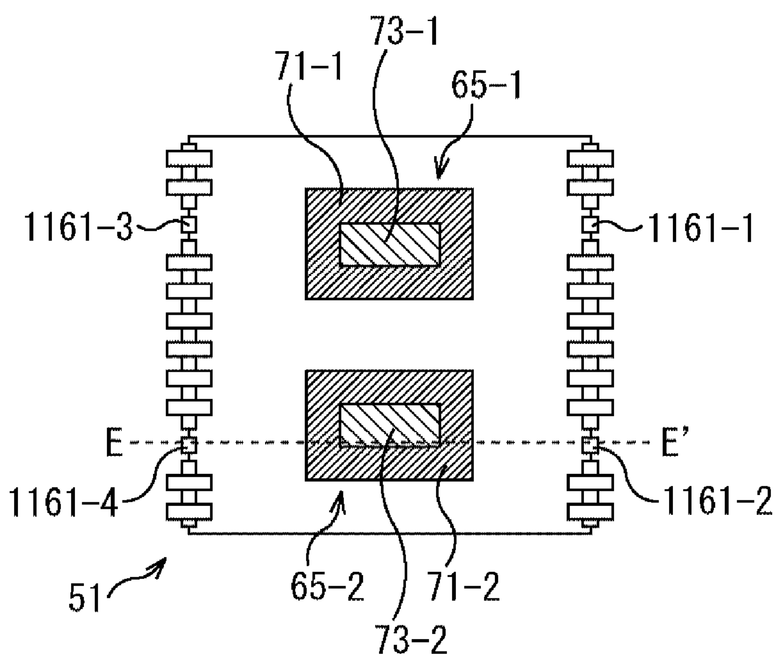
FIG. 55 is a diagram of a pixel viewed from a direction perpendicular to a surface of a substrate.

In such a case, for example, as illustrated in FIG. 55, a contact provided in a multilayer wiring layer 811 and connected to the ground line can be used as a voltage application unit. Note that, in FIG. 55, constituent members corresponding to those in the case of FIG. 3 are denoted with the same reference numerals and the description thereof will be omitted as appropriate.

FIG. 55 is a diagram of a pixel 51 viewed from a direction perpendicular to a surface of a substrate 61.

In this example, transistors are drawn at boundary portions of the pixel 51 in a left-right direction in the drawing. Furthermore, contacts 1161-1 to 1161-4 connected to a ground line 832, a ground line 834, and the like are provided at boundary portions of the pixel 51 in the left-right direction in the drawing.

These contacts 1161-1 to 1161-4 are formed, for example, by a metal material such as copper (Cu). Note that, hereinafter, the contacts 1161-1 to 1161-4 are also simply referred to as contacts 1161 in a case where it is not particularly necessary to distinguish between the contacts 1161-1 to 1161-4.

Since the contact 1161 is connected to a wiring having a constant voltage, such as the ground line 832, the contact 1161 can be used as a voltage application unit for applying a voltage to the substrate 61. Here, for example, a constant voltage such as 0 V is always applied to the contact 1161.

Accordingly, for example, since a current flows between a signal retrieving unit 65 that is assigned as an active tap and the contact 1161, the charge (electron) transfer efficiency can be improved.

Note that, here, an example has been described in which the contacts 1161 functioning as voltage application units are provided at left and right boundary positions of the pixel 51 in the drawing. However, the contacts 1161 functioning as voltage application units may be provided at upper and lower boundary positions of the pixel 51 in the drawing, or may be provided at upper, lower, left and right boundary positions.

Figure 56:
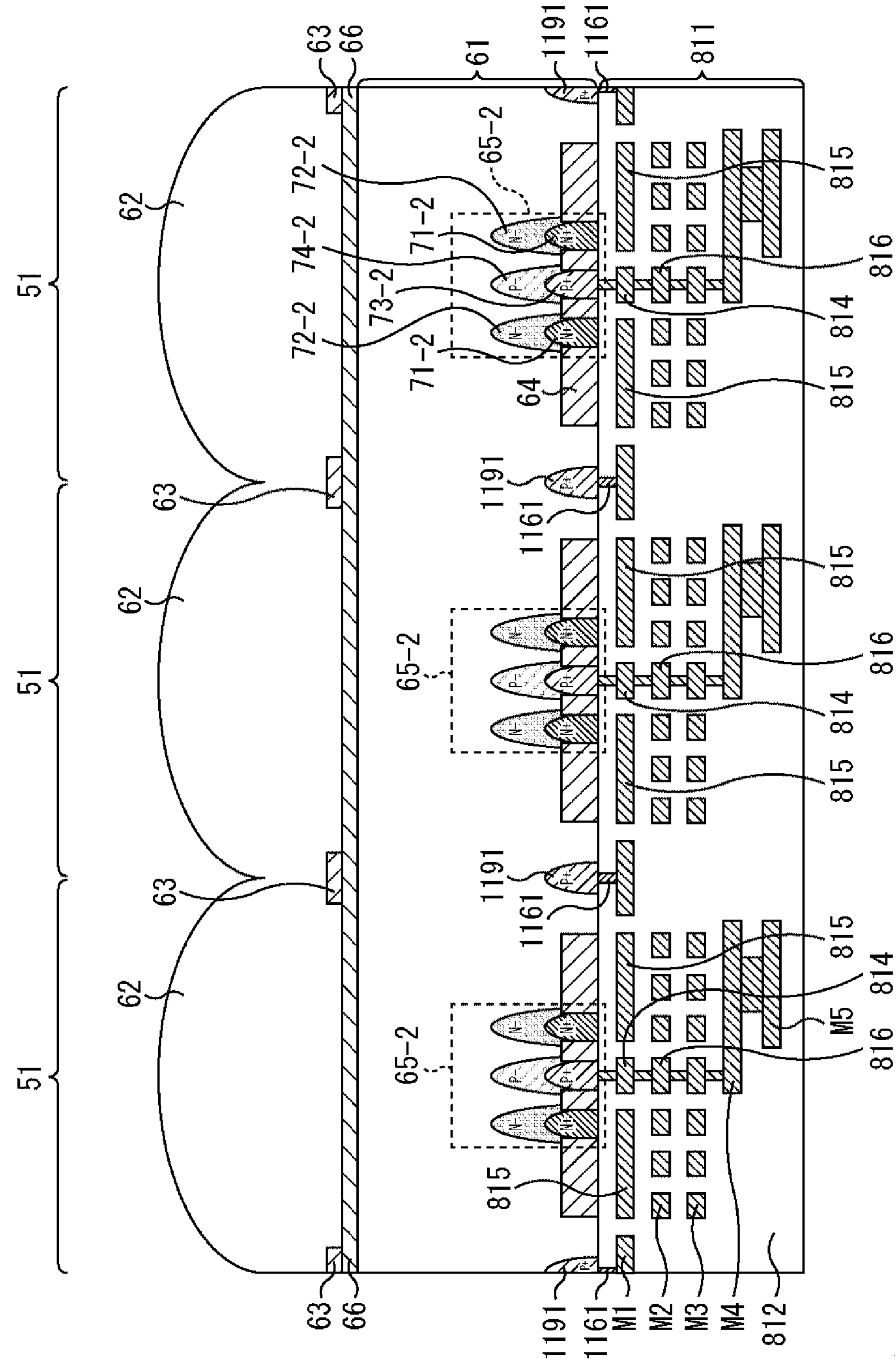
FIG. 56 is a cross-sectional view of a plurality of pixels.

Furthermore, a cross-sectional view of a plurality of pixels corresponding to an E-E' line in the pixel 51 illustrated in FIG. 55 is as illustrated in FIG. 56, for example. Note that, in FIG. 56, constituent members corresponding to those in the case of FIG. 37 are denoted with the same reference numerals and the description thereof will be omitted as appropriate.

The configuration of the pixel 51 illustrated in FIG. 56 is configured such that the contact 1161 is provided instead of the transistor in the configuration of the pixel 51 illustrated in FIG. 37. This is because not the transistor but the contact 1161 is arranged at a cross-sectional position of the multilayer wiring layer 811 corresponding to the E-E' line.

In this example, the contact 1161 is formed in the multilayer wiring layer 811 at a boundary portion between pixels 51 adjacent to each other and the contact 1161 is connected to the ground line or the like on the metal film M1. In particular, the contact 1161 is arranged at a boundary portion between the multilayer wiring layer 811 and the substrate 61, and a P+ semiconductor region 1191 is formed in a portion in the substrate 61 adjacent to the contact 1161 so as to cover the portion of the contact 1161.

With such a configuration, the substrate 61 is placed in a state in which a constant voltage is always applied to the substrate 61 by the contact 1161.

Drive Example of Pixel

Next, a drive example of the pixel 51 illustrated in FIG. 55 will be described.

Figure 57:
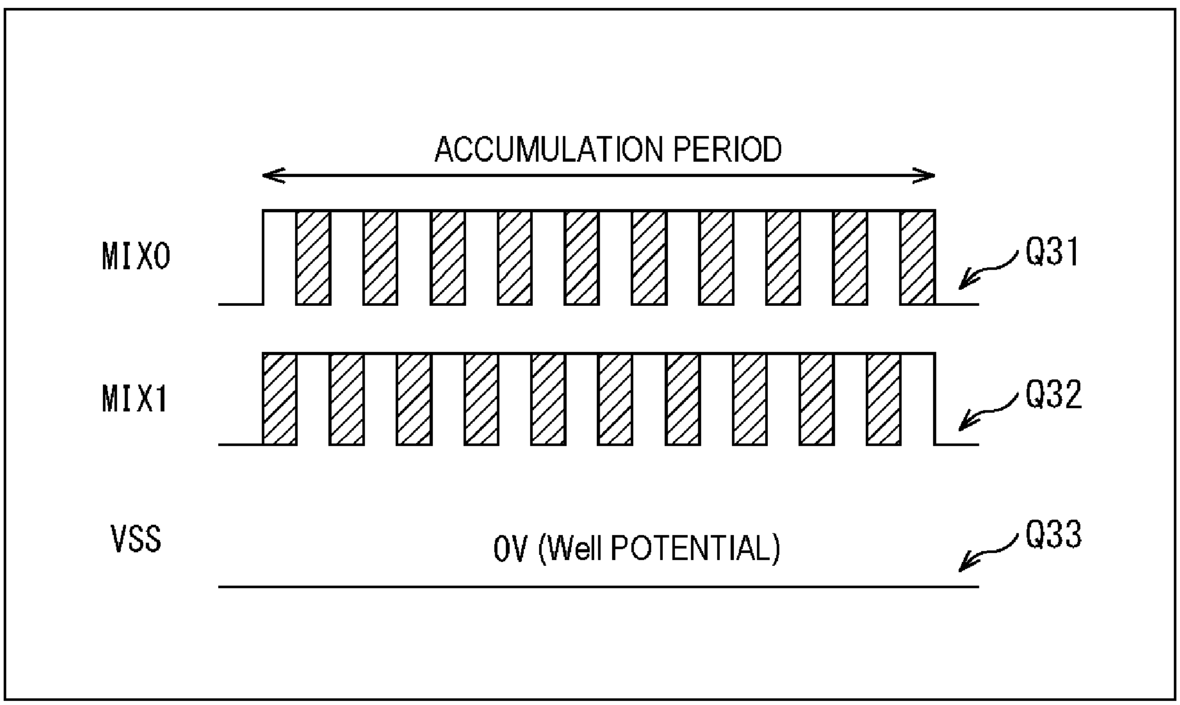
FIG. 57 is a diagram for explaining driving of the signal retrieving unit.

For example, as illustrated in FIG. 57, a tap drive unit 21 controls the driving of the signal retrieving unit 65 in the accumulation period of a charge generated by the photoelectric conversion in the substrate 61.

In FIG. 57, a portion indicated by an arrow Q31 illustrates the voltage MIX0 applied to a P+ semiconductor region 73-1 of the signal retrieving unit 65-1, and a portion indicated by an arrow Q32 illustrates the voltage MIX1 applied to a P+ semiconductor region 73-2 of the signal retrieving unit 65-2. In particular, shaded portions of the voltages MIX0 and MIX1 indicated by the arrows Q31 and Q32 indicate that the floating state is enabled.

Furthermore, a portion indicated by the arrow Q33 illustrates a voltage applied to the contact 1161, which is a voltage application unit.

In this example, as indicated by the arrow Q33, the contact 1161 is placed in a state in which a constant fixed voltage such as 0 V is continuously applied to the contact 1161.

On the other hand, in the P+ semiconductor region 73-1, a state in which a positive voltage such as 1.5 V is applied as the voltage MIX0 and the floating state are alternately repeated.

Specifically, at the timing when the signal retrieving unit 65-1 is assigned as an active tap, the tap drive unit 21 places a transistor 1041A in an ON state and applies a positive voltage such as 1.5 V to the P+ semiconductor region 73-1. Furthermore, at the timing when the signal retrieving unit 65-1 is not assigned as an active tap, the tap drive unit 21 places the transistor 1041A in an OFF state and places the P+ semiconductor region 73-1 in a floating state.

Similarly, in the P+ semiconductor region 73-2, for example, a state in which a positive voltage such as 1.5 V is applied to the P+ semiconductor region 73-2 as the voltage MIX1 and the floating state are alternately repeated.

In particular, the tap drive unit 21 places the P+ semiconductor region 73-2 in a floating state when a positive voltage is applied to the P+ semiconductor region 73-1, and places the P+ semiconductor region 73-1 in a floating state when a positive voltage is applied to the P+ semiconductor region 73-2.

As described above, by performing the driving described with reference to FIG. 57, the amount of current consumption can be cut down and also the charge (electron) transfer efficiency can be improved similarly to the case of the eighteenth embodiment, such that the distance can be detected with high accuracy. In different terms, characteristics of the CAPD sensor can be improved.

Besides, also in the twentieth embodiment, the tap drive unit 21 may be enabled to switch between the floating mode and the normal mode as appropriate.

Note that, in the eighteenth to twentieth embodiments described above, examples in which the reflecting member 815 is provided in the multilayer wiring layer 811 in FIGS. 48, 51, 53, and 56 have been described. In particular, here, the reflecting member 815 is provided so as to overlap the N+ semiconductor region 71 when viewed in plan, that is, when viewed from a direction perpendicular to a surface of the substrate 61. However, the light-shielding member 631' may be provided instead of the reflecting member 815. Even in such a case, the light-shielding member 631' is provided so as to overlap the N+ semiconductor region 71 when viewed in plan.

Twenty-First Embodiment

Configuration Example of Pixel

Incidentally, the substrate 61 and the multilayer wiring layer 811 constituting the pixel 51 are provided with structures such as an oxide film, a metal material, and a gate electrode.

For this reason, when infrared light that has been condensed by the on-chip lens 62 and entered the substrate 61 is reflected by these structures, the resultant reflected light enters the region of another pixel 51 being adjacent, causing the deterioration of pixel sensitivity or the occurrence of crosstalk. Furthermore, when crosstalk occurs, the resolution of a depth image generated by the light receiving element 1 during ranging, that is, the ranging accuracy is deteriorated.

Therefore, in the present technology, by providing a pixel isolation portion that isolates a light receiving region of a pixel 51 at a boundary portion of each pixel 51, an improvement in pixel sensitivity and suppression of the occurrence of crosstalk can be achieved. That is, characteristics of the CAPD sensor, such as sensitivity characteristics and the ranging accuracy can be improved. Note that, here, the light receiving region refers to a region in the substrate 61 where photoelectric conversion is performed.

In the following, a configuration example of a pixel 51 for suppressing the deterioration of the pixel sensitivity and crosstalk will be described with reference to FIGS. 58 to 93.

Note that, in FIGS. 58 to 93, constituent members corresponding to those in the case of FIG. 3, 36, 37, or 42 are denoted with the same reference numerals and the description thereof will be omitted as appropriate. Furthermore, in FIGS. 58 to 93, constituent members corresponding to each other are denoted with the same reference numerals and the description thereof will be omitted as appropriate.

First, the configuration of the pixel 51 according to a twenty-first embodiment will be described with reference to FIGS. 58 to 60.

Figure 58:
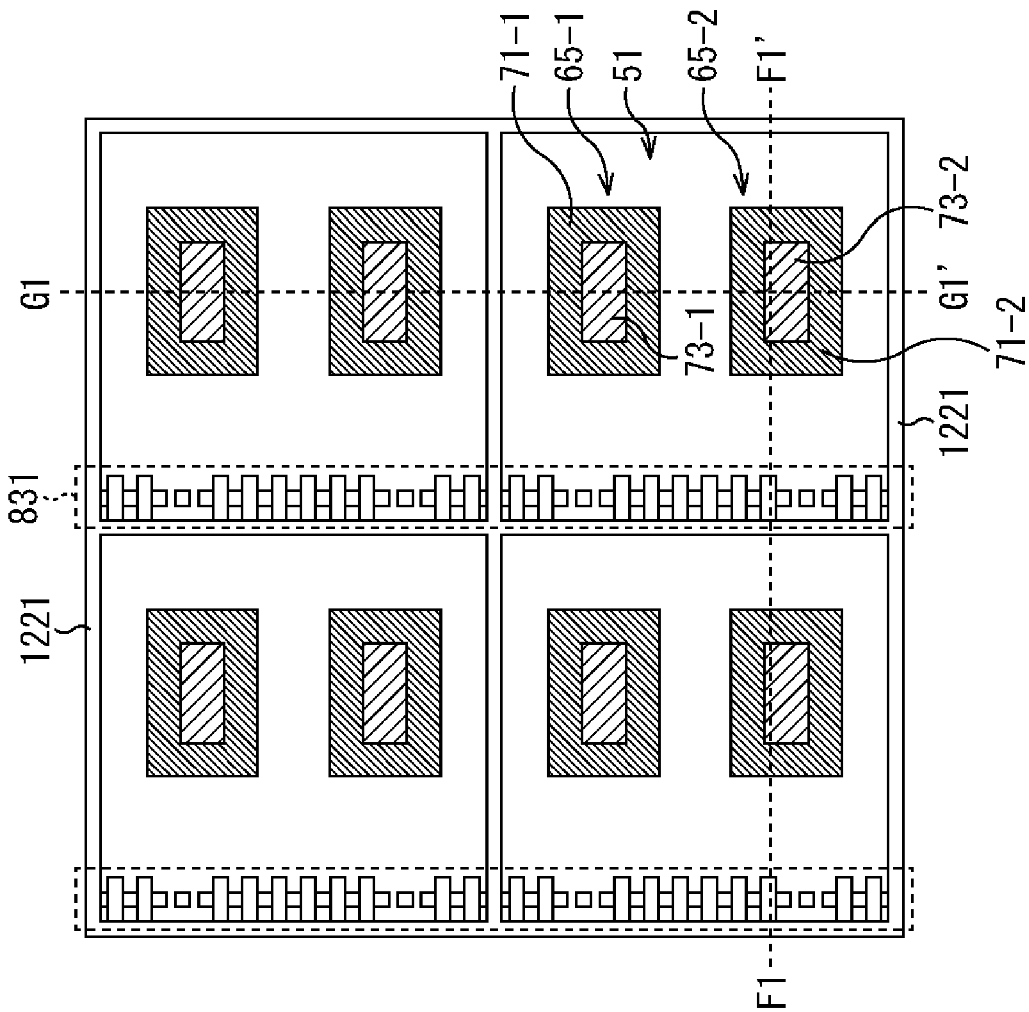
FIG. 58 is a diagram of pixels viewed from a direction perpendicular to a surface of a substrate.

FIG. 58 is a diagram of the pixels 51 viewed from a direction perpendicular to a surface of a substrate 61.

In this example, a pixel isolation portion 1221 that functions as a pixel isolation region that isolates the regions of the pixels 51 (light receiving regions) from each other is formed at a boundary portion of the pixels 51 adjacent to each other so as to surround the region of each pixel 51, that is, the light receiving region of the pixel 51 when viewed in plan.

A pixel transistor wiring region 831 is provided in a portion in the vicinity of a pixel boundary in the multilayer wiring layer 811 of the pixel 51.

Furthermore, a transistor and the like that drive the pixel 51 are formed in the substrate 61 and the multilayer wiring layer 811 at a boundary portion between these substrate 61 and multilayer wiring layer 811.

Specifically, for example, a reset transistor 723A and a transfer transistor 721A connected to an N+ semiconductor region 71-1, or a reset transistor 723B and a transfer transistor 721B connected to an N+ semiconductor region 71-2, and the like are formed at a boundary portion between the substrate 61 and the multilayer wiring layer 811.

In a case of being viewed from a direction perpendicular to a surface of the substrate 61, that is, when viewed in plan, a transistor that drives the pixel 51 is arranged in the pixel transistor wiring region 831. For this reason, it can be said that the pixel transistor wiring region 831 is a transistor region where a transistor is formed, when viewed in plan. In the example illustrated in FIG. 58, the pixel isolation portion 1221 is arranged at a position shifted from the transistor and the like such that the arrangement position of the transistor and the like for driving the pixel 51 and the arrangement position of the pixel isolation portion 1221 are positioned differently from each other when viewed from a direction perpendicular to a surface of the substrate 61.

In different terms, the pixel isolation portion 1221 is provided in the pixel transistor wiring region 831, that is, a region different from the transistor region when viewed in plan.

Figure 59:
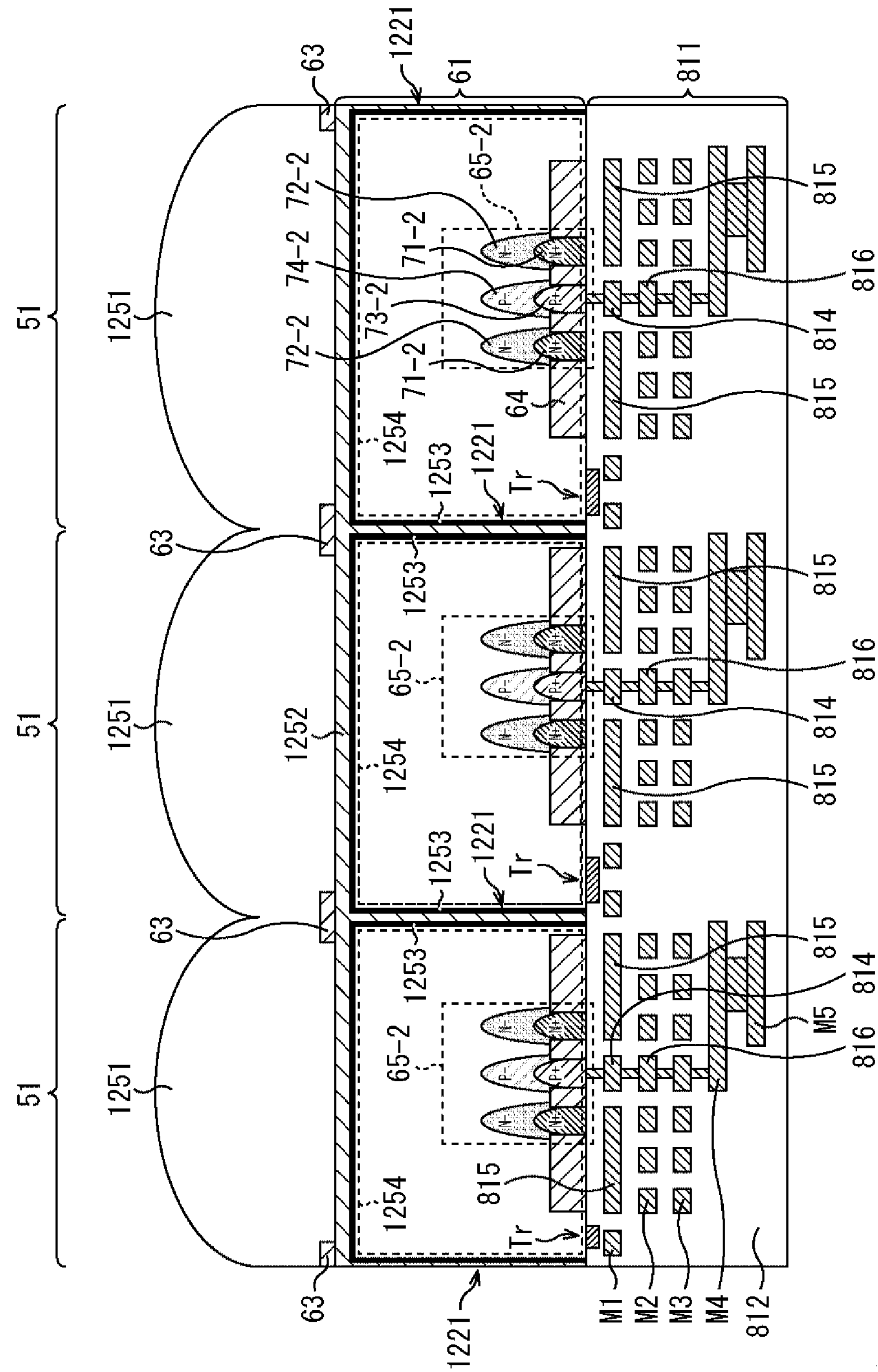
FIG. 59 is a cross-sectional view of a plurality of pixels.
Figure 60:
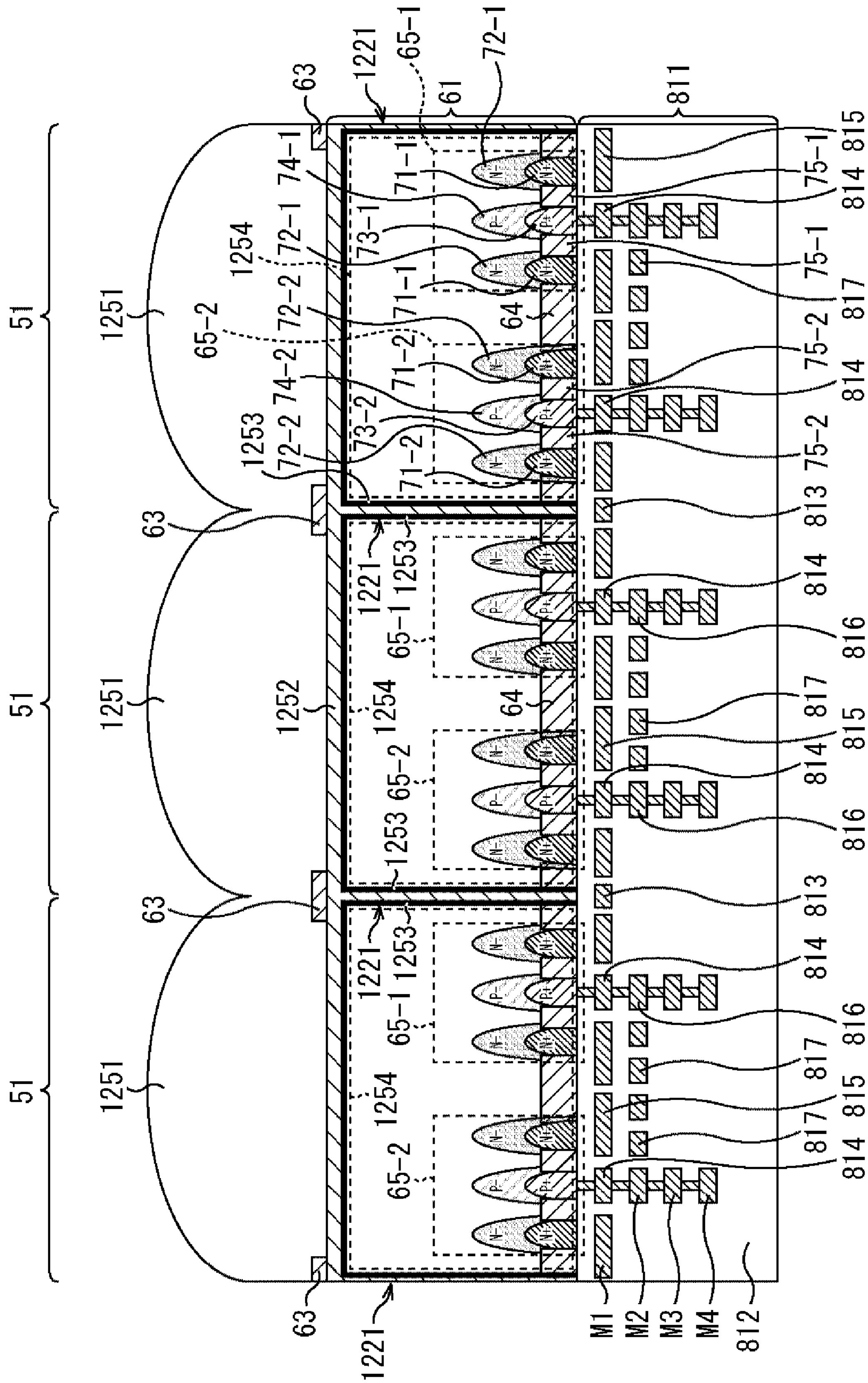
FIG. 60 is a cross-sectional view of a plurality of pixels.

Here, a cross section corresponding to an F1-F1' line and a cross section corresponding to a G1-G1' line in FIG. 58 are illustrated in FIGS. 59 and 60.

The configuration of the pixel 51 illustrated in FIGS. 59 and 60 is configured such that the on-chip lens 62 and the fixed charge film 66 in the configuration of the pixel 51 illustrated in FIGS. 36 and 37 are not provided, but an on-chip lens 1251, an oxide film 1252, and a fixed charge film 1253 are newly provided.

As illustrated in FIG. 59, in the respective pixels 51, the on-chip lenses 1251 are arranged adjacent on the light entrance surface side of the substrate 61, that is, an opposite side of the side of the multilayer wiring layer 811. The on-chip lens 1251 condenses infrared light that has entered from the outside and guides the condensed infrared light to the inside of the substrate 61.

Furthermore, in each pixel 51, a portion constituting one pixel 51 in the substrate 61 has a light receiving region 1254. Then, the light receiving regions 1254 of the pixels 51 that are adjacent are isolated from each other by the pixel isolation portion 1221 constituted by a part of the oxide film 1252 and the fixed charge film 1253.

Here, in a case of being viewed from a direction perpendicular to a surface of the substrate 61, that is, in a case of being viewed in plan, the light receiving region 1254 is surrounded by the pixel isolation portion 1221. In different terms, the pixel isolation portion 1221 is formed at a boundary portion between the light receiving regions 1254 adjacent to each other.

In the example illustrated in FIG. 59, the oxide film 1252 is formed so as to cover a surface of the substrate 61 on the side of the on-chip lens 1251. Moreover, the oxide film 1252 passes through the substrate 61 at a boundary portion between the pixels 51 adjacent to each other, and owing to this configuration, the light receiving regions 1254 of the pixels 51 that are adjacent are placed in an isolated state.

Furthermore, in the inside of the substrate 61, a region between the semiconductor region of P-type constituting the substrate 61 and the oxide film 1252, that is, an outer surface portion of the oxide film 1252 is covered with the fixed charge film 1253.

In particular, in this example, a portion of the oxide film 1252 and the fixed charge film 1253 having a trench structure that is long in a direction perpendicular to a surface of the substrate 61, that is, a portion functioning as a full trench isolation (FTI) that passes through the substrate 61 and isolates the light receiving regions 1254 from each other between the pixels 51 that are adjacent, has the pixel isolation portion 1221.

Note that, it has been described here that the pixel isolation portion 1221 is constituted by the oxide film 1252 and the fixed charge film 1253; however, it can also be understood that the pixel isolation portion 1221 is constituted by only the oxide film 1252.

Besides, the pixel isolation portion 1221 may be formed not by the oxide film 1252, but by a metal material and the fixed charge film 1253 covering this metal material, or formed by a metal material and the oxide film. That is, the pixel isolation portion 1221 can be formed by at least one of the oxide film, the fixed charge film, or the metal material.

The pixel isolation portion 1221 is formed at a boundary portion of the pixel 51. For this reason, even if infrared light that has entered the substrate 61 through the on-chip lens 1251 is reflected by a structure such as the oxide film 64, a gate electrode of the transistor, or a metal material, the reflected light can be prevented from entering the pixel 51 being adjacent because the pixel isolation portion 1221 is provided.

Consequently, the occurrence of crosstalk and the deterioration of the pixel sensitivity can be suppressed, and characteristics of the CAPD sensor, such as sensitivity characteristics and the ranging accuracy (resolution) can be improved.

Furthermore, in the example illustrated in FIG. 59, the pixel isolation portion 1221 is formed at a position shifted from a position where the transistor is formed in the lateral direction in the drawing. That is, the pixel isolation portion 1221 is not arranged immediately above the transistor.

For example, if the pixel isolation portion 1221 is formed immediately above the transistor, a leakage current from the fixed charge film 1253 of the pixel isolation portion 1221 is sometimes generated in the transistor, in more detail, a P-well portion that covers the transistor in the substrate 61.

Therefore, in this embodiment, the pixel isolation portion 1221 is formed at a position shifted from immediately above the transistor, and owing to this configuration, the generation of such a leakage current is suppressed.

Note that, in more detail, the pixel isolation portion 1221 is formed at a position away from the P-well portion that covers the transistor, but the pixel isolation portion 1221 may be formed so as to pass through a part of the P-well.

Moreover, in the example illustrated in FIG. 59, since the pixel isolation portion 1221 is formed at a position shifted in line with the position of the transistor, an inter-pixel light-shielding film 63 and the on-chip lens 1251 are also shifted and arranged in line with the shifted position.

That is, the inter-pixel light-shielding film 63 is arranged so as to be positioned on an upper side of (immediately above) the pixel isolation portion 1221 in FIG. 59. Furthermore, as illustrated in FIG. 59, when viewed from a direction parallel to a surface of the substrate 61, the position of the center of the on-chip lens 1251, that is, the optical axis of the on-chip lens 1251, is arranged so as to coincide with approximately the middle position between two pixel isolation portions 1221 provided at two ends of the pixel 51 (the side walls of the pixel 51).

In different terms, the on-chip lens 1251 is arranged such that the position of the optical axis of the on-chip lens 1251 is positioned at approximately the center of a rectangular region surrounded by the pixel isolation portions 1221 located at boundaries of the pixels 51 as illustrated in FIG. 58. By configuring in this manner, the amount of light (the amount of received light) guided into the light receiving region 1254 by the on-chip lens 1251 can be further expanded, and sensitivity characteristics can be improved.

In addition, a cross-sectional view corresponding to the G1-G1' line of the pixels 51 illustrated in FIG. 58 is as illustrated in FIG. 60. Also in FIG. 60, similarly to the case of FIG. 59, a portion of the oxide film 1252 and the fixed charge film 1253 having a trench structure that is long in a direction perpendicular to a surface of the substrate 61 has the pixel isolation portion 1221, and the light receiving regions 1254 are isolated from each other between the pixels 51 that are adjacent by the pixel isolation portion 1221. In particular, here, the pixel isolation portion 1221 passes through the portion of the oxide film 64 and reaches the multilayer wiring layer 811.

According to the pixel 51 having the configuration illustrated in FIGS. 58 to 60 as described above, characteristics such as sensitivity characteristics and the ranging accuracy (resolution) can be improved, and furthermore the generation of a leakage current can also be suppressed.

Note that, in FIG. 59, an example in which the arrangement position of the on-chip lens 1251 is shifted in line with the formation position of the pixel isolation portion 1221 has been described.

However, when viewed from a direction perpendicular to a surface of the substrate 61, the on-chip lens 1251 may be arranged such that the position of the optical axis of the on-chip lens 1251 coincides with approximately the middle position between two signal retrieving units 65, in more detail, between two N+ semiconductor regions 71 in the pixel 51.

By configuring in this manner, infrared light can be condensed at a position between the signal retrieving units 65-1 and 65-2, and the electron retrieving efficiency can be made approximately equal between these signal retrieving units 65.

Moreover, for example, in the example illustrate in FIG. 58, the signal retrieving units 65-1 and 65-2 may be shifted and arranged such that a position between these signal retrieving units 65 is positioned on the optical axis of the on-chip lens 1251.

Twenty-Second Embodiment

Configuration Example of Pixel

Next, the configuration of a pixel 51 according to a twenty-second embodiment will be described with reference to FIGS. 61 to 63.

Figure 61:
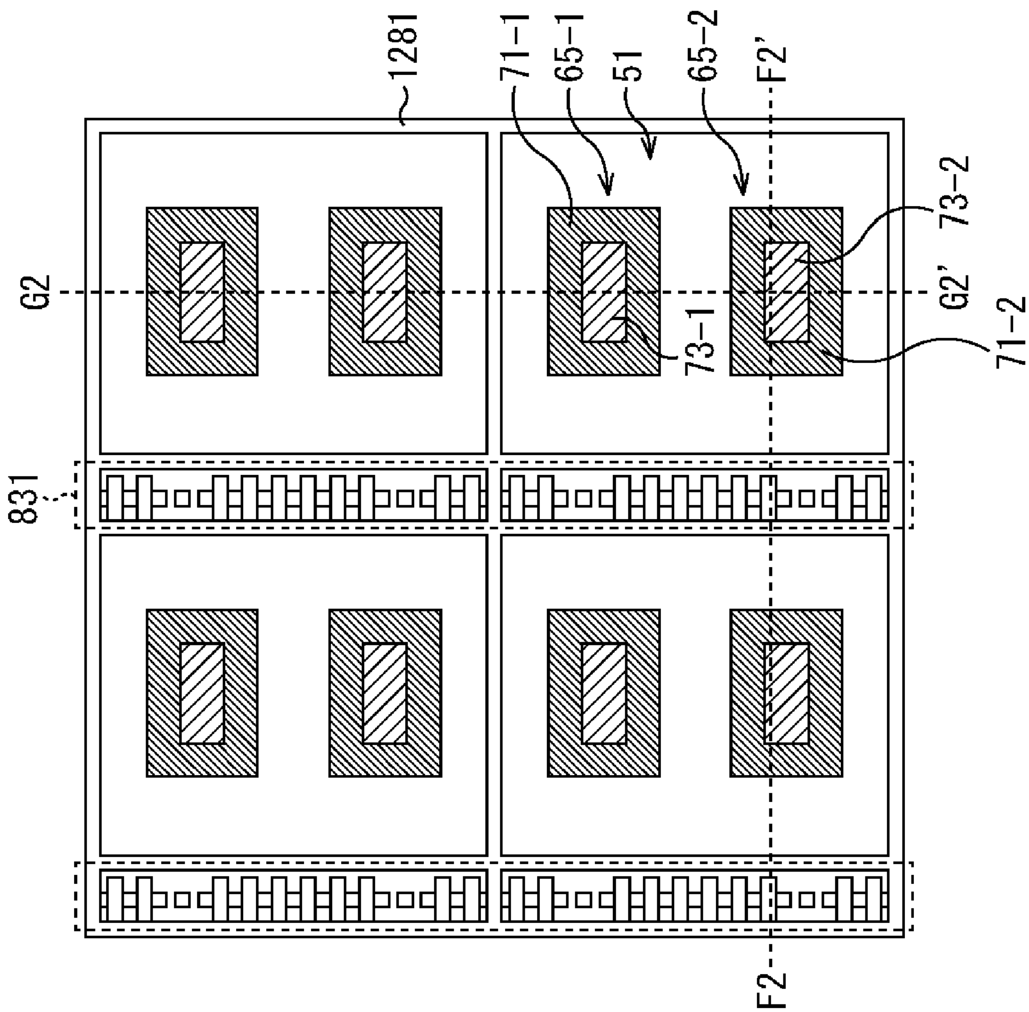
FIG. 61 is a diagram of pixels viewed from a direction perpendicular to a surface of a substrate.

FIG. 61 is a diagram of the pixels 51 viewed from a direction perpendicular to a surface of a substrate 61.

In this example, a pixel isolation portion 1281 that functions as a pixel isolation region that isolates the regions of the pixels 51 from each other is formed at a boundary portion of the pixels 51 adjacent to each other so as to surround the region of each pixel 51.

Moreover, in this example, a pixel transistor wiring region 831, in more detail, a transistor region where a transistor is formed, of a multilayer wiring layer 811 in the pixel 51 is also surrounded by the pixel isolation portion 1281. In different terms, the pixel isolation portions 1281 are provided at two end portions of the pixel transistor wiring region 831 (transistor region) in the left-right direction in the drawing.

Also in FIG. 61, similarly to the case of FIG. 58, the arrangement position of the transistor and the like for driving the pixel 51 and the arrangement position of the pixel isolation portion 1281 are positioned differently from each other when viewed from a direction perpendicular to a surface of the substrate 61. That is, the pixel isolation portion 1281 is arranged at a position shifted from the transistor and the like.

By forming the pixel isolation portion 1281 so as to surround (sandwich) the transistor region, the light receiving region and the transistor region can be isolated from each other, and infrared light can be prevented from entering a gate electrode portion of the transistor.

Figure 62:
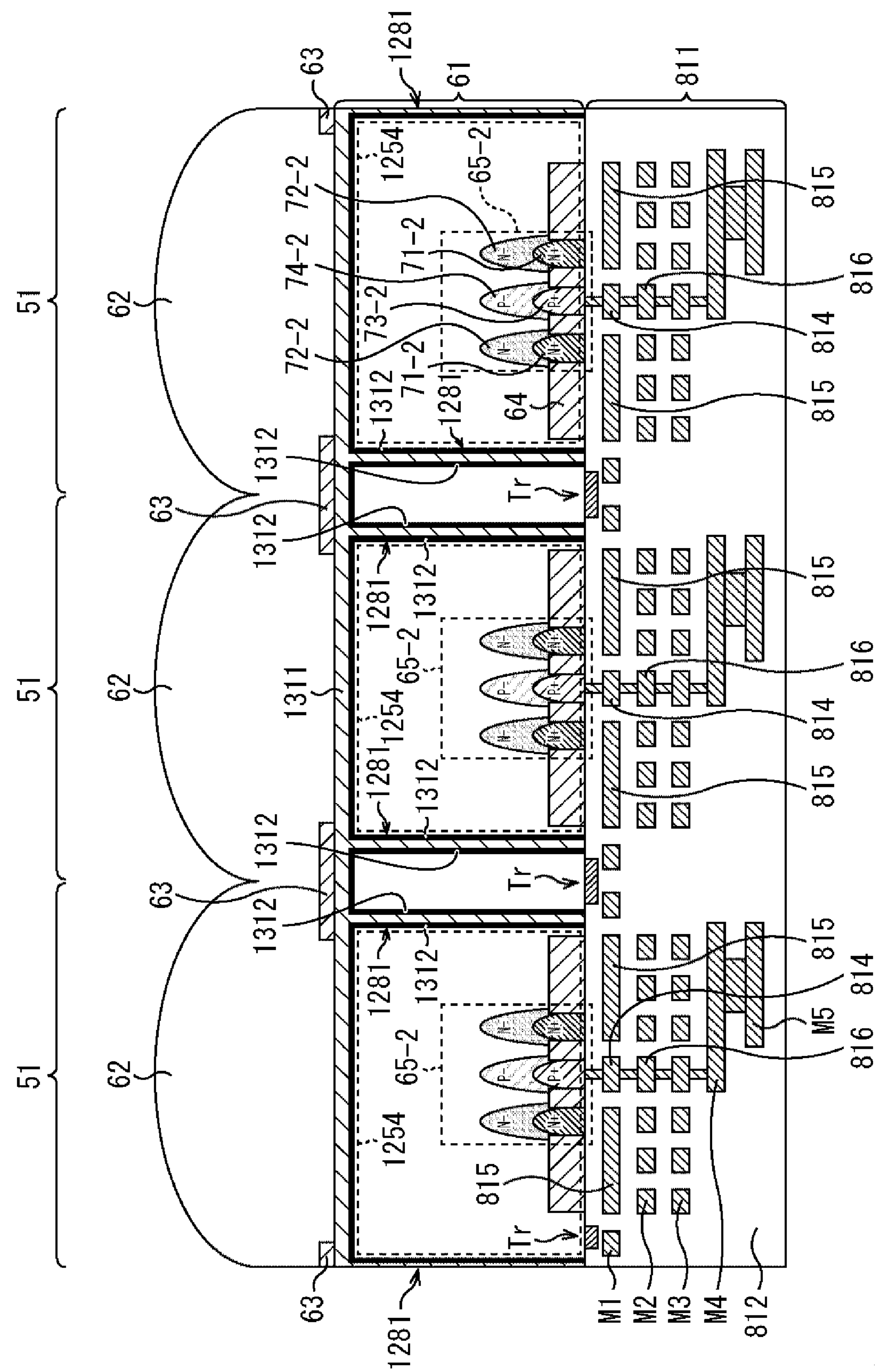
FIG. 62 is a cross-sectional view of a plurality of pixels.
Figure 63:
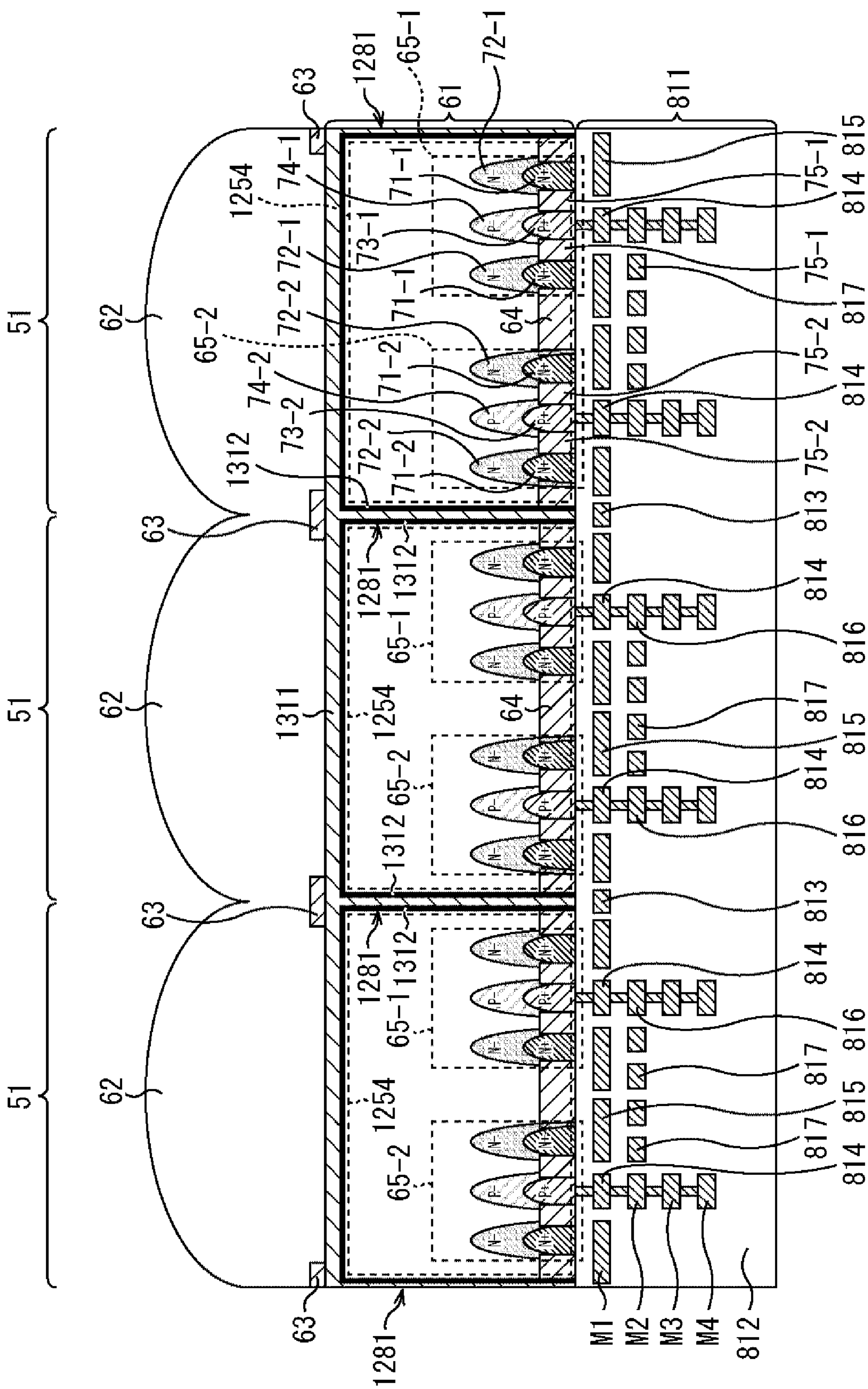
FIG. 63 is a cross-sectional view of a plurality of pixels.

Here, a cross section corresponding to an F2-F2' line and a cross section corresponding to a G2-G2' line in FIG. 61 are illustrated in FIGS. 62 and 63.

The configuration of the pixel 51 illustrated in FIGS. 62 and 63 is configured such that the fixed charge film 66 in the configuration of the pixel 51 illustrated in FIGS. 36 and 37 is not provided, but an oxide film 1311 and a fixed charge film 1312 are newly provided.

As illustrated in FIG. 62, in each pixel 51, the region of a portion surrounded by the pixel isolation portion 1281 where the signal retrieving unit 65 is arranged, out of a portion constituting one pixel 51 in the substrate 61, has a light receiving region 1254.

Here, the pixel isolation portion 1281 is constituted by a part of the oxide film 1311 and the fixed charge film 1312.

That is, in the example illustrated in FIG. 62, the oxide film 1311 is formed so as to cover a surface of the substrate 61 on the side of an on-chip lens 62. Moreover, in a boundary portion between the pixels 51 adjacent to each other, the oxide film 1311 passes through the substrate 61, and additionally the region of the transistor in the substrate 61 is surrounded by the oxide film 1311 formed so as to pass through the substrate 61 such that infrared light does not enter the transistor.

In the inside of the substrate 61, a region between the semiconductor region of P-type constituting the substrate 61 and the oxide film 1311, that is, an outer surface portion of the oxide film 1311 is covered with the fixed charge film 1312.

In particular, in this example, a portion of the oxide film 1311 and the fixed charge film 1312 having a trench structure that is long in a direction perpendicular to a surface of the substrate 61, that is, the portion of the FTI structure that passes through the substrate 61, has the pixel isolation portion 1281.

Note that, it has been described here that the pixel isolation portion 1281 is constituted by the oxide film 1311 and the fixed charge film 1312; however, it can also be understood that the pixel isolation portion 1281 is constituted by only the oxide film 1311.

Besides, the pixel isolation portion 1281 may be formed by a metal material and the fixed charge film, or formed by a metal material and the oxide film.

In the example illustrated in FIG. 62, since the pixel isolation portion 1281 is formed at a boundary portion of the pixel 51, reflected light of infrared light that has entered the substrate 61 through the on-chip lens 62 can be prevented from entering the pixel 51 being adjacent, similarly to the example illustrated in FIG. 59.

Consequently, the occurrence of crosstalk and the deterioration of the pixel sensitivity can be suppressed, and characteristics of the CAPD sensor, such as sensitivity characteristics and the ranging accuracy (resolution) can be improved.

Furthermore, the region of the transistor in the substrate 61 is surrounded by the pixel isolation portion 1281, and an inter-pixel light-shielding film 63 is arranged immediately above that region surrounded by the pixel isolation portion 1281. Accordingly, infrared light condensed by the on-chip lens 62 can be prevented from entering the transistor, in particular, a gate electrode portion of the transistor.

Consequently, the reflection of infrared light at the gate electrode portion of the transistor can be prevented, and the occurrence of crosstalk and the deterioration of the pixel sensitivity can be further suppressed.

Moreover, in the example illustrated in FIG. 62, similarly to the example illustrated in FIG. 59, since the pixel isolation portion 1281 is formed at a position shifted from the transistor, the generation of a leakage current at a P-well portion that covers the transistor can be suppressed.

In addition, a cross-sectional view corresponding to the G2-G2' line of the pixels 51 illustrated in FIG. 61 is as illustrated in FIG. 63. Also in FIG. 63, similarly to the case of FIG. 62, a portion of the oxide film 1311 and the fixed charge film 1312 having a trench structure that is long in a direction perpendicular to a surface of the substrate 61 has the pixel isolation portion 1281, and the light receiving regions 1254 are isolated from each other between the pixels 51 that are adjacent by the pixel isolation portion 1281. In particular, here, the pixel isolation portion 1281 passes through the portion of the oxide film 64 and reaches the multilayer wiring layer 811.

According to the pixel 51 having the configuration illustrated in FIGS. 61 to 63 as described above, characteristics such as sensitivity characteristics and the ranging accuracy (resolution) can be improved, and furthermore the generation of a leakage current can also be suppressed.

Twenty-Third Embodiment

Configuration Example of Pixel

The configuration of a pixel 51 according to a twenty-third embodiment will be described with reference to FIGS. 64 to 66.

Figure 64:
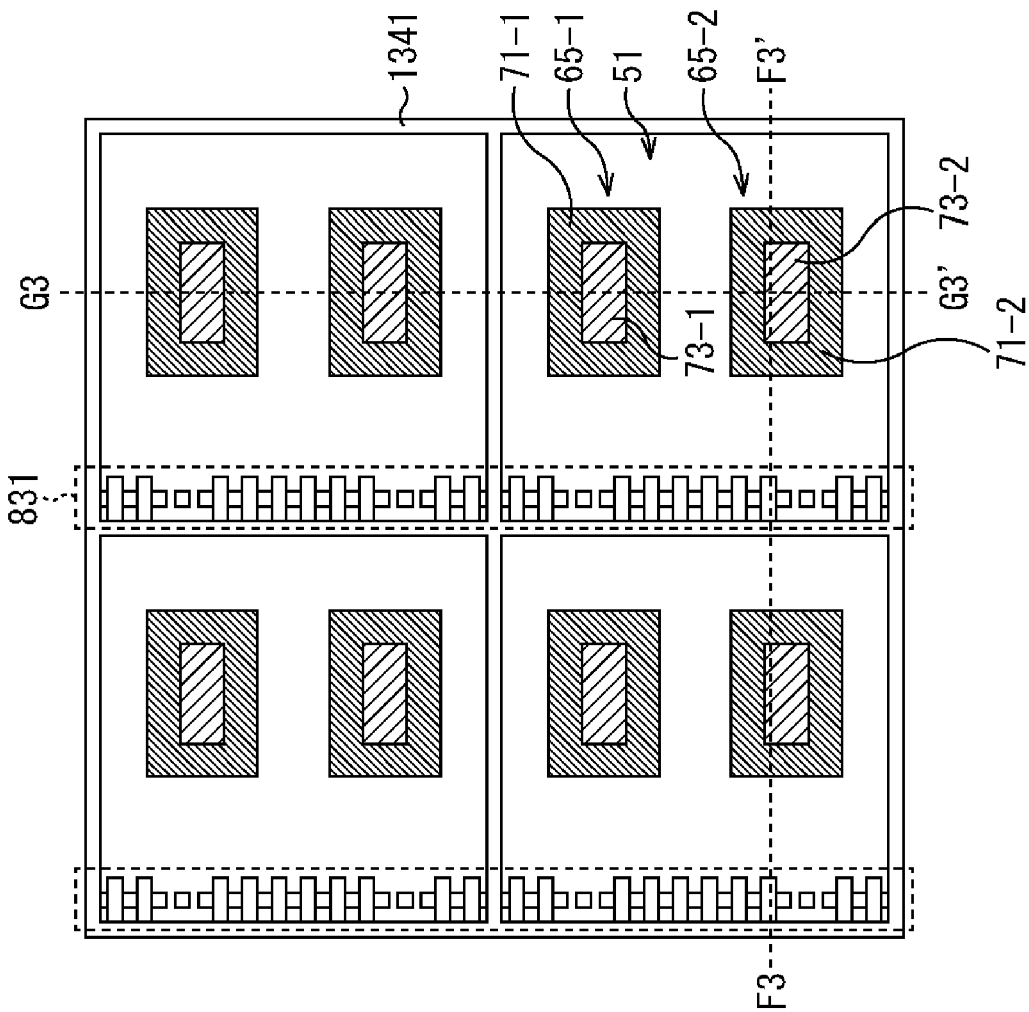
FIG. 64 is a diagram of pixels viewed from a direction perpendicular to a surface of a substrate.

FIG. 64 is a diagram of the pixels 51 viewed from a direction perpendicular to a surface of a substrate 61.

In this example, a pixel isolation portion 1341 that functions as a pixel isolation region that isolates the regions of the pixels 51 from each other is formed at a boundary portion of the pixels 51 adjacent to each other so as to surround the region of each pixel 51.

Also in FIG. 64, similarly to the case of FIG. 58, the arrangement position of the transistor and the like for driving the pixel 51 and the arrangement position of the pixel isolation portion 1341 are positioned differently from each other when viewed from a direction perpendicular to a surface of the substrate 61. That is, the pixel isolation portion 1341 is arranged at a position shifted from the transistor and the like.

Note that the pixel isolation portion 1341 differs from the pixel isolation portion 1221 illustrated in FIG. 58 in that the pixel isolation portion 1221 passes through the substrate 61, whereas the pixel isolation portion 1341 does not pass through the substrate 61.

Figure 65:
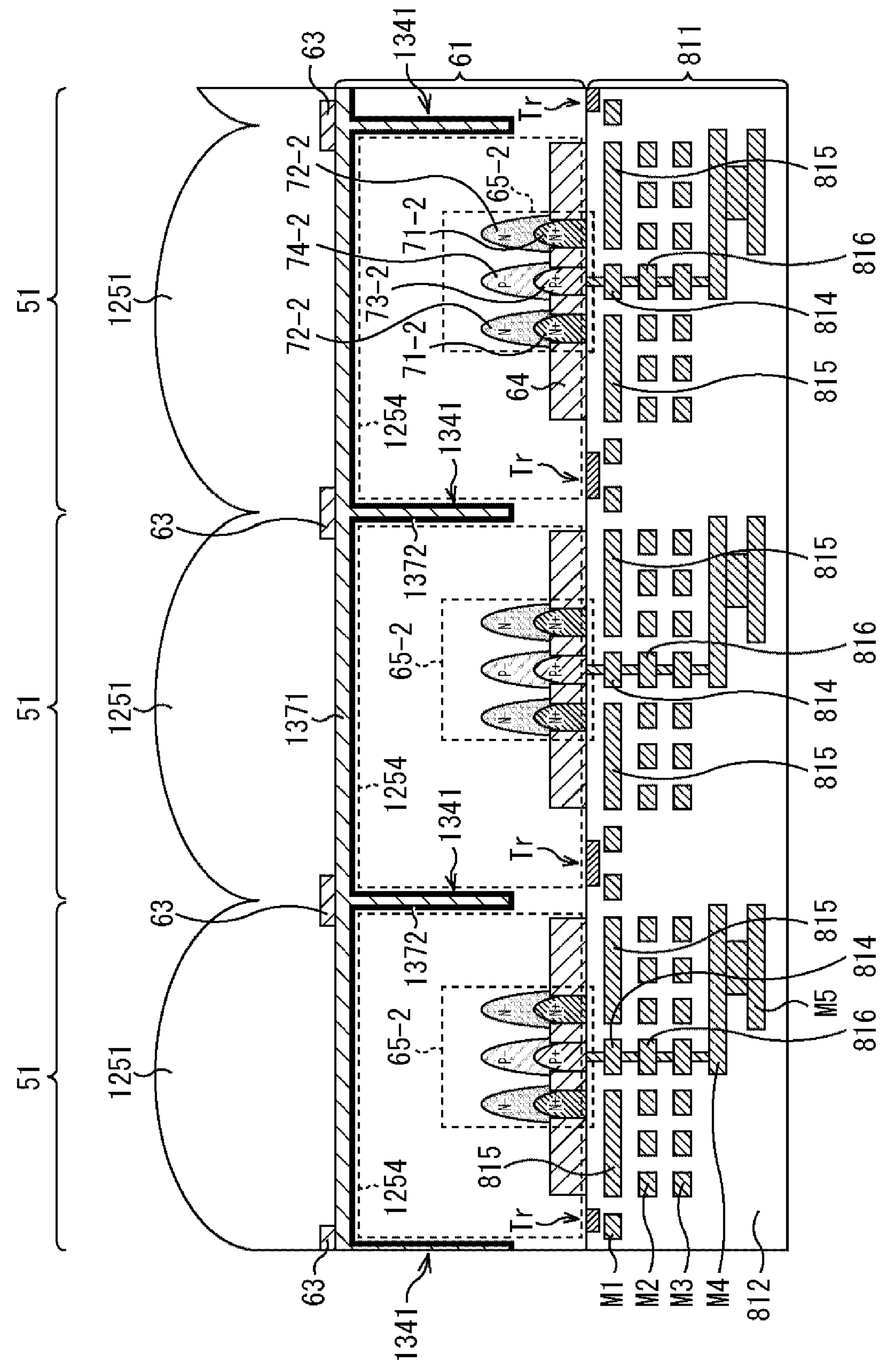
FIG. 65 is a cross-sectional view of a plurality of pixels.
Figure 66:
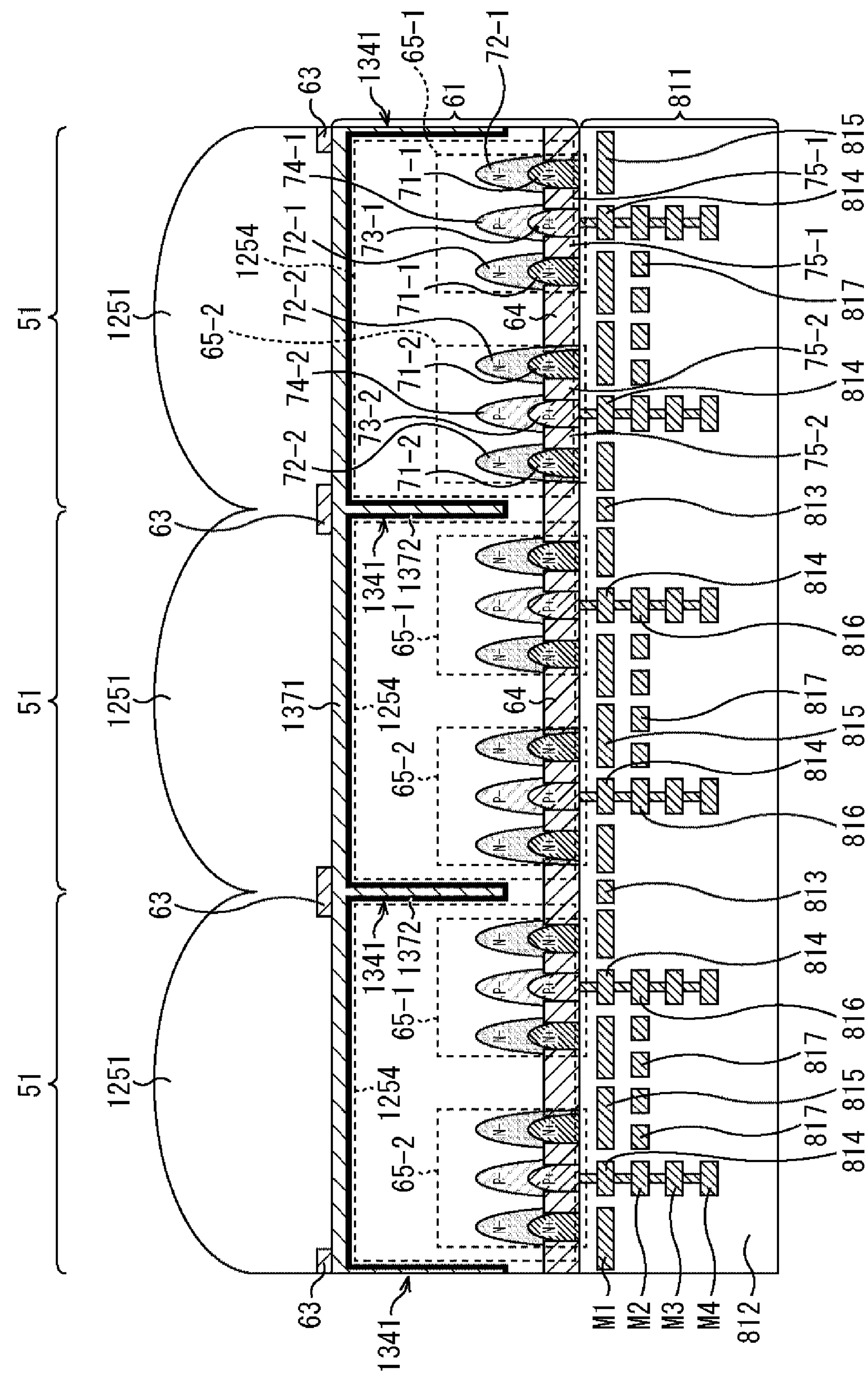
FIG. 66 is a cross-sectional view of a plurality of pixels.

Here, a cross section corresponding to an F3-F3' line and a cross section corresponding to a G3-G3' line in FIG. 64 are illustrated in FIGS. 65 and 66.

The configuration of the pixel 51 illustrated in FIGS. 65 and 66 is configured such that an oxide film 1371 and a fixed charge film 1372 are provided instead of the oxide film 1252 and the fixed charge film 1253 in the configuration of the pixel 51 illustrated in FIGS. 59 and 60.

As illustrated in FIG. 65, in each pixel 51, an on-chip lens 1251 is arranged on the light entrance surface side of the substrate 61. Furthermore, in each pixel 51, a portion constituting one pixel 51 in the substrate 61 has a light receiving region 1254.

Then, the light receiving regions 1254 of the pixels 51 that are adjacent are isolated from each other by the pixel isolation portion 1341 constituted by a part of the oxide film 1371 and the fixed charge film 1372.

That is, in the example illustrated in FIG. 65, the oxide film 1371 is formed so as to cover a surface of the substrate 61 on the side of the on-chip lens 1251.

Moreover, the oxide film 1371 is formed from a surface of the substrate 61 on the light entrance surface side (the side of the on-chip lens 1251) to a predetermined depth at a boundary portion between the pixels 51 adjacent to each other, and owing to this configuration, the light receiving regions 1254 of the pixels 51 that are adjacent are placed in an isolated state.

Furthermore, in the inside of the substrate 61, a region between the semiconductor region of P-type constituting the substrate 61 and the oxide film 1371, that is, an outer surface portion of the oxide film 1371 is covered with the fixed charge film 1372.

In particular, in this example, a portion of the oxide film 1371 and the fixed charge film 1372 functioning as a DTI having a trench structure that is formed long to a predetermined depth in a direction perpendicular to a surface of the substrate 61, and isolates the light receiving regions 1254 from each other between the pixels 51 that are adjacent, has the pixel isolation portion 1341.

Note that, it has been described here that the pixel isolation portion 1341 is constituted by the oxide film 1371 and the fixed charge film 1372; however, it can also be understood that the pixel isolation portion 1341 is constituted by only the oxide film 1371.

Besides, the pixel isolation portion 1341 may be formed by a metal material and the fixed charge film, or formed by a metal material and the oxide film.

In the example illustrated in FIG. 65, since the pixel isolation portion 1341 is formed at a boundary portion of the pixel 51, the entry of reflected light of infrared light that has entered the substrate 61 through the on-chip lens 1251 into the pixel 51 being adjacent can be suppressed, similarly to the example illustrated in FIG. 59.

Consequently, the occurrence of crosstalk and the deterioration of the pixel sensitivity can be suppressed, and characteristics of the CAPD sensor, such as sensitivity characteristics and the ranging accuracy (resolution) can be improved.

Furthermore, in the example illustrated in FIG. 65, similarly to the example illustrated in FIG. 59, since the pixel isolation portion 1341 is formed at a position shifted from the transistor, a leakage current at a P− well portion that covers the transistor can be suppressed.

In particular, in the example illustrated in FIG. 59, the pixel isolation portion 1221 passes through the substrate 61. For this reason, in the transistor, there is a possibility that a leakage current from the fixed charge film 1253 is generated via the P-well portion that is formed on a bottom portion of the substrate 61, that is, on the side of the multilayer wiring layer 811 of the substrate 61, and covers the transistor.

On the other hand, in the example illustrated in FIG. 65, the depth of the pixel isolation portion 1341 can be adjusted such that the pixel isolation portion 1341 is formed at a position sufficiently away from the P-well portion that covers the transistor. Consequently, it is possible to reliably prevent the generation of a leakage current.

Moreover, in the example illustrated in FIG. 65, similarly to the example in FIG. 59, an inter-pixel light-shielding film 63 and the on-chip lens 1251 are arranged in line with the pixel isolation portion 1341 shifted and arranged.

Accordingly, also in the case illustrated in FIG. 65, similarly to the case in FIG. 59, the amount of light (the amount of received light) guided into the light receiving region 1254 by the on-chip lens 1251 can be further expanded, and sensitivity characteristics can be improved.

In addition, a cross-sectional view corresponding to the G3-G3' line of the pixels 51 illustrated in FIG. 64 is as illustrated in FIG. 66. Also in FIG. 66, similarly to the case of FIG. 65, a portion of the oxide film 1371 and the fixed charge film 1372 having a trench structure that is long in a direction perpendicular to a surface of the substrate 61 has the pixel isolation portion 1341. In particular, the pixel isolation portion 1341 is formed to a predetermined depth, and in this example, the pixel isolation portion 1341 is in a state in which the pixel isolation portion 1341 does not arrive at the portion of an oxide film 64.

According to the pixel 51 having the configuration illustrated in FIGS. 64 to 66 as described above, characteristics such as sensitivity characteristics and the ranging accuracy (resolution) can be improved, and furthermore the generation of a leakage current can also be suppressed.

Note that, also in the examples illustrated in FIGS. 64 to 66, the on-chip lens 1251 may be arranged such that the position of the optical axis of the on-chip lens 1251 coincides with approximately the middle position between two signal retrieving units 65 in the pixel 51. Furthermore, the two signal retrieving units 65 may be shifted and arranged such that a position between these signal retrieving units 65 is positioned on the optical axis of the on-chip lens 1251.

Twenty-Fourth Embodiment

Configuration Example of Pixel

The configuration of a pixel 51 according to a twenty-fourth embodiment will be described with reference to FIGS. 67 to 69.

Figure 67:
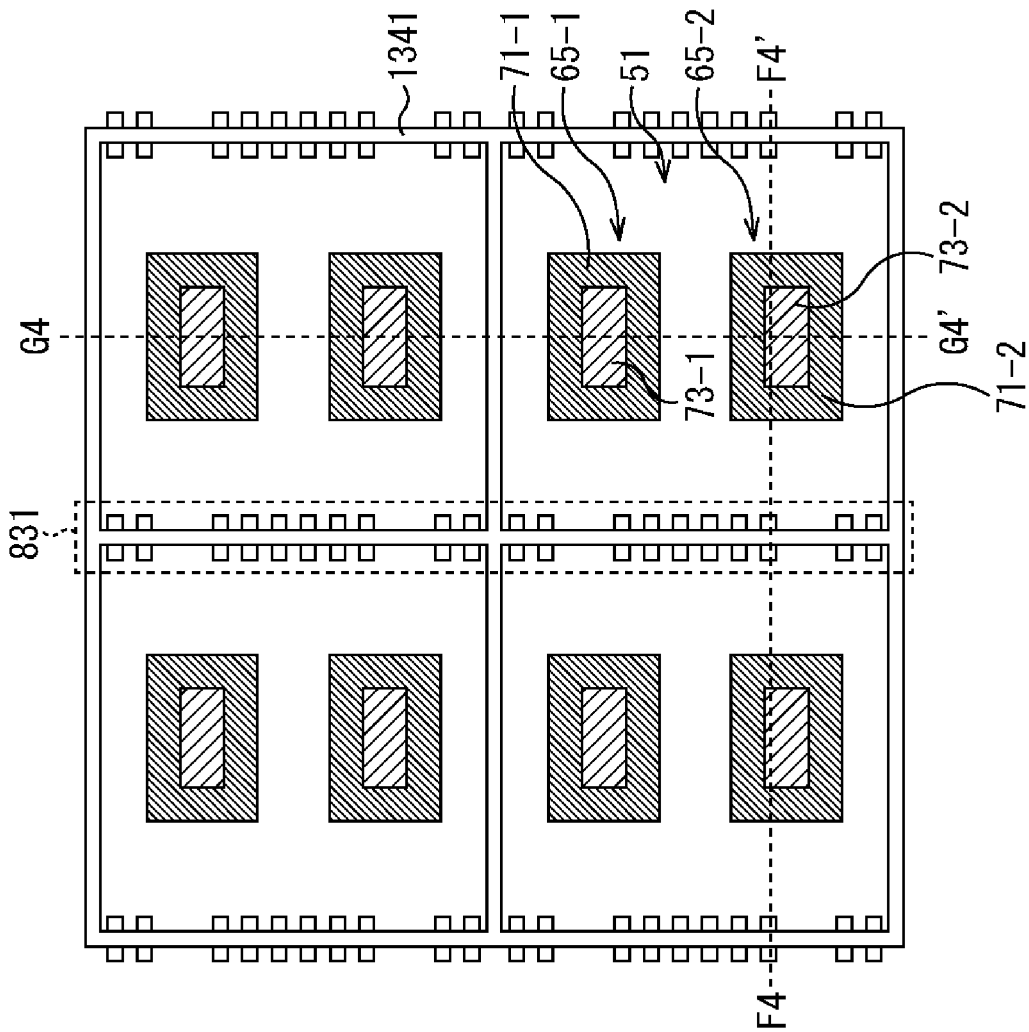
FIG. 67 is a diagram of pixels viewed from a direction perpendicular to a surface of a substrate.

FIG. 67 is a diagram of the pixels 51 viewed from a direction perpendicular to a surface of a substrate 61.

In this example, a pixel isolation portion 1341 that functions as a pixel isolation region that isolates the regions of the pixels 51 from each other is formed at a boundary portion of the pixels 51 adjacent to each other so as to surround the region of each pixel 51.

In FIG. 67, a different point from the example illustrated in FIG. 64 is that the pixel isolation portion 1341 is provided immediately above a pixel transistor wiring region 831, that is, immediately above a transistor.

Figure 68:
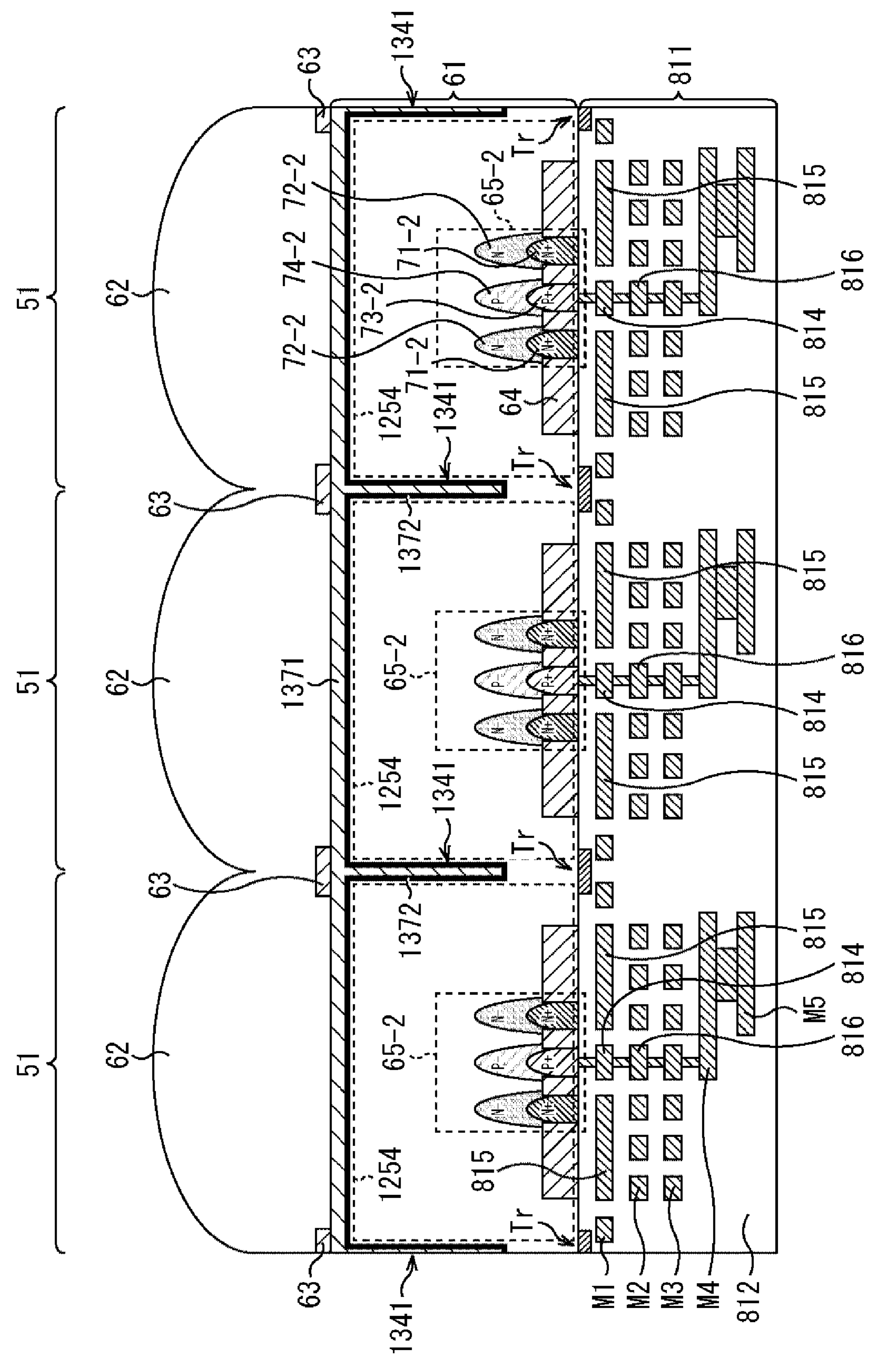
FIG. 68 is a cross-sectional view of a plurality of pixels.
Figure 69:
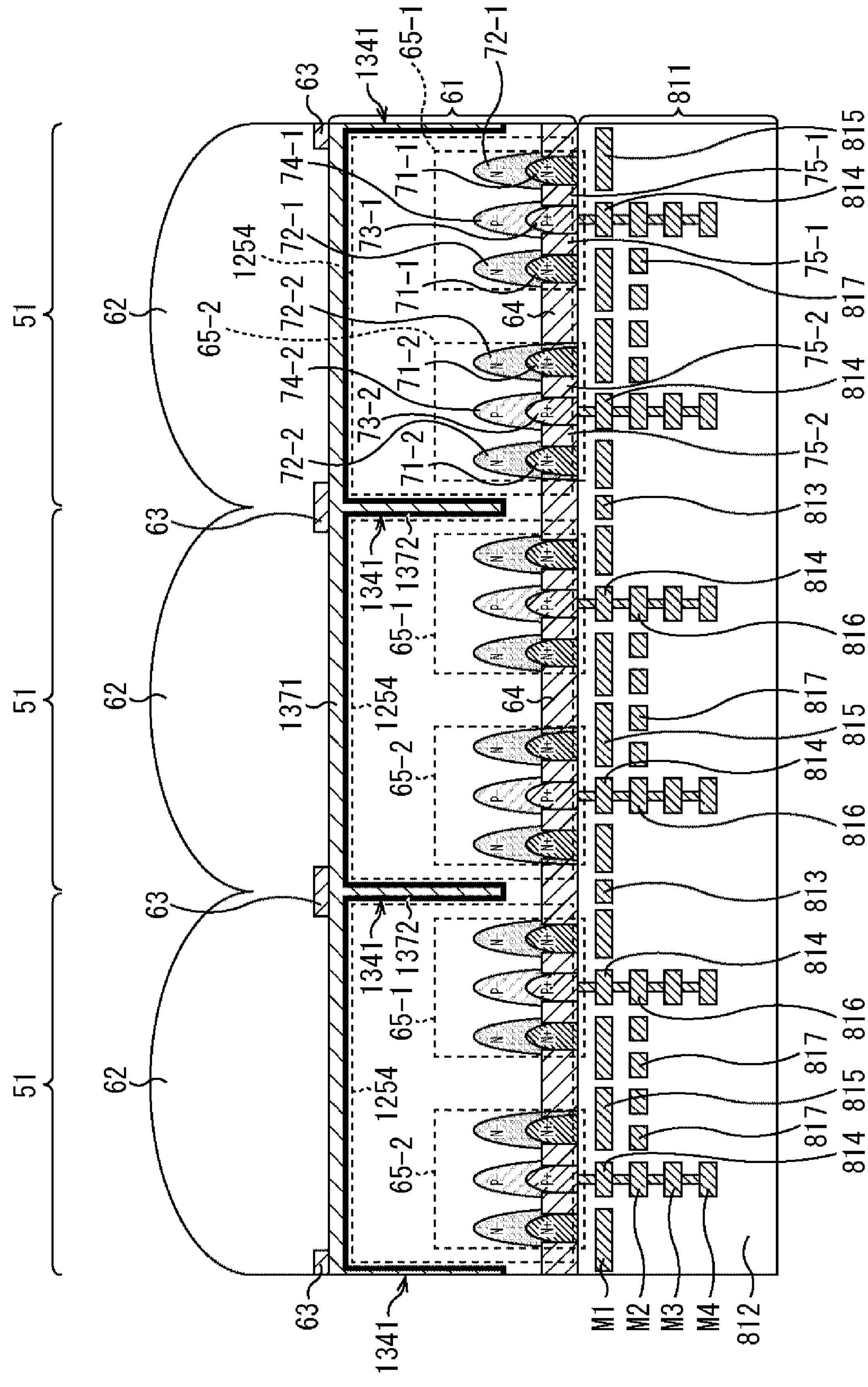
FIG. 69 is a cross-sectional view of a plurality of pixels.

Here, a cross section corresponding to an F4-F4' line and a cross section corresponding to a G4-G4' line in FIG. 67 are illustrated in FIGS. 68 and 69.

The configuration of the pixel 51 illustrated in FIGS. 68 and 69 differs from the configuration of the pixel 51 in FIGS. 65 and 66 in that an on-chip lens 62 is provided instead of the on-chip lens 1251, and additionally the position of the pixel isolation portion 1341 is different as compared with the configuration of the pixel 51 illustrated in FIGS. 65 and 66, but is configured the same in other points.

As illustrated in FIG. 68, in each pixel 51, the on-chip lens 62 is arranged on the light entrance surface side of the substrate 61. This on-chip lens 62 is arranged such that the position of the optical axis of the on-chip lens 62 coincides with a position between two signal retrieving units 65 in the pixel 51.

Furthermore, the pixel isolation portion 1341 constituted by a part of an oxide film 1371 and a fixed charge film 1372 is arranged immediately above the transistor, and light receiving regions 1254 of the pixels 51 that are adjacent are isolated from each other by such a pixel isolation portion 1341 having a trench structure.

In particular, since the pixel isolation portion 1341 does not have a configuration for passing through the substrate 61 here, the pixel isolation portion 1341 is sufficiently away from a P-well portion even if the pixel isolation portion 1341 is arranged immediately above the transistor, and the generation of a leakage current can be suppressed.

Accordingly, in the example illustrated in FIG. 68, the on-chip lens 62 does not need to be shifted when arranged, and the on-chip lens 62 can be arranged such that the position of the optical axis of the on-chip lens 62 coincides with a position between two signal retrieving units 65. Consequently, the electron retrieving efficiency can be made approximately equal between two signal retrieving units 65 in the pixel 51.

In addition, a cross-sectional view corresponding to the G4-G4' line of the pixels 51 illustrated in FIG. 67 is as illustrated in FIG. 69. The cross section of the pixel 51 illustrated in FIG. 69 differs from the cross section illustrated in FIG. 66 only in that the on-chip lens 62 is provided instead of the on-chip lens 1251 in FIG. 66, but is configured the same as the cross section illustrated in FIG. 66 in other points.

According to the pixel 51 having the configuration illustrated in FIGS. 67 to 69 as described above, characteristics such as sensitivity characteristics and the ranging accuracy (resolution) can be improved, and furthermore the generation of a leakage current can also be suppressed.

Twenty-Fifth Embodiment

Configuration Example of Pixel

The configuration of a pixel 51 according to a twenty-fifth embodiment will be described with reference to FIGS. 70 to 72.

Figure 70:
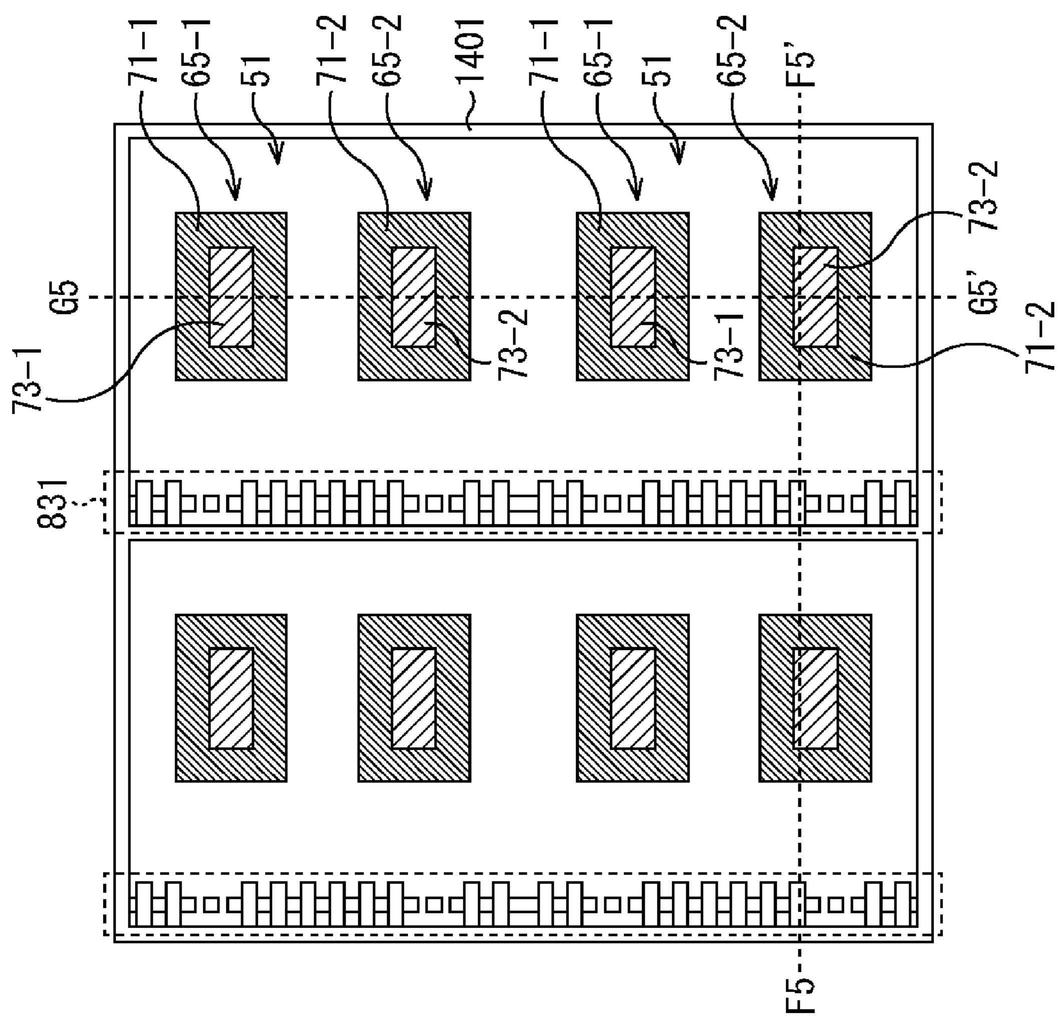
FIG. 70 is a diagram of pixels viewed from a direction perpendicular to a surface of a substrate.

FIG. 70 is a diagram of the pixels 51 viewed from a direction perpendicular to a surface of a substrate 61.

In this example, a pixel isolation portion 1401 that functions as a pixel isolation region that isolates the regions of the pixels 51 from each other is formed at a boundary portion of the pixels 51 so as to surround the region of two pixels 51 adjacent in the up-down direction in the drawing.

Note that a region surrounded by the pixel isolation portion 1401, where four signal retrieving units 65 are provided, can also be regarded as one pixel. In this case, four signal retrieving units 65 are formed in the light receiving region of one pixel on the substrate 61, and this light receiving region is surrounded by the pixel isolation portion 1401 and isolated from the light receiving regions of other pixels.

In this example, the pixel isolation portion 1401 is arranged at a position shifted from the transistor and the like such that the arrangement position of the transistor and the like for driving the pixel 51 and the arrangement position of the pixel isolation portion 1401 are positioned differently from each other when viewed from a direction perpendicular to a surface of the substrate 61.

For example, in a case where the distance to a target object is measured by the indirect ToF technique, if the measurement is performed using more than two phases, the number of times of read working for charges accumulated in the signal retrieving unit 65 can be cut down, and the frame rate at the time of ranging can be improved.

At this time, in order to cut down the number of times of read working, it is necessary to divide the used phases for each pixel 51 (signal retrieving unit 65) and, if a plurality of pixels 51 used for distance measurement for the same target object is surrounded by the pixel isolation portion 1401, using this plurality of pixels 51 as a unit, sensitivity characteristics can be improved.

Here, the phase refers to a timing at which one signal retrieving unit 65 is assigned as an active tap and a charge obtained by photoelectric conversion is accumulated in this signal retrieving unit 65, that is, a phase in which the signal retrieving unit 65 is assigned as an active tap.

Now, for example, it is assumed that the distance to a target object is measured using one pixel 51 by receiving reflected light from the target object with respect to one pulse light emission of infrared light. In particular, here, it is assumed that four-phase measurement is performed by two signal retrieving units 65 (taps) of the one pixel 51.

In this case, for example, in the first phase, which is an initial phase, a first tap, which is one of the signal retrieving units 65 of the one pixel 51, is assigned as an active tap, and in the subsequent second phase, a second tap, which is the other of the signal retrieving units 65, is assigned as an active tap. Charges accumulated in these first and second taps are read after the completion of the second phase, for example.

Moreover, in the third phase following the second phase, the first tap is again assigned as an active tap, and in the final fourth phase, the second tap is assigned as an active tap. Then, for example, when the fourth phase is completed, charges accumulated in the first and second taps are read.

When the charges (pixel signals) for four phases are read in this manner, the distance to the target object is found on the basis of signals corresponding to these read charges.

A method of finding the distance to the target object by accumulating charges in four phases using the two taps as described above is referred to as 2-tap 4-phase processing. When generalized, a method of finding the distance to the target object by accumulating charges in m phases using n different taps is represented as n-tap m-phase processing.

For example, when the above-described 2-tap 4-phase processing is performed, the number of times of charge reading is two.

On the other hand, it is considered that 4-tap 4-phase processing is performed using two pixels 51, that is, four signal retrieving units 65 (taps). In this case, when four respective different taps are assumed as the first to fourth taps, it is only required to drive such that the respective first to fourth taps are assigned as active taps in the respective first to fourth phases.

In this case, since each tap is assigned as an active tap once during the four phases, the required number of times of charge reading is only one.

Accordingly, for example, if the 4-tap 4-phase processing is performed, the number of times of reading can be shrunk as compared with a case where the 2-tap 4-phase processing is performed. In this example, the reading speed at the time of ranging, that is, the frame rate can be doubled.

Here, in a case where the distance to the target object is found by, for example, the 4-tap 4-phase processing using the four signal retrieving units 65 put side-by-side in the up-down direction in FIG. 70, two pixels 51 used for the distance measurement for the same target object can be surrounded by the pixel isolation portion 1401, as illustrated in FIG. 70. Note that, in this case, a region surrounded by the pixel isolation portion 1401 can be regarded as one pixel.

By configuring in this manner, reflected light from the same target object enters the region surrounded by the pixel isolation portion 1401, and therefore, variations in sensitivity and the deterioration of the sensitivity can be suppressed more than isolating the regions for each pixel 51. That is, sensitivity characteristics can be improved. Note that the use purpose of a light receiving element 1 having the configuration illustrated in FIG. 70 is not limited to the measurement of the distance to the target object, and may be of any other type.

Figure 71:
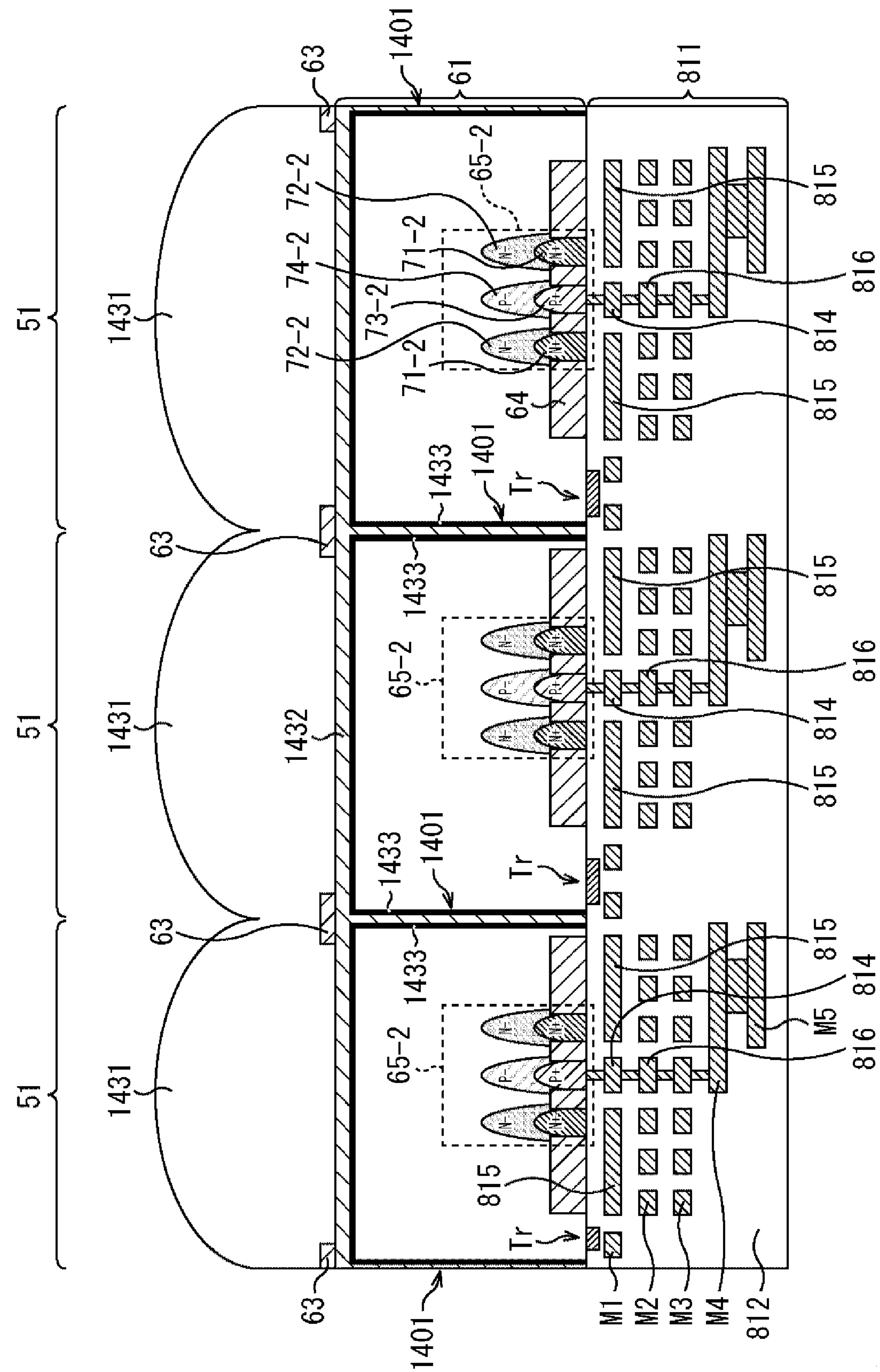
FIG. 71 is a cross-sectional view of a plurality of pixels.
Figure 72:
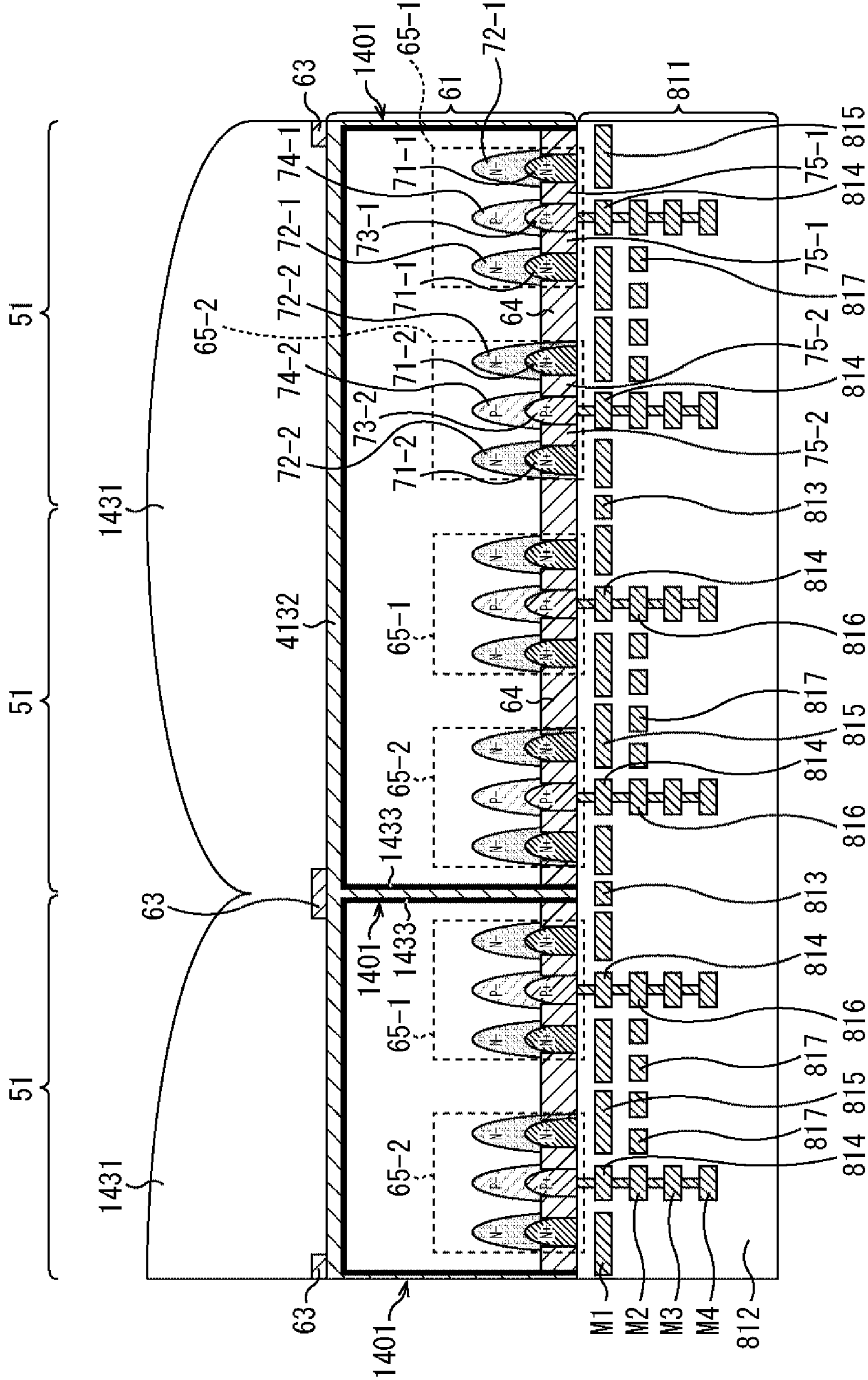
FIG. 72 is a cross-sectional view of a plurality of pixels.

Here, a cross section corresponding to an F5-F5' line and a cross section corresponding to a G5-G5' line in FIG. 70 are illustrated in FIGS. 71 and 72.

The configuration of the pixel 51 illustrated in FIGS. 71 and 72 is configured such that the on-chip lens 62 and the fixed charge film 66 in the configuration of the pixel 51 illustrated in FIGS. 36 and 37 are not provided, but an on-chip lens 1431, an oxide film 1432, and a fixed charge film 1433 are newly provided.

As illustrated in FIG. 71, in the respective pixels 51, the on-chip lenses 1431 are arranged adjacent on the light entrance surface side of the substrate 61, that is, an opposite side of the side of a multilayer wiring layer 811. The on-chip lens 1431 condenses infrared light that has entered from the outside and guides the condensed infrared light to the inside of the substrate 61.

In particular, in the cross section illustrated in FIG. 71, one on-chip lens 1431 is provided for one pixel 51 put side-by-side to others in the lateral direction in the drawing.

Furthermore, the light receiving regions of the pixels 51 that are adjacent are isolated from each other by the pixel isolation portion 1401 constituted by a part of the oxide film 1432 and the fixed charge film 1433. In particular, in the cross section illustrated in FIG. 71, the pixel isolation portion 1401 is formed at the position of a boundary between the pixels 51 put side-by-side in the lateral direction in the drawing, and the light receiving regions of these pixels 51 are isolated from each other.

In the example illustrated in FIG. 71, the oxide film 1432 is formed so as to cover a surface of the substrate 61 on the side of the on-chip lens 1431. Moreover, the oxide film 1432 passes through the substrate 61 at a boundary portion between the pixels 51 adjacent to each other, and owing to this configuration, the light receiving regions of the pixels 51 that are adjacent are placed in an isolated state. In addition, in the inside of the substrate 61, an outer surface portion of the oxide film 1432 is covered with the fixed charge film 1433.

A portion of such oxide film 1432 and fixed charge film 1433 having a trench structure that is long in a direction perpendicular to a surface of the substrate 61, that is, a portion functioning as an FTI that passes through the substrate 61 and isolates the light receiving regions from each other between the pixels 51 that are adjacent, has the pixel isolation portion 1401.

Note that, it has been described here that the pixel isolation portion 1401 is constituted by the oxide film 1432 and the fixed charge film 1433; however, it can also be understood that the pixel isolation portion 1401 is constituted by only the oxide film 1432.

Besides, the pixel isolation portion 1401 may be formed by a metal material and the fixed charge film, or formed by a metal material and the oxide film.

Since the pixel isolation portion 1401 is formed at a boundary portion of the pixel 51, reflected light of infrared light that has entered the substrate 61 through the on-chip lens 1431 can be prevented from entering the pixel 51 used for the distance measurement for a different target object, similarly to the example illustrated in FIG. 59.

Consequently, the occurrence of crosstalk and the deterioration of the pixel sensitivity can be suppressed, and characteristics of the CAPD sensor, such as sensitivity characteristics and the ranging accuracy (resolution) can be improved.

Furthermore, in the example illustrated in FIG. 71, similarly to the example illustrated in FIG. 59, since the pixel isolation portion 1401 is formed at a position shifted from the transistor, the generation of a leakage current at a P-well portion that covers the transistor can be suppressed.

Moreover, in this example, similarly to the example in FIG. 59, an inter-pixel light-shielding film 63 and the on-chip lens 1431 are arranged in line with the pixel isolation portion 1401 shifted and arranged.

Accordingly, also in the case illustrated in FIG. 71, similarly to the case in FIG. 59, the amount of light (the amount of received light) guided into the light receiving region by the on-chip lens 1431 can be further expanded, and sensitivity characteristics can be improved.

In addition, a cross-sectional view corresponding to the G5-G5' line of the pixels 51 illustrated in FIG. 70 is as illustrated in FIG. 72. In FIG. 72, two pixels 51 put side-by-side in the lateral direction in the drawing are used for the distance measurement for the same target object, such that the pixel isolation portion 1401 is formed at the portion of a boundary between these two pixels 51 and other pixels 51.

In different terms, the region of two pixels 51 put side-by-side in the lateral direction in the drawing in the substrate 61 is surrounded by the pixel isolation portion 1401, and the region of the two pixels 51 put side-by-side in the lateral direction and the region of other pixels 51 adjacent to these two pixels 51 are isolated from each other by the pixel isolation portion 1401.

Furthermore, in the cross section illustrated in FIG. 72, one on-chip lens 1431 is provided for two pixels 51 put side-by-side in the lateral direction in the drawing, that is, two pixels 51 used for the distance measurement for the same target object. Accordingly, for example, in the example illustrated in FIG. 70, one on-chip lens 1431 is provided for two pixels 51 put side-by-side in the up-down direction in FIG. 70, that is, two pixels 51 surrounded by the pixel isolation portion 1401 and used for the distance measurement for the same target object.

According to the pixel 51 having the configuration illustrated in FIGS. 70 to 72 as described above, characteristics such as sensitivity characteristics and the ranging accuracy (resolution) can be improved, and furthermore the generation of a leakage current can also be suppressed.

Note that, in FIG. 71, an example in which the arrangement position of the on-chip lens 1431 is shifted in line with the formation position of the pixel isolation portion 1401 has been described. However, when viewed from a direction perpendicular to a surface of the substrate 61, the on-chip lens 1431 may be arranged such that the position of the optical axis of the on-chip lens 1431 coincides with approximately the middle position between two pixels 51.

Moreover, for example, in the example illustrated in FIG. 70, for two pixels 51 surrounded by the pixel isolation portion 1401, the respective signal retrieving units 65 may be shifted and arranged such that a position between the signal retrieving unit 65-1 of the pixel 51 located on a lower side in the drawing and the signal retrieving unit 65-2 of the pixel 51 located on an upper side in the drawing coincides with the position of the optical axis of the on-chip lens 1431.

Twenty-Sixth Embodiment

Configuration Example of Pixel

The configuration of a pixel 51 according to a twenty-sixth embodiment will be described with reference to FIGS. 73 to 75.

Figure 73:
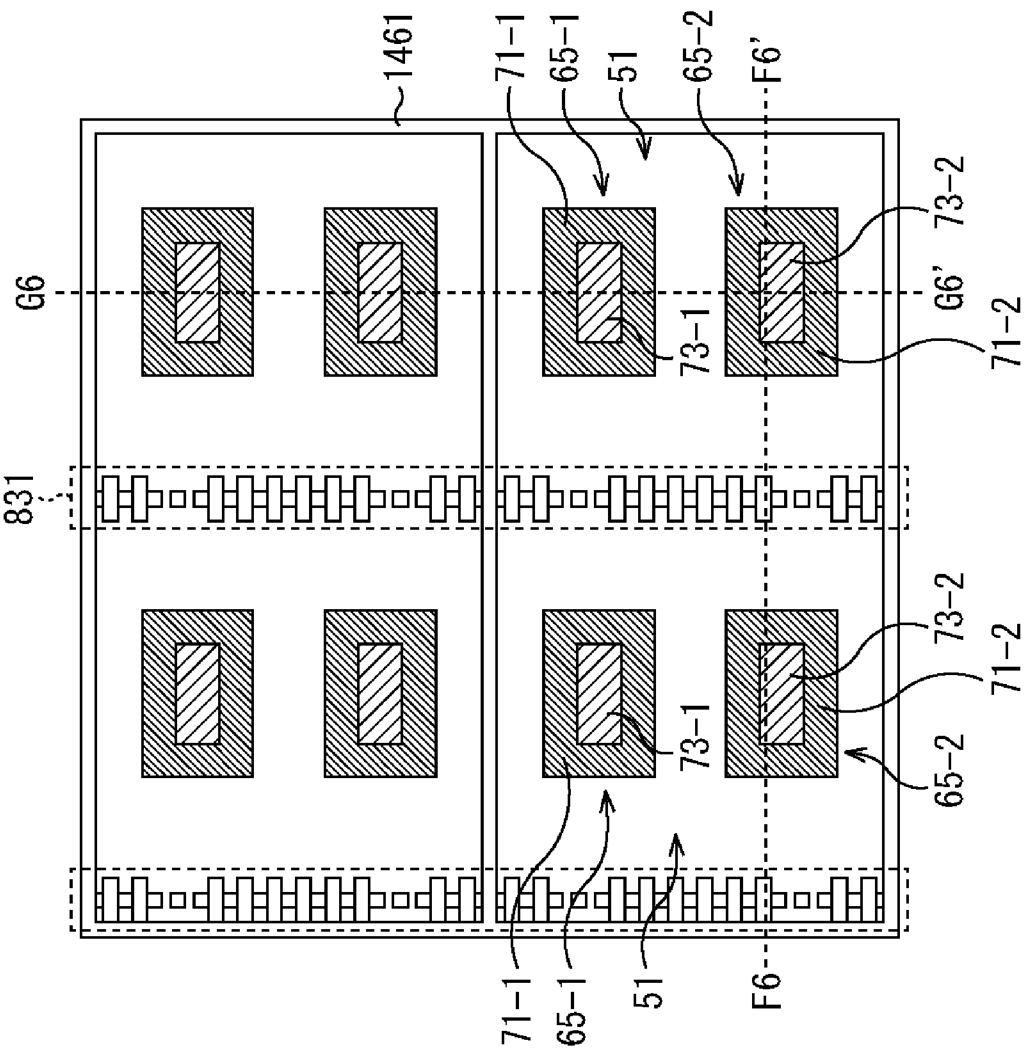
FIG. 73 is a diagram of pixels viewed from a direction perpendicular to a surface of a substrate.

FIG. 73 is a diagram of the pixels 51 viewed from a direction perpendicular to a surface of a substrate 61.

In this example, a pixel isolation portion 1461 that functions as a pixel isolation region that isolates the regions of the pixels 51 from each other is formed at a boundary portion of the pixels 51 so as to surround the region of two pixels 51 adjacent in the left-right direction in the drawing. Note that a region surrounded by the pixel isolation portion 1461, where four signal retrieving units 65 are provided, can also be regarded as one pixel.

In this example, the pixel isolation portion 1461 is arranged at a position shifted from the transistor and the like such that the arrangement position of the transistor and the like for driving the pixel 51 and the arrangement position of the pixel isolation portion 1461 are positioned differently from each other when viewed from a direction perpendicular to a surface of the substrate 61.

In FIG. 70, an example in which two pixels 51 adjacent in the up-down direction are used to measure the distance to the same target object by the indirect ToF technique has been described.

On the other hand, in the example illustrated in FIG. 73, for example, two pixels 51 adjacent in the left-right direction in the drawing, that is, two pixels 51 surrounded by the pixel isolation portion 1461 can be used for measuring the distance to the same target object by the indirect ToF technique. Note that, in this case, a region surrounded by the pixel isolation portion 1461 can be regarded as one pixel. In addition, note that the use purpose of a light receiving element 1 having the configuration illustrated in FIG. 73 is not limited to the measurement of the distance to the target object, and may be of any other type.

By surrounding two pixels 51 used to measure the distance to the same target object with the pixel isolation portion 1461 in this manner, variations in sensitivity and the deterioration of the sensitivity can be suppressed similarly to the example illustrated in FIG. 70. That is, sensitivity characteristics can be improved.

Figure 74:
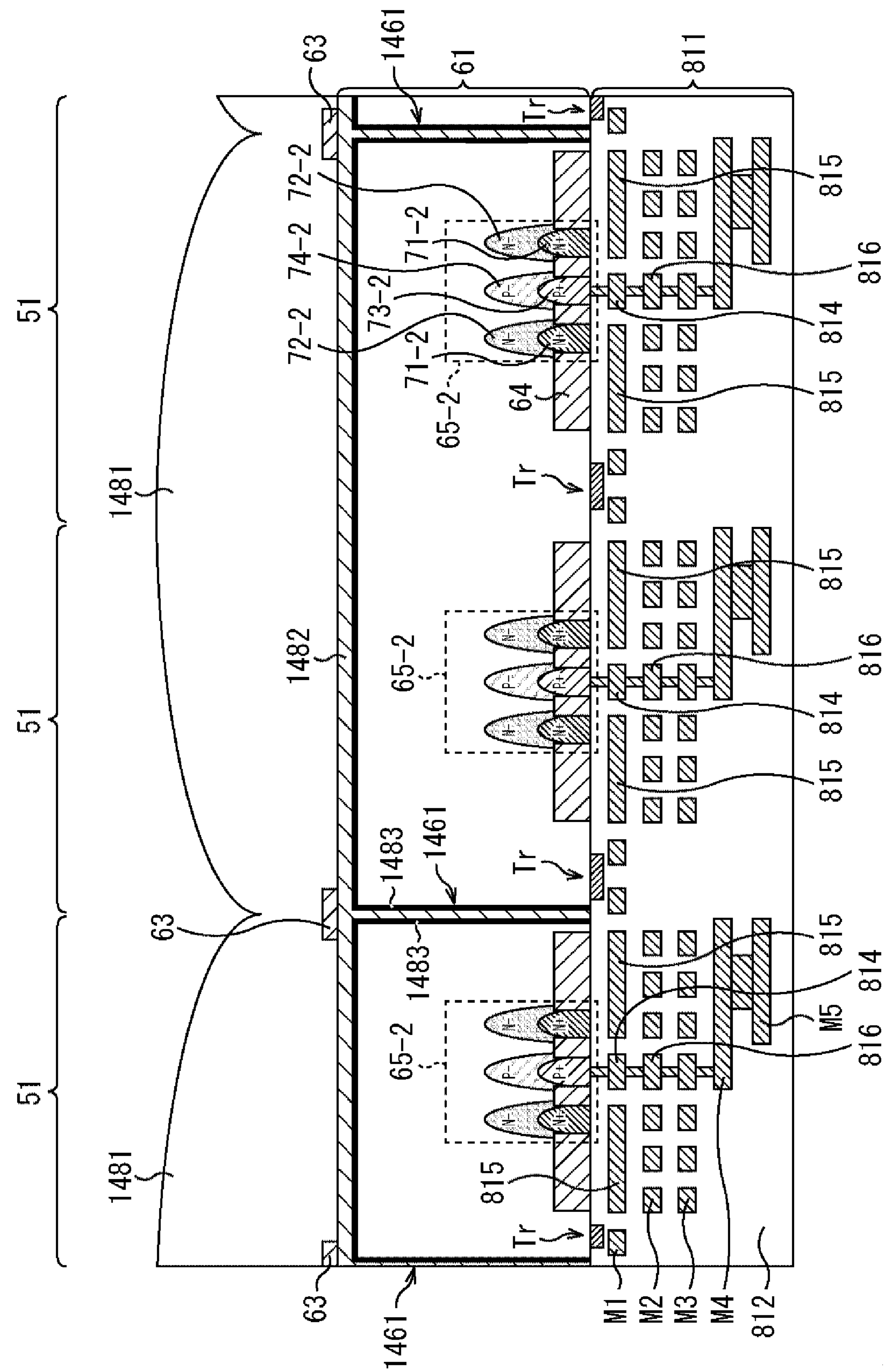
FIG. 74 is a cross-sectional view of a plurality of pixels.
Figure 75:
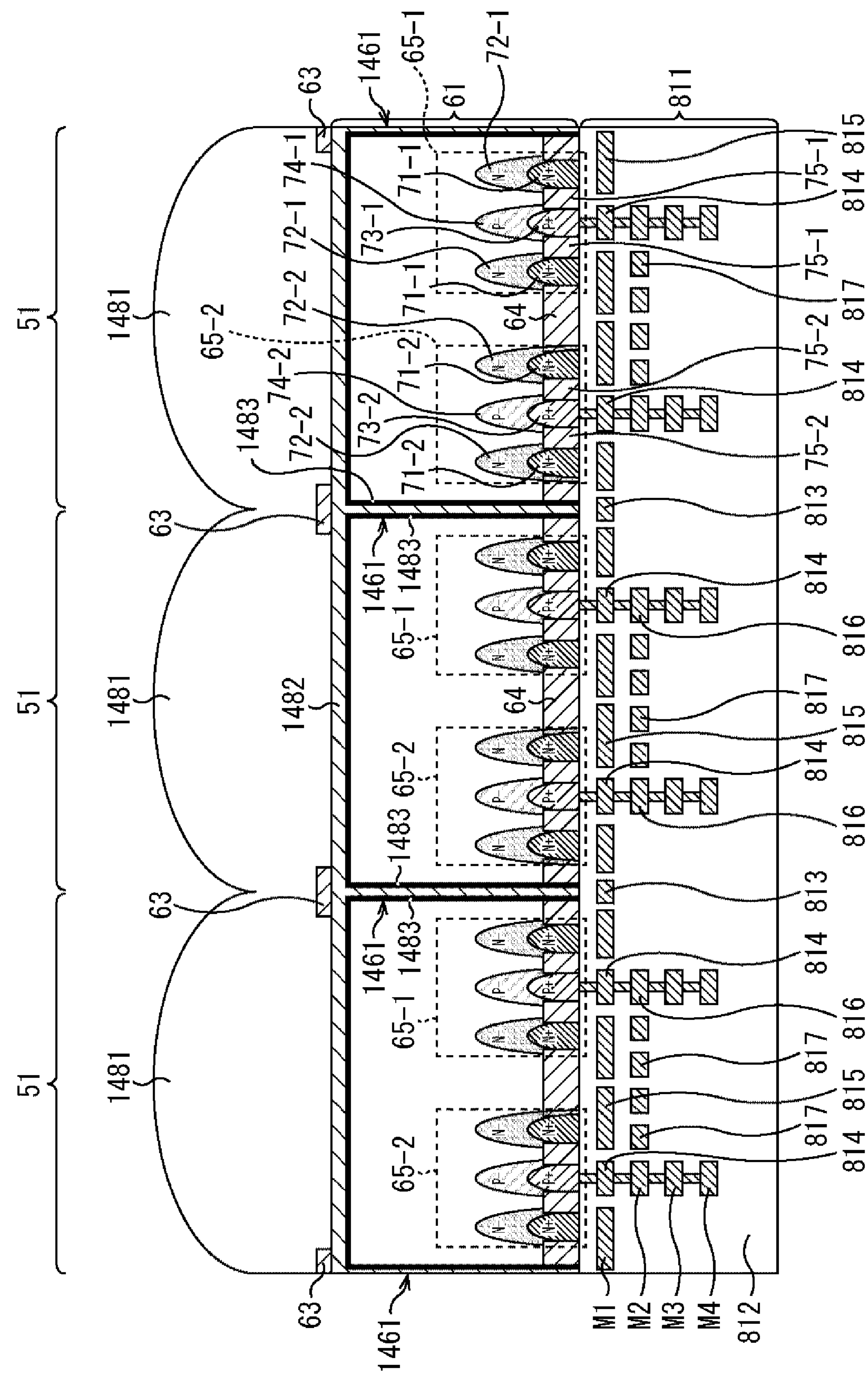
FIG. 75 is a cross-sectional view of a plurality of pixels.

Here, a cross section corresponding to an F6-F6' line and a cross section corresponding to a G6-G6' line in FIG. 73 are illustrated in FIGS. 74 and 75.

The configuration of the pixel 51 illustrated in FIGS. 74 and 75 is configured such that the on-chip lens 62 and the fixed charge film 66 in the configuration of the pixel 51 illustrated in FIGS. 36 and 37 are not provided, but an on-chip lens 1481, an oxide film 1482, and a fixed charge film 1483 are newly provided.

As illustrated in FIG. 74, in the respective pixels 51, the on-chip lenses 1481 are arranged adjacent on the light entrance surface side of the substrate 61, that is, an opposite side of the side of a multilayer wiring layer 811. The on-chip lens 1481 condenses infrared light that has entered from the outside and guides the condensed infrared light to the inside of the substrate 61.

In particular, in the cross section illustrated in FIG. 74, one on-chip lens 1481 is provided for two pixels 51 put side-by-side in the lateral direction in the drawing.

Furthermore, the light receiving region of the pixel 51 is isolated by the pixel isolation portion 1461 constituted by a part of the oxide film 1482 and the fixed charge film 1483.

In this example, two pixels 51 put side-by-side in the lateral direction in the drawing are used for the distance measurement for the same target object, such that the pixel isolation portion 1461 is formed at the portion of a boundary between these two pixels 51 and other pixels 51.

In different terms, the region of two pixels 51 put side-by-side in the lateral direction in the drawing in the substrate 61 is surrounded by the pixel isolation portion 1461, and the region of the two pixels 51 put side-by-side in the lateral direction and the region of other pixels 51 adjacent to these two pixels 51 are isolated from each other by the pixel isolation portion 1461.

In the example illustrated in FIG. 74, the oxide film 1482 is formed so as to cover a surface of the substrate 61 on the side of the on-chip lens 1481. Furthermore, the oxide film 1482 passes through the substrate 61 at a boundary portion between the pixels 51 that are adjacent to each other and are used for the distance measurement for different target objects, and owing to this configuration, the light receiving regions of the pixels 51 that are adjacent are placed in an isolated state. In addition, in the inside of the substrate 61, an outer surface portion of the oxide film 1482 is covered with the fixed charge film 1483.

A portion of such oxide film 1482 and fixed charge film 1483 having a trench structure that is long in a direction perpendicular to a surface of the substrate 61, that is, a portion functioning as an FTI that passes through the substrate 61 and isolates the light receiving regions from each other between the pixels 51 that are adjacent, has the pixel isolation portion 1461.

Note that, it has been described here that the pixel isolation portion 1461 is constituted by the oxide film 1482 and the fixed charge film 1483; however, it can also be understood that the pixel isolation portion 1461 is constituted by only the oxide film 1482.

Besides, the pixel isolation portion 1461 may be formed by a metal material and the fixed charge film, or formed by a metal material and the oxide film.

Since the pixel isolation portion 1461 is formed at a boundary portion between the pixels 51 used for the distance measurement for different target objects, reflected light of infrared light that has entered the substrate 61 through the on-chip lens 1481 can be prevented from entering the pixels 51 used for the distance measurement for a different target object, similarly to the example illustrated in FIG. 59.

Consequently, the occurrence of crosstalk and the deterioration of the pixel sensitivity can be suppressed, and characteristics of the CAPD sensor, such as sensitivity characteristics and the ranging accuracy (resolution) can be improved.

Furthermore, in the example illustrated in FIG. 74, similarly to the example illustrated in FIG. 59, since the pixel isolation portion 1461 is formed at a position shifted from the transistor, the generation of a leakage current at a P-well portion that covers the transistor can be suppressed.

Moreover, in this example, similarly to the example in FIG. 59, an inter-pixel light-shielding film 63 and the on-chip lens 1481 are arranged in line with the pixel isolation portion 1461 shifted and arranged.

Accordingly, also in the case illustrated in FIG. 74, similarly to the case in FIG. 59, the amount of light (the amount of received light) guided into the light receiving region by the on-chip lens 1481 can be further expanded, and sensitivity characteristics can be improved.

In addition, a cross-sectional view corresponding to the G6-G6' line of the pixels 51 illustrated in FIG. 73 is as illustrated in FIG. 75. In FIG. 75, the pixel isolation portion 1461 is formed at the portion of a boundary between the pixels 51 adjacent to each other. Moreover, in the cross section illustrated in FIG. 75, one on-chip lens 1481 is provided for one pixel 51.

Accordingly, for example, in the example illustrated in FIG. 73, one on-chip lens 1481 is provided for two pixels 51 put side-by-side in the left-right direction in FIG. 73, that is, two pixels 51 surrounded by the pixel isolation portion 1461 and used for the distance measurement for the same target object.

According to the pixel 51 having the configuration illustrated in FIGS. 73 to 75 as described above, characteristics such as sensitivity characteristics and the ranging accuracy (resolution) can be improved, and furthermore the generation of a leakage current can also be suppressed.

Note that, in FIG. 74, an example in which the arrangement position of the on-chip lens 1481 is shifted in line with the formation position of the pixel isolation portion 1461 has been described. However, when viewed from a direction perpendicular to a surface of the substrate 61, the on-chip lens 1481 may be arranged such that the position of the optical axis of the on-chip lens 1481 coincides with approximately the middle position between four signal retrieving units 65 in a region surrounded by the pixel isolation portion 1461, that is, a position whose distances from the respective signal retrieving units 65 are approximately equal.

Moreover, for example, in the example illustrate in FIG. 73, four signal retrieving units 65 surrounded by the pixel isolation portion 1461 may be shifted and arranged such that approximately the middle position between these four signal retrieving units 65 is positioned on the optical axis of the on-chip lens 1481.

Twenty-Seventh Embodiment

Configuration Example of Pixel

The configuration of a pixel 51 according to a twenty-seventh embodiment will be described with reference to FIGS. 76 to 78.

Figure 76:
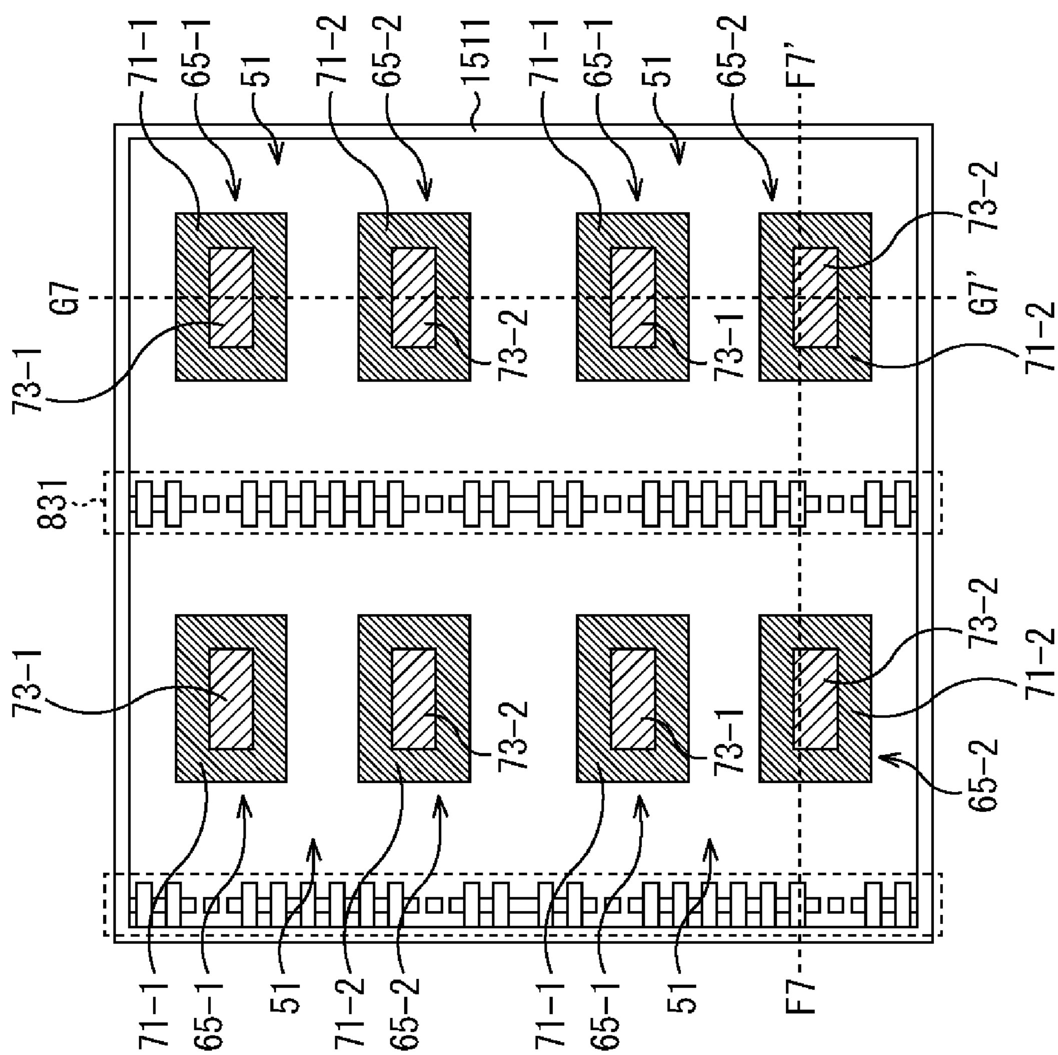
FIG. 76 is a diagram of pixels viewed from a direction perpendicular to a surface of a substrate.

FIG. 76 is a diagram of the pixels 51 viewed from a direction perpendicular to a surface of a substrate 61.

In this example, a pixel isolation portion 1511 that functions as a pixel isolation region that isolates the regions of the pixels 51 from each other is formed at a boundary portion of the pixels 51 so as to surround the region of four pixels 51 adjacent to each other in the drawing. Note that a region surrounded by the pixel isolation portion 1511, where eight signal retrieving units 65 are provided, can also be regarded as one pixel.

In this example, the pixel isolation portion 1511 is arranged at a position shifted from the transistor and the like such that the arrangement position of the transistor and the like for driving the pixel 51 and the arrangement position of the pixel isolation portion 1511 are positioned differently from each other when viewed from a direction perpendicular to a surface of the substrate 61.

In FIG. 70, an example in which two pixels 51 adjacent to each other are used to measure the distance to the same target object by the indirect ToF technique has been described.

On the other hand, in the example illustrated in FIG. 76, for example, four pixels 51 adjacent to each other, that is, four pixels 51 surrounded by the pixel isolation portion 1511 are used for measuring the distance to the same target object by the indirect ToF technique. Note that, in this case, a region surrounded by the pixel isolation portion 1511 can be regarded as one pixel. Furthermore, the use purpose of a light receiving element 1 having the configuration illustrated in FIG. 76 is not limited to the measurement of the distance to the target object, and may be of any other type.

By surrounding four pixels 51 used to measure the distance to the same target object with the pixel isolation portion 1511 in this manner, variations in sensitivity and the deterioration of the sensitivity can be suppressed similarly to the example illustrated in FIG. 70. That is, sensitivity characteristics can be improved.

Note that, in the example illustrated in FIG. 76, for example, 8-tap 8-phase processing can be performed using four pixels 51. In this case, the reading speed at the time of ranging can be quadrupled compared with when 2-tap 8-phase processing is performed.

Figure 77:
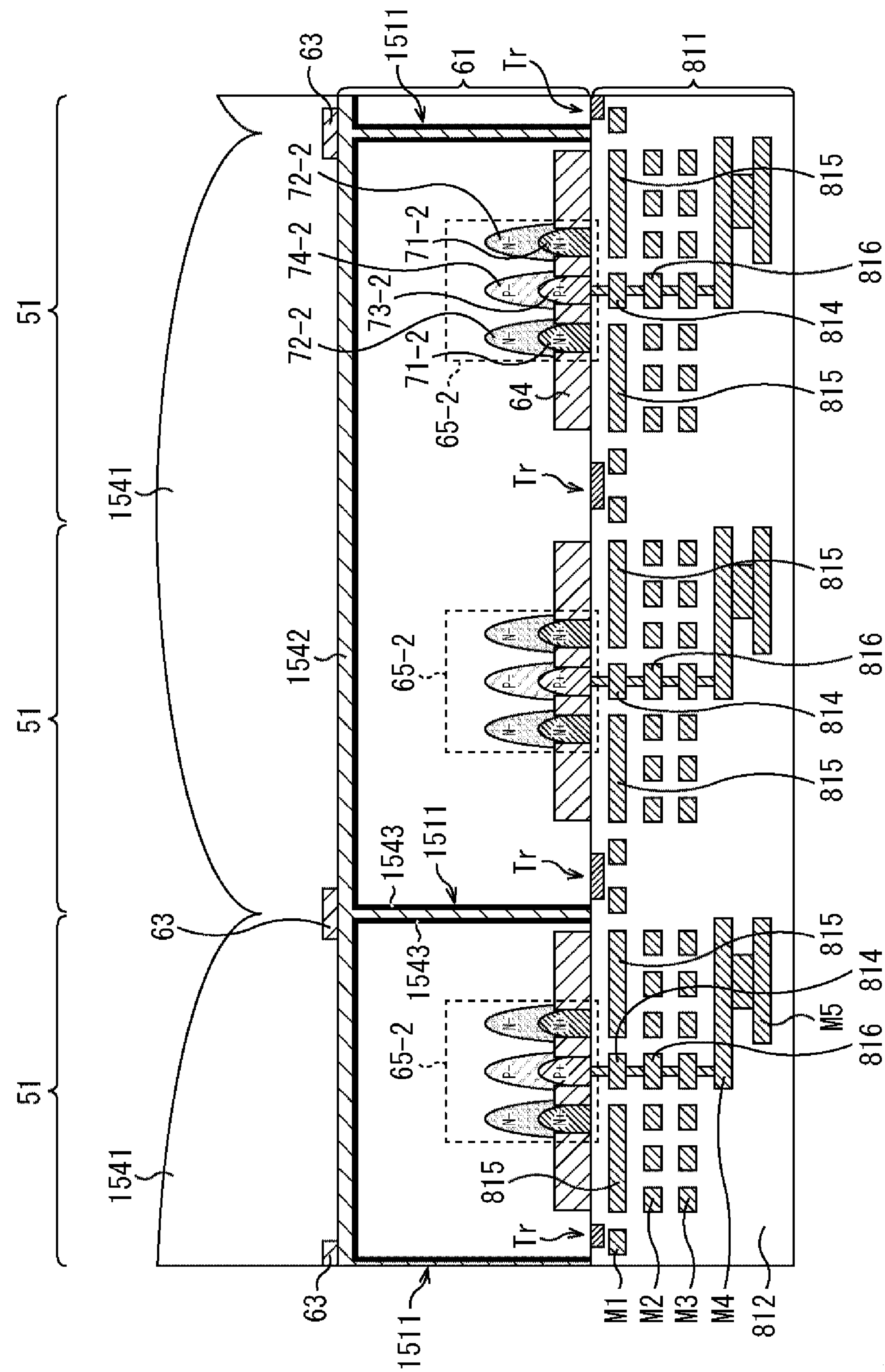
FIG. 77 is a cross-sectional view of a plurality of pixels.
Figure 78:
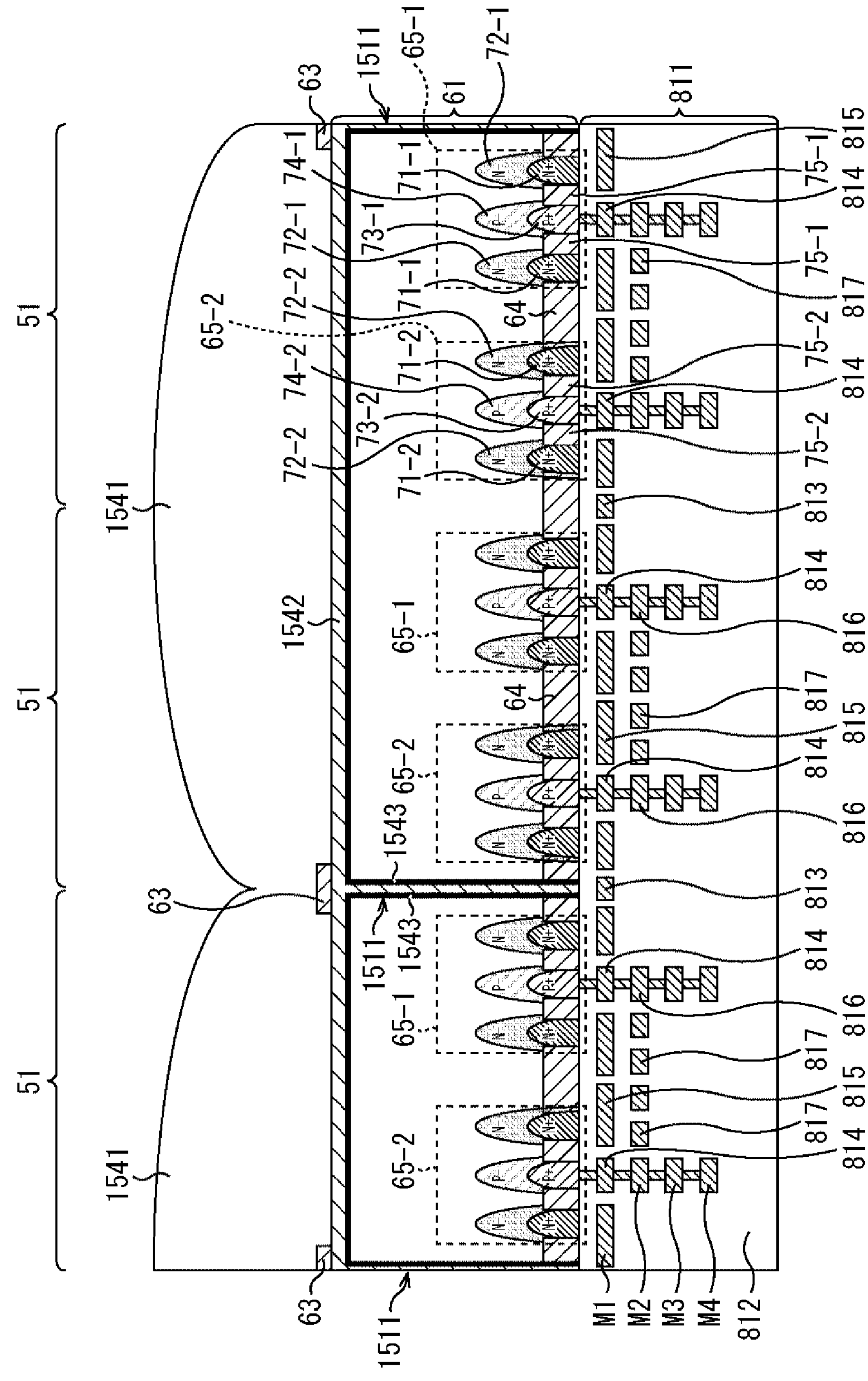
FIG. 78 is a cross-sectional view of a plurality of pixels.

Here, a cross section corresponding to an F7-F7' line and a cross section corresponding to a G7-G7' line in FIG. 76 are illustrated in FIGS. 77 and 78.

The configuration of the pixel 51 illustrated in FIGS. 77 and 78 is configured such that the on-chip lens 62 and the fixed charge film 66 in the configuration of the pixel 51 illustrated in FIGS. 36 and 37 are not provided, but an on-chip lens 1541, an oxide film 1542, and a fixed charge film 1543 are newly provided.

As illustrated in FIG. 77, in the respective pixels 51, the on-chip lenses 1541 are arranged adjacent on the light entrance surface side of the substrate 61, that is, an opposite side of the side of a multilayer wiring layer 811. The on-chip lens 1541 condenses infrared light that has entered from the outside and guides the condensed infrared light to the inside of the substrate 61.

In particular, in the cross section illustrated in FIG. 77, one on-chip lens 1541 is provided for two pixels 51 put side-by-side in the lateral direction in the drawing.

Furthermore, the light receiving region of the pixel 51 is isolated by the pixel isolation portion 1511 constituted by a part of the oxide film 1542 and the fixed charge film 1543.

In this example, two pixels 51 put side-by-side in the lateral direction in the drawing are used for the distance measurement for the same target object, such that the pixel isolation portion 1511 is formed at the portion of a boundary between these two pixels 51 and other pixels 51.

In different terms, the region of two pixels 51 put side-by-side in the lateral direction in the drawing in the substrate 61 is surrounded by the pixel isolation portion 1511, and the region of the two pixels 51 put side-by-side in the lateral direction and the region of other pixels 51 adjacent to these two pixels 51 are isolated from each other by the pixel isolation portion 1511.

In the example illustrated in FIG. 77, the oxide film 1542 is formed so as to cover a surface of the substrate 61 on the side of the on-chip lens 1541. Furthermore, the oxide film 1542 passes through the substrate 61 at a boundary portion between the pixels 51 that are adjacent to each other and are used for the distance measurement for different target objects, and owing to this configuration, the light receiving regions of the pixels 51 that are adjacent are placed in an isolated state. In addition, in the inside of the substrate 61, an outer surface portion of the oxide film 1542 is covered with the fixed charge film 1543.

A portion of such oxide film 1542 and fixed charge film 1543 having a trench structure that is long in a direction perpendicular to a surface of the substrate 61, that is, a portion functioning as an FTI that passes through the substrate 61 and isolates the light receiving regions from each other between the pixels 51 that are adjacent, has the pixel isolation portion 1511.

Note that, it has been described here that the pixel isolation portion 1511 is constituted by the oxide film 1542 and the fixed charge film 1543; however, it can also be understood that the pixel isolation portion 1511 is constituted by only the oxide film 1542.

Besides, the pixel isolation portion 1511 may be formed by a metal material and the fixed charge film, or formed by a metal material and the oxide film.

Since the pixel isolation portion 1511 is formed at a boundary portion between the pixels 51 used for the distance measurement for different target objects, reflected light of infrared light that has entered the substrate 61 through the on-chip lens 1541 can be prevented from entering the pixels 51 used for the distance measurement for a different target object, similarly to the example illustrated in FIG. 59.

Consequently, the occurrence of crosstalk and the deterioration of the pixel sensitivity can be suppressed, and characteristics of the CAPD sensor, such as sensitivity characteristics and the ranging accuracy (resolution) can be improved.

Furthermore, in the example illustrated in FIG. 77, similarly to the example illustrated in FIG. 59, since the pixel isolation portion 1511 is formed at a position shifted from the transistor, the generation of a leakage current at a P-well portion that covers the transistor can be suppressed.

Moreover, in this example, similarly to the example in FIG. 59, an inter-pixel light-shielding film 63 and the on-chip lens 1541 are arranged in line with the pixel isolation portion 1511 shifted and arranged.

Accordingly, also in the case illustrated in FIG. 77, similarly to the case in FIG. 59, the amount of light (the amount of received light) guided into the light receiving region by the on-chip lens 1541 can be further expanded, and sensitivity characteristics can be improved.

In addition, a cross-sectional view corresponding to the G7-G7' line of the pixels 51 illustrated in FIG. 76 is as illustrated in FIG. 78. In FIG. 78, two pixels 51 put side-by-side in the lateral direction in the drawing are used for the distance measurement for the same target object, such that the pixel isolation portion 1511 is formed at the portion of a boundary between these two pixels 51 and other pixels 51.

In different terms, the region of two pixels 51 put side-by-side in the lateral direction in the drawing in the substrate 61 is surrounded by the pixel isolation portion 1511, and the region of the two pixels 51 put side-by-side in the lateral direction and the region of other pixels 51 adjacent to these two pixels 51 are isolated from each other by the pixel isolation portion 1511.

Furthermore, in the cross section illustrated in FIG. 78, one on-chip lens 1541 is provided for two pixels 51 put side-by-side in the lateral direction in the drawing, that is, two pixels 51 used for the distance measurement for the same target object. Accordingly, for example, in the example illustrated in FIG. 76, one on-chip lens 1541 is provided for four pixels 51 adjacent to each other, that is, four pixels 51 surrounded by the pixel isolation portion 1511 and used for the distance measurement for the same target object.

According to the pixel 51 having the configuration illustrated in FIGS. 76 to 78 as described above, characteristics such as sensitivity characteristics and the ranging accuracy (resolution) can be improved, and furthermore the generation of a leakage current can also be suppressed.

Note that, in FIG. 77, an example in which the arrangement position of the on-chip lens 1541 is shifted in line with the formation position of the pixel isolation portion 1511 has been described. However, when viewed from a direction perpendicular to a surface of the substrate 61, the on-chip lens 1541 may be arranged such that the position of the optical axis of the on-chip lens 1541 coincides with approximately the middle position between four pixels 51. Conversely, in the cross section illustrated in FIG. 77, the respective signal retrieving units 65 of the four pixels 51 may be shifted and arranged such that the position of the optical axis of the on-chip lens 1541 coincides with approximately the middle position between the two pixels 51.

Twenty-Eighth Embodiment

Configuration Example of Pixel

The configuration of a pixel 51 according to a twenty-eighth embodiment will be described with reference to FIGS. 79 to 81.

Figure 79:
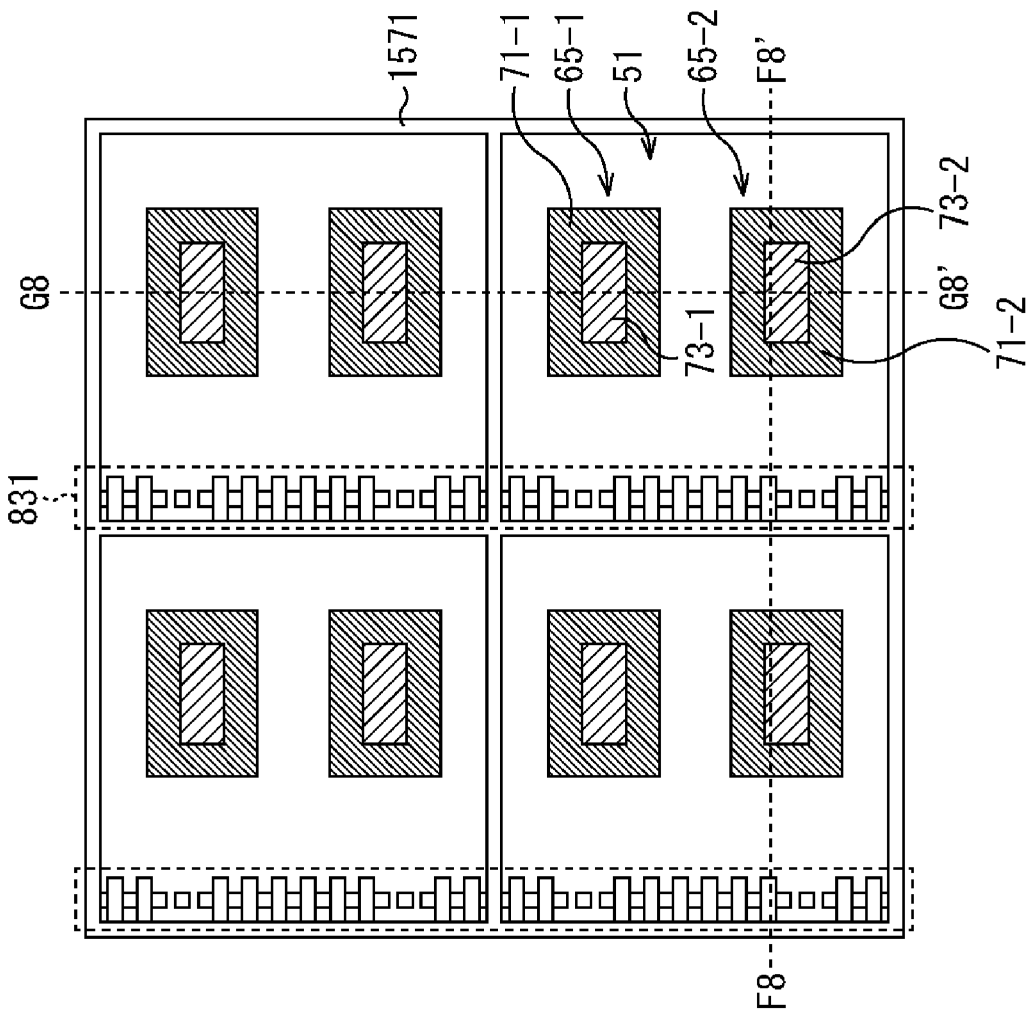
FIG. 79 is a diagram of pixels viewed from a direction perpendicular to a surface of a substrate.

FIG. 79 is a diagram of the pixels 51 viewed from a direction perpendicular to a surface of a substrate 61.

In this example, a pixel isolation portion 1571 that functions as a pixel isolation region that isolates the regions of the pixels 51 from each other is formed at a boundary portion of the pixels 51 adjacent to each other so as to surround the region of each pixel 51.

Also in FIG. 79, similarly to the case of FIG. 58, the arrangement position of the transistor and the like for driving the pixel 51 and the arrangement position of the pixel isolation portion 1571 are positioned differently from each other when viewed from a direction perpendicular to a surface of the substrate 61. That is, the pixel isolation portion 1571 is arranged at a position shifted from the transistor and the like.

Figure 80:
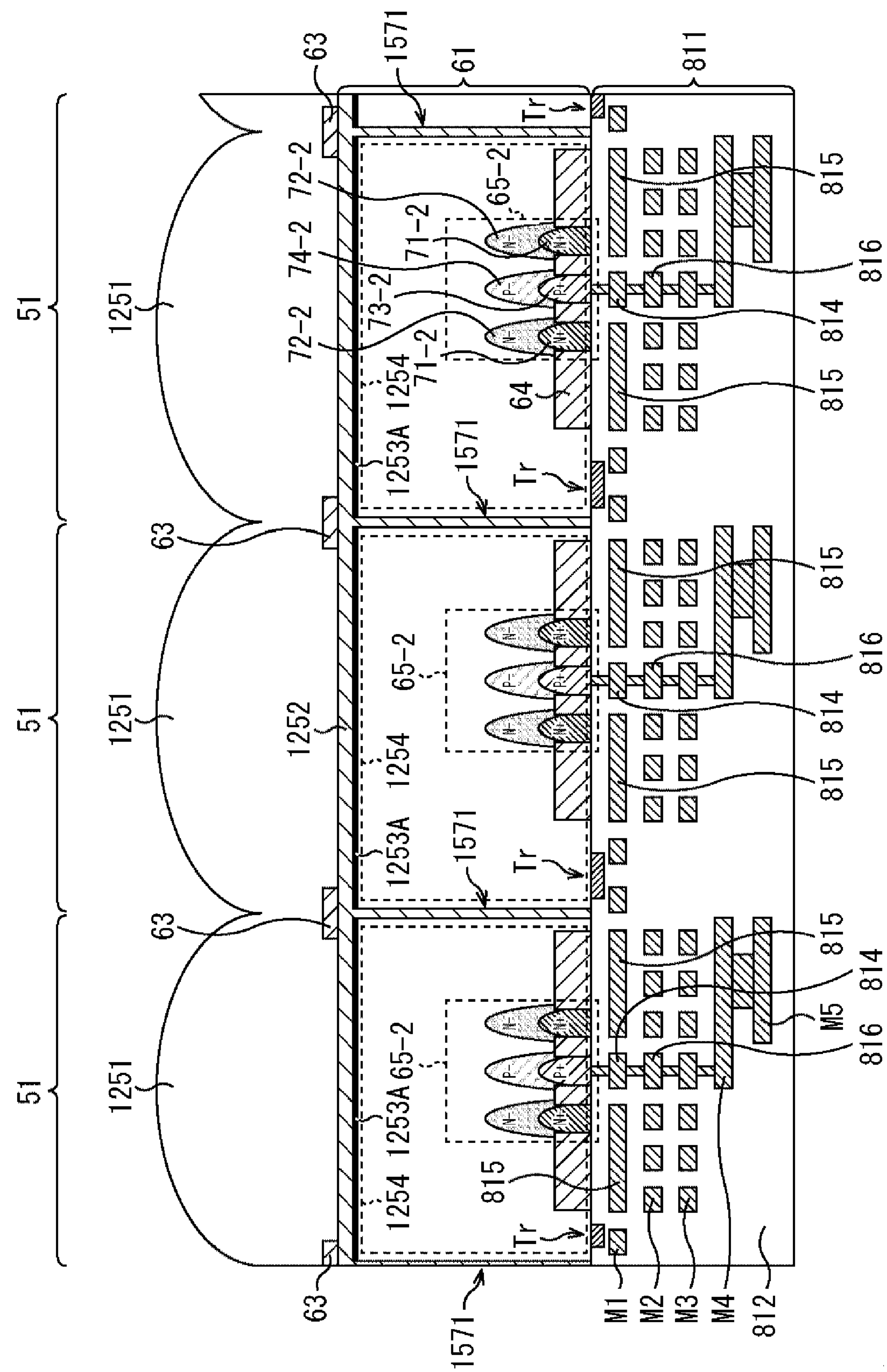
FIG. 80 is a cross-sectional view of a plurality of pixels.
Figure 81:
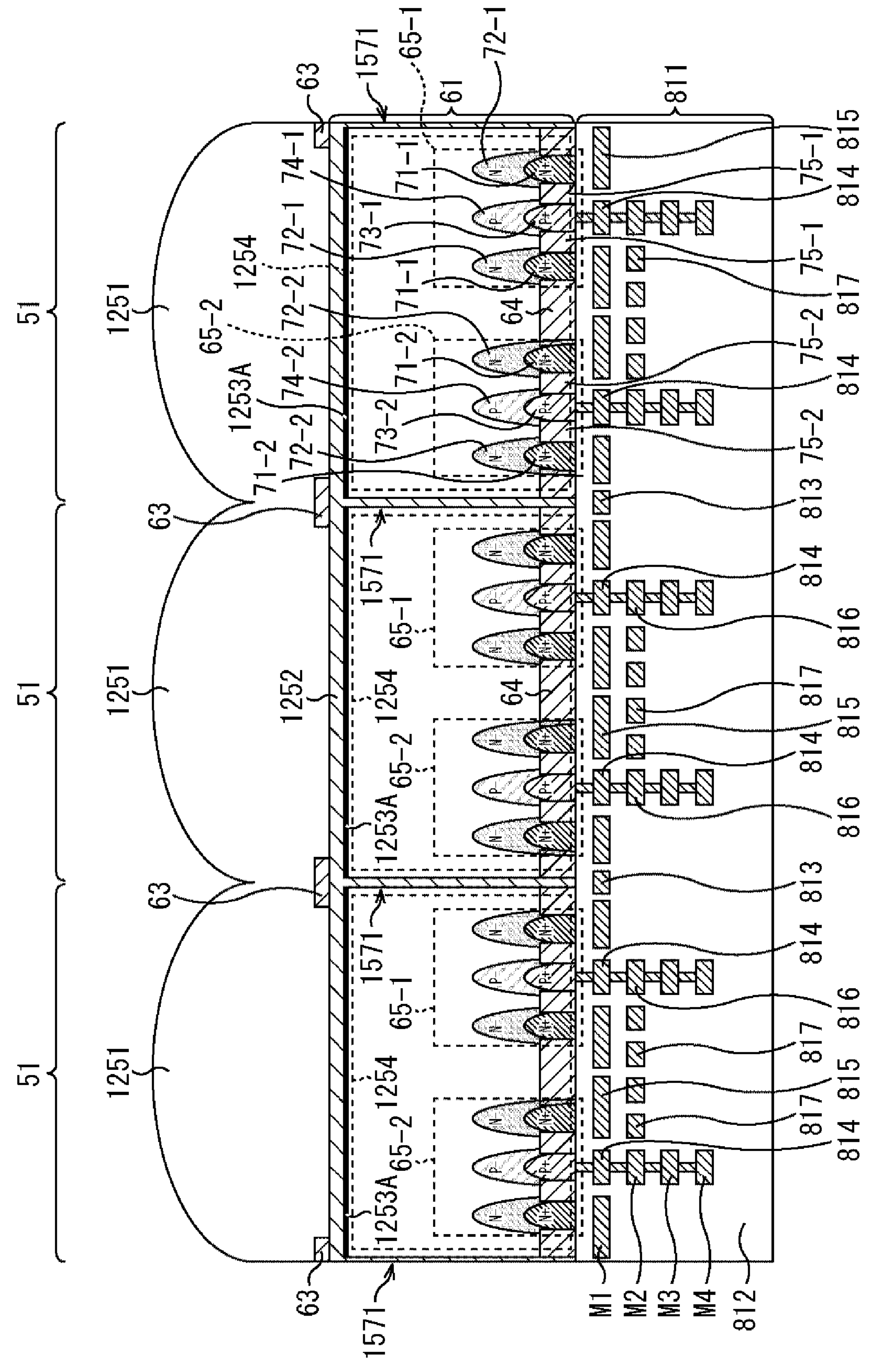
FIG. 81 is a cross-sectional view of a plurality of pixels.

Here, a cross section corresponding to an F8-F8' line and a cross section corresponding to a G8-G8' line in FIG. 79 are illustrated in FIGS. 80 and 81.

The configuration of the pixel 51 illustrated in FIGS. 80 and 81 is configured such that a fixed charge film 1253A is formed instead of the fixed charge film 1253 in the configuration of the pixel 51 illustrated in FIGS. 59 and 60. That is, the configuration of the pixel 51 illustrated in FIGS. 80 and 81 is configured the same as the example illustrated in FIGS. 59 and 60 except for the portion of the fixed charge film 1253A.

Specifically, in FIG. 59, the fixed charge film 1253 is formed on an outer surface of the oxide film 1252 that passes through the substrate 61 at a boundary portion of the pixel 51. On the other hand, in FIG. 80, the fixed charge film 1253 is not formed on an outer surface portion of an oxide film 1252 that passes through the substrate 61 at a boundary portion of the pixel 51.

In FIG. 80, the oxide film 1252 is formed so as to cover the surface of the substrate 61 on the side of an on-chip lens 1251, and the fixed charge film 1253A is formed so as to cover a surface of the oxide film 1252 on an inner side of the substrate 61 excluding the pixel boundary portion.

Accordingly, a portion of the fixed charge film 1253 constituting the pixel isolation portion 1221 illustrated in FIG. 59, that is, the FTI portion is not formed in FIG. 80, but in FIG. 80, a portion of the fixed charge film 1253 illustrated in FIG. 59 other than the FTI portion has the fixed charge film 1253A.

In the example illustrated in FIG. 80, a portion of the oxide film 1252 having a trench structure that is long in a direction perpendicular to a surface of the substrate 61, that is, a portion functioning as an FTI that passes through the substrate 61 and isolates light receiving regions 1254 from each other between the pixels 51 that are adjacent, has the pixel isolation portion 1571.

For example, in the configuration illustrated in FIG. 59, if the pixel isolation portion 1221 and the P− well portion that covers the transistor are not sufficiently away from each other, a leakage current from the fixed charge film 1253 to the transistor is likely to be generated via the P-well portion.

On the other hand, in the example illustrated in FIG. 80, a configuration in which the fixed charge film is not formed at a portion in the vicinity of a P-well that covers the transistor is employed, such that the generation of a leakage current can be prevented.

In addition, a cross-sectional view corresponding to the G8-G8' line of the pixels 51 illustrated in FIG. 79 is as illustrated in FIG. 81. Also in FIG. 81, similarly to the case of FIG. 80, a portion of the oxide film 1252 having a trench structure that is long in a direction perpendicular to a surface of the substrate 61 has the pixel isolation portion 1571, and the light receiving regions 1254 are isolated from each other between the pixels 51 that are adjacent by the pixel isolation portion 1571. In particular, here, the pixel isolation portion 1571 passes through the portion of the oxide film 64 and reaches the multilayer wiring layer 811.

According to the pixel 51 having the configuration illustrated in FIGS. 79 to 81 as described above, characteristics such as sensitivity characteristics and the ranging accuracy (resolution) can be improved, and furthermore the generation of a leakage current can also be prevented.

Twenty-Ninth Embodiment

Configuration Example of Pixel

The configuration of a pixel 51 according to a twenty-ninth embodiment will be described with reference to FIGS. 82 to 84.

Figure 82:
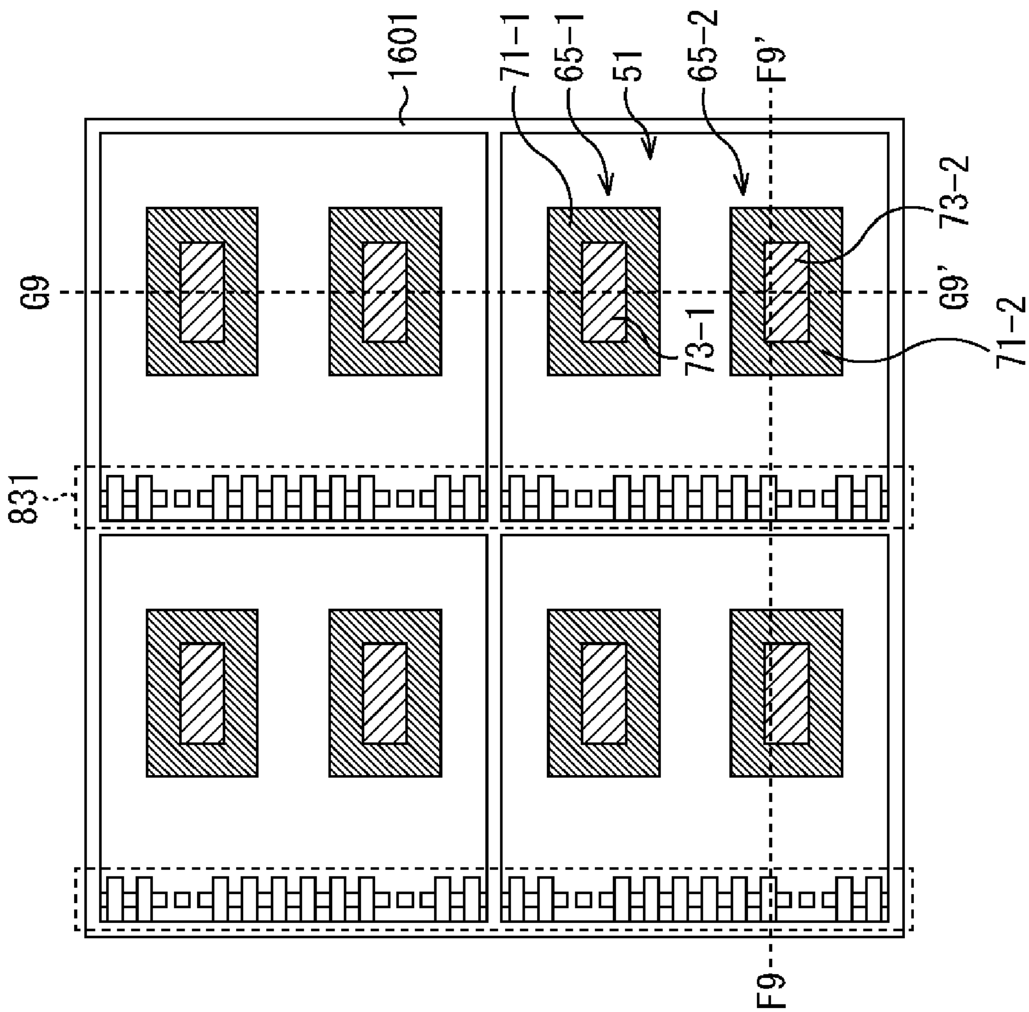
FIG. 82 is a diagram of pixels viewed from a direction perpendicular to a surface of a substrate.

FIG. 82 is a diagram of the pixels 51 viewed from a direction perpendicular to a surface of a substrate 61.

In this example, a pixel isolation portion 1601 that functions as a pixel isolation region that isolates the regions of the pixels 51 from each other is formed at a boundary portion of the pixels 51 adjacent to each other so as to surround the region of each pixel 51.

Also in FIG. 82, similarly to the case of FIG. 58, the arrangement position of the transistor and the like for driving the pixel 51 and the arrangement position of the pixel isolation portion 1601 are positioned differently from each other when viewed from a direction perpendicular to a surface of the substrate 61. That is, the pixel isolation portion 1601 is arranged at a position shifted from the transistor and the like.

Figure 83:
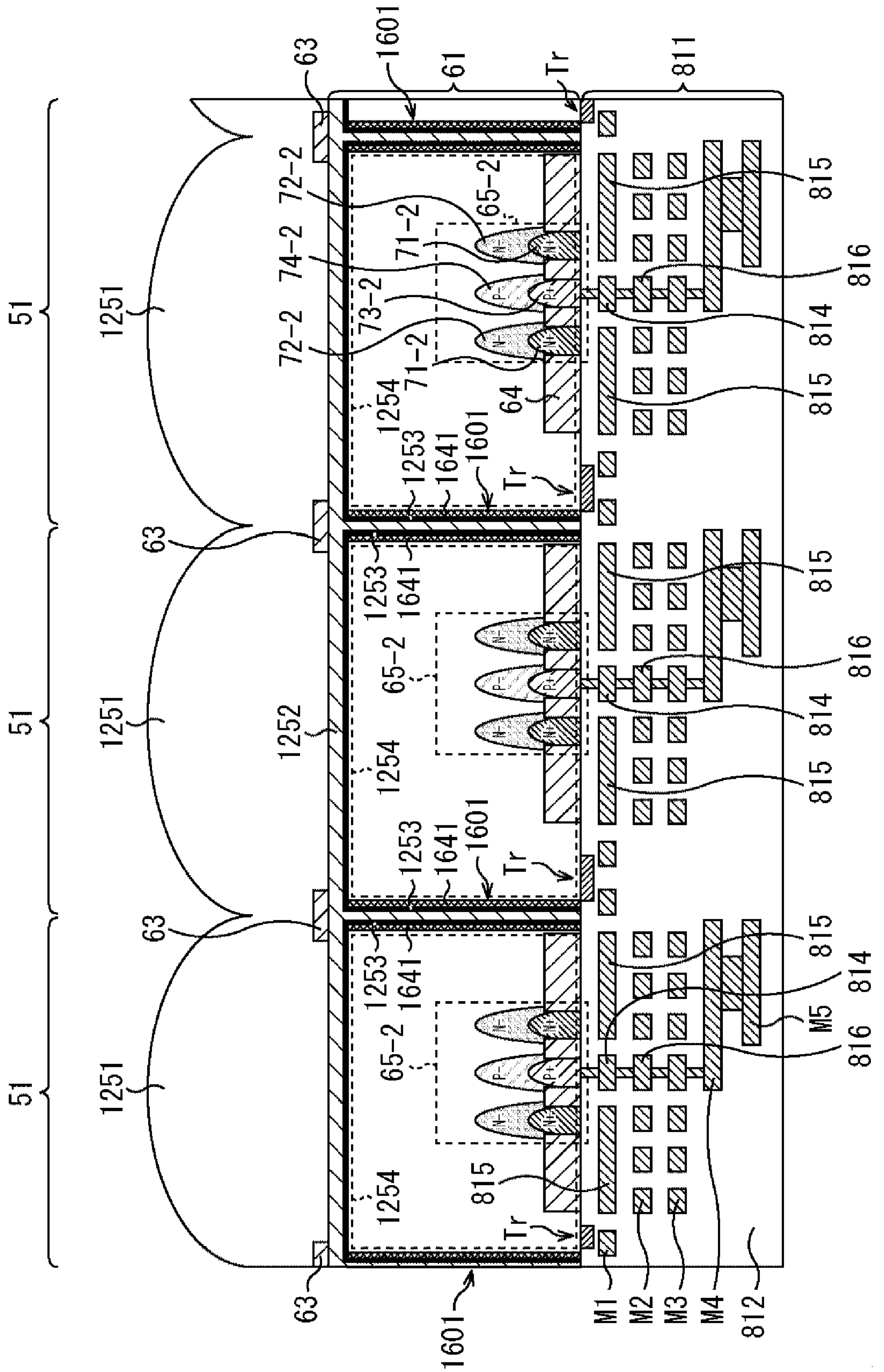
FIG. 83 is a cross-sectional view of a plurality of pixels.
Figure 84:
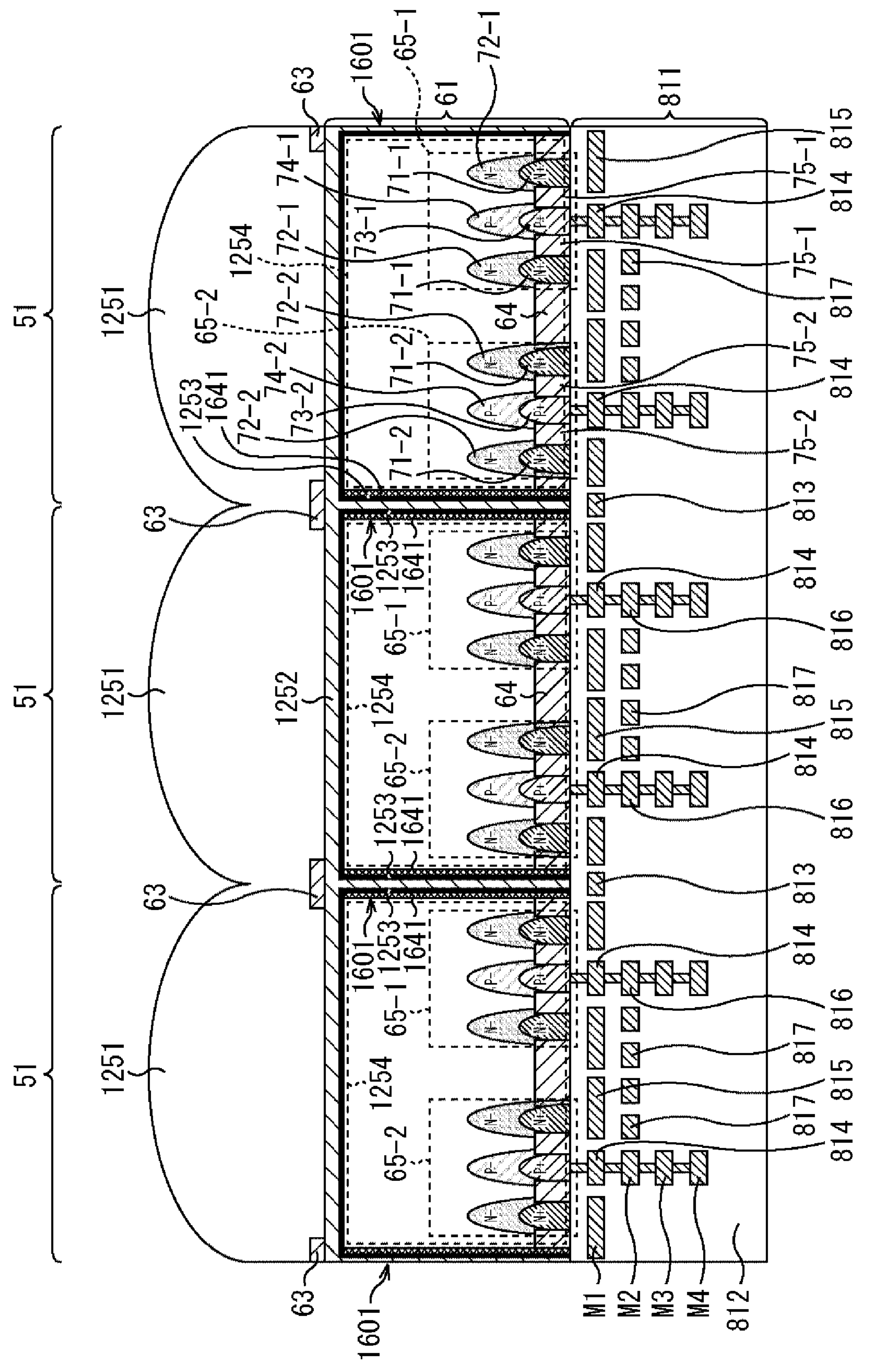
FIG. 84 is a cross-sectional view of a plurality of pixels.

Here, a cross section corresponding to an F9-F9' line and a cross section corresponding to a G9-G9' line in FIG. 82 are illustrated in FIGS. 83 and 84.

The configuration of the pixel 51 illustrated in FIGS. 83 and 84 is configured such that an N-type semiconductor region 1641 is further provided in the configuration of the pixel 51 illustrated in FIGS. 59 and 60. That is, the configuration of the pixel 51 illustrated in FIGS. 83 and 84 is configured the same as the example illustrated in FIGS. 59 and 60 except for the portion of the N-type semiconductor region 1641.

In FIG. 83, the N-type semiconductor region 1641 is formed at a portion of the oxide film 1252 and the fixed charge film 1253 that is long in a direction perpendicular to the surface of the substrate 61, that is, the portion of an FTI structure that passes through the substrate 61, so as to cover an outer surface of the fixed charge film 1253. This N-type semiconductor region 1641 is formed by, for example, implantation.

In this example, a portion functioning as an FTI that includes parts of both of the oxide film 1252 and the fixed charge film 1253, and the N-type semiconductor region 1641, passes through the substrate 61, and isolates light receiving regions 1254 from each other between the pixels 51 that are adjacent has the pixel isolation portion 1601. Note that, also in this case, it can be understood that the pixel isolation portion 1601 is constituted by only the oxide film 1252, or it can be understood that the pixel isolation portion 1601 is constituted by only the oxide film 1252 and the fixed charge film 1253.

By providing such a pixel isolation portion 1601, the generation of a leakage current can be prevented by PN isolation and the isolation of the light receiving regions 1254 from each other between the pixels 51 can be implemented.

For example, in the example illustrated in FIG. 59, if the pixel isolation portion 1221 and the P-well portion that covers the transistor are not sufficiently away from each other, a leakage current from the fixed charge film 1253 to the transistor is likely to be generated via the P-well portion.

Therefore, in the example illustrated in FIG. 83, an outer surface (peripheral) portion of the FTI is isolated by the N-type semiconductor region 1641, and furthermore a fixed voltage of, for example, 0 V to 2.8 V is applied to the N-type semiconductor region 1641, such that the occurrence of a leakage current is prevented by utilizing the reverse bias of a PN junction.

Note that the fixed voltage applied to the N-type semiconductor region 1641 only needs to be a voltage equal to or higher than a voltage applied to the substrate 61. Furthermore, although an example in which the substrate 61 includes a semiconductor layer of P-type has been described here, in a case where the substrate 61 includes a semiconductor layer of N-type, a P-type semiconductor region is only required to be formed instead of the N-type semiconductor region 1641.

In addition, a cross-sectional view corresponding to the G9-G9' line of the pixels 51 illustrated in FIG. 82 is as illustrated in FIG. 84. Also in FIG. 84, similarly to the case of FIG. 83, a portion functioning as an FTI that includes parts of both of the oxide film 1252 and the fixed charge film 1253, and the N-type semiconductor region 1641, and passes through the substrate 61 has the pixel isolation portion 1601. Then, the light receiving regions 1254 are isolated from each other between the pixels 51 that are adjacent by the pixel isolation portion 1601. In particular, here, the portion of the oxide film 1252, the fixed charge film 1253, and the N-type semiconductor region 1641 constituting the pixel isolation portion 1601 pass through the oxide film 64 and reach the multilayer wiring layer 811.

According to the pixel 51 having the configuration illustrated in FIGS. 82 to 84 as described above, characteristics such as sensitivity characteristics and the ranging accuracy (resolution) can be improved, and furthermore the generation of a leakage current can also be prevented. Note that, in the example illustrated in FIGS. 83 and 84, a configuration in which the fixed charge film 1253 is not provided may be employed.

Thirtieth Embodiment

Configuration Example of Pixel

The configuration of a pixel 51 according to a thirtieth embodiment will be described with reference to FIGS. 85 to 87.

Figure 85:
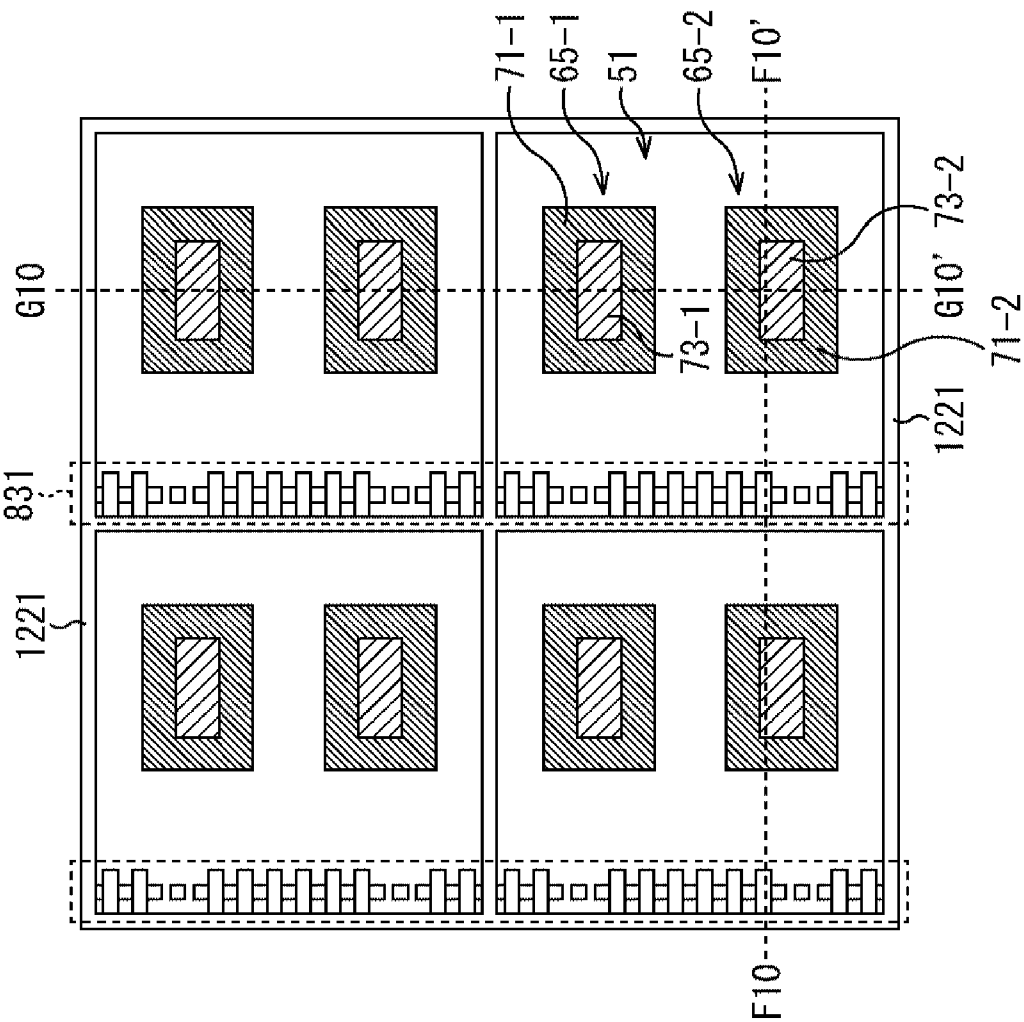
FIG. 85 is a diagram of pixels viewed from a direction perpendicular to a surface of a substrate.

FIG. 85 is a diagram of the pixels 51 viewed from a direction perpendicular to a surface of a substrate 61.

In this example, a pixel isolation portion 1221 that functions as a pixel isolation region that isolates the regions of the pixels 51 from each other is formed at a boundary portion of the pixels 51 adjacent to each other so as to surround the region of each pixel 51.

Also in FIG. 85, similarly to the case of FIG. 58, the arrangement position of the transistor and the like for driving the pixel 51 and the arrangement position of the pixel isolation portion 1221 are positioned differently from each other when viewed from a direction perpendicular to a surface of the substrate 61. That is, the pixel isolation portion 1221 is arranged at a position shifted from the transistor and the like.

Figure 86:
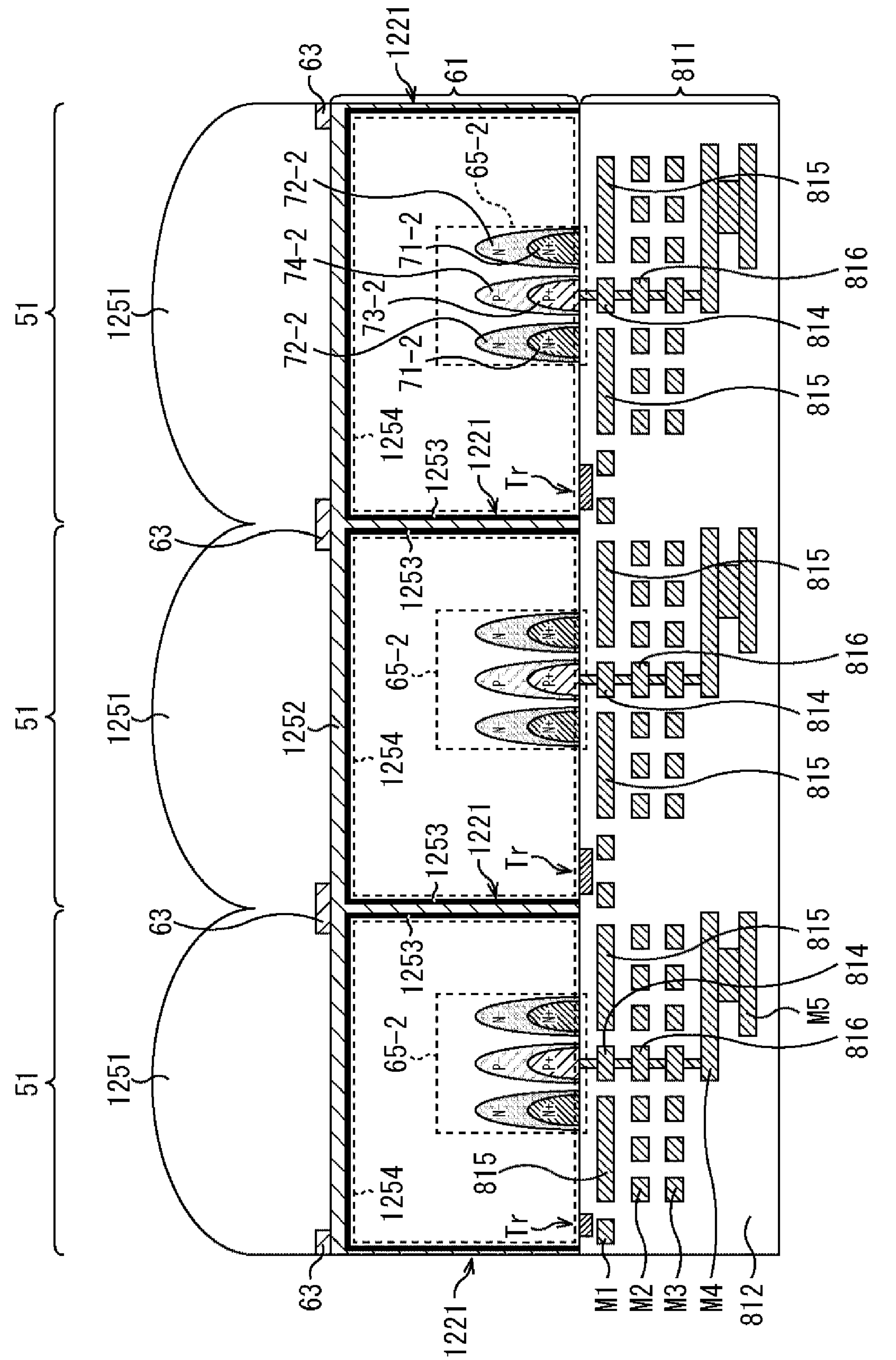
FIG. 86 is a cross-sectional view of a plurality of pixels.
Figure 87:
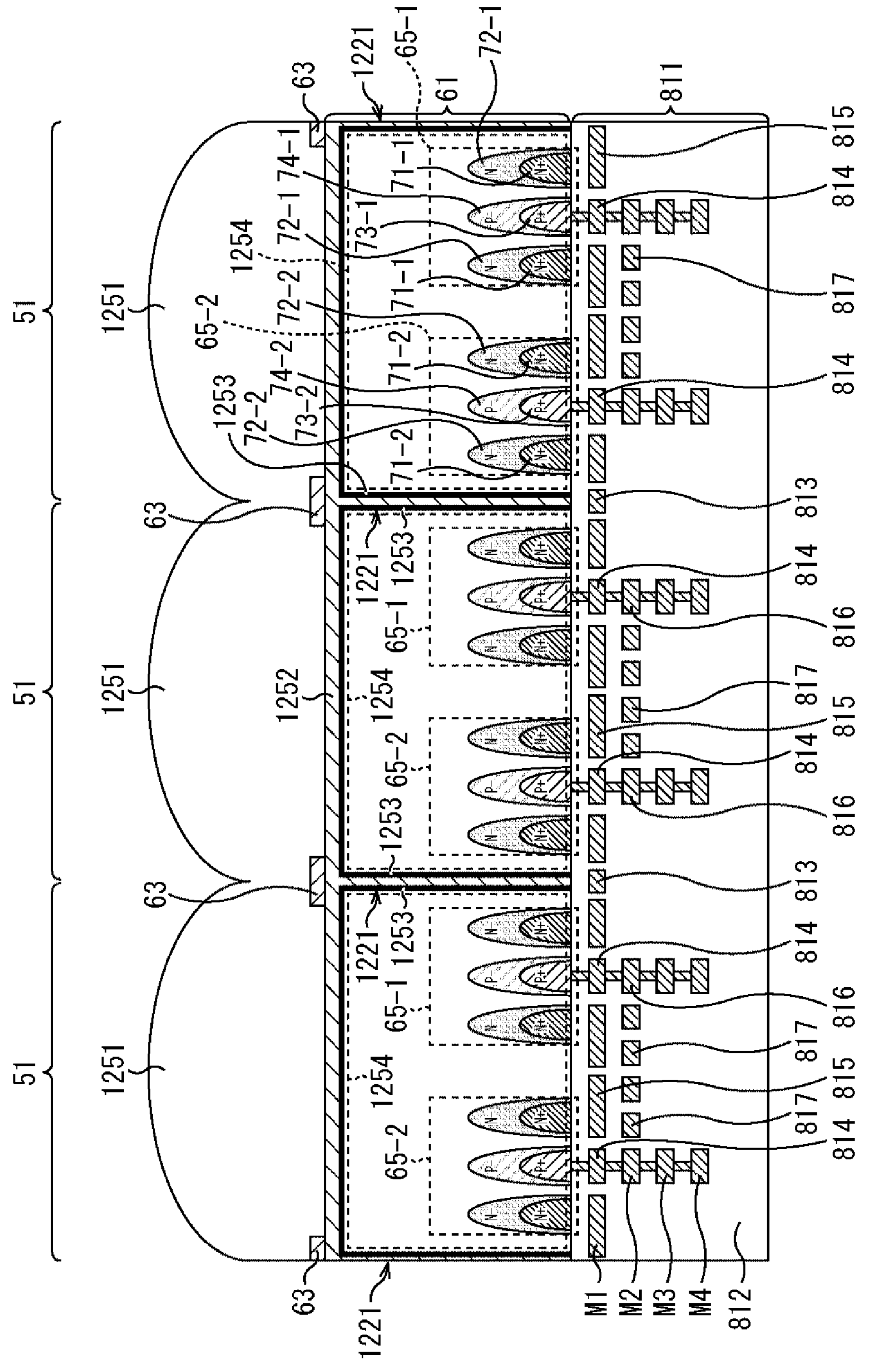
FIG. 87 is a cross-sectional view of a plurality of pixels.

Here, a cross section corresponding to an F10-F10' line and a cross section corresponding to a G10-G10' line in FIG. 85 are illustrated in FIGS. 86 and 87.

The configuration of the pixel 51 illustrated in FIGS. 85 and 86 is a configuration in which the oxide film 64 in the configuration of the pixel 51 illustrated in FIGS. 59 and 60 is not provided, and is configured the same as the configuration of the pixel 51 in FIGS. 59 and 60 in other points.

If a configuration in which the oxide film 64 is not provided in the pixel 51, that is, in a light receiving region 1254 of the pixel 51 in this manner is employed, a phenomenon in which infrared light that has entered the inside of the substrate 61 through an on-chip lens 1251 is reflected in the portion of the oxide film 64 and enters the pixel 51 being adjacent does not happen. Accordingly, the occurrence of crosstalk and the deterioration of the pixel sensitivity can be further suppressed, and characteristics of the CAPD sensor, such as sensitivity characteristics and the ranging accuracy (resolution) can be improved.

Thirty-First Embodiment

Configuration Example of Pixel

The configuration of a pixel 51 according to a thirty-first embodiment will be described with reference to FIGS. 88 to 90.

Figure 88:
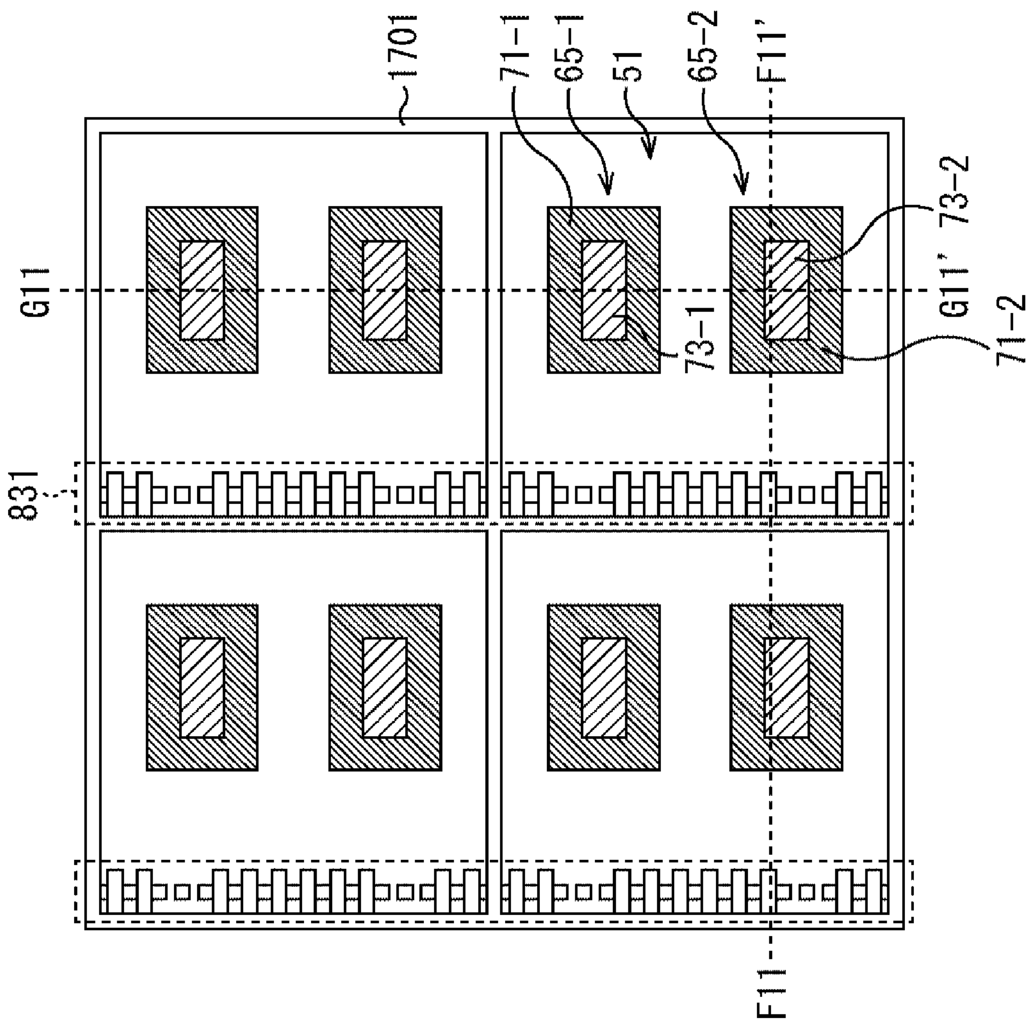
FIG. 88 is a diagram of pixels viewed from a direction perpendicular to a surface of a substrate.

FIG. 88 is a diagram of the pixels 51 viewed from a direction perpendicular to a surface of a substrate 61.

In this example, a pixel isolation portion 1701 that functions as a pixel isolation region that isolates the regions of the pixels 51 from each other is formed at a boundary portion of the pixels 51 adjacent to each other so as to surround the region of each pixel 51.

Also in FIG. 88, similarly to the case of FIG. 58, the arrangement position of the transistor and the like for driving the pixel 51 and the arrangement position of the pixel isolation portion 1701 are positioned differently from each other when viewed from a direction perpendicular to a surface of the substrate 61. That is, the pixel isolation portion 1701 is arranged at a position shifted from the transistor and the like.

Figure 89:
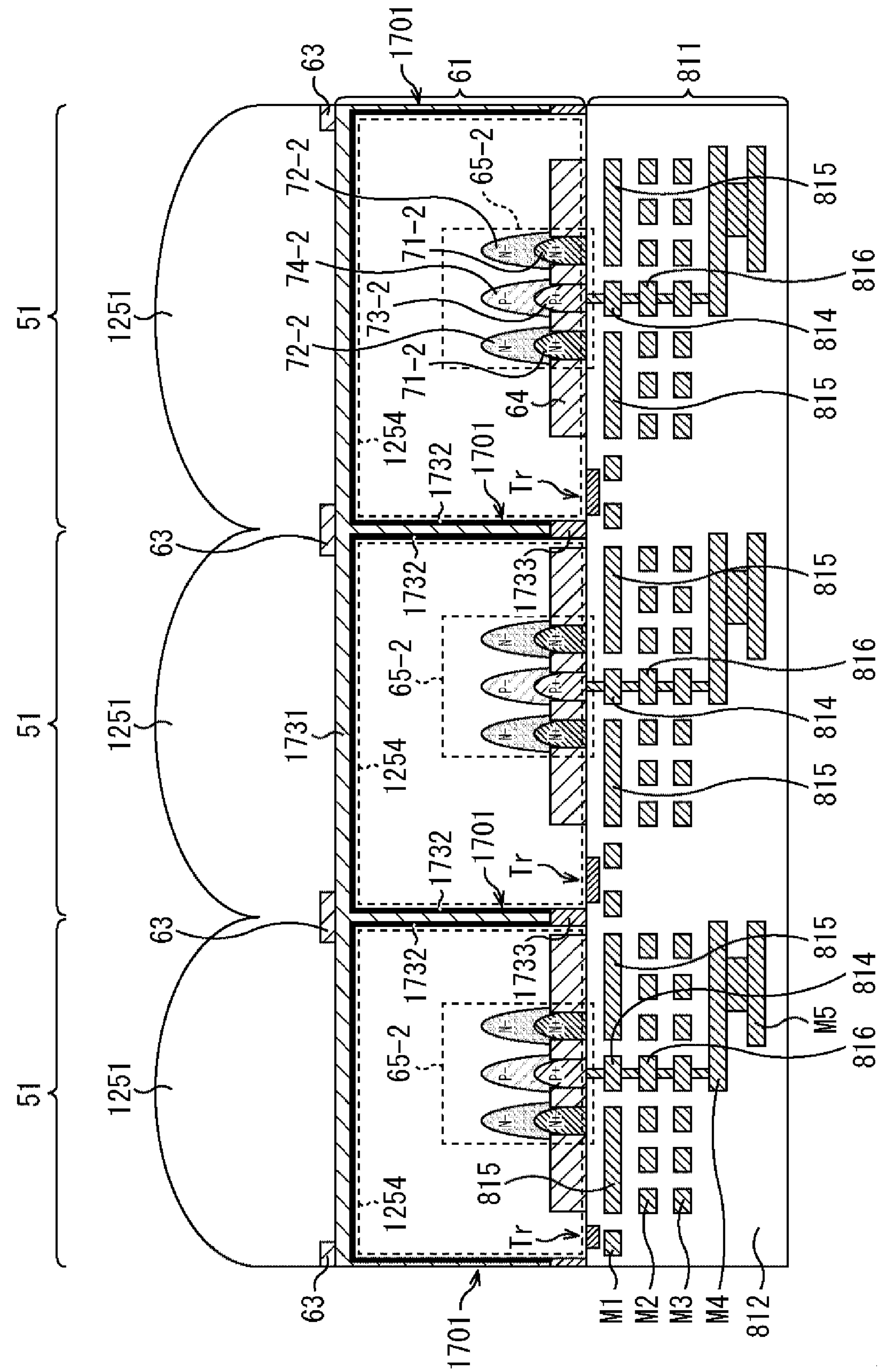
FIG. 89 is a cross-sectional view of a plurality of pixels.
Figure 90:
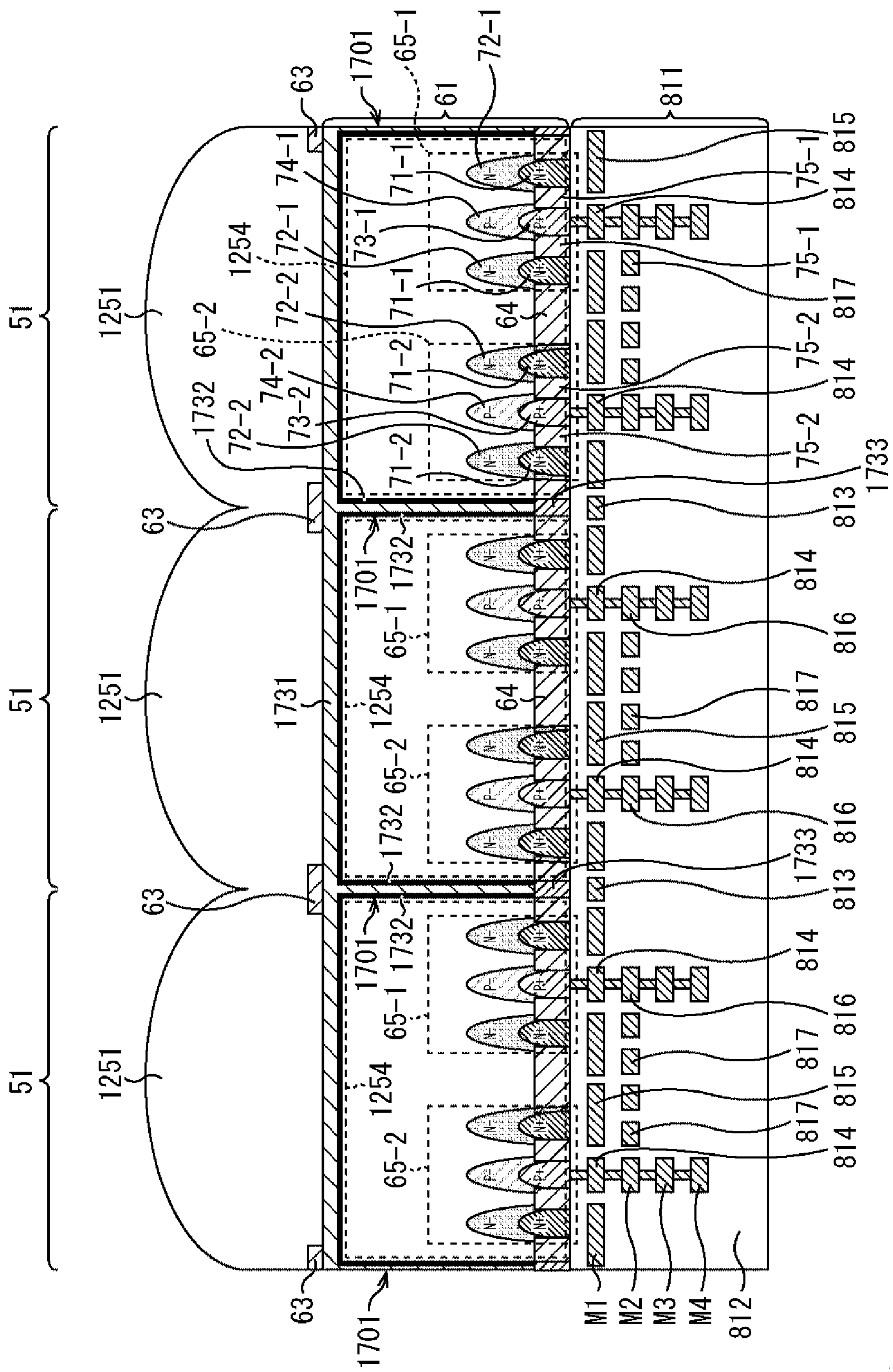
FIG. 90 is a cross-sectional view of a plurality of pixels.

Here, a cross section corresponding to an F11-F11' line and a cross section corresponding to a G11-G11' line in FIG. 88 are illustrated in FIGS. 89 and 90.

The configuration of the pixel 51 illustrated in FIGS. 89 and 90 is configured such that an oxide film 1731, a fixed charge film 1732, and an oxide film 1733 are provided instead of the oxide film 1252 and the fixed charge film 1253 in the configuration of the pixel 51 illustrated in FIGS. 59 and 60.

In the example illustrated in FIG. 89, the oxide film 1731 is formed so as to cover a surface of the substrate 61 on the side of the on-chip lens 1251. Moreover, the oxide film 1731 is formed from the substrate 61 on the side of the on-chip lens 1251 to a predetermined depth in a direction on the side of a multilayer wiring layer 811 at a boundary portion between the pixels 51 adjacent to each other, and owing to this configuration, the light receiving regions 1254 of the pixels 51 that are adjacent are placed in an isolated state.

Furthermore, in the inside of the substrate 61, a region between a semiconductor region of P-type constituting the substrate 61 and the oxide film 1731, that is, an outer surface portion of the oxide film 1731 is covered with the fixed charge film 1732.

In particular, in this example, a portion of the oxide film 1731 and the fixed charge film 1732 functioning as an FTI that is long in a direction perpendicular to a surface of the substrate 61, and isolates the light receiving regions 1254 from each other between the pixels 51 that are adjacent has the pixel isolation portion 1701.

Note that, it has been described here that the pixel isolation portion 1701 is constituted by the oxide film 1731 and the fixed charge film 1732; however, it can also be understood that the pixel isolation portion 1701 is constituted by only the oxide film 1731.

Besides, the pixel isolation portion 1701 may be formed by a metal material and the fixed charge film, or formed by a metal material and the oxide film.

Furthermore, in the example illustrated in FIG. 89, the oxide film 1733 is provided in the substrate 61 between the pixel isolation portion 1701 and the multilayer wiring layer 811. That is, the oxide film 1733 is formed between a surface of the substrate 61 on the side of the multilayer wiring layer 811 and the pixel isolation portion 1701. This oxide film 1733 is formed simultaneously with the oxide film 64.

In addition, a cross-sectional view corresponding to the G11-G11' line of the pixels 51 illustrated in FIG. 88 is as illustrated in FIG. 90. In FIG. 90, a portion of the oxide film 64 has the oxide film 1733, and this oxide film 1733 is connected to the oxide film 1731 and the fixed charge film 1732 constituting the pixel isolation portion 1701.

Also in the cross section illustrated in FIG. 90, the light receiving regions 1254 are isolated from each other between the pixels 51 that are adjacent by the pixel isolation portion 1701.

As described above, in the configuration illustrated in FIGS. 89 and 90, the oxide film 1731 and the fixed charge film 1732 constituting the pixel isolation portion 1701 functioning as the FTI are formed from the light entrance surface side (the side of the on-chip lens 1251) of the substrate 61. Then, in the substrate 61, the oxide film 1733 and the pixel isolation portion 1701 functioning as the FTI are connected to pass through a fixed charge layer.

By providing the oxide film 1733 between the pixel isolation portion 1701 and the multilayer wiring layer 811 in this manner, the generation of a leakage current flowing from the fixed charge film 1732 to the transistor through a P-well portion that covers the transistor can be suppressed.

According to the pixel 51 having the configuration illustrated in FIGS. 88 to 90 as described above, characteristics such as sensitivity characteristics and the ranging accuracy (resolution) can be improved, and furthermore the generation of a leakage current can also be suppressed.

Note that, in FIG. 89, an example in which the arrangement position of the on-chip lens 1251 is shifted in line with the formation position of the pixel isolation portion 1701 has been described. However, when viewed from a direction perpendicular to a surface of the substrate 61, the on-chip lens 1251 may be arranged such that the position of the optical axis of the on-chip lens 1251 coincides with approximately the middle position between two signal retrieving units 65 in the pixel 51.

By configuring in this manner, infrared light can be condensed at a position between the signal retrieving units 65-1 and 65-2, and the electron retrieving efficiency can be made approximately equal between these signal retrieving units 65.

Moreover, for example, in the example illustrate in FIG. 88, the signal retrieving units 65-1 and 65-2 may be shifted and arranged such that a position between these signal retrieving units 65 is positioned on the optical axis of the on-chip lens 1251.

Thirty-Second Embodiment

Configuration Example of Pixel

The configuration of a pixel 51 according to a thirty-second embodiment will be described with reference to FIGS. 91 to 93.

Figure 91:
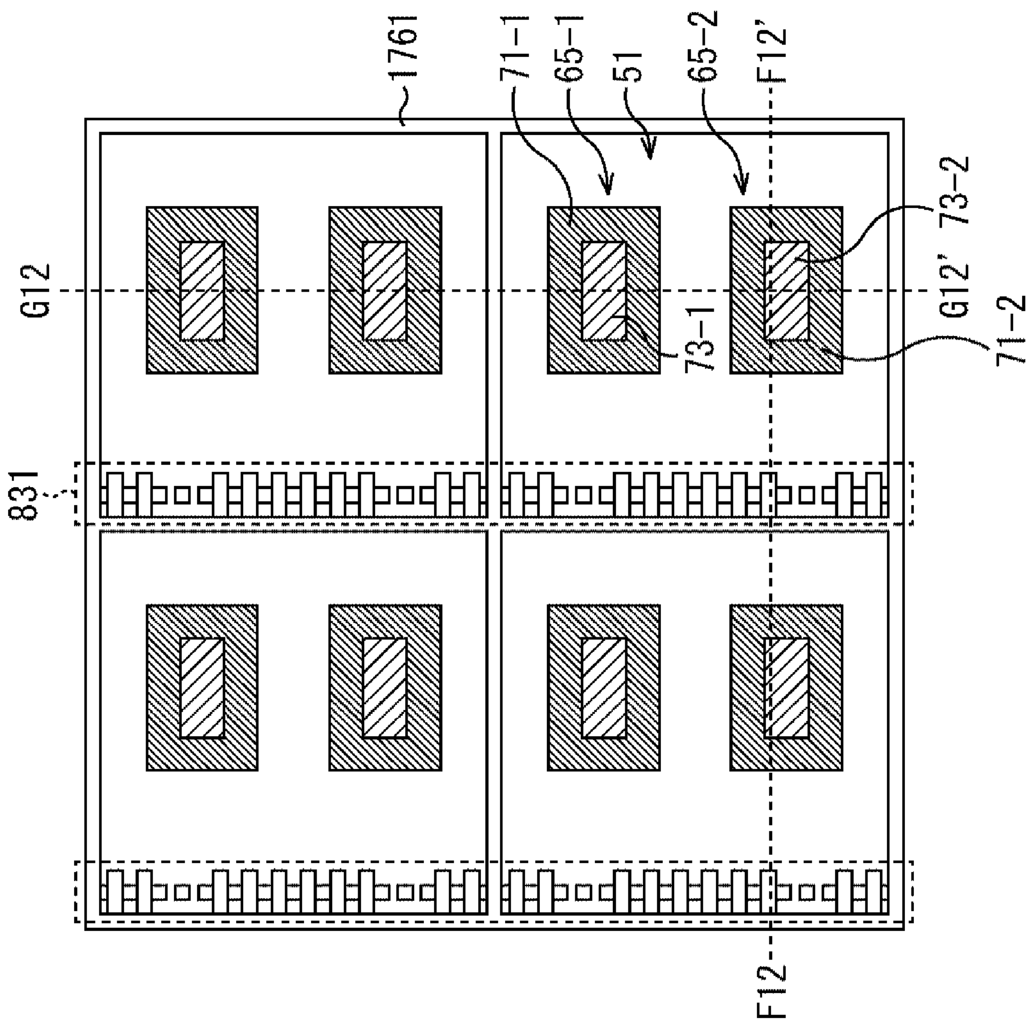
FIG. 91 is a diagram of pixels viewed from a direction perpendicular to a surface of a substrate.

FIG. 91 is a diagram of the pixels 51 viewed from a direction perpendicular to a surface of a substrate 61.

In this example, a pixel isolation portion 1761 that functions as a pixel isolation region that isolates the regions of the pixels 51 from each other is formed at a boundary portion of the pixels 51 adjacent to each other so as to surround the region of each pixel 51.

Figure 92:
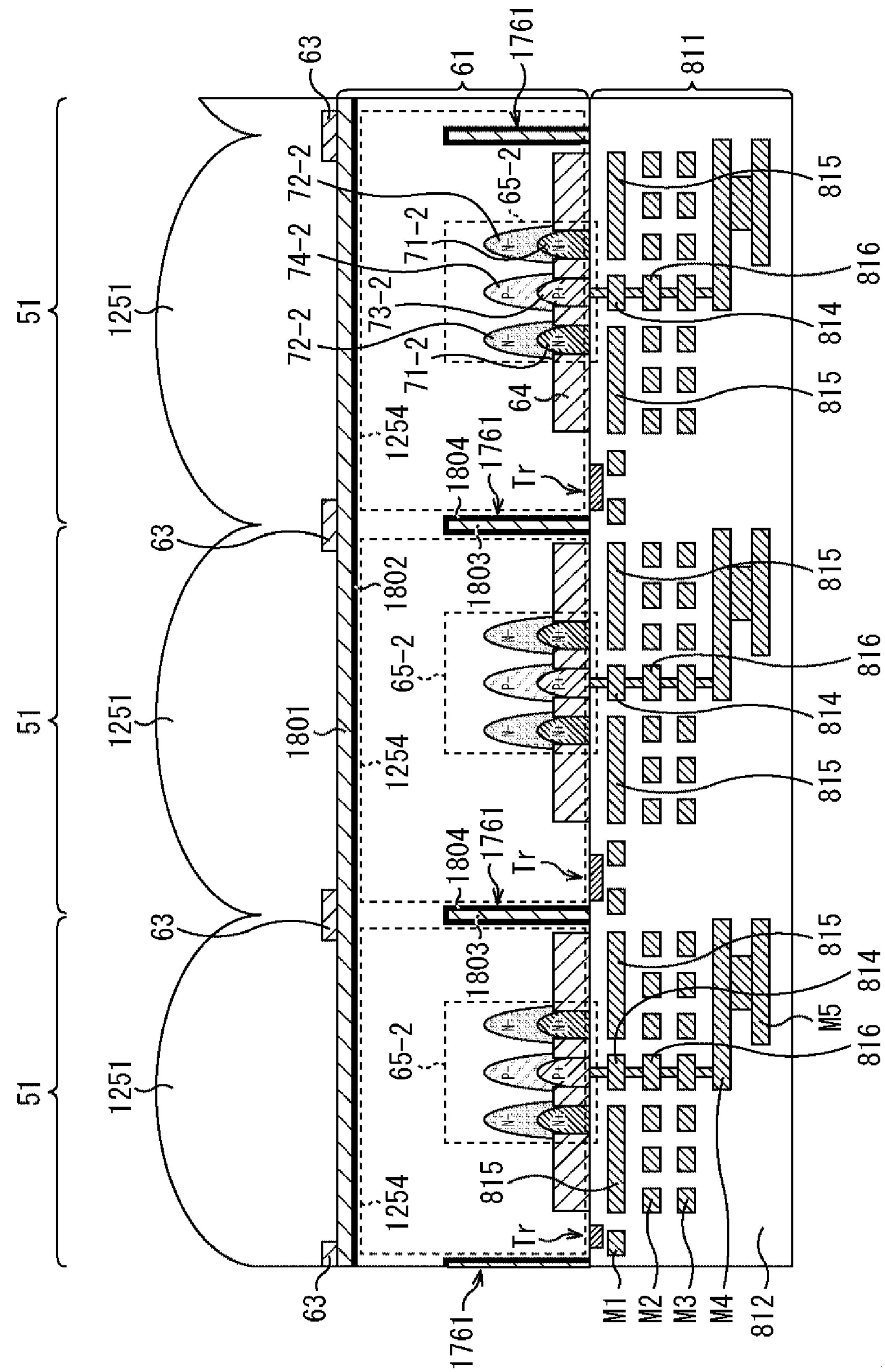
FIG. 92 is a cross-sectional view of a plurality of pixels.
Figure 93:
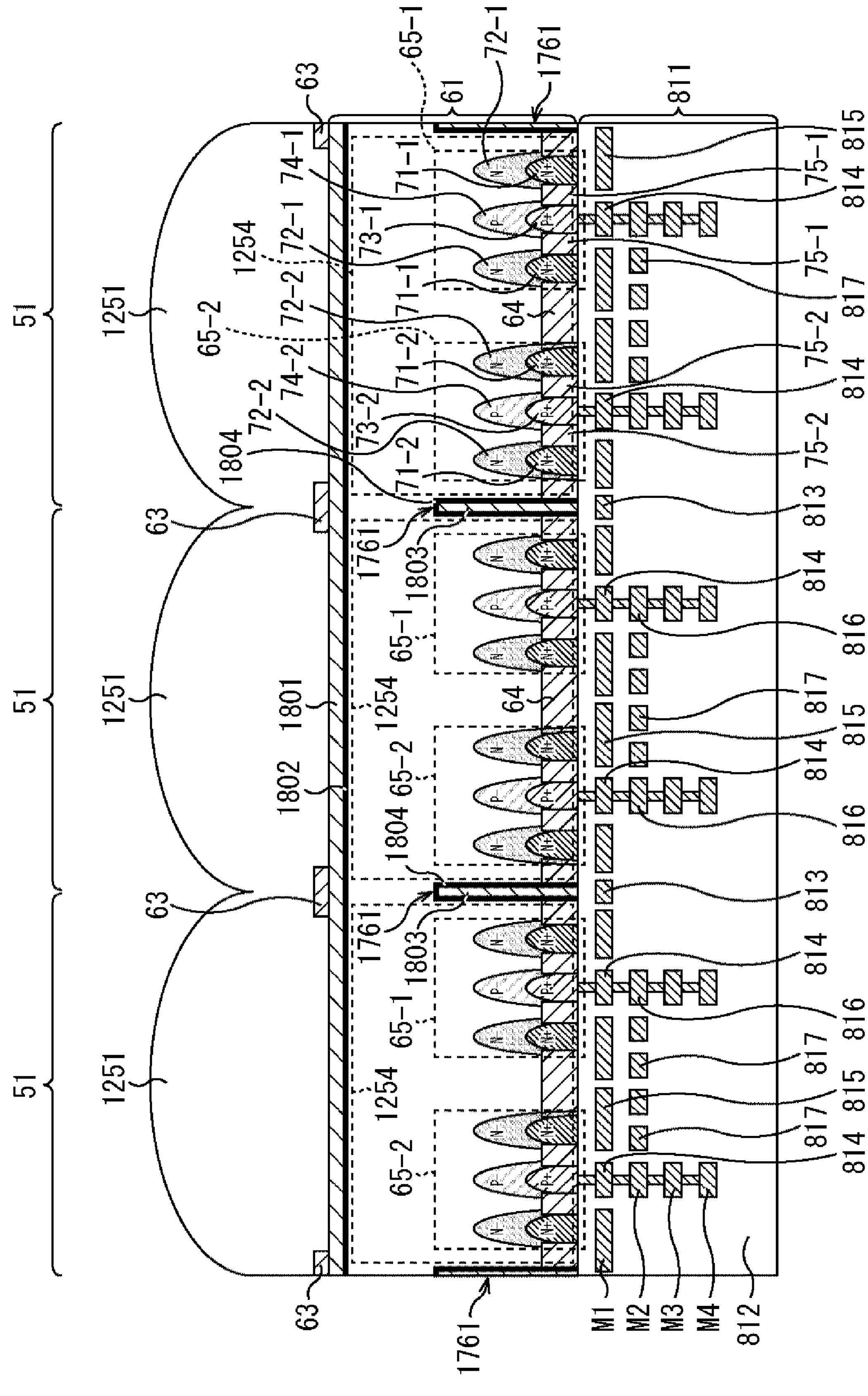
FIG. 93 is a cross-sectional view of a plurality of pixels.

Here, a cross section corresponding to an F12-F12' line and a cross section corresponding to a G12-G12' line in FIG. 91 are illustrated in FIGS. 92 and 93.

The configuration of the pixel 51 illustrated in FIGS. 92 and 93 is configured such that an oxide film 1801, a fixed charge film 1802, an oxide film 1803, and a fixed charge film 1804 are provided instead of the oxide film 1252 and the fixed charge film 1253 in the configuration of the pixel 51 in FIGS. 59 and 60.

As illustrated in FIG. 92, the oxide film 1801 is formed so as to cover a surface of the substrate 61 on the side of an on-chip lens 1251, and additionally the fixed charge film 1802 is formed immediately below this oxide film 1801, that is, on the side of the multilayer wiring layer 811 so as to cover an outer surface of the oxide film 1801.

Furthermore, at a pixel boundary portion of the substrate 61, the oxide film 1803 that isolates the pixels 51 that are adjacent, from each other, and the fixed charge film 1804 that covers an outer surface of this oxide film 1803 are formed from a surface of the substrate 61 on the side of the multilayer wiring layer 811 to a predetermined depth.

In FIG. 92, a portion functioning as a DTI having a trench structure including these oxide film 1803 and fixed charge film 1804 has the pixel isolation portion 1761, and light receiving regions 1254 of the pixels 51 that are adjacent are isolated from each other by this pixel isolation portion 1761.

Note that, it has been described here that the pixel isolation portion 1761 is constituted by the oxide film 1803 and the fixed charge film 1804; however, it can also be understood that the pixel isolation portion 1761 is constituted by only the oxide film 1803.

Besides, the pixel isolation portion 1761 may be formed by a metal material and the fixed charge film, or formed by a metal material and the oxide film.

In the example illustrated in FIG. 92, since the pixel isolation portion 1761 is formed at a boundary portion of the pixel 51, the entry of reflected light of infrared light that has entered the substrate 61 through the on-chip lens 1251 into the pixel 51 being adjacent can be suppressed, similarly to the example illustrated in FIG. 59.

Consequently, the occurrence of crosstalk and the deterioration of the pixel sensitivity can be suppressed, and characteristics of the CAPD sensor, such as sensitivity characteristics and the ranging accuracy (resolution) can be improved.

Furthermore, in the example illustrated in FIG. 92, similarly to the example illustrated in FIG. 59, since the pixel isolation portion 1761 is formed at a position shifted from the transistor, the generation of a leakage current at a P-well portion that covers the transistor can be suppressed.

Moreover, in the example illustrated in FIG. 92, similarly to the example in FIG. 59, an inter-pixel light-shielding film 63 and the on-chip lens 1251 are arranged in line with the pixel isolation portion 1761 shifted and arranged.

Accordingly, also in the case illustrated in FIG. 92, similarly to the case in FIG. 59, the amount of light (the amount of received light) guided into the light receiving region 1254 by the on-chip lens 1251 can be further expanded, and sensitivity characteristics can be improved.

In addition, a cross-sectional view corresponding to the G12-G12' line of the pixels 51 illustrated in FIG. 91 is as illustrated in FIG. 93. In FIG. 93, the oxide film 1803 and the fixed charge film 1804 constituting the pixel isolation portion 1761 pass through an oxide film 64 from a surface of the substrate 61 on the side of the multilayer wiring layer 811, and are formed up to a position at a predetermined depth.

When the pixel 51 having the configuration illustrated in FIGS. 92 and 93 is manufactured, after the oxide film 64 is first formed on the substrate 61, a trench (groove) is formed at a pixel boundary portion of the substrate 61 from the front surface side (the side of the multilayer wiring layer 811) by dry etching.

Then, after the pixel isolation portion 1761 is formed in the trench portion formed in the substrate 61, annealing processing, that is, defect repair is performed, and then a P-well that covers the transistor and a signal retrieving unit 65 are formed.

Accordingly, at the time of manufacturing the substrate 61, a pixel defect can be repaired by annealing processing, and the substrate 61 with fewer defects can be obtained.

Note that, in a case where the DTI is formed from the light entrance surface side (on the side of the on-chip lens 1251) of the substrate 61, since the P-well that covers the transistor and the signal retrieving unit 65 are already formed at the time point when dry etching for forming the DTI is performed on the substrate 61, the annealing processing cannot be performed.

On the other hand, in the configuration illustrated in FIGS. 92 and 93, the annealing process can be performed after the pixel isolation portion 1761 is formed and before the P-well and the signal retrieving unit 65 are formed, and accordingly the light receiving element 1 with fewer pixel defects can be obtained.

Furthermore, also in the examples illustrated in FIGS. 91 to 93, the on-chip lens 1251 may be arranged such that the position of the optical axis of the on-chip lens 1251 coincides with approximately the middle position between two signal retrieving units 65 in the pixel 51. Furthermore, the two signal retrieving units 65 may be shifted and arranged such that a middle position between these signal retrieving units 65 is positioned on the optical axis of the on-chip lens 1251.

Note that, in the twenty-first to thirty-second embodiments described above, examples in which the reflecting member 815 is provided in the multilayer wiring layer 811 in FIGS. 59, 62, 65, 68, and other drawings have been described. In particular, here, the reflecting member 815 is provided so as to overlap the N+ semiconductor region 71 when viewed in plan, that is, when viewed from a direction perpendicular to a surface of the substrate 61. However, the light-shielding member 631' may be provided instead of the reflecting member 815. Even in such a case, the light-shielding member 631' is provided so as to overlap the N+ semiconductor region 71 when viewed in plan.

Configuration Example of Ranging Module

Figure 94:
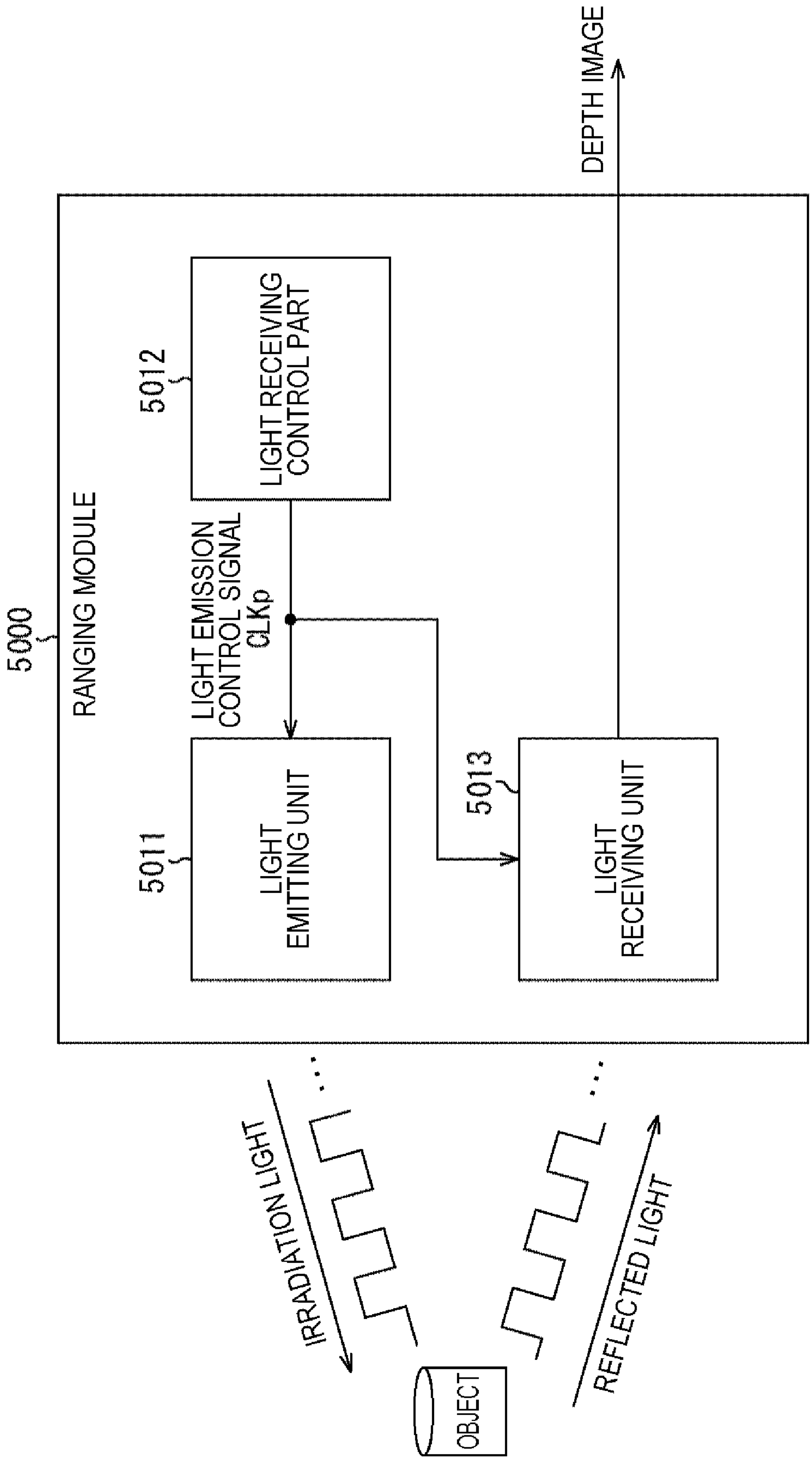
FIG. 94 is a block diagram illustrating a configuration example of a ranging module.

FIG. 94 is a block diagram illustrating a configuration example of a ranging module that outputs ranging information using the light receiving element 1 in FIG. 1.

A ranging module 5000 includes a light emitting unit 5011, a light emission control part 5012, and a light receiving unit 5013.

The light emitting unit 5011 includes a light source that discharges light of a predetermined wavelength, and discharges irradiation light whose brightness periodically varies to irradiate an object. For example, the light emitting unit 5011 includes a light emitting diode that discharges infrared light having a wavelength in the range of 780 nm to 1000 nm as a light source, and generates irradiation light in synchronization with a rectangular wave light emission control signal CLKp supplied from the light emission control part 5012.

Note that the light emission control signal CLKp is not limited to a rectangular wave as long as a periodic signal is obtained. For example, the light emission control signal CLKp may have a sine wave.

The light emission control part 5012 supplies the light emission control signal CLKp to the light emitting unit 5011 and the light receiving unit 5013, and controls the irradiation timing of the irradiation light. The frequency of this light emission control signal CLKp is, for example, 20 megahertz (MHz). Note that the frequency of the light emission control signal CLKp is not limited to 20 megahertz (MHz), and may be five megahertz (MHz) or the like.

The light receiving unit 5013 receives reflected light reflected from the object to calculate distance information for each pixel according to the light reception result, and generates a depth image that represents the distance to the object with a grayscale value for each pixel to output.

The light receiving element 1 described above is used for the light receiving unit 5013, and the light receiving element 1 as the light receiving unit 5013 calculates the distance information for each pixel, for example, from signal intensities detected by the charge detection units (N+ semiconductor regions 71) of each of the signal retrieving units 65-1 and 65-2 of each pixel 51 in the pixel array unit 20 on the basis of the light emission control signal CLKp.

As described above, the light receiving element 1 in FIG. 1 can be incorporated as the light receiving unit 5013 of the ranging module 5000 that finds and outputs distance information to a subject by the indirect ToF technique. By adopting, as the light receiving unit 5013 of the ranging module 5000, the light receiving element 1 of each of the above-described embodiments, specifically, a light receiving element with improved pixel sensitivity as a backside illumination type, ranging characteristics as the ranging module 5000 can be improved.

Application Example to Moving Body

The technology according to the present disclosure (present technology) can be applied to diverse products. For example, the technology according to the present disclosure may be implemented as an apparatus to be equipped in any type of moving body such as automobile, electric automobile, hybrid electric automobile, motorcycle, bicycle, personal mobility, airplane, drone, ship, and robot.

Figure 95:
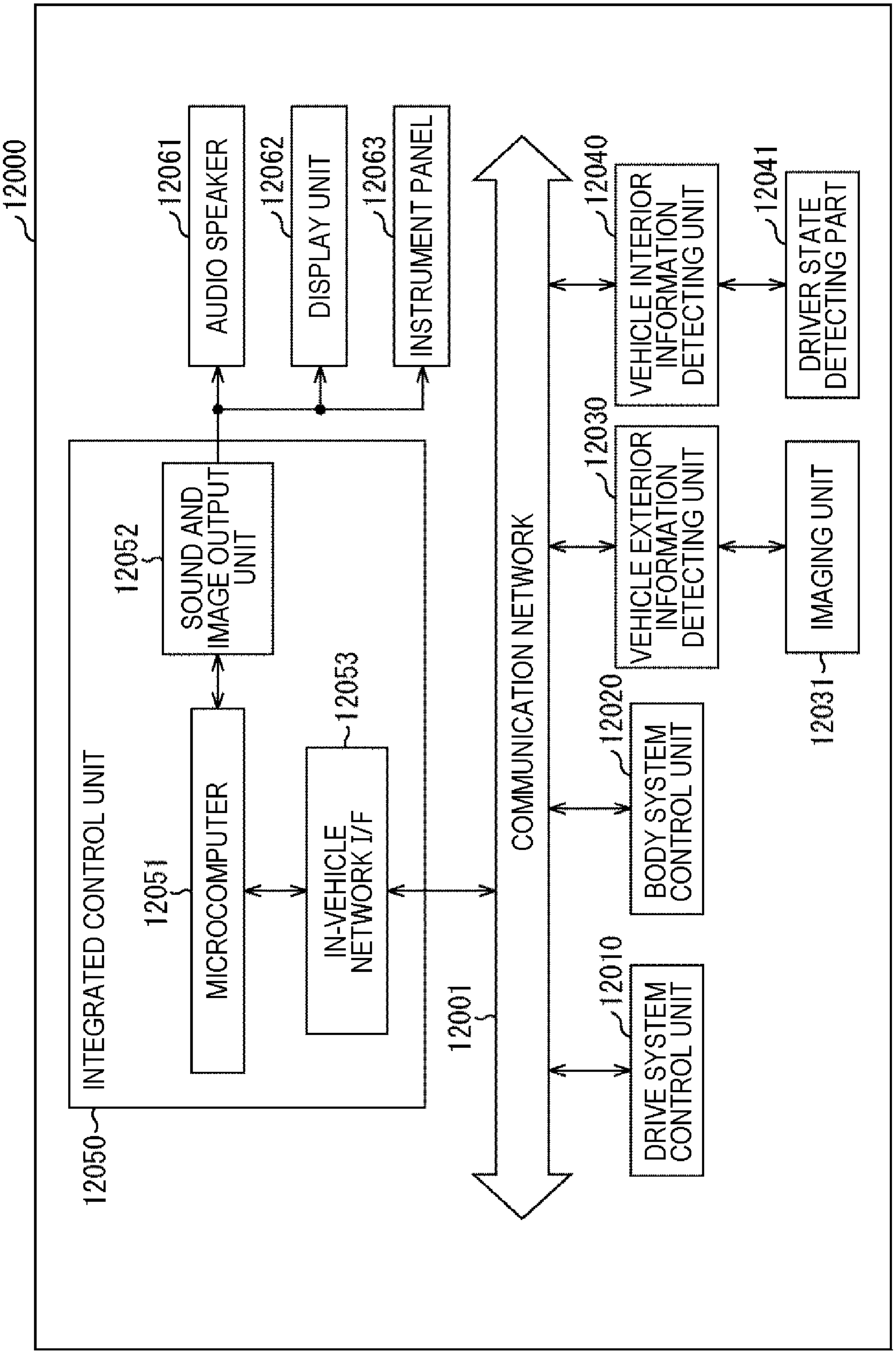
FIG. 95 is a block diagram illustrating an example of a schematic configuration of a vehicle control system.

FIG. 95 is a block diagram illustrating a schematic configuration example of a vehicle control system, which is an example of a moving body control system to which the technology according to the present disclosure can be applied.

The vehicle control system 12000 includes a plurality of electronic control units connected via a communication network 12001. In the example illustrated in FIG. 95, the vehicle control system 12000 includes a drive system control unit 12010, a body system control unit 12020, a vehicle exterior information detecting unit 12030, a vehicle interior information detecting unit 12040, and an integrated control unit 12050. Furthermore, as a functional configuration of the integrated control unit 12050, a microcomputer 12051, a sound and image output unit 12052, and an in-vehicle network interface (I/F) 12053 are illustrated.

The drive system control unit 12010 controls working of an apparatus related to a drive system of the vehicle in accordance with various programs. For example, the drive system control unit 12010 functions as a driving force generating apparatus for generating a driving force of the vehicle, such as an internal combustion engine or a driving motor, a driving force transmitting mechanism for transmitting a driving force to wheels, a steering mechanism that regulates a steer angle of the vehicle, and a control apparatus such as a braking apparatus that generates a braking force of the vehicle.

The body system control unit 12020 controls working of various apparatuses disposed in the vehicle body in accordance with various programs. For example, the body system control unit 12020 functions as a keyless entry system, a smart key system, a power window apparatus, or a control apparatus for various lamps such as a headlamp, a back lamp, a brake lamp, a turn signal lamp, or a fog lamp. In this case, the body system control unit 12020 can accept input of a radio wave released from a portable device that substitutes a key or signals from various switches. The body system control unit 12020 accepts input of the above-mentioned radio wave or signals and controls a door lock apparatus, the power window apparatus, the lamp, and the like of the vehicle.

The vehicle exterior information detecting unit 12030 detects information outside the vehicle equipped with the vehicle control system 12000. For example, an imaging unit 12031 is connected to the vehicle exterior information detecting unit 12030. The vehicle exterior information detecting unit 12030 causes the imaging unit 12031 to capture an image of the outside of the vehicle and receives an image that has been captured. The vehicle exterior information detecting unit 12030 may perform object detection processing or distance detection processing for a person, a car, an obstacle, a sign, a character on a road surface, or the like on the basis of the received image.

The imaging unit 12031 is an optical sensor that receives light and outputs an electrical signal according to the amount of the received light. The imaging unit 12031 can output an electrical signal as an image, or can also output an electrical signal as information regarding ranging. Furthermore, light received by the imaging unit 12031 may be visible light or invisible light such as an infrared ray.

The vehicle interior information detecting unit 12040 detects information inside the vehicle. For example, a driver state detecting part 12041 that detects the state of the driver is connected to the vehicle interior information detecting unit 12040. The driver state detecting part 12041 includes, for example, a camera that images the driver, and the vehicle interior information detecting unit 12040 may calculate the degree of fatigue or the degree of concentration of the driver or may discriminate whether or not the driver is dozing off, on the basis of detection information input from the driver state detecting part 12041.

The microcomputer 12051 can compute a targeted control value for the driving force generating apparatus, the steering mechanism, or the braking apparatus on the basis of the information inside and outside the vehicle acquired by the vehicle exterior information detecting unit 12030 or the vehicle interior information detecting unit 12040, and can output a control command to the drive system control unit 12010. For example, the microcomputer 12051 can perform coordinative control for the purpose of implementing the function of advanced driver assistance system (ADAS) including vehicle collision avoidance or impact mitigation, follow-up running based on inter-vehicle distance, vehicle speed maintenance running, vehicle collision warning, vehicle lane departure warning, or the like.

Furthermore, the microcomputer 12051 can control the driving force generating apparatus, the steering mechanism, the braking apparatus, or the like on the basis of the information around the vehicle acquired by the vehicle exterior information detecting unit 12030 or the vehicle interior information detecting unit 12040, so as to perform coordinative control for the purpose of, for example, the automated driving that allows to run autonomously without depending on the driver's operation.

In addition, the microcomputer 12051 can output a control command to the body system control unit 12020 on the basis of information outside the vehicle acquired by the vehicle exterior information detecting unit 12030. For example, the microcomputer 12051 can control the headlamps according to the position of a preceding vehicle or oncoming vehicle sensed by the vehicle exterior information detecting unit 12030, and can perform coordinative control for the purpose of anti-glare, such as switching from a high beam to a low beam.

The sound and image output unit 12052 transmits an output signal of at least one of a sound or an image to an output apparatus capable of visually or audibly notifying an occupant of the vehicle or the outside of the vehicle of information. In the example in FIG. 95, an audio speaker 12061, a display unit 12062, and an instrument panel 12063 are exemplified as output apparatuses. For example, the display unit 12062 may include at least one of an on-board display or a head-up display.

Figure 96:
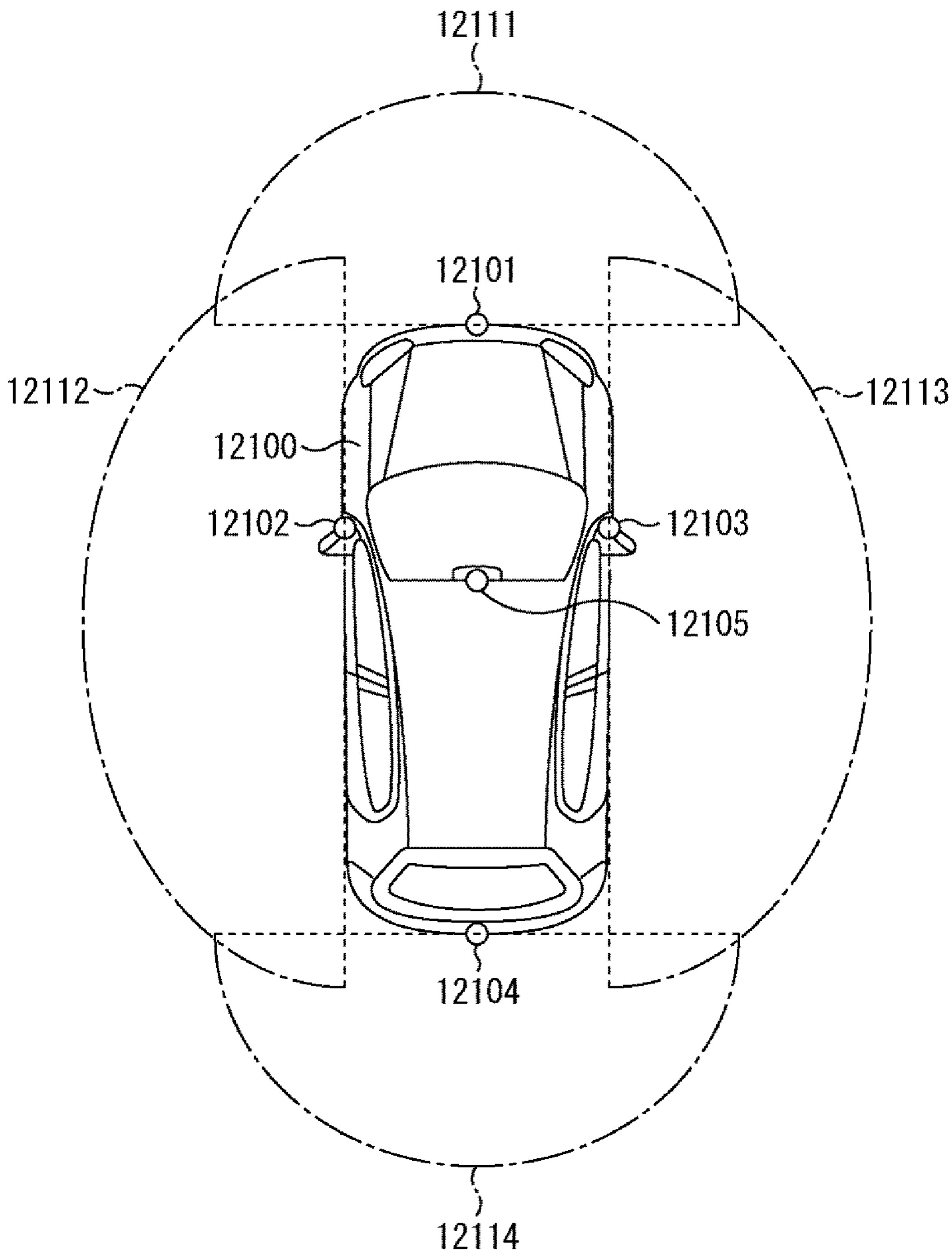
FIG. 96 is an explanatory diagram illustrating an example of installation positions of vehicle exterior information detecting parts and imaging units.

FIG. 96 is a diagram illustrating an example of installation positions of the imaging units 12031.

In FIG. 96, a vehicle 12100 includes, as the imaging units 12031, imaging units 12101, 12102, 12103, 12104, and 12105.

For example, the imaging units 12101, 12102, 12103, 12104, and 12105 are provided at positions such as a front nose, a side mirror, a rear bumper, a back door, and an upper portion of a windshield in a passenger compartment of the vehicle 12100. The imaging unit 12101 provided at the front nose and the imaging unit 12105 provided at the upper portion of the windshield in the passenger compartment mainly acquire an image ahead of the vehicle 12100. The imaging units 12102 and 12103 provided at the side mirrors mainly acquire images of the sides of the vehicle 12100. The imaging unit 12104 provided at the rear bumper or the back door mainly acquires an image behind the vehicle 12100. The images ahead of the vehicle 12100 acquired by the imaging units 12101 and 12105 are mainly used for detecting a preceding vehicle, a pedestrian, an obstacle, a traffic signal, a traffic sign, a lane, or the like.

Note that FIG. 96 illustrates an example of capturing ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the side mirrors, respectively, and an imaging range 12114 indicates an imaging range of the imaging unit 12104 provided at the rear bumper or the back door. For example, by overlaying image data captured by the imaging units 12101 to 12104, an overhead view image of the vehicle 12100 viewed from above is obtained.

At least one of the imaging units 12101 to 12104 may have a function of acquiring distance information. For example, at least one of the imaging units 12101 to 12104 may be a stereo camera including a plurality of imaging elements, or may be an imaging element having pixels for phase difference detection.

For example, the microcomputer 12051 finds, from the distance information obtained from the imaging units 12101 to 12104, a distance to each three-dimensional object in the imaging ranges 12111 to 12114, and the temporal change in this distance (relative speed with respect to the vehicle 12100), thereby being able to extract, as a preceding vehicle, particularly a closest three-dimensional object that is present on the traveling path of the vehicle 12100 and runs at a predetermined speed (for example, 0 km/h or higher) in approximately the same direction as the vehicle 12100. Moreover, the microcomputer 12051 can set an inter-vehicle distance to be secured in advance behind the preceding vehicle, and can perform automatic brake control (including follow-up stop control), automatic acceleration control (including follow-up start control), and the like. In this manner, coordinative control for the purpose of automated driving or the like that allows to run autonomously without depending on the driver's operation can be performed.

For example, the microcomputer 12051 can classify three-dimensional object data relating to three-dimensional objects into two-wheeled vehicles, ordinary vehicles, large vehicles, pedestrians, and other three-dimensional objects such as power poles, with reference to the distance information obtained from the imaging units 12101 to 12104 to extract, and can use the extracted data for automatic avoidance of obstacles. For example, the microcomputer 12051 identifies peripheral obstacles of the vehicle 12100 as an obstacle that can be visually recognized by the driver of the vehicle 12100 and an obstacle that are difficult to visually recognize. Then, the microcomputer 12051 can estimate a collision risk indicating the degree of danger of collision with each obstacle and, when a situation is such that the collision risk is equal to or higher than a set value and a collision is likely to happen, can perform driving assistance for collision avoidance by outputting an alarm to the driver via the audio speaker 12061 and the display unit 12062, or performing forced deceleration or avoidance steering via the drive system control unit 12010.

At least one of the imaging units 12101 to 12104 may be an infrared camera that detects an infrared ray. For example, the microcomputer 12051 can recognize a pedestrian by determining whether or not a pedestrian is present in the captured images of the imaging units 12101 to 12104. Such pedestrian recognition is performed, for example, by the procedure of extracting feature points in the captured images of the imaging units 12101 to 12104 as infrared cameras, and the procedure of performing pattern matching processing on a sequence of feature points indicating a contour of an object to discriminate whether or not the object is a pedestrian. When the microcomputer 12051 determines that a pedestrian is present in the captured images of the imaging units 12101 to 12104 and recognizes the pedestrian, the sound and image output unit 12052 controls the display unit 12062 so as to display a quadrangular contour frame for emphasizing the recognized pedestrian in a superimposed manner. Furthermore, the sound and image output unit 12052 may control the display unit 12062 so as to display an icon or the like indicating a pedestrian at a desired position.

An example of the vehicle control system to which the technology according to the present disclosure can be applied has been described thus far. The technology according to the present disclosure can be applied to the imaging unit 12031 in the configuration described above. Specifically, for example, by applying the light receiving element 1 illustrated in FIG. 1 to the imaging unit 12031, characteristics such as the sensitivity can be improved.

The embodiments according to the present technology are not limited to the aforementioned embodiments and a variety of modifications can be made without departing from the scope of the present technology.

For example, it is of course possible to appropriately combine two or more embodiments described above. That is, for example, according to which characteristic such as the sensitivity of the pixel has priority, it is possible to appropriately select the number and arrangement positions of the signal retrieving units provided in the pixel, the shape of the signal retrieving unit, whether or not to use a shared structure, the presence or absence of the on-chip lens, the presence or absence of the inter-pixel light-shielding portion, the presence or absence of the isolation region, the thicknesses of the on-chip lens and substrate, the type and film design of the substrate, the presence or absence of the bias to the light entrance surface, the presence or absence of the reflecting member, and the like.

Furthermore, in the above-described embodiments, an example in which electrons are used as signal carriers has been described; however, holes generated by photoelectric conversion may be used as signal carriers. In such a case, it is only required that the charge detection unit for detecting the signal carrier is constituted by the P+ semiconductor region, and the voltage application unit for generating an electric field in the substrate is constituted by the N+ semiconductor region, to allow a hole as the signal carrier to be detected in the charge detection unit provided in the signal retrieving unit.

According to the present technology, ranging characteristics can be improved by configuring the CAPD sensor as a backside illuminated light receiving element.

Note that, in the above-described embodiments, description has been given assuming a driving technique in which a voltage is directly applied to the P+ semiconductor region 73 formed in the substrate 61, and the photoelectrically converted charge is moved by the generated electric field; however, the present technology is not limited to this driving technique, and can be applied to other driving techniques. For example, a driving technique using first and second transfer transistors and first and second floating diffusion regions formed in the substrate 61 may be employed in which charges photoelectrically converted by applying a predetermined voltage to each of the gates of the first and second transfer transistors are each distributed to and accumulated in the first floating diffusion region via the first transfer transistor or the second floating diffusion region via the second transfer transistor. In that case, the first and second transfer transistors formed in the substrate 61 function as first and second voltage application units in which a predetermined voltage is applied to the gates, respectively, and the first and second floating diffusion regions formed in the substrate 61 function as first and second charge detection units that detect charges generated by photoelectric conversion, respectively.

Furthermore, in different terms, in the driving technique in which a voltage is directly applied to the P+ semiconductor region 73 formed in the substrate 61 and the photoelectrically converted charge is moved by the generated electric field, two P+ semiconductor regions 73 assigned as first and second voltage application units serve as control nodes to which a predetermined voltage is applied, and two N+ semiconductor regions 71 assigned as first and second charge detection units serve as detection nodes that detect charges. In the driving technique in which a predetermined voltage is applied to the gates of the first and second transfer transistors formed in the substrate 61, and the photoelectrically converted charges are distributed to and accumulated in the first floating diffusion region or the second floating diffusion region, the gates of the first and second transfer transistors serve as control nodes to which a predetermined voltage is applied, and the first and second floating diffusion regions formed in the substrate 61 serve as detection nodes for detecting charges.

In addition, the effects described in the present description merely serve as examples and not construed to be limited. There may be another effect.

Note that the present technology can be also configured as described below.

(1)

A light receiving element including:

light receiving regions each including a first voltage application unit to which a first voltage is applied, a first charge detection unit provided around the first voltage application unit, a second voltage application unit to which a second voltage different from the first voltage is applied, and a second charge detection unit provided around the second voltage application unit; and an isolation portion that is arranged at a boundary between the light receiving regions adjacent to each other, and isolates the light receiving regions from each other.

(2)

The light receiving element according to (1), further including:

an on-chip lens;

a wiring layer; and a semiconductor layer arranged between the on-chip lens and the wiring layer, in which each of the light receiving regions and the isolation portion are formed in the semiconductor layer.

(3)

The light receiving element according to (2), in which the wiring layer includes at least one layer including a reflecting member, and the reflecting member is provided so as to overlap the first charge detection unit or the second charge detection unit when viewed in plan.

(4)

The light receiving element according to (2), in which the wiring layer includes at least one layer including a light-shielding member, and the light-shielding member is provided so as to overlap the first charge detection unit or the second charge detection unit when viewed in plan.

(5)

The light receiving element according to any one of (2) to (4), further including a transistor region provided with a transistor connected to the first charge detection unit and a transistor connected to the second charge detection unit.

(6)

The light receiving element according to (5), in which the isolation portion is provided in a region different from the transistor region when viewed in plan.

(7)

The light receiving element according to (5) or (6), in which the isolation portions are provided at positions at two ends of the transistor region.

(8)

The light receiving element according to any one of (1) to (7), in which each of the light receiving regions is surrounded by the isolation portion when viewed in plan.

(9)

The light receiving element according to any one of (2) to (7), in which the on-chip lens is arranged such that an optical axis position of the on-chip lens coincides with approximately a center position of a region surrounded by the isolation portion.

(10)

The light receiving element according to any one of (2) to (7), in which the on-chip lens is arranged such that an optical axis position of the on-chip lens coincides with approximately a middle position between the first charge detection unit and the second charge detection unit.

(11)

The light receiving element according to any one of (1) to (10), in which each of the light receiving regions is formed with a plurality of the first voltage application unit and the first charge detection unit, and the second voltage application unit and the second charge detection unit.

(12)

The light receiving element according to any one of (2) to (7), in which the isolation portion is formed so as to pass through the semiconductor layer.

(13)

The light receiving element according to any one of (2) to (7), in which the isolation portion is formed from a surface of the semiconductor layer on a side of the wiring layer to a predetermined depth.

(14)

The light receiving element according to any one of (2) to (7), in which the isolation portion is formed from a surface of the semiconductor layer on a side of the on-chip lens to a predetermined depth.

(15)

The light receiving element according to (14), in which an oxide film is formed between a surface of the semiconductor layer on a side of the wiring layer and the isolation portion.

(16)

The light receiving element according to any one of (1) to (15), in which the isolation portion includes at least an oxide film.

(17)

The light receiving element according to any one of (1) to (15), in which the isolation portion includes at least a fixed charge film.

(18)

The light receiving element according to any one of (1) to (15), in which the isolation portion includes at least a metal material.

(19)

The light receiving element according to any one of (1) to (15), in which the isolation portion includes at least an N-type semiconductor region or a P-type semiconductor region.

(20)

The light receiving element according to any one of (2) to (7), in which the semiconductor layer is a P-type semiconductor layer, and the isolation portion includes at least an N-type semiconductor region, and a voltage equal to or higher than a voltage applied to the semiconductor layer is applied to the N-type semiconductor region.

(21)

The light receiving element according to any one of (1) to (20), in which no oxide film is formed in the light receiving regions.

(22)

The light receiving element according to any one of (2) to (7), in which the first voltage application unit and the second voltage application unit include a first P-type semiconductor region and a second P-type semiconductor region formed in the semiconductor layer, respectively.

(23)

The light receiving element according to any one of (2) to (7), in which the first voltage application unit and the second voltage application unit include a first transfer transistor and a second transfer transistor formed in the semiconductor layer, respectively.

(24)

A ranging module including:

a light receiving element;

a light source that radiates irradiation light whose brightness varies periodically; and a light emission control part that controls an irradiation timing of the irradiation light, in which the light receiving element includes light receiving regions each including a first voltage application unit to which a first voltage is applied, a first charge detection unit provided around the first voltage application unit, a second voltage application unit to which a second voltage different from the first voltage is applied, and a second charge detection unit provided around the second voltage application unit, and an isolation portion that is arranged at a boundary between the light receiving regions adjacent to each other, and isolates the light receiving regions from each other.

REFERENCE SIGNS LIST

1 Light receiving element
20 Pixel array unit
21 Tap drive unit
22 Vertical drive unit
51 Pixel
61 Substrate
62 On-chip lens
66 Fixed charge film
71-1, 71-2, 71 N+ semiconductor region
73-1, 73-2, 73 P+ semiconductor region
441-1, 441-2, 441 Isolation region
471-1, 471-2, 471 Isolation region
631 Reflecting member
721 Transfer transistor
722 FD
723 Reset transistor
724 Amplification transistor
725 Select transistor
727 Additional capacitance
728 Switching transistor
741 Voltage supply line
811 Multilayer wiring layer
812 Interlayer insulating film
813 Power supply line
814 Voltage application wiring
815 Reflecting member
816 Voltage application wiring
817 Control line
M1 to M5 Metal film
1001 Through electrode
1002 Insulating film
1041 Transistor
1101-1 to 1101-4, 1101 Inter-pixel light-shielding portion
1071 Transparent conductive film
1161-1 to 1161-4, 1161 Contact
1221 Pixel isolation portion
1254 Light receiving region
1733 Oxide film
5000 Ranging module
5011 Light emitting unit
5012 Light emission control part
5013 Light receiving unit

The invention claimed is:

1. A light receiving element, comprising:

a plurality of pixels, each including:

a first voltage application unit to which a first voltage is applied;

a first charge detection unit provided adjacent to the first voltage application unit;

a second voltage application unit to which a second voltage different from the first voltage is applied; and a second charge detection unit provided adjacent to the second voltage application unit; and a trench that is arranged between the pixels adjacent to each other in a semiconductor layer.

2. The light receiving element according to claim 1, further comprising:

an on-chip lens; and a wiring layer, wherein the semiconductor layer is arranged between the on-chip lens and the wiring layer, and wherein each of the pixels and the trench are formed in the semiconductor layer.

3. The light receiving element according to claim 2, wherein the wiring layer includes at least one layer including a reflecting member, and the reflecting member is provided so as to overlap the first charge detection unit or the second charge detection unit when viewed in plan.

4. The light receiving element according to claim 2, wherein the wiring layer includes at least one layer including a light-shielding member, and the light-shielding member is provided so as to overlap the first charge detection unit or the second charge detection unit when viewed in plan.

5. The light receiving element according to claim 2, further comprising a transistor region provided with a transistor connected to the first charge detection unit and a transistor connected to the second charge detection unit.

6. The light receiving element according to claim 5, wherein the trench is provided in a region different from the transistor region when viewed in plan.

7. The light receiving element according to claim 5, wherein trenches are provided at positions at two ends of the transistor region.

8. The light receiving element according to claim 1, wherein each of the pixels is surrounded by the trench when viewed in plan.

9. The light receiving element according to claim 2, wherein the on-chip lens is arranged such that an optical axis position of the on-chip lens coincides with approximately a center position of a region surrounded by the trench.

10. The light receiving element according to claim 2, wherein the on-chip lens is arranged such that an optical axis position of the on-chip lens coincides with approximately a middle position between the first charge detection unit and the second charge detection unit.

11. The light receiving element according to claim 1, wherein each of the pixels is formed with a plurality of the first voltage application unit and the first charge detection unit, and the second voltage application unit and the second charge detection unit.

12. The light receiving element according to claim 2, wherein the trench is formed so as to pass through the semiconductor layer.

13. The light receiving element according to claim 2, wherein the trench is formed from a surface of the semiconductor layer on a side of the wiring layer to a predetermined depth.

14. The light receiving element according to claim 2, wherein the trench is formed from a surface of the semiconductor layer on a side of the on-chip lens to a predetermined depth.

15. The light receiving element according to claim 14, wherein an oxide film is formed between a surface of the semiconductor layer on a side of the wiring layer and the trench.

16. The light receiving element according to claim 1, wherein the trench includes at least an oxide film.

17. The light receiving element according to claim 1, wherein the trench includes at least a fixed charge film.

18. The light receiving element according to claim 1, wherein the trench includes at least a metal material.

19. The light receiving element according to claim 1, wherein the trench includes at least an N-type semiconductor region or a P-type semiconductor region.

20. The light receiving element according to claim 2, wherein the semiconductor layer is a P-type semiconductor layer, and the trench includes at least an N-type semiconductor region, and a voltage equal to or higher than a voltage applied to the semiconductor layer is applied to the N-type semiconductor region.

21. The light receiving element according to claim 1, wherein no oxide film is formed in the pixels.

22. The light receiving element according to claim 2, wherein the first voltage application unit and the second voltage application unit include a first P-type semiconductor region and a second P-type semiconductor region formed in the semiconductor layer, respectively.

23. The light receiving element according to claim 2, wherein the first voltage application unit and the second voltage application unit include a first transfer transistor and a second transfer transistor formed in the semiconductor layer, respectively.

24. A ranging module, comprising:

a pixel;

a light source that radiates irradiation light whose brightness varies periodically; and a light emission control part that controls an irradiation timing of the irradiation light, wherein the pixel includes:

light receiving regions, each including:

a first voltage application unit to which a first voltage is applied:

a first charge detection unit provided adjacent to the first voltage application unit;

a second voltage application unit to which a second voltage different from the first voltage is applied; and a second charge detection unit provided adjacent to the second voltage application unit; and a trench that is arranged at a boundary between the light receiving regions adjacent to each other, and isolates the light receiving regions from each other.

* * * * *